(12) United States Patent
Wang et al.

(10) Patent No.: US 12,021,097 B2
(45) Date of Patent: Jun. 25, 2024

(54) CAMERA MODULE, AND PHOTOSENSITIVE COMPONENT THEREOF AND MANUFACTURING METHOD THEREFOR

(71) Applicant: NINGBO SUNNY OPOTECH CO., LTD., Zhejiang (CN)

(72) Inventors: Mingzhu Wang, Ningbo (CN); Bojie Zhao, Ningbo (CN); Takehiko Tanaka, Ningbo (CN); Zhongyu Luan, Ningbo (CN); Zhenyu Chen, Ningbo (CN); Zhen Huang, Ningbo (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 0 days.

(21) Appl. No.: 17/847,569

(22) Filed: Jun. 23, 2022

(65) Prior Publication Data

US 2023/0019091 A1   Jan. 19, 2023

Related U.S. Application Data

(62) Division of application No. 16/082,533, filed as application No. PCT/CN2017/076041 on Mar. 9, 2017, now abandoned.

(30) Foreign Application Priority Data

Mar. 12, 2016  (CN) .......................... 201610142925.9
Mar. 12, 2016  (CN) .......................... 201610143457.7

(Continued)

(51) Int. Cl.
*H01L 23/10*   (2006.01)
*H01L 27/146*  (2006.01)
(Continued)

(52) U.S. Cl.
CPC ........ *H01L 27/14618* (2013.01); *H01L 23/10* (2013.01); *H01L 27/14621* (2013.01);
(Continued)

(58) Field of Classification Search
CPC ........ H04N 23/50; H04N 23/53; H04N 23/54; H01L 27/14618; H05K 1/0274; H05K 1/118

See application file for complete search history.

(56) References Cited

U.S. PATENT DOCUMENTS 5,321,204 A    6/1994  Ko
2005/0263312 A1  12/2005  Bolken
(Continued)

FOREIGN PATENT DOCUMENTS

CN    1898790    1/2007
CN    1913113    2/2007
(Continued)

*Primary Examiner* — Daniel M Pasiewicz
(74) *Attorney, Agent, or Firm* — WENDEROTH, LIND & PONACK, L.L.P.

(57) ABSTRACT

A camera module and photosensitive component or unit thereof and manufacturing method therefor are provided. The photosensitive unit includes an encapsulation portion and a photosensitive portion that includes a main circuit board and a photosensitive sensor, wherein the encapsulation portion is integrally encapsulated to form on the main circuit board and the photosensitive sensor.

6 Claims, 65 Drawing Sheets

(30) Foreign Application Priority Data

| Mar. 12, 2016 | (CN) | 201620191631.0 |
| Mar. 12, 2016 | (CN) | 201620191969.6 |
| Apr. 1, 2016 | (CN) | 201610202500.2 |
| Apr. 1, 2016 | (CN) | 201620269534.9 |
| Apr. 28, 2016 | (CN) | 201610278035.0 |
| Apr. 28, 2016 | (CN) | 201620373323.X |
| Jun. 16, 2016 | (CN) | 201610430615.7 |
| Jun. 16, 2016 | (CN) | 201620590779.1 |

(51) Int. Cl.
 *H04N 23/55* (2023.01)
 *H05K 1/02* (2006.01)
 *H05K 1/11* (2006.01)

(52) U.S. Cl.
 CPC ....... *H01L 27/14698* (2013.01); *H04N 23/55* (2023.01); *H05K 1/0274* (2013.01); *H05K 1/118* (2013.01); *H01L 2224/83101* (2013.01); *H01L 2224/83192* (2013.01); *H01L 2224/92247* (2013.01); *H01L 2924/16195* (2013.01)

(56) References Cited

U.S. PATENT DOCUMENTS

| 2006/0024856 | A1 | 2/2006 | Derderian et al. |
| 2006/0091513 | A1 | 5/2006 | Weng |
| 2007/0037321 | A1 | 2/2007 | Higashino et al. |
| 2007/0126081 | A1 | 6/2007 | Webster et al. |
| 2007/0166500 | A1 | 7/2007 | Sutoh et al. |
| 2008/0164550 | A1 | 7/2008 | Chen et al. |
| 2010/0035373 | A1* | 2/2010 | Hunziker ............ H01L 23/3185 257/E21.599 |
| 2013/0141541 | A1* | 6/2013 | Jung ...................... H04N 23/00 348/46 |
| 2013/0334706 | A1 | 12/2013 | McConnelee |
| 2016/0150133 | A1 | 5/2016 | Suzuki |
| 2016/0191767 | A1 | 6/2016 | Otani |

FOREIGN PATENT DOCUMENTS

| CN | 1980325 | 6/2007 |
| CN | 101989555 | 3/2011 |
| CN | 103166104 | 6/2013 |
| CN | 103700634 | 4/2014 |
| CN | 203674192 | 6/2014 |
| CN | 103903991 | 7/2014 |
| CN | 104617051 | 5/2015 |
| CN | 105206640 | 12/2015 |
| CN | 105681640 | 6/2016 |
| CN | 105704354 | 6/2016 |
| CN | 105721754 | 6/2016 |
| CN | 105744130 | 7/2016 |
| CN | 105827916 | 8/2016 |
| CN | 205545597 | 8/2016 |
| CN | 205792874 | 12/2016 |
| CN | 205792875 | 12/2016 |
| CN | 1913166 | 2/2017 |
| CN | 205961266 | 2/2017 |
| EP | 1 475 960 | 11/2004 |
| EP | 2 282 327 | 2/2011 |
| JP | 2007-311416 | 11/2007 |
| JP | 2008-172191 | 7/2008 |
| JP | 2008-306350 | 12/2008 |
| JP | 2012-019422 | 1/2012 |
| JP | 2016-33963 | 3/2016 |
| KR | 1992-0005020 | 6/1992 |
| KR | 10-2012-0112070 | 10/2012 |
| TW | I251938 | 3/2006 |
| TW | 200616106 | 5/2006 |
| TW | 200616177 | 5/2006 |

\* cited by examiner

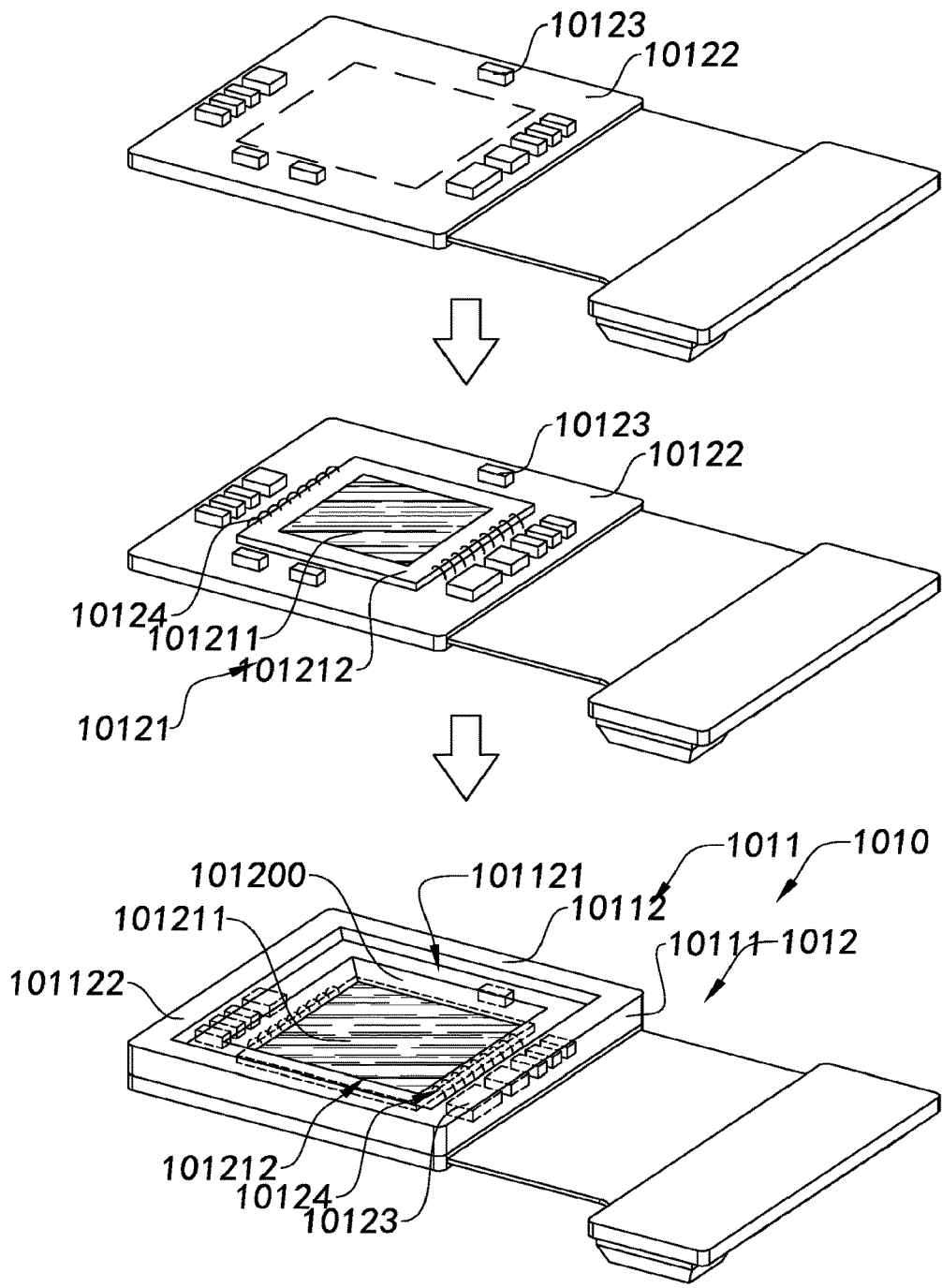
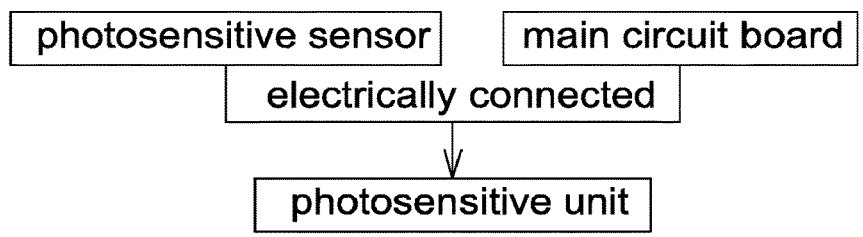
Fig.5

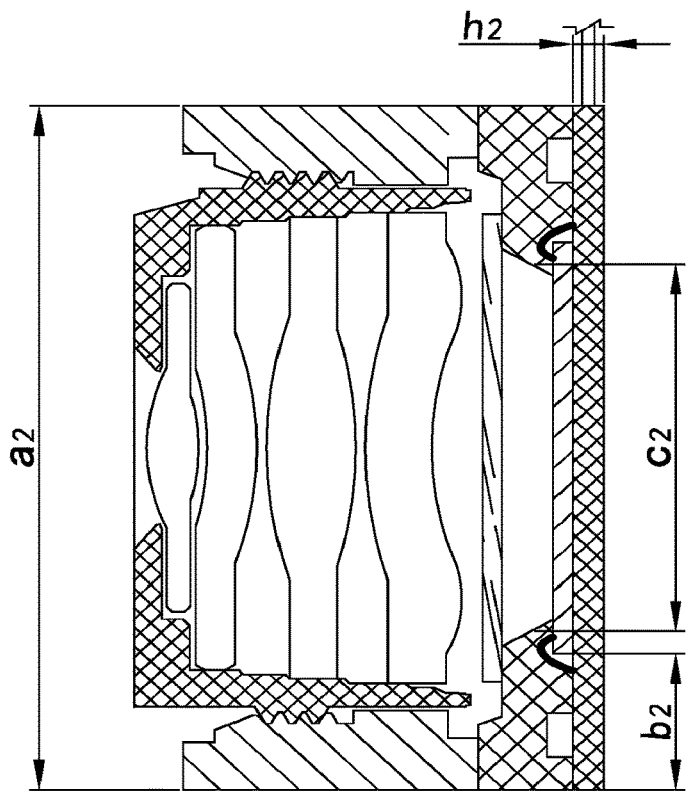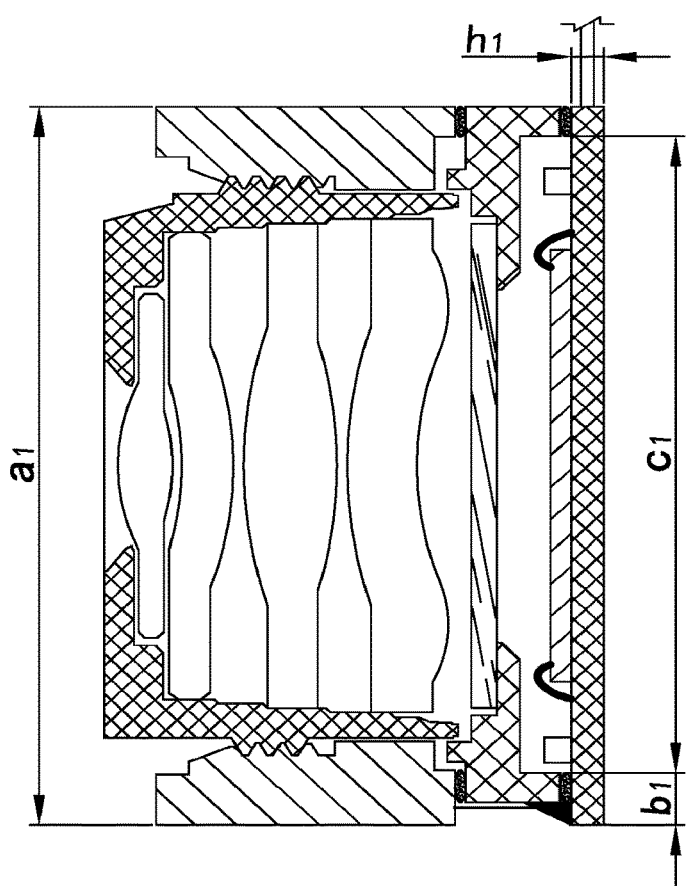
Fig.36A

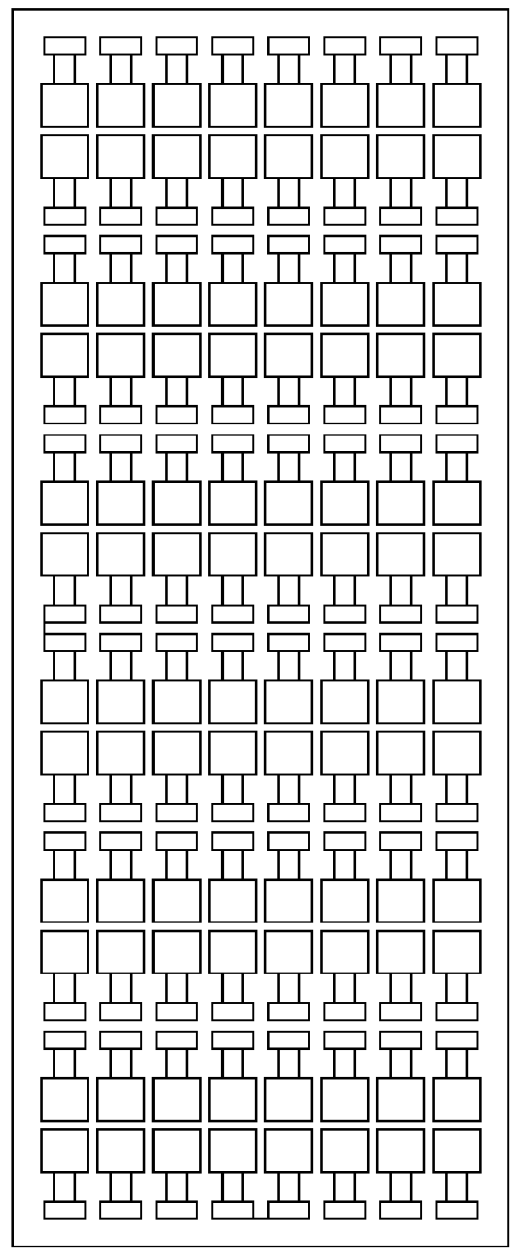
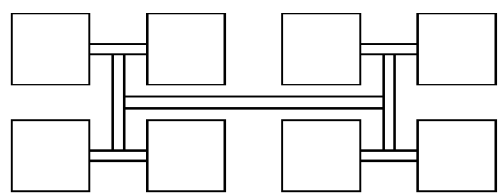
Fig.36B

CAMERA MODULE, AND PHOTOSENSITIVE COMPONENT THEREOF AND MANUFACTURING METHOD THEREFOR

CROSS REFERENCE OF RELATED APPLICATION

This is a U.S. National state non-provisional application under 35 U.S.C. § 371 of the international application PCT/CN2017/076041, international filing date Mar. 9, 2017, the entire content of which is expressly incorporated herein by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to the field of camera module, and more particularly to a camera module and photosensitive component or unit thereof and manufacturing method therefor.

Description of Related Arts

COB (Chip On Board, chip packaging) technique is a very important technical process in the method of assembling and producing camera module. A camera module produced by means of the conventional COB technique is assembled of a circuit board, a photosensitive sensor, a lens holder, a motor drive, and a camera lens.

FIG. 1 refers to a perspective view of a camera module produced by means of the conventional COB technique. The camera module includes a circuit board 101P, a sensor 102P such as a photosensitive chip, a frame 103P, an optical filter 104P, a motor 105P, and a camera lens 106P. The sensor 102P is installed on the circuit board 101P. The optical filter 104P is installed on the frame 103P. The camera lens 106P is installed in the motor 105P. The motor 105P is installed on the frame 103P, so that the camera lens 106P is positioned along a photosensitive path of the sensor 102P.

It is worth mentioning that there is often a plurality of circuit components 1011P, such as resistors, capacitors, and etc., installed on the circuit board 101P. These circuit components 1011P protrude from the surface of the circuit board 101P. However, the frame 103P has to be mounted on the circuit board 101P with the circuit components 1011P. According to the conventional COB technology, there are disadvantages in the assembling and coordination relationships among the circuit board 101P, the circuit components 1011P, and the frame 103P, which also restrict the development for the camera module to become lighter and thinner.

It is also worth mentioning that the sensor 102P is usually electrically connected with the circuit board 101P with conductive elements such as gold wires 1021P for data transmission between the sensor 102P and the circuit board 101P. Based on the feature and structure of the gold wires 1021P, the gold wires 1021P are usually curvedly bent and protruded from the surface of the circuit board 101P. Therefore, the assembling process of the sensor 102P, like the circuit components 1011P, has the similar adverse effects to the camera module.

In particular, firstly, the circuit components 1011P and the gold wires 1021P are directly exposed on the surface of the circuit board 101P. As a result, they will inevitably be affected during the subsequent assembling processes, such as adhering the frame 103P, soldering the motor 105P, and etc., wherein solder resists, dusts and etc. during the soldering process may easily stick to the circuit components 1011P. Besides, because the circuit components 1011P and the sensor 102P are connected and provided in a common space, those dusts and pollutants can easily and adversely affect the sensor 102P that can result in undesirable occurrences such as dark spots of the assembled camera module, which increases the defective rate of the camera module.

Secondly, the conventional frame 103P is positioned at the outer side around the circuit components 1011P. Therefore, to mount the frame 103P on the circuit board 101P, a safe distance is required to be reserved between the frame 103P and the circuit components 1011P in both horizontal direction and upward direction, that results in increasing the thickness of the camera module and the difficulty to the thickness reduction of the camera model.

Thirdly, during the COB assembling process, the frame 103P or the motor 105P is adhered on the circuit board 101P with adhesive material, such as glue. During the adhering, an Active Arrangement (AA) technique is usually required to adjust the central axis lines of the sensor 102P and the camera lens 106P being aligned coincidently in both horizontal and vertical directions. Therefore, in order to satisfy the practice of the AA technique, it is required to additionally provide more glue between the frame 103P and the circuit board 101P as well as between the r frame 103P and the motor 105P, so as to reserve adjustment space between each other. Nevertheless, this adjustment space requirement will not only further increase the thickness of the camera module, rendering it substantially being more difficult to reduce the thickness of the camera module, but also cause tilt discrepancy of the assembling more easily during such multiple adhering process. Moreover, it further requires a higher evenness for the lens holder 103P, circuit board 101P and motor 105P.

It is worth mentioning that the frame 103P is usually made through injection molding technique. Due to the limitation in material selection and manufacturing technique, the evenness and flatness of the surface of the frame 103P itself are relatively poor. As a result, the stability, evenness, and flatness of the bonding between the frame 103P and the circuit board 101P are relatively poor. Besides, the evenness and flatness of the installing platform for other components, such as the motor unit 105P and/or camera lens 106P, provided by the frame 3P are also poor. All of these factors will influence the final quality of the camera module and the yield rate of the mass production.

In addition, in the conventional COB technology, the circuit board 101P forms the basic affixing and supporting body for the camera module, so that the circuit board 101P is required to have a predetermined structural strength. This requirement makes the circuit board 101P having a larger thickness, which also increases the thickness of the camera module from another aspect.

Along with the development of all kinds of electronic product and smart device, camera modules are also developed to achieve higher performance and more compact size.

Meanwhile, in order to meet the various requirements of high performance development, including high resolution and high image quality, more and more electronic components are provided in the circuit, the size and surface area of the sensor becomes larger and larger, and the passive components, such as driving resistors and capacitors, are correspondingly increased. As a result, the size of the electronic device becomes larger and larger, the assemble difficulty thereof increases accordingly, and the overall size of the camera module becomes bigger and bigger. In view of the above factors, the conventional assembling method of the lens holder, circuit board, and circuit components becomes a great restriction, to a certain extent, to the development of a lighter and thinner camera module. As the demanding for camera module has dramatically increased nowadays, its mass production has become a must. The ways to improve the product performance and to increase the product yield rate, which allows a technology to be actually put into practical production activity, are both very significant and meaningful for technology researchers and manufacturer of camera module.

There are usually capacitors and plastic parts attached on the encapsulated circuit board of the camera module of a conventional phone. The capacitors and plastic parts are independent, which do not spatially overlap. The plastic parts serve for supporting. Such technical solution mainly has the following issues:

1. The plastic frame is formed alone and then bonded on the circuit board through adhesive. Nonetheless, if the plastic frame is not flat and smooth itself or is assembled with tilt, it will render module tilt. 2. The resistance-capacitance components and the photosensitive sensor all exist in the same space. Because dusts on the resistance-capacitance components cannot be cleaned up easily, it will eventually affect the module and cause dark spots and defectives. 3. The structural strength is weak in circuit board. 4. It is difficult to reduce the product size, especially the lateral dimension thereof. It wastes the dimensions between two camera modules and affects the overall dimensions.

In recent years, the trend of electronic device development is heading toward expecting thinner and lighter devices, which, especially, demand strictly on the height of the camera module since it has serves as a standard layout of an electronic device. In addition, customers demand higher and higher on the image quality of the camera module. Hence, the ways to reduce the size of the camera module and to enhance the image quality of the camera module have become critical technical issues the camera module industry focuses on recently.

Currently, the Molding On Chip (MOC) encapsulation technology applied in the camera module industry has been developed. The MOC encapsulation technology is to encapsulate the photosensitive sensor and circuit together through an encapsulation process of the camera module, so as to maximize the structural strength of the camera module, minimize the size of the camera module, and reduce the defectives rendered by dusts and etc. Specifically speaking, according to a camera module manufacturing process utilizing MOC encapsulation technology, it has to firstly attach a photosensitive sensor on a circuit board and connected the photosensitive sensor and the circuit board through gold wires. Then the circuit board is put into a forming mold with the photosensitive area of the photosensitive sensor facing toward the forming mold. Next, it fills a molding material into the forming mold to form a frame, such that the frame can integrally bond the photosensitive sensor and the circuit board. Although this method is positive in enhancing the structural strength of the camera module and reducing the size of the camera module, such camera module manufacturing process still has several issues.

First, the photosensitivity of the photosensitive sensor can normally be enhanced through microlenses that match each pixel element respectively. Because the microlenses are usually in a micrometer scale, they can be damaged or scratched very easily. Especially, the risk is even higher under high temperature and high pressure. Any microlens of a regular photosensitive sensor being damaged or scratched will inevitably affect the image quality of the camera module. Next, the bonding and attachment of the photosensitive sensor and the circuit board has a tolerance, which will cause gap between the photosensitive sensor and the forming mold as the forming mold is pressed on the non-photosensitive area of the photosensitive sensor. When a molding material is filled into the forming mold, the molding material will flow into the gap between the photosensitive sensor and the forming mold and eventually become burr of the frame formed by the molding material. Because the temperature of the molding material is high, if the molding material flows to the photosensitive area of the photosensitive sensor, it will inevitably damage the microlenses on the photosensitive area of the photosensitive sensor. Moreover, the burr of the frame may also partially obstruct or shade the photosensitive area of the photosensitive sensor and render defective of the product.

The consistency of the photosensitive axis is a critical factor that decides the image quality of the camera module. The consistency of the photosensitive axis mainly refers to coaxiality of the central axis of the photosensitive sensor and the main photosensitive axis of the camera lens. Hence, the Die/Attach (D/A) technique is an important procedure in the manufacturing and assembling method for the camera module.

FIGS. 81A-81C illustrate chip and circuit board of conventional camera through conventional D/A technology. Conventionally, it usually attaches a chip 501P on a circuit board 502P, which is the D/A process. Namely, it applies thermosetting conducting adhesive or insulation paste on the surface of the circuit board 502P according to a specific shape, such as dispensing points, crosses. Then, the chip 501P will be attached on the circuit board 502P. It utilizes the pressing operation in the attaching process to spread out the adhesive and bond the chip 501P. Lastly, it utilizes heating and roasting to dry and solidify the adhesive, so as to affix the chip 501P on the surface of the circuit board 502P.

It can be obviously noted that the circuit board 502P and the chip 501P can be bonded in the adhering process that the glue colloid 503P is painted on the circuit board 502P and the chip 501P thereon is then pressed. Accordingly, it should not have too much glue colloid 503P applied on the circuit board 502P, so as to avoid making excessive glue colloid 503P and having it overflowed from the side edge of the circuit board, which can contaminate the circuit board 502P or the chip 501P. In other words, it is difficult to control both the amount and shape of the glue colloid 503P in this process. It usually applies less glue colloid 503P according to a predetermined shape, so as to ensure that the glue colloid will not overflow from the edge of the chip 501P. Because there is less glue colloid 503P preset on the circuit board 502P, the bonding result turns out that there is an overhanging space 504P created in the fringe area between the chip 501P and the circuit board 502P. Moreover, the overhanging space 504P is usually all around. The presence of the overhanging space 504P is likely to cause the chip 501P tilt, such as the included angle θ° between the chip 501P and the circuit board 502P as illustrated in FIG. 81B. Besides, distribution of the glue colloid 503P after pressing is usually not even, flat, and smooth, which deviation is often around 20 μm. All these conditions affect the consistency of the photosensitive axis of the optical system and the image quality of the camera module. In addition, the bonding stability of the chip 501P and the circuit board 502P in this way is relatively poor. In other words, the chip 501P can easily be separated from the circuit board 502P due to external force, which is not quite reliable.

Further, referring to FIG. 81C, the Molding On Chip (MOC) technique is a recently developed and important chip assembling technique. Its main procedures include attaching the chip 501P on the circuit board 502P, bonding the wire 505P, and molding a molding frame 506P on the circuit board 502P and the chip 501P, so as to moldingly encapsulate the connecting area of the circuit board 502P and the fringe of the chip 501P. When it is moldingly forming the molding frame 506P, the fringe of the chip 501P has to bear the pressing of the mold and there will be an overhanging space 504P occurring between the circuit board 502P and the chip 501P as the conventional D/A technique is utilized. Consequently, such pressing is likely to make the chip 501P tilt or even crack the fringe of the chip 501P due to uneven stress. In order to ensure a better consistency of the photosensitive axis and reliability of the chip, it may require a flat and smooth bonding between the chip and the circuit board as well as a more accurate pressing process of the molding technique. Unfortunately, it still cannot completely solve the problems, such as inconsistency of the photosensitive axis, poor resolution, abnormal image curve, error code of the motor brought by conventional D/A technique for the camera module.

SUMMARY OF THE PRESENT INVENTION

An object of the present invention is to provide a camera module and photosensitive unit thereof and manufacturing method therefor, wherein the photosensitive unit includes an encapsulation portion and a photosensitive portion. The encapsulation portion is encapsulated to form on the photosensitive portion.

An object of the present invention is to provide a camera module and photosensitive unit thereof and manufacturing method therefor, wherein the encapsulation portion is integrally formed on the photosensitive portion, so as to provide a flat and smooth installing surface.

An object of the present invention is to provide a camera module and photosensitive unit thereof and manufacturing method therefor, wherein the photosensitive portion of the photosensitive unit includes a sensor and a main circuit board. The sensor electrically connects to the main circuit board through at least a connecting element and the encapsulation portion of the photosensitive unit wraps up the connecting element to prevent it from being directly exposed to the outside.

An object of the present invention is to provide a camera module and photosensitive unit thereof and manufacturing method therefor, wherein the connecting elements are integrally enclosed, encapsulated and/or wrapped up in the encapsulation portion through a molding manufacturing process.

An object of the present invention is to provide a camera module and photosensitive unit thereof and manufacturing method therefor, wherein the photosensitive unit includes at least one circuit element. The circuit element is enclosed, encapsulated and/or wrapped up in the encapsulation portion, so as to prevent it from being directly exposed to the outside.

An object of the present invention is to provide a camera module and photosensitive unit thereof and manufacturing method therefor, wherein the circuit element is integrally enclosed, encapsulated and/or wrapped up in the encapsulation portion through a molding manufacturing process.

An object of the present invention is to provide a camera module and photosensitive unit thereof and manufacturing method therefor, wherein the sensor of the photosensitive unit has a photosensitive portion and a non-photosensitive portion. The non-photosensitive portion of the sensor is molded by the encapsulation portion to reduce the size of the photosensitive unit and the assembled camera module.

An object of the present invention is to provide a camera module and photosensitive unit thereof and manufacturing method therefor, wherein the main circuit board has at least an inner groove and the sensor of the photosensitive unit is installed in the inner groove, so as to reduce a height of the encapsulation portion as demanded.

An object of the present invention is to provide a camera module and photosensitive unit thereof and manufacturing method therefor, wherein the encapsulation portion includes an enclosure section and an optical filter installation section, wherein the installation section is integrally connected with enclosure section by molding, wherein the installation section is adapted to install an optical filter so that no additional optical filter mounting frame is required.

An object of the present invention is to provide a camera module and photosensitive unit thereof and manufacturing method therefor, wherein the encapsulation portion comprises a camera lens installing section, integrally and upwardly extended thereon, so as to be adapted for installing a camera lens therein.

An object of the present invention is to provide a camera module and photosensitive unit based on molding technique and manufacturing method therefor, wherein the camera lens installing section has a thread structure, so as for mounting a camera lens by screwing.

An object of the present invention is to provide a camera module and photosensitive unit thereof and manufacturing method therefor, wherein the photosensitive unit comprises an optical filter and the optical filter is molded on the sensor of the photosensitive unit so as to protect the sensor through the optical filter, wherein the back focal length of the camera module after assembled is reduced that further reduces the height of the camera module.

An object of the present invention is to provide a camera module and photosensitive unit thereof and manufacturing method therefor, wherein the photosensitive unit comprises a reinforced layer, wherein the reinforced layer is overlappedly attached to a bottom side of the main circuit board so as to enhance a structural strength of the main circuit board, that allows the use of a thinner main circuit board while enhancing the thermal dissipation ability of the main circuit board.

An object of the present invention is to provide a camera module and photosensitive unit thereof and manufacturing method therefor, wherein the main circuit board has at least a reinforced hole therein, wherein the encapsulation portion extends into the reinforced hole so as to enhance the bonding strength between the encapsulation portion and the photosensitive unit and increase the structural strength of the main circuit board.

An object of the present invention is to provide a camera module and photosensitive unit thereof and manufacturing method therefor, wherein the encapsulation portion is adapted for mounting a motor or a camera lens thereon, functioning as a conventional frame that supports the motor or the camera lens in position. Besides, the encapsulation portion is molded to form and provide a better smoothness and evenness that substantially reduces the tilt deviation during the assembling of the camera.

An object of the present invention is to provide a camera module and photosensitive unit thereof and manufacturing method therefor, wherein the camera module is assembled and produced by molding that improves the conventional COB technique of the camera module.

An object of the present invention is to provide a camera module and photosensitive unit thereof and manufacturing method therefor, wherein the photosensitive circuit unit is manufactured by molding, so that an integral and molded photosensitive unit is achieved.

An object of the present invention is to provide a camera module and photosensitive unit thereof and manufacturing method therefor, wherein the photosensitive unit comprises a motor connecting structure for connecting with the motor unit, which alters the conventional means of motor welding.

An object of the present invention is to provide a camera module and photosensitive unit thereof and manufacturing method therefor, wherein the encapsulation portion at least partially integrally encapsulates the main circuit board and the photosensitive sensor, so as to inwardly expand the available area for the encapsulation portion, which can further reduce the size of the camera module.

An object of the present invention is to provide a camera module and photosensitive unit thereof and manufacturing method therefor, wherein the encapsulation portion at least partially integrally encapsulates the main circuit board and the photosensitive sensor, such that the photosensitive sensor can be connected with the main circuit board more stably.

An object of the present invention is to provide a camera module and photosensitive unit thereof and manufacturing method therefor, wherein the encapsulation portion at least partially integrally encapsulates the main circuit board and the photosensitive sensor, so as to enlarge the connecting area between the encapsulation portion and the photosensitive portion and to enhance the stability of the connection of the encapsulation portion.

An object of the present invention is to provide a camera module and photosensitive unit thereof and manufacturing method therefor, wherein the connecting area between the encapsulation portion and the photosensitive portion is enlarged, so as to reinforce the structural strength of the photosensitive portion.

An object of the present invention is to provide a camera module and photosensitive unit thereof and manufacturing method therefor, wherein the photosensitive unit is adapted for being utilized in producing multi-lens and high resolution camera module.

An object of the present invention is to provide a camera module and photosensitive unit thereof and manufacturing method therefor, wherein the encapsulation portion forms an inner side with a controllable gradient, which helps to reduce stray light reflection to the photosensitive sensor, so as to enhance the image quality.

An object of the present invention is to provide a camera module and photosensitive unit thereof and manufacturing method therefor, wherein the camera module is adapted for being utilized in the actual production processes, increasing the product yield rate, and reducing the production cost.

An object of the present invention is to provide a camera module based on integrally encapsulation technology, wherein when the side or bottom of the circuit board was molded, it can reinforce the mechanical strength of the module.

Another object of the present invention is to provide a camera module based on integrally encapsulation technology, wherein when the side of the circuit board was molded, it can enhance the dicing efficiency of the circuit board.

Another object of the present invention is to provide a camera module based on integrally encapsulation technology, wherein when the side of the circuit board was molded, it allows the design of the module to be more flexible.

Another object of the present invention is to provide a camera module based on integrally encapsulation technology, wherein when the bottom of the circuit board was molded, it can reinforce the structural strength of the module.

Another object of the present invention is to provide a camera module based on integrally encapsulation technology, wherein when the side or bottom of the circuit board was molded, it can enhance the heat dissipation efficiency of the module.

Another object of the present invention is to provide a camera module based on integrally encapsulation technology, wherein when the side or bottom of the circuit board was molded, it can enhance the parallelness of the upper surface of the encapsulation portion and the surface of the photosensitive sensor of the module and the flatness and smoothness of the upper surface of the encapsulation portion.

Another object of the present invention is to provide a camera module based on integrally encapsulation technology, wherein when the side or bottom of the circuit board was molded, it can decrease the working procedures and enhance the production efficiency.

Another object of the present invention is to provide a camera module based on integrally encapsulation technology, wherein when the side or bottom of the circuit board was molded, it can reduce the overall size of the module.

Another object of the present invention is to provide a camera module based on integrally encapsulation technology, wherein when the side or bottom of the circuit board was molded, it can provide dusts from entering and affecting the function and performance of the module after the module is formed.

An object of the present invention is to provide a camera module and manufacturing method therefor, wherein the camera module provides a protection frame, arranged on the periphery of the photosensitive area of the photosensitive sensor, such that when the integrally encapsulated frame is being formed, the protection frame can avoid the molding material for forming the integrally encapsulated frame from damaging the photosensitive area of the photosensitive sensor.

An object of the present invention is to provide a camera module and manufacturing method therefor, wherein when the integrally encapsulated frame is being formed, the protection frame can avoid "burr" from occurring on the inner sides of the integrally encapsulated frame.

An object of the present invention is to provide a camera module and manufacturing method therefor, wherein the protection frame is arranged on the periphery of the filter, such that when the integrally encapsulated frame is being formed, the protection frame can avoid "burr" from occurring on the inner sides of the integrally encapsulated frame.

An object of the present invention is to provide a camera module and manufacturing method therefor, wherein the protection frame is protrudingly deployed on the periphery of the photosensitive area of the photosensitive sensor, such that when the forming mold for forming the integrally encapsulated frame exert pressure on the protection frame, the protection frame can avoid the forming mold from directly contacting the photosensitive sensor, so as to prevent the photosensitive area of the photosensitive sensor from being pressed and damaged or scratched.

An object of the present invention is to provide a camera module and manufacturing method therefor, wherein the protection frame has resilience for buffering, such that when the protection frame bears a pressure, it can sufficiently contact the forming mold, so as to serve as a seal to isolate the photosensitive area of the photosensitive sensor from the external environment and to prevent the photosensitive area of the photosensitive sensor from being damaged during the formation of the integrally encapsulated frame.

An object of the present invention is to provide a camera module and manufacturing method therefor, wherein the protection frame has resilience for buffering, such that the requirements of the flatness and smoothness of the camera module can be lowered and the assembling requirements on the mechanisms of the camera module can be lowered.

An object of the present invention is to provide a camera module and manufacturing method therefor, wherein the protection frame formed is overlappedly arranged on the photosensitive sensor, so as to enhance the manufacturing efficiency of the camera module.

An object of the present invention is to provide a camera module and manufacturing method therefor, wherein the surface of the upper mold of the forming mold comprises at least a cover film deployed thereon, such that when the upper mold of the forming mold is pressing, the cover film can provide additional protection to the photosensitive sensor. Moreover, the cover film also helps in the difficulty of demolding and enhances the sealingness and tightness, so as to prevent burr.

An object of the present invention is to provide a camera module and manufacturing method therefor, wherein the forming mold can have a concave structure on the side facing the photosensitive area of the photosensitive sensor, so as to provide a safe distance between the photosensitive area of the photosensitive sensor and the forming mold, which further lowers its impact to the photosensitive sensor.

An object of the present invention is to provide a camera module and manufacturing method therefor, wherein the protection frame is covered by a layer of protective film, so as to deploy the protection frame on the photosensitive sensor. Besides, the protective film may also isolate the photosensitive area of the photosensitive sensor from the external environment.

An object of the present invention is to provide a photosensitive unit and camera module thereof and manufacturing method therefor, wherein the photosensitive unit comprises a photosensitive sensor and a main circuit board, wherein the photosensitive sensor is connected to the main circuit board through a connecting medium, wherein the shapes of the connecting medium and the photosensitive sensor match each other.

An object of the present invention is to provide a photosensitive unit and camera module thereof and manufacturing method therefor, wherein the space between the photosensitive sensor and the main circuit board is completely filled by the connecting medium without leaving any overhanging space, so as to enhance the flatness, evenness, and smoothness of the photosensitive sensor and reduce tilt of the photosensitive sensor relative to the main circuit board.

An object of the present invention is to provide a photosensitive unit and camera module thereof and manufacturing method therefor, wherein the photosensitive sensor has a front side and a back side, wherein when manufacturing the photosensitive sensor, it may spray coat the connecting medium on the back side of the photosensitive sensor and cut off the excess part of the connecting medium, so as to match the shape of the connecting medium and the shape of the photosensitive sensor.

An object of the present invention is to provide a photosensitive unit and camera module thereof and manufacturing method therefor, wherein when manufacturing the photosensitive unit, it applies the connecting medium on the back side of the photosensitive sensor through roll extrusion, wherein excess part of the connecting medium will be cut off, so as to make the connecting medium attached on the back side of the photosensitive sensor in an even and flat manner, such that the flatness, smoothness and evenness of the cementation and connection of the photosensitive sensor and the main circuit board can be ensured.

An object of the present invention is to provide a photosensitive unit and camera module thereof and manufacturing method therefor, wherein the connecting medium comprises a circuit board film, attached on the main circuit board, wherein the shapes of the circuit board film and the photosensitive sensor match each other.

An object of the present invention is to provide a photosensitive unit and camera module thereof and manufacturing method therefor, wherein when manufacturing the photosensitive unit, it may deploy the connecting medium on the back side of a whole chip and then dice the whole chip into a plurality of single photosensitive sensors, wherein the photosensitive sensors are respectively attached on corresponding main circuit boards, which is suitable for mass production, reduces the assembling hours of the photosensitive unit, and enhances the production efficiency in chip attaching.

An object of the present invention is to provide a photosensitive unit and camera module thereof and manufacturing method therefor, wherein the photosensitive unit comprises a molding body, integrally formed on the circuit board and the photosensitive sensor, wherein the photosensitive sensor is flat and smoothly attached on the main circuit board, such that the photosensitive sensor will not tilt during the forming of the molding body, which ensures the consistency of the photosensitive axis of the camera module.

In order to achieve the above objects and other objects and advantages of the present invention, the present invention from an aspect, provides a photosensitive unit of a camera module which includes: an encapsulation portion and a photosensitive portion. The photosensitive portion includes a main circuit board and a photosensitive sensor. The encapsulation portion is encapsulated to form on the main circuit board and the photosensitive sensor.

According to a preferred embodiment of the present invention, the encapsulation portion of the photosensitive unit has a window corresponding to the photosensitive sensor so as to provide the photosensitive sensor a light path thereof.

According to an embodiment of the present invention, the window of the encapsulation portion of the photosensitive unit enlarges its size from a bottom thereof upwardly and gradually, having a smaller bottom size and a larger top size, to form an inclined shape slope side.

According to an embodiment of the present invention, the top of the encapsulation portion of the photosensitive unit is adapted for installing a camera module component selected from the group consisting of a camera lens, a motor unit, and an optical filter of the camera module.

According to an embodiment of the present invention, the top of the encapsulation portion is flat, so as for installing a camera module component selected from the group consisting of a camera lens, a motor unit, and an optical filter of the camera module.

According to an embodiment of the present invention, the encapsulation portion comprises an installing groove arranged on the top thereof, wherein the installing groove is communicated with the window, so as for installing a camera module component selected from the group consisting of an optical filter, a camera lens, and a motor unit of the camera module.

According to an embodiment of the present invention, the encapsulation portion of the photosensitive unit comprises a covering section, an optical filter installing section, and a camera lens installing section. The optical filter installing section and the camera lens installing section are molded to integrally and upwardly extend from the covering section orderly and form an internal step shape structure for respectively installing the optical filters and the camera lens of the camera module. According to an embodiment of the present invention, the camera lens installing section of the photosensitive unit comprises a camera lens inner wall arranged thereon, wherein the camera lens inner wall is flat and smooth, so as for installing a threadless camera lens.

According to an embodiment of the present invention, the camera lens installing section of the photosensitive unit comprises a camera lens inner wall arranged thereon, wherein the camera lens inner wall has a thread structure, so as for installing a camera lens with thread.

According to a preferred embodiment of the present invention, the photosensitive portion of the photosensitive unit comprises at least one connecting element. The connecting element electrically connects the photosensitive sensor with the main circuit board. The encapsulation portion wraps up and encloses the connecting element to avoid the connecting element from being directly exposed to outside.

According to an embodiment of the present invention, the connecting element of the photosensitive unit is selected from the group consisting of gold wire, silver wire, copper wire, and aluminum wire.

According to an embodiment of the present invention, the connecting element of the photosensitive unit curvingly connects the main circuit board and the photosensitive sensor.

According to a preferred embodiment of the present invention, the photosensitive sensor of the photosensitive unit includes a photosensitive area and a non-photosensitive area, wherein the non-photosensitive area is positioned around the periphery of the photosensitive area. The encapsulation portion is molded to extend to the non-photosensitive area of the photosensitive sensor to inwardly expand the molding area to reduce an overall dimension of the encapsulation portion.

According to a preferred embodiment of the present invention, the photosensitive portion in the photosensitive unit comprises at least one circuit element protruded from the main circuit board. The encapsulation portion encapsulates and wraps up the circuit element to prevent the circuit element from being directly exposed to outside.

According to an embodiment of the present invention, the circuit element of the photosensitive unit is selected from the group consisting resistor, capacitor, diode, triode, potentiometer, electric relay, and combinations thereof.

According to a preferred embodiment of the present invention, the photosensitive portion in the photosensitive unit comprises an optical filter covering the photosensitive sensor. The encapsulation portion is encapsulated to form on the main circuit board and surround the photosensitive sensor and the optical filter, so as to protect the photosensitive sensor with the optical filter and reduce a back focal length and a height of the camera module.

According to an embodiment of the present invention, the photosensitive portion comprises a reinforced layer, overlappedly attached to the bottom of the main circuit board, so as to reinforce the structural strength of the main circuit board.

According to an embodiment of the present invention, the reinforced layer is a metal plate, so as to enhance the heat dissipation of the photosensitive portion.

According to an embodiment of the present invention, the photosensitive portion of the photosensitive unit comprises a shielding layer, covering, encapsulating, and wrapping up the main circuit board and the encapsulation portion, so as to enhance the electromagnetic immunity of the photosensitive unit.

According to an embodiment of the present invention, the shielding layer of the photosensitive unit is a metal plate or a metal net.

According to an embodiment of the present invention, the main circuit board of the photosensitive unit has one or more reinforced holes formed thereon, wherein the encapsulation portion is molded to extend into the reinforced holes, so as to enhance the structural strength of the main circuit board.

According to an embodiment of the present invention, the reinforced hole of the photosensitive unit is groove shaped.

According to an embodiment of the present invention, the reinforced hole of the photosensitive unit is a through hole, so as to allow the molding material of the encapsulation portion fully contact the main circuit board and facilitate the manufacturing.

According to an embodiment of the present invention, the material of the main circuit board of the photosensitive unit is selected from the group consisting of rigid-flex circuit board, ceramics base plate, PCB hard board, and flexible printed circuit.

According to an embodiment of the present invention, the material of the encapsulation portion of the photosensitive unit is selected from the group consisting of nylon, LCP, PP, resin, and combinations thereof.

Another aspect of the present invention provides a manufacturing method for a photosensitive unit of a camera module, which include the following step: encapsulating to form an encapsulation portion on a main circuit board and a photosensitive sensor.

According to an embodiment of the present invention, the manufacturing method for the photosensitive unit further includes the following step: attaching the photosensitive sensor on a main circuit board and electrically connecting them through at least a connecting element.

According to an embodiment of the present invention, the manufacturing method for the photosensitive unit further comprises the following step: encapsulating and wrapping up the connecting element through the encapsulation portion.

According to an embodiment of the present invention, the manufacturing method for the photosensitive unit further comprises the following step: extending the encapsulation portion to a non-photosensitive area of the photosensitive sensor.

According to an embodiment of the present invention, the manufacturing method for the photosensitive unit further comprises the following step: forming an installing groove on the top of the encapsulation portion for installing an optical filter, motor unit or camera lens.

According to an embodiment of the present invention, the manufacturing method for the photosensitive unit further comprises the following step: upwardly extending the encapsulation portion and forming a two-step structure therein for installing an optical filter or a camera lens.

According to an embodiment of the present invention, the manufacturing method for the photosensitive unit further comprises the following step: arranged a thread structure on the inner wall of the encapsulation portion for installing a camera lens with thread.

According to an embodiment of the present invention, the manufacturing method for the photosensitive unit comprising the following steps: providing at least a groove shaped reinforced hole on the main circuit board and extending the encapsulation portion into the reinforced hole.

According to an embodiment of the present invention, the manufacturing method for the photosensitive unit comprising the following steps: providing at least a through-hole shaped reinforced hole on the main circuit board and extending the encapsulation portion into the reinforced hole.

According to an embodiment of the present invention, the manufacturing method further comprises the following step: attaching a reinforced layer on the main circuit board, so as to reinforce the structural strength of the main circuit board.

According to an embodiment of the present invention, the manufacturing method for the photosensitive unit further comprises the following step: covering a shielding layer on the encapsulation portion and the main circuit board, so as to reinforce the electromagnetic immunity of the photosensitive unit.

Another aspect of the present invention provides a photosensitive unit of a camera module, which includes an encapsulation portion and a photosensitive portion. The photosensitive portion includes a main circuit board, a photosensitive sensor, and an optical filter. The encapsulation portion is encapsulated to form on the main circuit board, the photosensitive sensor, and the optical filter.

Another aspect of the present invention provides a photosensitive unit of a camera module, wherein the encapsulation portion comprises a camera lens installing groove, communicated with the window, so as to provide an installation site for the motor unit or camera lens of the camera module.

Another aspect of the present invention provides a manufacturing method for a photosensitive unit of a camera module, which include the following step: encapsulating to form an encapsulation portion on a main circuit board, a photosensitive sensor, and an optical filter.

According to an embodiment of the present invention, the manufacturing method for the photosensitive unit further includes the following step: attaching the photosensitive sensor on a main circuit board and electrically connecting them through at least a connecting element.

According to another embodiment of the present invention, the manufacturing method for the photosensitive unit further includes the following step: positioning the optical filter above the photosensitive sensor, so as to protect the photosensitive sensor.

According to another embodiment of the present invention, the manufacturing method for the photosensitive unit further comprises the following step: encapsulating and wrapping up the connecting element and the optical filter through the encapsulation portion.

According to an embodiment of another the present invention, the manufacturing method for the photosensitive unit further comprises the following step: extending the encapsulation portion to an edge of the optical filter.

Another aspect of the present invention provides a camera module, which comprises one of the photosensitive units and a camera lens, wherein the camera lens is arranged along the photosensitive path of the photosensitive sensor of the photosensitive unit.

According to an embodiment of the present invention, the camera module further includes a frame, wherein the frame is mounted on the photosensitive unit, wherein the camera lens is mounted on the frame.

According to an embodiment of the present invention, the camera module further includes a motor unit, wherein the camera lens is mounted in the motor unit, wherein the motor unit is mounted on the photosensitive unit.

According to an embodiment of the present invention, the camera module further includes an optical filter, wherein the optical filter is mounted on the photosensitive unit.

According to an embodiment of the present invention, the camera module further includes an optical filter, wherein the optical filter is mounted on the frame.

Still further objects and advantages will become apparent from a consideration of the ensuing description and drawings.

These and other objectives, features, and advantages of the present invention will become apparent from the following detailed description, the accompanying drawings, and the appended claims.

BRIEF DESCRIPTION OF THE DRAWINGS

FIG. 4 is a manufacturing process diagram of a photosensitive unit according to the above first preferred embodiment of the present invention.

FIG. 5 is a block diagram of a manufacturing method for a photosensitive unit according to the above first preferred embodiment of the present invention.

FIGS. 36A and 36B are sectional views illustrating beneficial effect comparison of the camera module according to the above preferred embodiments of the present invention.

FIG. 90 is a sectional view of a photosensitive unit according to another preferred embodiment of the present invention.

FIG. 91 is a sectional view of a camera module utilizing the photosensitive unit according to another preferred embodiment of the present invention.

DETAILED DESCRIPTION OF THE PREFERRED EMBODIMENT

Figure 1:
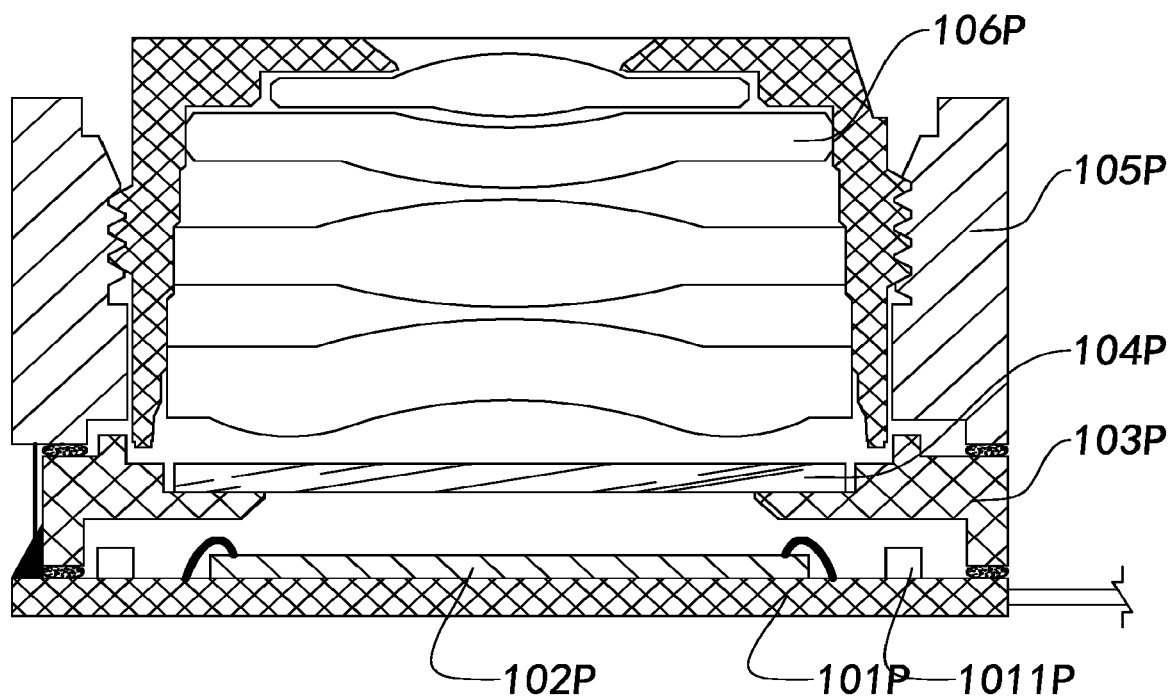
FIG. 1 is a sectional view illustrates the conventional COB technique of camera module.
Figure 2:
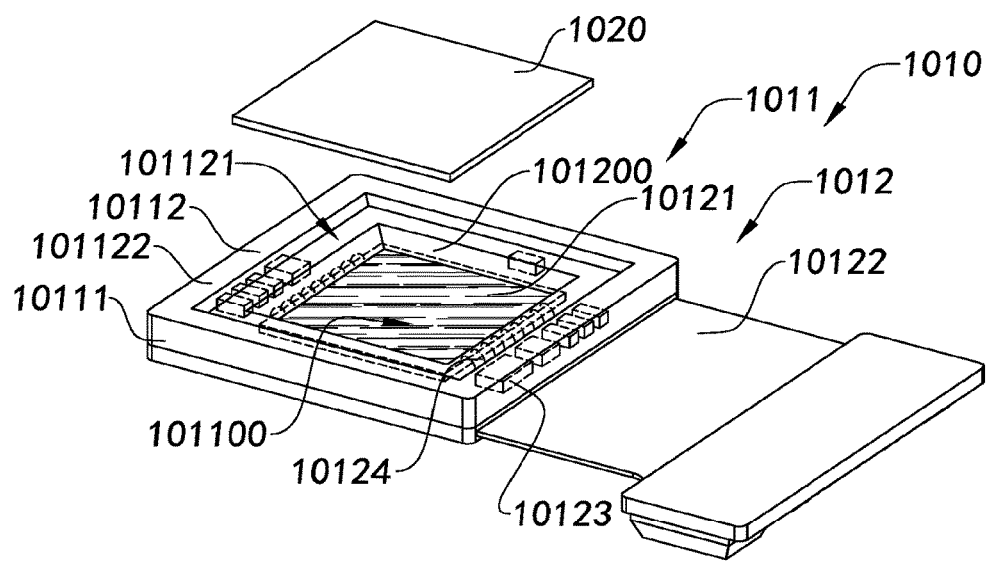
FIG. 2 is a perspective view of a photosensitive unit according to a first preferred embodiment of the present invention.
Figure 3:
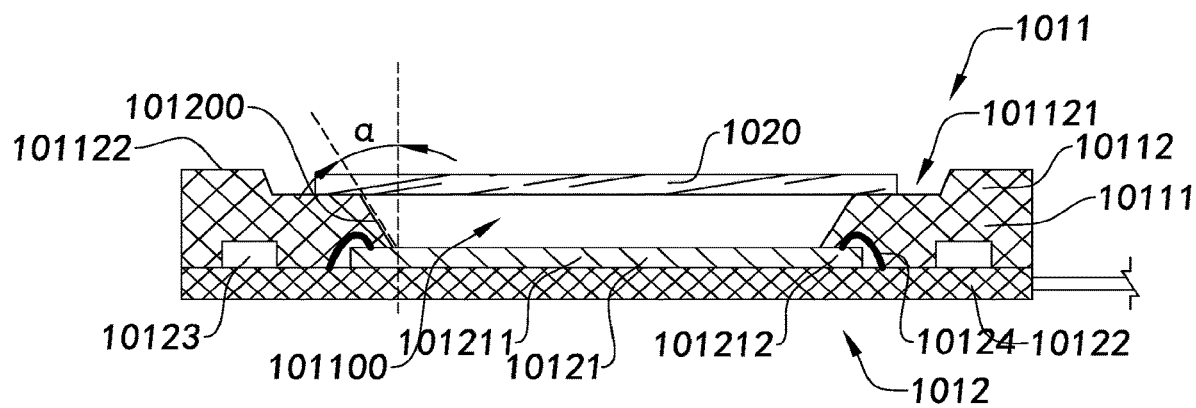
FIG. 3 is a sectional view of a photosensitive unit according to the above first preferred embodiment of the present invention.
Figure 6:
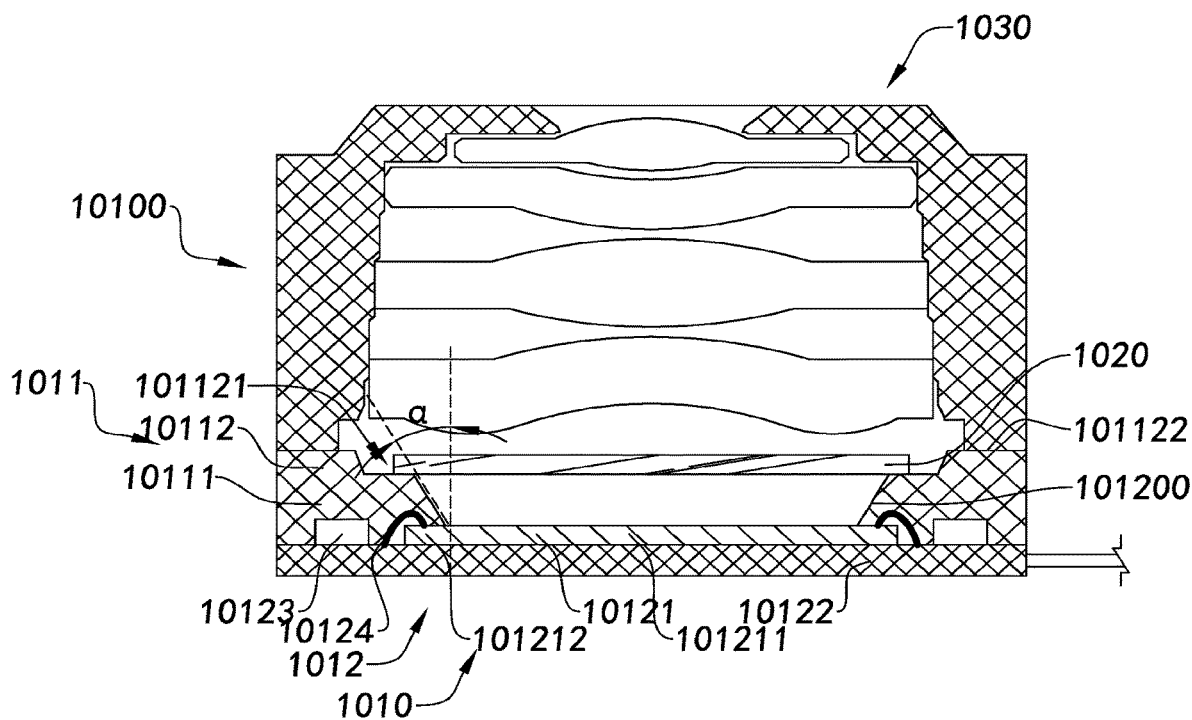
FIG. 6 is a sectional view of the camera module according to the above first preferred embodiment of the present invention.
Figure 7:
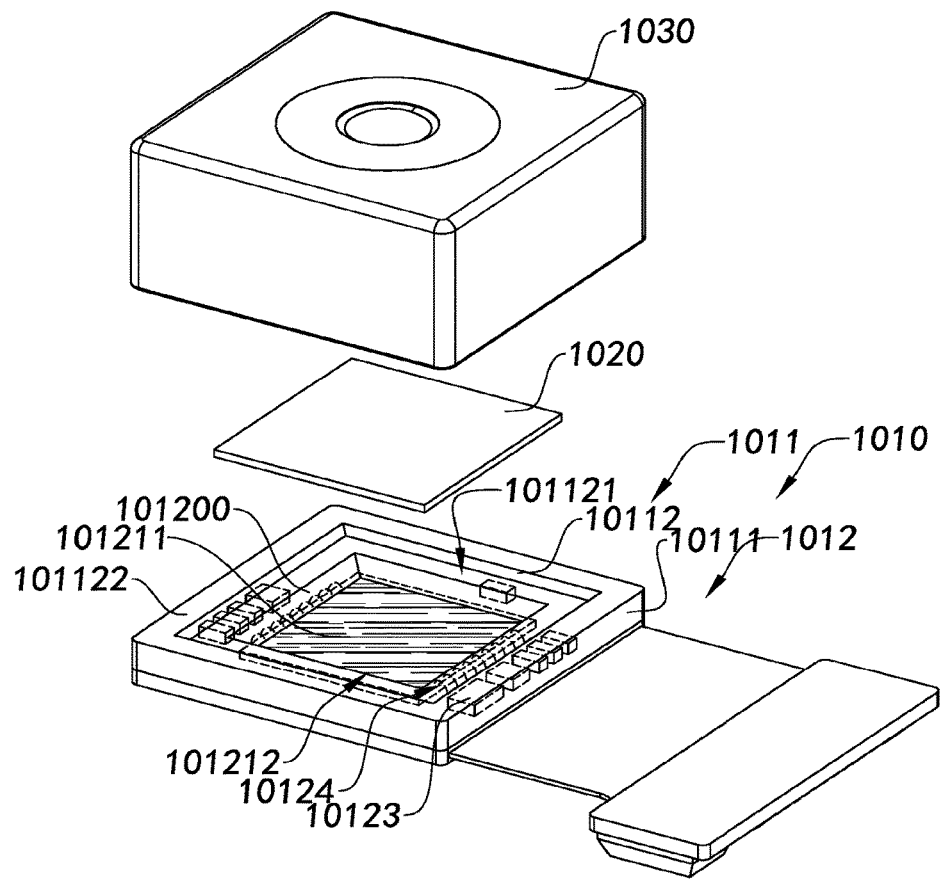
FIG. 7 is an exploded perspective view of the camera module according to the above first preferred embodiment of the present invention.
Figure 8:
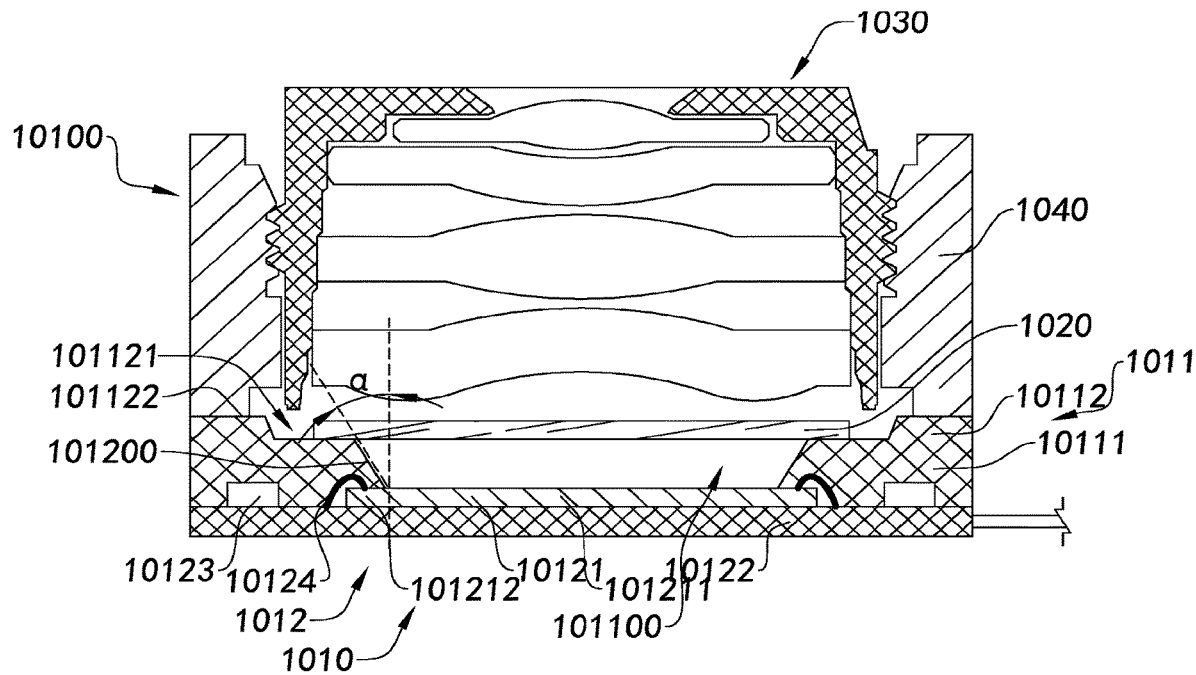
FIG. 8 is a sectional view of the camera module according to a first alternative mode of the above first preferred embodiment of the present invention.
Figure 9:
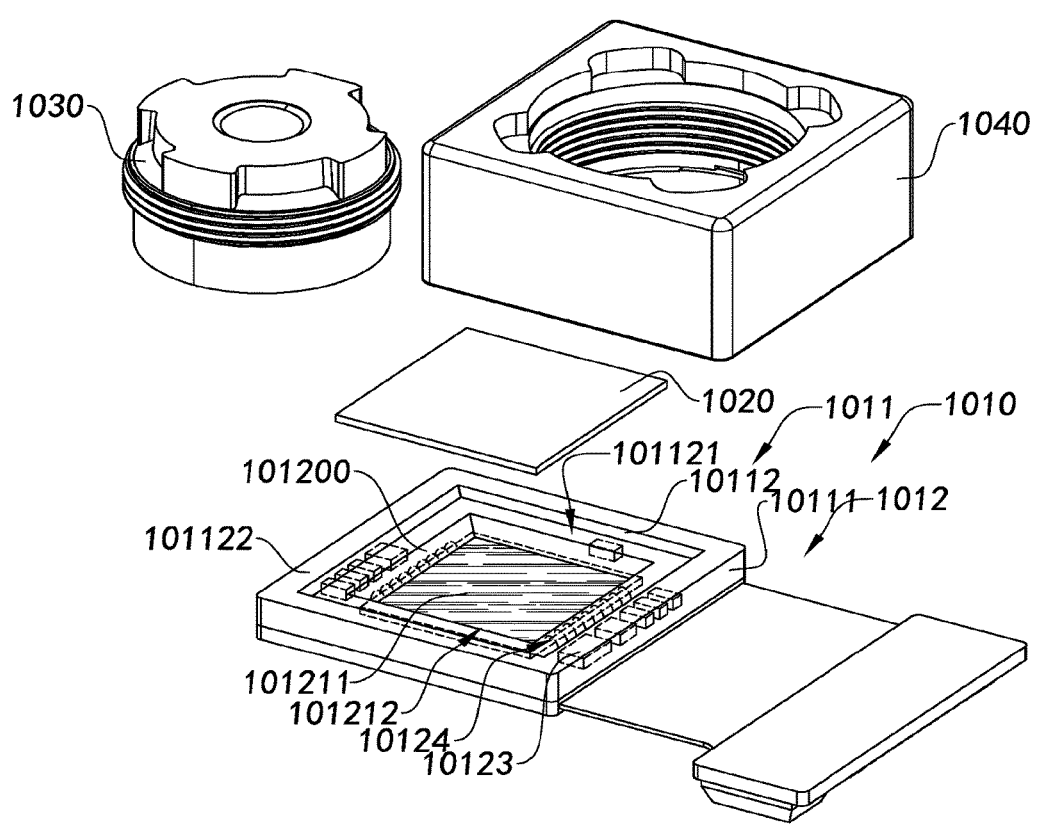
FIG. 9 is an exploded perspective view of the camera module according to the above alternative mode of the first preferred embodiment of the present invention.

The following is disclosed in order that those skilled in the art can implement the present invention. Preferred embodiments in the following descriptions are to give examples only. Those skilled in the art can think of other obvious modifications. The basic notions of the present invention defined in the following descriptions can apply to other implementations, modifications, improvements, equivalences, and other technical solutions that do not deviate from the scope or spirit of the present invention.

Those skilled in the art should understand that in the disclosure of the present invention, terms such as "longitudinal," "lateral," "upper," "lower," "front," "back," "left," "right," "perpendicular," "horizontal," "top," "bottom," "inner," "outer," etc., which indicate directions or positional relations are based on the directions or positional relations demonstrated in the figures and only to better describe the present invention and simplify the description, rather than to indicate or imply that the indicated device or element must be applied to a specific direction or be operated or constructed in a specific direction. Therefore, these terms shall not be considered limits of the present invention.

Referring to FIGS. 2 to 7, a camera module and its photosensitive unit are illustrated according to a first preferred embodiment of the present invention. The photosensitive unit 1010, which is constructed and configured for assembling and producing the camera module, includes an encapsulation portion 1011 and a photosensitive portion 1012, wherein the encapsulation portion 1011 is integrally encapsulated and connected to the photosensitive portion 1012, such as being molded to connect to the photosensitive portion 1012.

The photosensitive portion 1012 includes a main circuit board 10122 and a photosensitive sensor 10121, wherein the photosensitive sensor 10121 is disposed on the main circuit board 10122. According to the present embodiment of the present invention, the photosensitive sensor 10121 is molded to connect to the main circuit board 10122. Especially, the encapsulation portion 1011 is moldingly coupled to the photosensitive portion 1012 by means of, for example, the method of Molding on Chip (MOC).

In other words, the encapsulation portion 1011, at least partially, integrally encapsulates the main circuit board 10122 and the photosensitive sensor 10121.

According to the present embodiment of the present invention, the photosensitive portion 1012 includes a connecting circuit and at least a circuit element 10123. The connecting circuit is prearranged in the main circuit board 10122 and the circuit element 10123 is electrically connected to the connecting circuit and the photosensitive sensor 10121 to process the photosensing function for the photosensitive sensor 10121. The circuit element 10123 is protrudedly deployed on the main circuit board 10122. The circuit element 10123 can be, for example but not limited to, resistors, capacitors, diodes, triodes, potentiometers, electric relays, or actuators.

It is worth mentioning that the encapsulation portion 1011 encapsulates and wraps up the circuit element 10123 therein, so that the circuit element 10123 will not be directly exposed in any space, and more specifically, not be exposed in the environment that communicates with the photosensitive sensor 10121. Therefore, during the assembling of the camera module, the circuit element 10123 will not be contaminated with contaminants, such as dusts, and influence the photosensitive sensor 10121, that is different from the arrangement of conventional camera module that the circuit components, such as resistance-capacitance components, are exposed to outside. So that by means of such molding encapsulation, sundries and dusts are prevented from staying on the surface of the circuit element 10123 to avoid the photosensitive sensor 10121 from being contaminated thereby that would result in dark spots and other defectives of the camera module.

The manner that has the encapsulation portion 1011 be integrally formed on the main circuit board 10122 and the photosensitive sensor 10121 is advantageous in several aspects, for example but not limited to the follows.

First, by integrally forming the encapsulation portion 1011 on the main circuit board 10122 and the photosensitive sensor 10121, the traditional technique like adhering the frame 3P on the circuit board 1P in conventional OCB module will no longer be required, such that it not only saves the gluing space, but also skips the AA adjustment of the encapsulation portion 1011.

Second, when the encapsulation portion 1011 is integrally molded to form on the main circuit board 10122 and the photosensitive sensor 10121, it improves the evenness and flatness of the surface of the encapsulation portion 1011, such that the evenness and flatness of the encapsulation portion 1011 becomes better than it of a frame 3P made through conventional injection molding technique.

Third, when the encapsulation portion 1011 is integrally molded to form on the main circuit board 10122 and the photosensitive sensor 10121, it expands the area available for forming or arranging the encapsulation portion 1011 inward, so as to allow the overall dimensions of the camera module to be compressed inward, which provides a potential extent to further reduce the size of the camera module.

Fourth, when the encapsulation portion 1011 is integrally molded to form on the main circuit board 10122 and the photosensitive sensor 10121, the photosensitive sensor 10121 is affixed on the main circuit board 10122 more stably due to the reinforcement of the encapsulation portion 1011, which prolongs the service life of the camera module.

Fifth, when the encapsulation portion 1011 is integrally molded to form on the main circuit board 10122 and the photosensitive sensor 10121, it enlarges the overall connecting area of the encapsulation portion 1011 and the photosensitive portion 1012, which enhances the stability of the connection of the encapsulation portion 1011.

Sixth, when the encapsulation portion 1011 is integrally molded to form on the main circuit board 10122 and the photosensitive sensor 10121, it enlarges the interconnecting area between the encapsulation portion 1011 and the photosensitive portion 1012, which enhances the structural strength of the photosensitive portion 1012 through the encapsulation portion 1011.

Seventh, when the encapsulation portion 1011 is integrally molded to form on the main circuit board 10122 and the photosensitive sensor 10121, it allows the photosensitive unit 1010 to be utilized in the production of multi-lens and high resolution camera modules, such that the molding encapsulation technology can be utilized in actual production and be suitable for the development needs of the components of current camera module.

Eighth, the way the encapsulation portion 1011 being integrally molded to form on the main circuit board 10122 allows the height and width of the encapsulation portion 1011 to be flexibly adjusted and controlled, such that the back focal length of the camera module can be flexibly adjusted and controlled and module of various sizes can be made, so as to be adapted for different types of camera module.

Ninth, when the encapsulation portion 1011 is integrally molded to form on the main circuit board 10122, it does not require connecting medium like glue to be closely connected on the main circuit board and it can reinforce the structural strength of the main circuit board 10122, so as to allow the thickness of the main circuit board 10122 to further be reduced.

It is also worth mentioning that the camera module as a small-sized product is composed by small components, so any small difference can eventually bring a relatively large influence to the camera module. Because of such variation, even a small change in a macro view is critical to the actual production of the camera module, which may even decide if a concept can actually be implemented in the production process.

It is also worth mentioning that the camera module as a whole is composed by various components, such as photosensitive sensor, camera lens, motor unit, and etc., which components are adapted to each other. In other words, the developments of different components are not independent, but interrelated. For instance, the pixel increase has to do with not only the photosensitive sensor, but also the camera lens, while the camera lens has installation requirements, which has to do with the supporting elements. In the development of the actual production of the camera module, the requirements to the frame are relatively low and the influences of the evenness and flatness thereof, the exposure of the circuit components, and the size of the circuit components to the whole camera module are not major concerns because the performance of early photosensitive sensor is low and there were only few lenses, like one or two, in a camera lens. The most important qualities were about the basic hardware, such as the performance improvements on the photosensitive sensor and the camera lens. Nevertheless, for the camera module of today, especially the camera module for the rapid developing smartphone, demands in all aspects, such as pixel, size, accuracy, and etc., are continuously promoted. Quantity of the lens, for example, has increased from 4, to 5, 6, 7, and more pieces. Such demands have required the development of the camera module to be more meticulous. For instance, it could be dispensable for a camera module constructed with a camera lens having one lens or two to utilize the way of the present invention that have the encapsulation portion 1011 integrally encapsulate the main circuit board 10122 and the photosensitive sensor 10121. The improvement of the present invention would not bring advantage to such simple camera module. On the other hand, for those camera module constructed with a camera lens having multiple lenses, the improvement of the present invention would show significant advantages and would be very suitable for its development and actual production process. Besides, another critical factor of an actual production is product yield rate, which, namely, is the stability of the overall performance of the mass produced products. Therefore, since the camera module of the embodiment of the present invention has a significant better product yield rate than the camera module of conventional structure, the camera module of the present invention is advantageous even for camera modules of the same size because it is suitable for mass production, lower in the production cost, and suitable for the development of the entire camera module industry. Of course, there are other advantages of the way that the encapsulation portion 1011 integrally encapsulates the main circuit board 10122 and the photosensitive sensor 10121, which, nevertheless, are not completely specified here.

It is worth mentioning that, in the present embodiment of the present invention, the circuit element 10123 is recited as protruded on the main circuit board 10122 as an example for the description, whereas in other embodiments of the present invention, the circuit element 10123 can also be embedded in the main circuit board 10122 without protruding from the main circuit board 10122 or be attached on the back side of the main circuit board 10122. Person skilled in the art should understand that the shape, type, and mounting position of the circuit element 10123 should not limit the present invention.

The encapsulation portion 1011 has a through hole window 101100 formed therein to provide a photosensitive path for the photosensitive sensor 10121.

In other words, the encapsulation portion 1011 provides a window, so as to serve as an light path for the photosensitive sensor 10121, such that light passed through the camera lens 1030 (being introduced later) positioned on the top of the encapsulation portion 1011 can reach the photosensitive sensor 10121 without being obstructed by the encapsulation portion 1011.

According to the present preferred embodiment of the present invention, the photosensitive portion 1012 includes at least one connecting element 10124 for electrically connecting the photosensitive sensor 10121 with the main circuit board 10122. Further, the connecting element (lead wire) 10124 can be embodied to be, for example but not limited to, gold wire, copper wire, aluminum wire, and/or silver wire. Especially, the connecting elements 10124 curvingly connect the photosensitive sensor 10121 and the main circuit board 10122.

It is worth mentioning that the connecting element 10124 is molded inside the encapsulation portion 1011, so as to enclose, encapsulate and/or wrap up the connecting element 10124 by the encapsulation portion 1011 to keep them from direct exposure to outside. Therefore, during the assembling of the camera module, the connecting element(s) 10124 will not receive any collision and damage, and, at the same time, it reduces the adverse effect of the connecting element(s) 10124 due to the environmental factors, such as temperature, so as to ensure a stable communication and connection between the photosensitive sensor 10121 and the main circuit board 10122. This is completely different from the conventional art.

Preferably, the window 101100 of the encapsulation portion 1011 enlarges its size from a bottom thereof upwardly and gradually, having a smaller bottom size and a larger top size, to form an inclined shape slope side. Nonetheless, such inclined shape shall not be considered as a limitation to the present invention.

The encapsulation portion 1011 has an inner side 101200. The inner side 101200 surrounds to form the window 101100. The inner side 101200 is arranged in a inclined and slope manner, such that the window 101100 enlarges its size from a bottom thereof upwardly and gradually, having a smaller bottom size and a larger top size, to form an inclined shape slope side. Specifically, the inner side 101200 has a tilt angle α, which is the included angle between the tilt direction of the inner side 101200 and the vertical direction.

It is worth mentioning that the encapsulation portion 1011 is integrally formed through a forming mold (being introduced later). After the encapsulation portion 1011 is formed, the forming mold has to be separated from the photosensitive unit 1010, which is demolding. Due to the interactive forces, such as pressing force, friction force, and etc., between the forming mold and the encapsulation portion 1011, the forming mold can be hard to be demolded, the shape of the encapsulation portion 1011 will affected, and there can be burr or even more serious issue. These problems seriously bother the actual production and lower the product yield rate thereof. On the other hand, according to the present invention, the encapsulation portion 1011 is arranged in a inclined and slope manner, such that it only has to make a certain shift of the forming mold relatively to the encapsulation portion 1011, a gap will be created between the encapsulation portion 1011 and the forming mold, which reduces the influence of the forming mold to the encapsulation portion 1011 and allows the camera module to actually be mass produced. It is worth noticing that these relatively small improvements come out from long time testing. Moreover, these tiny improvements are usually determinants that decide whether a theoretically workable solution can actually put into production.

The magnitude of the tilt angle α can be designed based on the actual needs.

The arrangement of the inner side 101200 of the encapsulation portion 1011 and the tilt structure of the inner side 101200 are advantageous in several aspects, for example but not limited to the follows. First, the tilt arrangement of the inner side 101200 helps the demolding process in actual production, which reduces burr of the encapsulation portion 1011 and is practical for the actual production. Second, because the arrangement of the inner side 101200 enlarges the direct contact area to the air in the closed interior space of the camera lens and because of the characteristic of the integrally forming material of the encapsulation portion 1011, dust particles in the interior space becomes more likely to stay on the inner side 101200 of the encapsulation portion 1011, which, namely, helps to capture the dust particle. Third, the tilt arrangement of the inner side 101200 changes the reflection angle of the entering light on the inner side 101200, which reduces stray light reflected to the photosensitive area of the photosensitive sensor 10121 and reduces the influence of the stray light to the image quality. Fourth, the tilt arrangement of the inner side 101200 enlarges the upper opening of the encapsulation portion 1011, which allows more light to enter.

According to the present invention, the camera module and photosensitive unit and manufacturing method thereof are disclosed, wherein the camera module is adapted for being utilized in the actual production processes, increasing the product yield rate, and decreasing the production cost.

It is worth mentioning that the encapsulation portion 1011 substantially covers and encloses, encapsulates and/or wraps up the circuit element 10123 and the connecting element 10124 that advantages in protecting the circuit element 10123 and the connecting element 10124 as well as in achieving a higher performance camera module. However, those skilled in the art should understand that the encapsulation portion 1011 shall not be limited in wrapping up the circuit element 10123 and/or the connecting element 10124. In other words, in other embodiments of the present invention, the encapsulation portion 1011 can be directly molded on the main circuit board 10122 without circuit element 10123 protruded thereon or be molded on various positions, such as the outer side portion and the periphery, of the circuit element 10123.

In addition, the photosensitive sensor 10121 has a photosensitive area 101211 and a non-photosensitive area 101212, wherein the non-photosensitive area 101212 is positioned around the periphery of the photosensitive area 101211. The photosensitive area 101211 is adapted for conducting photosensitive function and process. The connecting element 10124 is connected to the non-photosensitive area 101212.

According to the present preferred embodiment of the present invention, the encapsulation portion 1011 is extended to the non-photosensitive area 101212 of the photosensitive sensor 10121, so as to overlappedly affix the photosensitive sensor 10121 on the main circuit board 10122 by means of molding. In this manner, such as the method of Molding on Chip (MOC), the molding area of the encapsulation portion 1011 can be extended inwardly, so that the outer structural portions of the encapsulation portion 1011 and the main circuit board 10122 can be reduced, which further reduces the size in length and width of the photosensitive unit 1010 as well as the size in length and width of the camera module assembled thereby.

In the present embodiment of the present invention, the encapsulation portion 1011 is protrudingly positioned surrounding the outer portion of the photosensitive area 101211 of the photosensitive sensor 10121. Particularly, the encapsulation portion 1011 integrally seals its connection, so as to provide a great sealingness and tightness. Therefore, when the photosensitive unit 1010 is used to assemble the camera module, the photosensitive sensor 10121 will be sealed inside the camera module to forms a sealed inner space.

Practically, to produce the photosensitive unit 1010, a conventional circuit board can be used to produce the main circuit board 10122, wherein a photosensitive sensor 10121 is provided on the main circuit board 10122 and electrically connected by the connecting elements 10124. And then, the assembled main circuit board 10122 with photosensitive sensor 10121 affixed thereon are molded by means of, for example, the compression molding technique that is commonly applied in semiconductor packaging industry, to form the encapsulation portion 1011. Alternatively, the main circuit board 10122 can be molded by means of insert molding technique by an injection molding machine to mold the main circuit board 10122 which has been processed by a surface mount technology (SMT) to form the encapsulation portion 1011. The main circuit board 10122 can selectively be, for example but not limited to, rigid-flex circuit board, ceramic substrate circuit board (without flexible board), rigid PCB (without flexible board), and etc. The formation of the encapsulation portion 1011 can be selected by, for example but not limited to, injection molding technique and pressing molding technique. The material of the encapsulation portion 1011 can be, for example but not limited to, nylon, liquid crystal polymer (LCP), or polypropylene (PP) for injection molding technique, or thermoplastic resin or thermosetting resin for pressing molding technique. Person skilled in the art should understand that the above available manufacture methods and available materials are examples to describe available implementations of the present invention, rather than limitations of the present invention.

It is worth mentioning that according to the molding formation method of the photosensitive unit 1010 of the present invention, the molded photosensitive unit 1010 is suitable for making in form of combined board that can produce photosensitive units 1010 as many as 90 pieces, for example, at the same time, while conventional injected encapsulation portion, that is, the lens holder, requires a prior gluing process and usually allow only piece to be attached at a time, which can merely allow 4-8 pieces in most cases or up to 32 pieces the most to be produced at one time.

The manner that has the encapsulation portion 1011 cover and enclose, encapsulate and/or wrap up the circuit element 10123 and the connecting element 10124 is advantageous in several aspects, for example but not limited to the follows.

First, when the encapsulation portion 1011 covers and encloses, encapsulates and/or wraps up the circuit element 10123 and the connecting element 10124, it does not have to reserve extra safety margin for the circuit element 10123 and the connecting element 10124, which provides potential for size reduction of the camera module.

Second, when the encapsulation portion 1011 covers and encloses, encapsulates and/or wraps up the circuit element 10123 and the connecting element 10124, it helps the circuit element 10123 and the connecting element 10124 to be stably secured internally, which can avoid unnecessary influences, such as collision, during the assembling and lower the effects, such as shaking, occurring in use to the camera module.

Third, when the encapsulation portion 1011 covers and encloses, encapsulates and/or wraps up the circuit element 10123 and the connecting element 10124, it isolates the circuit element 10123, the connecting element 10124 and other components, which reduces the external and reciprocal electromagnetism influences and helps them to function more stably.

Fourth, when the encapsulation portion 1011 covers and encloses, encapsulates and/or wraps up the circuit element 10123 and the connecting element 10124, it avoids the circuit element 10123 and the connecting element 10124 from directly exposed to the closed interior space of the camera lens, so as to not only prevent sundries and dusts on the circuit element 10123 and the connecting element 10124 from entering the interior space and affecting the image quality, but also avoid the circuit element 10123 and the connecting element 10124 from reflecting stray light to the photosensitive sensor 10121 and affecting the image quality.

Fifth, when the encapsulation portion 1011 covers and encloses, encapsulates and/or wraps up the connecting wire, it allows the integral forming area of the encapsulation portion 1011 to expand inward to the non-photosensitive area of the photosensitive sensor 10121.

Furthermore, the encapsulation portion 1011 includes a covering section 10111 and an optical filter installing section 10112. The optical filter installing section 10112 is integrally molded to connect with the covering section 10111. The covering section 10111 is molded to mount on the main circuit board 10122 to encapsulate, wrap up and/or enclose the circuit element(s) 10123 and the connecting element(s) 10124. The optical filter installing section 10112 is configured for installing the optical filter 1020. In other words, when the photosensitive unit 1010 is used for assembling the camera module, the optical filter 1020 of the camera module is mounted at the optical filter installing section 10112 to ensure the optical filter 1020 be deployed along a photosensitive path of the photosensitive sensor 10121 and does not require any additional mounting frame for installing the optical filter. In other words, the encapsulation portion 1011 itself also provides the function as a conventional mounting frame and, in addition, according to the advantage of molding technique, the top of the optical filter installing section 10112 would have good evenness and smoothness due to the molding technique, so as to allow the optical filter 1020 to be installed in an even and flat manner that is more superior to the conventional camera modules. Particularly, the optical filter 1020 can be an Infrared-Cut Filter (IRCF).

In addition, the optical filter installing section 10112 has an installing groove 101121. The installing groove 101211 is communicated with the window 101100 to provide an adequate installation space for the optical filter 1020 such that the optical filter 1020 will not protrude from the top surface 101122 of the optical filter installing section 10112. In other words, the installing groove 101121 is provided on top of the encapsulation portion 1011 for the optical filter 1020 to be installed therein.

It is worth mentioning that, in the present embodiment of the present invention, the installing groove 101121 can be used for the installation of the optical filter, whereas in other embodiments of the present invention, the installing groove 101121 can be used for the installation of other component, such as the camera lens, motor of the camera module, or etc. Person skilled in the art should understand that the use of the installing groove 101121 shall not consider as a limitation of the present invention.

It is worth mentioning that the inner wall of the encapsulation portion 1011 is designed according to the shape of the connecting element 10124 to be mounted thereon. For example, it can be in sloped or inclined shape, so that while it encapsulates and wraps up the connecting element(s) 10124, the photosensitive sensor 10121 is capable of receiving as much light as possible. Person skilled in the art should understand that a specific shape of the encapsulation portion 1011 will not limit the scope of the present invention.

Referring to FIGS. 2-7, the camera module according to a first preferred embodiment of the present invention is illustrated. The camera module can be a fixed focus module (FFM). The camera module 10100 includes one the photosensitive unit 1010, one the optical filter 1020, and a camera lens 1030.

The optical filter 1020 and the camera lens 1030 are mounted at the photosensitive unit 1010.

More specifically, the optical filter 1020 is mounted in the installing groove 101121 of the optical filter installing section 10112 of the encapsulation portion 1011 of the photosensitive unit 1010. The camera lens 1030 is mounted at a top portion of the optical filter installing section 10112 of the encapsulation portion 1011 of the photosensitive unit 1010. In other words, the optical filter 1020 is mounted in the installing groove, while the camera lens 1030 is mounted on top of the encapsulation portion 1011.

It is also worth mentioning that the camera lens 1030 is supported on top of the optical filter installing section 10112 of the encapsulation portion 1011 of the photosensitive unit 1010. Therefore, the encapsulation portion 1011 functions as the frame of a conventional camera module to provide a supportive and holding site for the camera lens 1030, but it is assembled by a different process from the process of the conventional COB technology. The conventional frame of a conventional camera module assembled based on the conventional COB technique is glued to affix on the circuit board by adhesive, but the encapsulation portion 1011 is molded to encapsulate and wrap up the main circuit board 10122 by means of the molding technique without the requirement of any adhering and affixing process. With respect to the process of adhering and affixing, the molding process provides better connection stability and controllability thereof. Besides, it does not have to reserve adhering space for AA adjustment between the encapsulation portion 1011 and the main circuit board 10122 according to the present invention, and thus it saves the adhering space for AA adjustment of the conventional camera module. Accordingly, under the same achievement in structural strength with respect to the conventional camera module, the molded main circuit board 10122 according to the molding technology of the present invention has a thinner thickness. The thickness of the molded main circuit 122 can be further reduced when the optical filter quilt 20 is directly attached on the molded surface that enables a shorter back focal length of the camera lens 30, so as to further reduce the thickness of the camera module. On the other hand, the encapsulation and enclosure of the circuit elements 10123 and the connecting elements 10124 by the encapsulation portion 1011 allows the supporting feature of conventional frame being provided overlappedly with the circuit elements 10123 and the connecting element 10124 spatially to save space, without the need of the conventional camera module that requires to reserve a safe distance around the circuit components. As a result, the height of the encapsulation portion 1011 can be configured in a smaller range while providing its supporting function and feature, so as to provide a room of further reduction of the thickness of the camera module. Besides, the encapsulation portion 1011 substitutes the conventional frame that prevents any tilt deviation occurred in adhering and assembling such conventional frame that reduces the accumulated tolerance of the assembly of the camera module. In addition, the encapsulation and wrapping up of the connecting element(s) 10124 by the encapsulation portion 1011 and the inner extension of the encapsulation portion 1011 towards the non-photosensitive area 101212 of the photosensitive sensor 10121 enables the size of the encapsulation portion 1011 can be shrunk inwardly, so as to further decrease the lateral sizes in length and width of the camera module.

Referring to FIGS. 2, 5, 8, and 9, an alternative mode of the camera module 10100 according to the above first preferred embodiment of the present invention is illustrated. The camera module 10100 can be an Automatic Focus Camera Module (AFM). The camera module includes one the photosensitive unit 1010, one the optical filter 1020, one motor unit 1030, and a camera lens 1030.

The optical filter 1020 is mounted in the photosensitive unit 1010, while the camera lens 1030 is mounted in the motor unit 1040. The motor unit 1040 is mounted on the photosensitive unit 1010.

Furthermore, the optical filter 1020 is mounted in the installing groove 101121 of the optical filter installing section 10112 of the encapsulation portion 1011 of the photosensitive unit 1010. The motor unit 40 is mounted on top of the optical filter installing section 10112 of the encapsulation portion 1011 of the photosensitive unit 1010. In other words, the optical filter 1020 is mounted in the installing groove of the encapsulation portion 1011, while the camera lens 1030 is installed in the motor unit 1040. The motor unit 1040 is mounted on top of the encapsulation portion 1011.

Especially, when the motor terminal is affixed on the circuit junction by attaching with conducting adhesive, it does not require to solder any lead wire for connecting the motor unit 1040 with the main circuit board 10122 of the photosensitive portion 1012, and thus it reduces the motor soldering process.

The motor unit 1040 is mounted on the encapsulation portion 1011. In other words, the motor unit 1040 is supported on the top of the encapsulation portion 1011. Because the encapsulation portion 1011 is integrally formed on the main circuit board 10122 by the mold, it can provide a flat and smooth installing plane, which is, namely, the flat and smooth top surface 101122, for the motor unit 1040, which facilitates the AA adjustment to the motor unit 1040 during the camera module assembling, so as to ensure the consistency of the photosensitive axis of the camera module.

Those skilled in the art should understand that the structures and forms of the camera module mentioned above are just examples to describe ways of implementing the camera module, rather than limitations of the present invention.

Figure 10A:
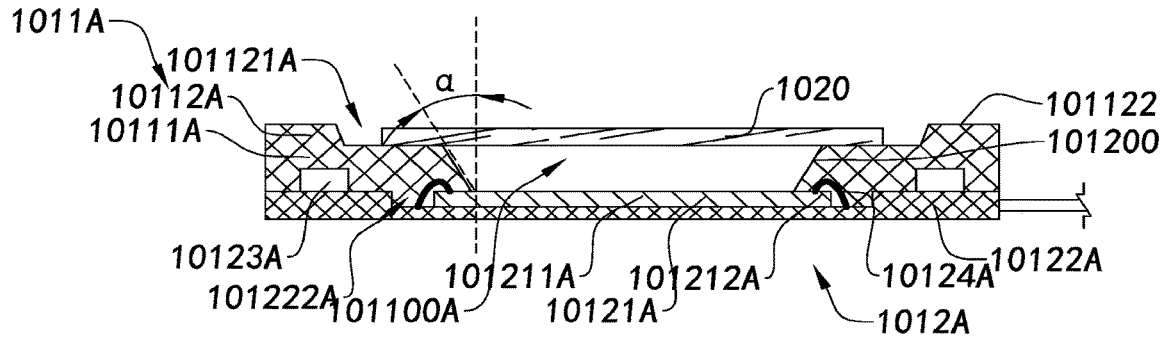
FIG. 10A is a sectional view of a photosensitive unit according to a second preferred embodiment of the present invention.
Figure 11:
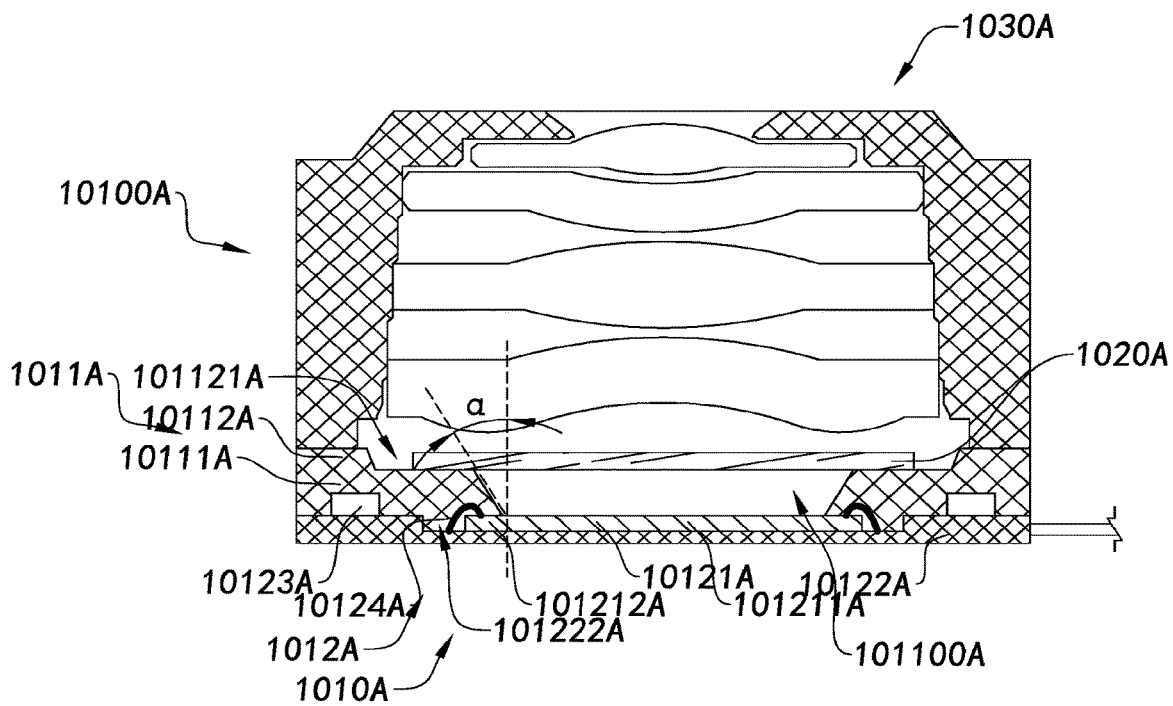
FIG. 11 is a sectional view of the camera module according to the above second preferred embodiment of the present invention.

Referring to FIGS. 10A and 11, a photosensitive unit 1010A and a camera module 10100A thereof according to a second preferred embodiment of the present invention are illustrated. The photosensitive unit 1010A is used for assembling and producing of camera module 10100A, so as to obtain a molded camera module. The photosensitive unit 1010A includes an encapsulation portion 1011A and a photosensitive portion 1012A, wherein the encapsulation portion 1011A is molded to connect with the photosensitive portion 1012A.

The photosensitive portion 1012A includes a main circuit board 10122A and a photosensitive sensor 10121A, wherein the photosensitive sensor 10121A is disposed on the main circuit board 10122A. According to the present embodiment of the present invention, the photosensitive sensor 10121A is molded to connect to the main circuit board 10122.

According to the present embodiment of the present invention, the photosensitive portion 1012A includes a connecting circuit and at least a circuit element 10123A. The connecting circuit is prearranged in the main circuit board 10122A and the circuit element 10123A is electrically connected to the connecting circuit and the photosensitive sensor 10121A to process the photosensing function for the photosensitive sensor 10121A. The circuit element 10123A is protrudingly deployed on the main circuit board 10122A. The circuit element 10123A can be, for example but not limited to, resistors, capacitors, diodes, triodes, potentiometers, electric relays, actuators, and/or etc.

It is worth mentioning that the encapsulation portion 1011A encapsulates and wraps up the circuit element 10123A therein, so that the circuit element 10123A will not directly exposed in any space, and more specifically, not be exposed in the environment that communicates with the photosensitive sensor 10121A. Therefore, during the assembling of the camera module, the circuit element 10123A will not contaminate pollutions, such as dusts, or adversely influence the photosensitive sensor 10121A. It is different from the conventional camera module that the circuit element 10123A, such as resistance-capacitance components, is exposed outside. The enclosure and encapsulation of the photosensitive sensor 10121A by molding, sundries and dusts are prevented from staying on the surface of the circuit element 10123A that avoids the photosensitive sensor 10121A from being contaminated and causes dark spots and other defectives of the camera module.

The encapsulation portion 1011A forms a window 101100A to provide a photosensitive path for the photosensitive sensor 10121A.

According to the present preferred embodiment of the present invention, the photosensitive portion 1012A includes at least one connecting element 10124A for electrically connecting the photosensitive sensor 10121A with the main circuit board 10122A. Further, the connecting element 10124A can be embodied to be, for example but not limited to, gold wire, copper wire, aluminum wire, and/or silver wire. Especially, the connecting elements 10124A curvingly connect the photosensitive sensor 10121A and the main circuit board 10122A. It is worth mentioning that the connecting element 10124A is molded inside the encapsulation portion 1011A, so that the connecting element(s) 10124A are enclosed, encapsulated and/or wrapped up by the molded encapsulation portion 1011A that keep them from direct exposure to the outside. Therefore, during the assembling of the camera module, the connecting element(s) 10124A will not suffer any collision or damage, and, at the same time, the influence by the environmental factors, such as temperature, on the connecting element 10124A is reduced that results in stabilization of the communication and connection between the photosensitive sensor 10121A and the main circuit board 10122A. This is completely different from the prior art.

It is worth mentioning that the encapsulation portion 1011A encapsulates and wraps up the circuit element 10123A and the connecting element 10124A, which advantages in protecting the circuit element 10123A and the connecting element 10124A as well as obtaining a higher performance camera module. However, those skilled in the art should understand that the encapsulation portion 1011A shall not be limited in wrapping up the circuit element 10123A and/or the connecting element 10124A. In other words, in other embodiments of the present invention, the encapsulation portion 1011A can be directly molded on main circuit board 10122A without protruded circuit element 10123A or be molded on various positions, such as the outer sides, the periphery, and etc., of the circuit element 10123A.

This embodiment is an alternative mode of the above preferred embodiment that, the main circuit board 10122A has an inner groove 101222A and the photosensitive sensor 10121A is installed in the inner groove 101222A, so as to reduce the relative height of the photosensitive sensor 10121A and the main circuit board 10122A. Therefore, when the encapsulation portion 1011A covers and wraps up the photosensitive sensor 10121A, the height of the encapsulation portion 1011A can be reduced that results in reducing the height of the camera module assembled with the photosensitive unit 1010A.

In addition, each of the photosensitive sensors 10121A has a photosensitive area 101211A and a non-photosensitive area 101212A, wherein the non-photosensitive area 101212A is positioned surrounding the periphery of the photosensitive area 101211A. The photosensitive area 101211A is adapted for processing photosensitization. The connecting element 10124A is connected to the non-photosensitive area 101212A.

According to the present preferred embodiment of the present invention, the encapsulation portion 1011A is extended to mold on the non-photosensitive area 101212A of the photosensitive sensor 10121A, so as to overlappedly mount the photosensitive sensor 10121A on the main circuit board 10122A by means of molding. Such that, for example, by using the process of Molding on Chip (MOC) or other molding technologies, the moldable area of the encapsulation portion 1011A can be increased inwardly, so that the structural portion 1011A the outer portions of the encapsulation portion 1011A and the main circuit board 10122A can be reduced, which further reduces the size in length and width of the photosensitive unit 1012A and reduces the size in length and width of the molded camera module assembled thereby.

In the present embodiment of the present invention, the encapsulation portion 1011A is protrudingly positioned surrounding the outer portion of the photosensitive area 101211A of the photosensitive sensor 10121A. Particularly, the encapsulation portion 1011A integrally seals its connection, so as to provide a great sealingness and tightness. Therefore, when the photosensitive unit 1010A is used to assemble the camera module, the photosensitive sensor 10121A will be sealed inside the camera module to forms a sealed inner space.

Furthermore, the encapsulation portion 1011A includes a covering section 10111A and an optical filter installing section 10112A. The optical filter installing section 10112A is molded integrally to connect with the covering section 10111A. The covering section 10111A is molded to attach on the main circuit board 10122A for encapsulating and wrapping up the circuit element 10123A and the connecting element 10124A. The optical filter installing section 10112A is arranged for installing an optical filter 1020A. In other words, when the photosensitive unit 1010A is used to assemble the camera module, the optical filter 1020A of the camera module will be mounted at the optical filter installing section 10112A, which makes the optical filter 1020A be positioned along the photosensitive path of the photosensitive sensor 10121A without the need of any additional mounting frame of the optical filter 1020A. In other words, the encapsulation portion 1011A of the present embodiment has a function as a conventional optical filter frame while the top portion of the optical filter installing section 10112A has a good evenness and smoothness by means of the molding technique, that enables the optical filter 1020A to be installed evenly, that is superior to conventional camera modules.

In addition, the optical filter installing section 10112A has an installing groove 101121A. The installing groove 101121A is communicated with the window 101100A to provide an adequate installation space for the optical filter 1020A such that the optical filter 1020A will not protrude from the top surface 101122A of the optical filter installing section 10112A. In other words, the top of the encapsulation portion 1011A has the installing groove 101121A provided therein for the optical filter 1020A to be stably installed at the encapsulation portion 1011A without protruding from the top of the encapsulation portion 1011A.

It is worth mentioning that the inner wall of the encapsulation portion 1011A can be shaped according to the shape of the connecting element. For example, it can be an inclined and slope shape, so that the photosensitive sensor 10121A can receive more light while the connecting element 10124A is encapsulated and wrapped by the encapsulation portion 1011A. Person skilled in the art should understand that a specific shape of the encapsulation portion 1011A will not limit the scope of the present invention.

Figure 10B:
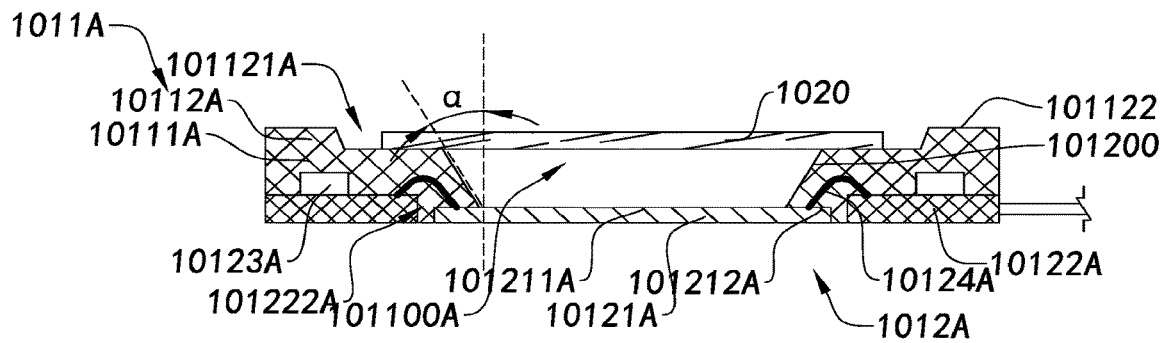
FIG. 10B is an alternative mode of the above second preferred embodiment of the present invention.

Referring to FIG. 10B, an alternative mode of the above second preferred embodiment of the present invention is illustrated. The main circuit board 10122A of the photosensitive unit 1010A has a sunken hole 101222A and the photosensitive sensor 10121A is sunkenly installed in the sunken hole 101222A, so as to reduce the relative height of the photosensitive sensor 10121A and the main circuit board 10122A. Therefore, when the encapsulation portion 1011A covers and encloses, encapsulates and/or wraps up the photosensitive sensor 10121A, the required height of the encapsulation portion 1011A can be reduced that results in reducing the height of the camera module assembled with the photosensitive unit 1010A.

The sunken hole 101222A is a through hole structure communicating the spaces of the two sides of the main circuit board, such that the sunkable extent of the photosensitive sensor 10121A is increased. The relative height positions between the photosensitive sensor 10121A and the main circuit board 10122A can be decided based on the needs. For example, the height of the top surfaces of the photosensitive sensor 10121A and the main circuit board 10122A are consistent, the height of the bottom surfaces of the photosensitive sensor 10121A and the main circuit board 10122A are consistent, the heights of both the top and bottom surfaces of the photosensitive sensor 10121A and the main circuit board 10122A are inconsistent, and etc.

An end of the connecting element 10124A is connected to the photosensitive sensor 10121A, while the other end of the connecting element 10124A is connected to the main circuit board 10122A, which is the peripheral area of the sunken hole 101222A, such that it makes more area of the sunken hole 101222A available for deploying the photosensitive sensor 10121A. Therefore, it can be suitable for accommodating a larger photosensitive sensor 10121A or it can reduce the area size of the sunken hole 101222A.

Referring to FIG. 11, the camera module 10100A according to the above second preferred embodiment of the present invention is illustrated. The camera module can be an automatic focus module. The camera module includes one the photosensitive unit 1010A, one the optical filter 1020A, and a camera lens 1030A.

The optical filter 1020A is installed at the photosensitive unit 1010A, while the camera lens 1030A is mounted on the photosensitive unit 1010A.

More specifically, the optical filter 1020A is installed at the installing groove 1111A of the optical filter installing section 10111A of the encapsulation portion 1011A of the photosensitive unit 1010A. The camera lens 1030A is mounted on top of the optical filter installing section 10111A of the encapsulation portion 1011A of the photosensitive unit 1010A. In other words, the optical filter 1020A is mounted in the installing groove 1111A. The camera lens 1030A is mounted on top of the encapsulation portion 1011A.

In other embodiments of the present invention, the photosensitive unit 1010A can also be assembled in an automatic focus camera module. Person skilled in the art should understand that the fixed focus module is only an example for describing the present invention, which shall not limit the present invention.

Figure 12:
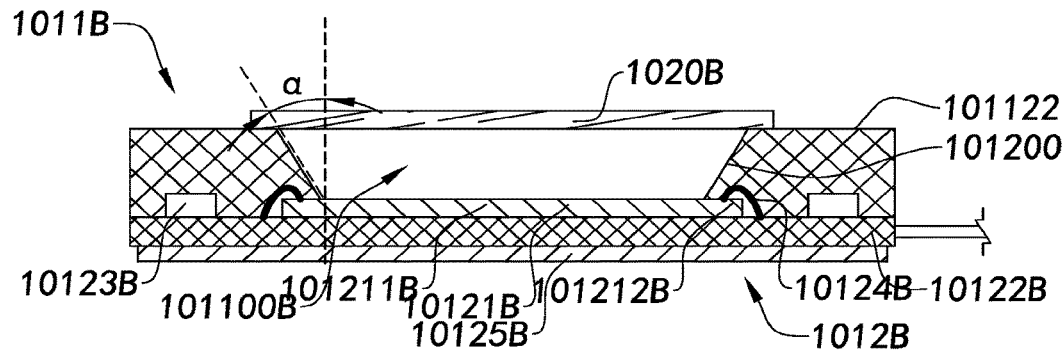
FIG. 12 is a sectional view of a photosensitive unit according to a third preferred embodiment of the present invention.
Figure 13:
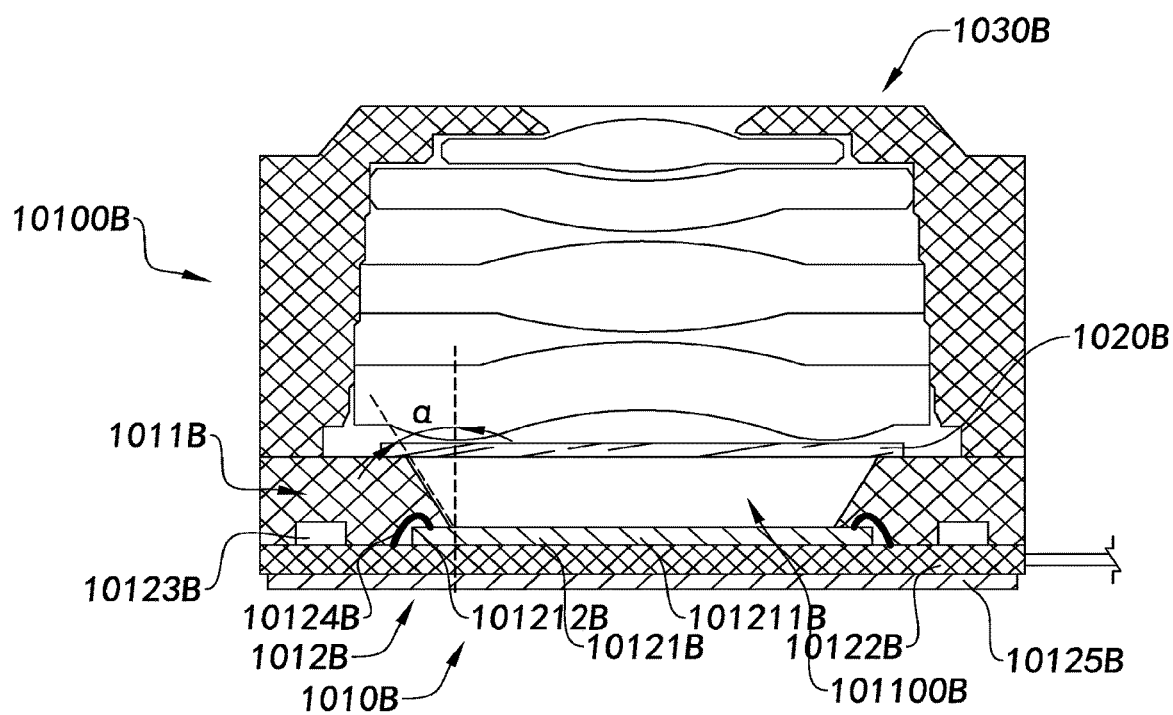
FIG. 13 is a sectional view of the camera module according to the above third preferred embodiment of the present invention.

Referring to FIGS. 12 and 13, a photosensitive unit 1010B and a camera module 10100B according to a third preferred embodiment of the present invention is illustrated. The photosensitive unit 1010B is used for assembling and producing of camera module, so as to obtain a molded camera module. The photosensitive unit 1010B includes an encapsulation portion 1011B and a photosensitive portion 1012B, wherein the encapsulation portion 1011B is molded to connect with the photosensitive portion 1012B.

The photosensitive portion 1012B includes a main circuit board 10122B and a photosensitive sensor 10121B, wherein the photosensitive sensor 10121B is disposed on the main circuit board 10122B. According to the present embodiment of the present invention, the photosensitive sensor 10121B is molded to connect to the main circuit board 10122.

According to the present embodiment of the present invention, the photosensitive portion 1012B includes a connecting circuit and at least a circuit element 10123B. The connecting circuit is prearranged in the main circuit board 10122B and the circuit element 10123B is electrically connected to the connecting circuit and the photosensitive sensor 10121B to process the photosensing function for the photosensitive sensor 10121B. The circuit element 10123B is protrudingly deployed on the main circuit board 10122B. The circuit element 10123B can be, for example but not limited to, resistors, capacitors, diodes, triodes, potentiometers, electric relays, actuators, or etc.

It is worth mentioning that the encapsulation portion 1011B encapsulates and wraps up the circuit element 10123B therein, so that the circuit element 10123B will not be directly exposed in any space, and more specifically, not be exposed in the environment that communicates with the photosensitive sensor 10121B. Therefore, during the assembling of the camera module, the circuit element 10123B will not contaminate pollutions, such as dusts, or adversely influence the photosensitive sensor 10121B. It is different from the conventional camera module that the circuit element 10123B, such as resistance-capacitance components, is exposed outside. The enclosure and encapsulation of the photosensitive sensor 10121B by molding, sundries and dusts are prevented from staying on the surface of the circuit element 10123B that avoids the photosensitive sensor 10121B from being contaminated and causes dark spots and other defectives of the camera module.

The encapsulation portion 1011B forms a window 101100B to provide a photosensitive path for the photosensitive sensor 10121B.

According to the present preferred embodiment of the present invention, the photosensitive portion 1012B includes at least one connecting element 10124B for electrically connecting the photosensitive sensor 10121B with the main circuit board 10122B. Further, the connecting element 10124B can be embodied to be, for example but not limited to, gold wire, copper wire, aluminum wire, and/or silver wire. Especially, the connecting elements 10124B curvingly connect the photosensitive sensor 10121B and the main circuit board 10122B.

It is worth mentioning that the connecting element 10124B is molded within the encapsulation portion 1011B, so that the encapsulation portion 1011B, encloses, encapsulates and/or wraps up the connecting element(s) 10124B and keep them from direct exposure to the outside. Therefore, during the assembling of the camera module, the connecting element(s) 10124B will not suffer any collision or damage, and, at the same time, it reduces the impact due to the environmental factors, such as temperature, on the connecting element 10124B and stabilizes the communication and connection between the photosensitive sensor 10121B and the main circuit board 10122B. This is completely absent in the traditional art.

It is worth mentioning that the encapsulation portion 1011B encapsulates and wraps up the circuit element 10123B and the connecting element 10124B, which advantages in protecting the circuit element 10123B and the connecting element 10124B as well as obtaining a higher performance camera module. However, those skilled in the art should understand that the encapsulation portion 1011B shall not be limited in wrapping up the circuit element 10123B and/or the connecting element 10124B. In other words, in other embodiments of the present invention, the encapsulation portion 1011B can be directly molded on main circuit board 10122B without protruded circuit element 10123B or be molded on various positions, such as the outer sides, the periphery, and etc., of the circuit element 10123B.

In addition, each of the photosensitive sensors 10121B has a photosensitive area 101211B and a non-photosensitive area 101212B, wherein the non-photosensitive area 101212B is positioned surrounding the periphery of the photosensitive area 101211B. The photosensitive area 101211B is adapted for processing photosensitization. The connecting element 10124B is connected to the non-photosensitive area 101212B.

According to the present preferred embodiment of the present invention, the encapsulation portion 1011B is extended to mold on the non-photosensitive area 101212B of the photosensitive sensor 10121B, so as to overlappedly mount the photosensitive sensor 10121B on the main circuit board 10122B by means of molding. In this manner, such as the method of Molding on Chip (MOC), the moldable area of the encapsulation portion 1011B can be extended inwardly, such that the structural portion outside of the encapsulation portion 1011B and the main circuit board 10122B can be reduced, that further reduces the size in length and width the molded photosensitive portion 1012B and reduces the size in length and width of the camera module assembled thereby.

In the present embodiment of the present invention, the encapsulation portion 1011B is protrudingly positioned surrounding the outer portion of the photosensitive area 101211B of the photosensitive sensor 10121B. Particularly, the encapsulation portion 1011B integrally seals its connection, so as to provide a great sealingness and tightness. Therefore, when the photosensitive unit 1010B is used to assemble the camera module, the photosensitive sensor 10121B will be sealed inside the camera module to forms a sealed inner space.

Particularly, in producing the photosensitive unit 1010B, a conventional circuit board can be used to make the main circuit board 10122B. The photosensitive sensor 10121B is deployed on the main circuit board 10122B and electrically connected by the connecting elements 10124B. Then, after the main circuit board 10122B and the photosensitive sensor 10121B are initially assembled, they are processed by Surface Mount Technology (SMT) and then molded by the insert molding technique, for example by means of an injection molding machine, to form the encapsulation portion 1011B, or molded by the pressing molding technique, which is commonly applied in semiconductor packaging, to form the encapsulation portion 1011B. The main circuit board 10122B can selectively be, for example but not limited to, rigid-flex board, ceramic substrate (without flexible board), or rigid PCB (without flexible board). The formation of the encapsulation portion 1011B can be selected by, for example but not limited to, injection molding technique and pressing molding technique. The material of the encapsulation portion 1011B can be, for example but not limited to, nylon, liquid crystal polymer (LCP), or polypropylene (PP) for injection molding technique, or thermoplastic resin or thermosetting resin for pressing molding technique. Person skilled in the art should understand that the above available manufacture methods and available materials are examples to describe available implementations of the present invention, rather than limitations of the present invention.

Furthermore, the top surface of the encapsulation portion 1011B is flat and smooth, and is adapted for mounting an optical filter 1020B thereon. In other words, when the photosensitive unit 1010B is used in assembling the camera module, the optical filter 1020B of the camera module is mounted on the top surface of the encapsulation portion 1011B, enabling the optical filter 1020B to be arranged along the photosensitive path of the photosensitive sensor 10121B without the need of any additional mounting frame for the optical filter 1020B. In other words, the encapsulation portion 1011B also functions as a conventional independent mounting frame. In addition, due to the advantage of molding technique, the molded top portion of the encapsulation portion 1011B can take advantage of the mold to achieve good evenness and smoothness, so that the optical filter 1020B can be evenly installed, that is superior to conventional camera module.

The differences between the present preferred embodiments and the previous embodiment of the present invention, the photosensitive portion 1012B of the photosensitive unit 1010B further includes a reinforced layer 10125B overlappedly attached to the bottom of the main circuit board 10122B, so as to reinforce the structural strength of the main circuit board 10122B. In other words, the reinforced layer 10125B is adhered on a position of the bottom layer of the main circuit board 10122B corresponding to the positions of the encapsulation portion 1011B and the photosensitive sensor 10121B, so that the main circuit board 10122B can also stably and reliably support the encapsulation portion 1011B and the photosensitive sensor 10121B.

Furthermore, the reinforced layer 10125B is a metal plate attaching on the bottom layer of the main circuit board 10122B to increase the structural strength of the main circuit board 10122B as well as to enhance the heat dissipation of the photosensitive unit 1010B by effectively dissipating heat generated by the photosensitive sensor 10121B It is worth mentioning that the main circuit board 10122B can be Flex Print Circuit (FPC). By enhancing the rigidity of the FPC with the reinforced layer 10125B, the FPC having excellent flexural property can still fulfill the loading and supporting requirement for the photosensitive unit 1010B. In other words, more options of different circuit boards can be used as the main circuit board 10122B, such as PCB (Printed Circuit Board), FPC (Flexible Printed Circuit), and RF (Rigid Flex). By using the reinforced layer 10125B to enhance the structural strength and heat dissipation of the main circuit board 10122B, the thickness of the main circuit board 10122B can thus be reduced, that enables the height of the photosensitive unit 1010B to be further reduced. Hence, the height of the camera module assembled thereby can be reduced too.

It is worth mentioning that, according to the present embodiment of the present invention, the reinforced layer 10125 is overlapped on the main circuit board 10122B in a plane manner. In other embodiments of the present invention, the reinforced layer 10125B can be extended to cover the side walls of the encapsulation portion 1011B, so as to not only reinforce the structural strength of the photosensitive unit 1010B, but also enhance an anti-electromagnetic ability thereof.

It is worth mentioning that the inner wall of the encapsulation portion can be shaped according to the shape of the connecting element. For example, it can be an inclined and slope shape, so that the photosensitive sensor 10121B can receive more light while the connecting element 10124B is encapsulated and wrapped by the encapsulation portion. Person skilled in the art should understand that a specific shape of the encapsulation portion 1011B will not limit the scope of the present invention.

Referring to FIGS. 12-13, the camera module 10100B according to the third preferred embodiment of the present invention is illustrated. The camera module 10100B can be a fixed focus module (FFM). The camera module includes one the photosensitive unit 1010B, one the optical filter 1020B, and a camera lens 1030B.

The optical filter 1020B is installed at the photosensitive unit 1010B, while the camera lens 1030B is mounted on the photosensitive unit 1010B.

More specifically, the optical filter 1020B is mounted on top of encapsulation portion 1011B of the photosensitive unit 1010B. The camera lens 1030B is mounted on top of encapsulation portion 1011B of the photosensitive unit 1010B. Particularly, the specific installation positions of the optical filter 1020B and the camera lens 1030B in the encapsulation portion 1011B can be coordinated and arranged based on practical needs.

It is also worth mentioning that the camera lens 1030B is supported on top portion of the encapsulation portion 1011B of the photosensitive unit 1010B. Therefore, the encapsulation portion 1011B can also function as the independent mounting frame of a conventional camera module to provide a supportive and holding site for the camera lens 1030B, but it is assembled by technical process different from the conventional COB technology. The independent mounting frame of a camera module based on the conventional COB technique is affixed on the circuit board by means of adhering, but the encapsulation portion 1011B of the present invention is affixed on the main circuit board 10122B by means of molding that does not require the process of adhering and affixing. Contrasting to the process of adhering and affixing, the process of molding provides better connection stability and technological process controllability. In addition, it does not have to reserve the adhesive space between the encapsulation portion 1011B and the main circuit board 10122B for AA adjustment. Therefore, it saves the adhesive space of AA adjustment of conventional camera module, and allows the thickness of the camera module to be further reduced. Meanwhile, the encapsulation portion 1011B encapsulates and wraps the circuit elements 10123B and the connecting elements 10124B, that enables the function of the conventional mounting frame, the circuit elements 10123B, and the connecting element 10124B can spatially overlap without the need to reserve a safety distance around the circuit components as in the conventional camera module. As a result, the height of the encapsulation portion 1011B, which functions as the independent mounting frame, can be arranged in a smaller range, so as to further provide room for reducing the thickness of the camera module. Besides, the encapsulation portion 1011B that substitutes the conventional mounting frame avoids any tilt deviation occurred in attaching and assembling the mounting frame as in the conventional camera module and to reduce the accumulated tolerance of in assembling the camera module. In addition, the encapsulation and wrapping up of the connecting element(s) 10124B by the encapsulation portion 1011B and the inner extension of the encapsulation portion 1011B towards the non-photosensitive area 101212B of the photosensitive sensor 10121B enables the size of the encapsulation portion 1011B can be shrunk inwardly, so as to further decrease the lateral sizes in length and width of the camera module.

Figure 14:
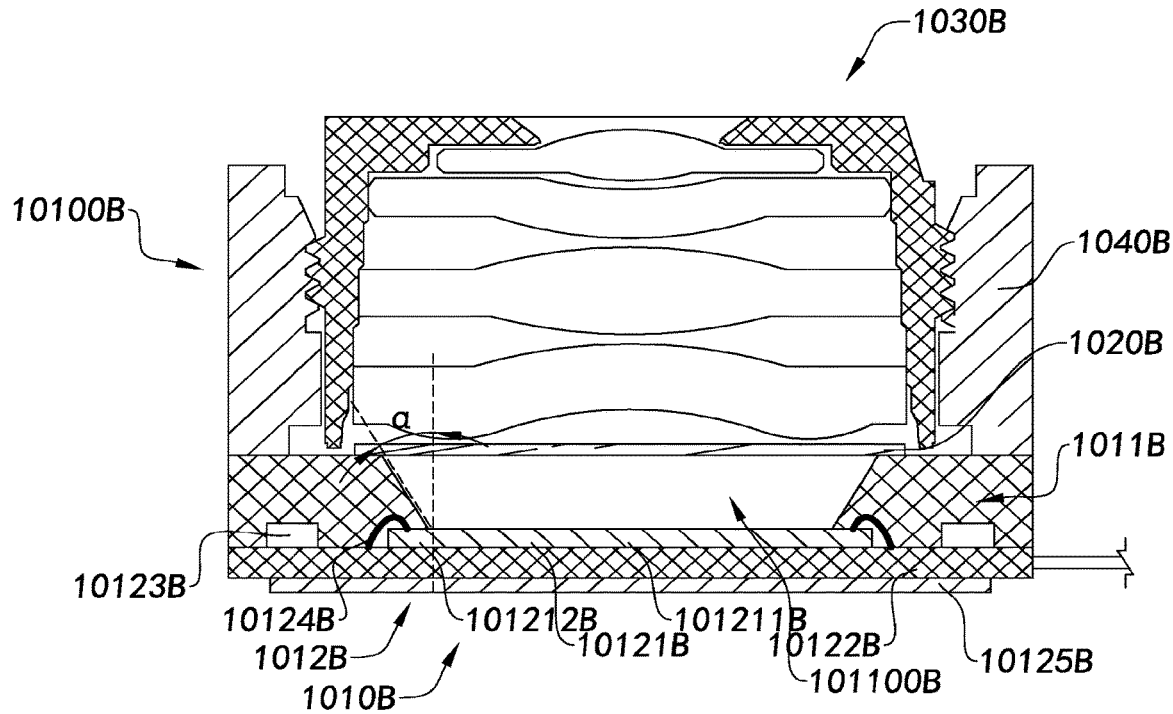
FIG. 14 is sectional view of the camera module according to an alternative of the above third preferred embodiment of the present invention.

Referring to FIGS. 12 and 14, an alternative mode of the camera module according to the above third preferred embodiment of the present invention is illustrated. The camera module 10100B can be an automatic focus camera module. The camera module includes one the photosensitive unit 1010B, one the optical filter 1020B, a motor unit 1040B, and a camera lens 1030B.

The optical filter 1020B is mounted on the photosensitive unit 1010B, while the camera lens 1030B is mounted on the motor unit 1040B and the motor unit 1040B is mounted on the molded photosensitive unit 1010B.

Furthermore, the optical filter 1020B is mounted on the top portion of encapsulation portion 1011B of the photosensitive unit 1010B. The motor unit 1040B is mounted on the top portion of the encapsulation portion 1011B of the photosensitive unit 1010B. Particularly, the specific installation positions of the optical filter 1020B and the motor unit 1040B at the encapsulation portion 1011B can be coordinated and arranged based on practical needs.

Those skilled in the art should understand that the structures and forms of the camera module mentioned above are just examples to describe ways of implementing the camera module, rather than limitations of the present invention.

Figure 15:
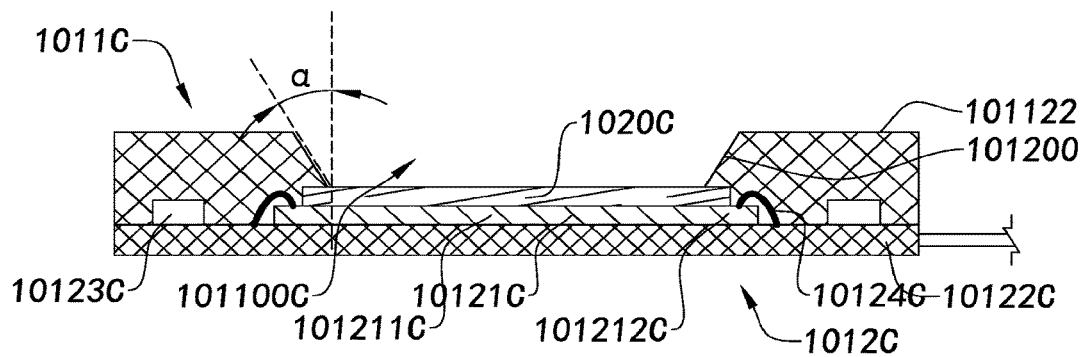
FIG. 15 is a sectional view of a photosensitive unit according to a fourth preferred embodiment of the present invention.
Figure 17:
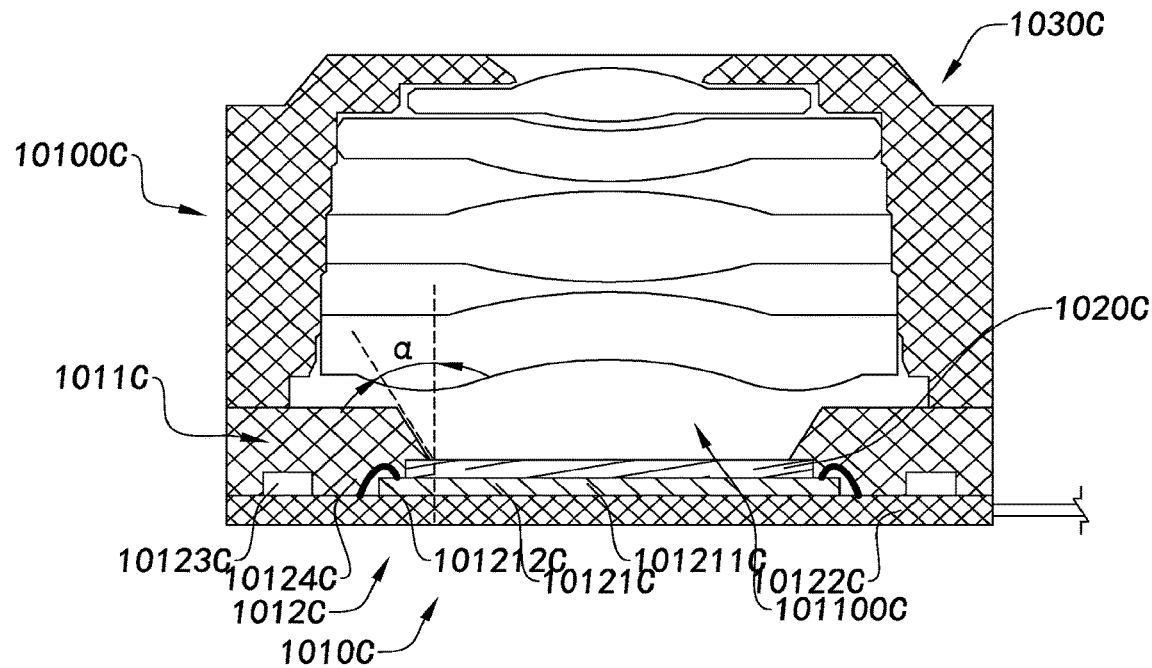
FIG. 17 is a sectional view of the camera module according to the above fourth preferred embodiment of the present invention.

Referring to FIGS. 15 and 17, a camera module 10100C and a photosensitive unit 1010C according to a fourth preferred embodiment of the present invention is illustrated. The photosensitive unit 1010C is used for assembling and producing of camera module, so as to obtain a molded camera module. The photosensitive unit 1010C includes an encapsulation portion 1011C and a photosensitive portion 1012C, wherein the encapsulation portion 1011C is molded to connect with the photosensitive portion 1012C.

The photosensitive portion 1012C includes a main circuit board 10122C and a photosensitive sensor 10121C, wherein the photosensitive sensor 10121C is disposed on the main circuit board 10122C. According to the present embodiment of the present invention, the photosensitive sensor 10121C is molded to connect to the main circuit board 10122.

According to the present embodiment of the present invention, the photosensitive portion 1012C includes a connecting circuit and at least a circuit element 10123C. The connecting circuit is prearranged in the main circuit board 10122C and the circuit element 10123C is electrically connected to the connecting circuit and the photosensitive sensor 10121C to process the photosensing function for the photosensitive sensor 10121C. The circuit element 10123C is protrudingly deployed on the main circuit board 10122C. The circuit element 10123C can be, for example but not limited to, resistors, capacitors, diodes, triodes, potentiometers, electric relays, actuators, or etc.

It is worth mentioning that the encapsulation portion 1011C encapsulates and wraps up the circuit element 10123C therein, so that the circuit element 10123C will not be directly exposed in any space, and more specifically, not be exposed in the environment that communicates with the photosensitive sensor 10121C. Therefore, during the assembling of the camera module, the circuit element 10123C will not contaminate pollutions, such as dusts, or adversely influence the photosensitive sensor 10121C. It is different from the conventional camera module that the circuit element 10123C, such as resistance-capacitance components, is exposed outside. The enclosure and encapsulation of the photosensitive sensor 10121C by molding, sundries and dusts are prevented from staying on the surface of the circuit element 10123C that avoids the photosensitive sensor 10121C from being contaminated and causes dark spots and other defectives of the camera module.

The encapsulation portion 1011C forms a window 101100C to provide a photosensitive path for the photosensitive sensor 10121C.

According to the present preferred embodiment of the present invention, the photosensitive portion 1012C includes at least one connecting element 10124C for electrically connecting the photosensitive sensor 10121C with the main circuit board 10122C. Further, the connecting element 10124C can be embodied to be, for example but not limited to, gold wire, copper wire, aluminum wire, and/or silver wire. Especially, the connecting elements 10124C curvingly connect the photosensitive sensor 10121C and the main circuit board 10122C.

It is worth mentioning that the connecting element 10124C is molded within the encapsulation portion 1011C, so that the encapsulation portion 1011C, encloses, encapsulates and/or wraps up the connecting element(s) 10124C and keep them from direct exposure to the outside. Therefore, during the assembling of the camera module, the connecting element(s) 10124C will not suffer any collision or damage, and, at the same time, it reduces the impact due to the environmental factors, such as temperature, on the connecting element 10124C and stabilizes the communication and connection between the photosensitive sensor 10121C and the main circuit board 10122C. This is completely absent in the traditional art.

It is worth mentioning that the encapsulation portion 1011C encapsulates and wraps up the circuit element 10123C and the connecting element 10124C, which advantages in protecting the circuit element 10123C and the connecting element 10124C as well as obtaining a higher performance camera module. However, those skilled in the art should understand that the encapsulation portion 1011C shall not be limited in wrapping up the circuit element 10123C and/or the connecting element 10124C. In other words, in other embodiments of the present invention, the encapsulation portion 1011C can be directly molded on main circuit board 10122C without protruded circuit element 10123C or be molded on various positions, such as the outer sides, the periphery, and etc., of the circuit element 10123C.

In addition, each of the photosensitive sensors 10121C has a photosensitive area 101211C and a non-photosensitive area 101212C, wherein the non-photosensitive area 101212C is positioned surrounding the periphery of the photosensitive area 101211C. The photosensitive area 101211C is adapted for processing photosensitization. The connecting element 10124C is connected to the non-photosensitive area 101212C.

According to the present preferred embodiment of the present invention, the encapsulation portion 1011C is extended to mold on the non-photosensitive area 101212C of the photosensitive sensor 10121C, so as to overlappedly mount the photosensitive sensor 10121C on the main circuit board 10122C by means of molding. In this manner, such as using the method of Molding on the Chip, the moldable area of the encapsulation portion 1011C can be extended inwardly, such that the structural portion of the outer portion of the encapsulation portion 1011C and the main circuit board 10122C can be reduced, that further reduces the size in length and width of the photosensitive unit and reduces the size in length and width of the camera module assembled thereby.

In the present embodiment of the present invention, the encapsulation portion 1011C is protrudingly positioned surrounding the outer portion of the photosensitive area 101211C of the photosensitive sensor 10121C. Particularly, the encapsulation portion 1011C integrally seals its connection, so as to provide a great sealingness and tightness. Therefore, when the photosensitive unit 1010C is used to assemble the camera module, the photosensitive sensor 10121C will be sealed inside the camera module to forms a sealed inner space.

Particularly, in producing the photosensitive unit 1010C, a conventional circuit board can be used to make the main circuit board 10122C. The photosensitive sensor 10121C is deployed on the main circuit board 10122C and electrically connected by the connecting elements 10124C. Then, after the main circuit board 10122C and the photosensitive sensor 10121C are initially assembled, they are processed by Surface Mount Technology (SMT) and then molded by the insert molding technique, for example by means of an injection molding machine, to form the encapsulation portion 1011C, or molded by the pressing molding technique, which is commonly applied in semiconductor packaging, to form the encapsulation portion 1011C. The main circuit board 10122C can selectively be, for example but not limited to, rigid-flex board, ceramic substrate (without flexible board), or rigid PCB (without flexible board). The formation of the encapsulation portion 1011C can be selected by, for example but not limited to, injection molding technique and pressing molding technique. The material of the encapsulation portion 1011C can be, for example but not limited to, nylon, liquid crystal polymer (LCP), or polypropylene (PP) for injection molding technique, or thermoplastic resin or thermosetting resin for pressing molding technique. Person skilled in the art should understand that the above available manufacture methods and available materials are examples to describe available implementations of the present invention, rather than limitations of the present invention.

The photosensitive unit 1010C further includes an optical filter 1020C, wherein the optical filter 1020C is molded to be overlappedly disposed on the photosensitive sensor 10121C. The edges of the optical filter 1020C are molded by the encapsulation portion 1011C so as to affix the optical filter 1020C in position. It is worth mentioning that the optical filter 1020C covers on the photosensitive sensor 10121C and insulates the photosensitive sensor 10121C from the external environment to protect the photosensitive sensor 10121C from damage and prevent dusts from entering therein.

To produce the photosensitive unit 1010C, the photosensitive sensor 10121C is firstly adhered on the main circuit board 10122C and the connecting element 124C is connected with the photosensitive sensor 10121C and the main circuit board 10122C. Then, the optical filter 1020C is adhered on the photosensitive sensor 10121C. Thereafter, the main circuit board, the photosensitive sensor 10121C, and the optical filter 1020C are molded to form the encapsulation portion 1011C. During the molding process, since the optical filter 1020C covers on top of the photosensitive sensor 10121C, any damage caused by the molding mold to the photosensitive sensor 10121C can be prevented. In addition, because the distance between the optical filter 1020C and the photosensitive sensor 10121C is shortened, the back focal length of the camera module assembled thereby can also be shortened, so that the height of the camera module is reduced too. On the other hand, since there is no need to provide an additional supporting component for the optical filter 1020C, the thickness of the camera module can be further reduced.

It is worth mentioning that the inner wall of the encapsulation portion 1010C can be shaped with respect to the object such as the optical filter to be connected. For example, it can be in an inclined or slope shape, so that while the connecting elements 10124C are encapsulated and wrapped, the photosensitive sensor 10121C can still receive more light through the window and the installing groove. Person skilled in the art should understand that a specific shape of the encapsulation portion 1011C will not limit the scope of the present invention.

Figure 16:
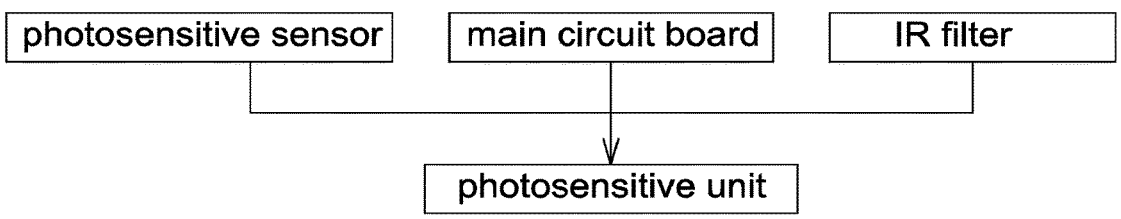
FIG. 16 is a block diagram of the photosensitive unit according to the above fourth preferred embodiment of the present invention.

Referring to FIGS. 15-17, the camera module 10100C according to the fourth preferred embodiment of the present invention is illustrated. The camera module can be an automatic focus module. The camera module includes one the photosensitive unit 1010C and a camera lens 1030C. The camera lens 1030C is mounted on the photosensitive unit 1010C for assembling to form the camera module.

Especially, the camera lens 1030C can be affixed on top of the encapsulation portion 1011C of the photosensitive unit 1010C by means of adhering. In addition, taking advantage of the features of the molding production in the molding technique, the top portion of the encapsulation portion 1011C can have a better evenness and smoothness that provides an excellent installation condition for the camera lens 1030C, so as to achieve a high quality camera module.

It is worth mentioning that the camera lens 1030C is supported on top of the encapsulation portion 1011C of the photosensitive unit 1010C. Therefore, the encapsulation portion 1011C itself functions as the independent mounting frame of a conventional camera module to provide supportive and holding site for the camera lens 1030C, but it is assembled by different technical process from the conventional COB technology. The independent mounting frame of a camera module based on the conventional COB technique is affixed on the circuit board by means of adhering, but the encapsulation portion 1011C of the present invention is affixed on the main circuit board 10122C by means of molding that does not require the process of adhering and affixing. Contrasting to the process of adhering and affixing, the process of molding provides better connection stability and technological process controllability. In addition, it does not have to reserve the adhesive space between the encapsulation portion 1011C and the main circuit board 10122C for AA adjustment. Therefore, it saves the adhesive space of AA adjustment of conventional camera module, and allows the thickness of the camera module to be further reduced. Meanwhile, the encapsulation portion 1011C encapsulates and wraps the circuit elements 10123C and the connecting elements 10124C, that enables the function of the conventional mounting frame, the circuit elements 10123C, and the connecting element 10124C can spatially overlap without the need to reserve a safety distance around the circuit components as in the conventional camera module. As a result, the height of the encapsulation portion 1011C, which functions as the independent mounting frame, can be arranged in a smaller range, so as to further provide room for reducing the thickness of the camera module. Besides, the encapsulation portion 1011C that substitutes the conventional mounting frame avoids any tilt deviation occurred in attaching and assembling the mounting frame as in the conventional camera module and to reduce the accumulated tolerance of in assembling the camera module. In addition, the encapsulation and wrapping up of the connecting element(s) 10124C by the encapsulation portion 1011C and the inner extension of the encapsulation portion 1011C towards the non-photosensitive area 101212C of the photosensitive sensor 10121C enables the size of the encapsulation portion 1011C can be shrunk inwardly, so as to further decrease the lateral sizes in length and width of the camera module. Also, the photosensitive unit 1010C molds the optical filter 1020C therein, so when assembling the camera module, in it is not necessary to conduct one more optical filter attachment process. As a result, the assembling technological process of the camera module can be minimized while the efficiency can be enhanced. These are both superior to the traditional art.

Figure 18:
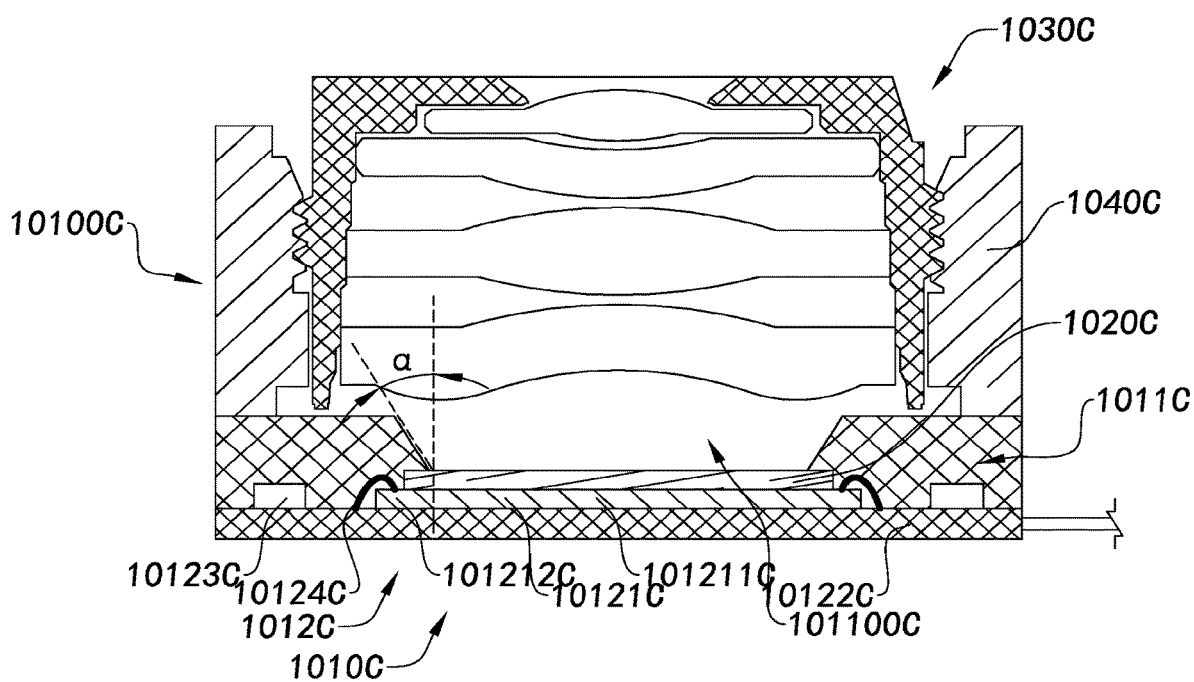
FIG. 18 is sectional view of the camera module according to an alternative of the above fourth preferred embodiment of the present invention.

Referring to FIGS. 15, 16, and 18, an alternative mode of the camera module 10100C according to the above fourth preferred embodiment of the present invention is illustrated. The camera module can be an automatic focus camera module (AFM). The camera module includes one the photosensitive unit 1010C, one the motor unit 1040C, and a camera lens 1030C.

The camera lens 1030C is installed on the motor unit 1040C. The motor unit 1040C is installed on the photosensitive unit 1010C, so as to allow focal length adjustment of the camera module through the motor unit 1040C. The motor unit 1040C is mounted on the top portion of the encapsulation portion 1011C of the photosensitive unit 1010C.

Those skilled in the art should understand that the structures and forms of the camera module mentioned above are just examples to describe ways of implementing the camera module, rather than limitations of the present invention.

Figure 19A:
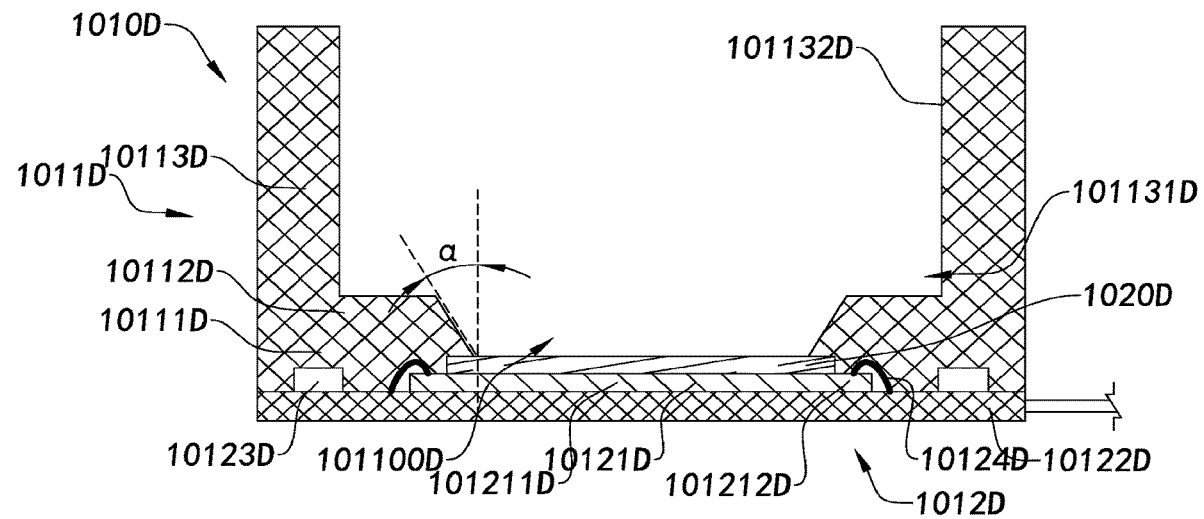
FIG. 19A is a sectional view of a photosensitive unit according to a fifth preferred embodiment of the present invention.
Figure 20A:
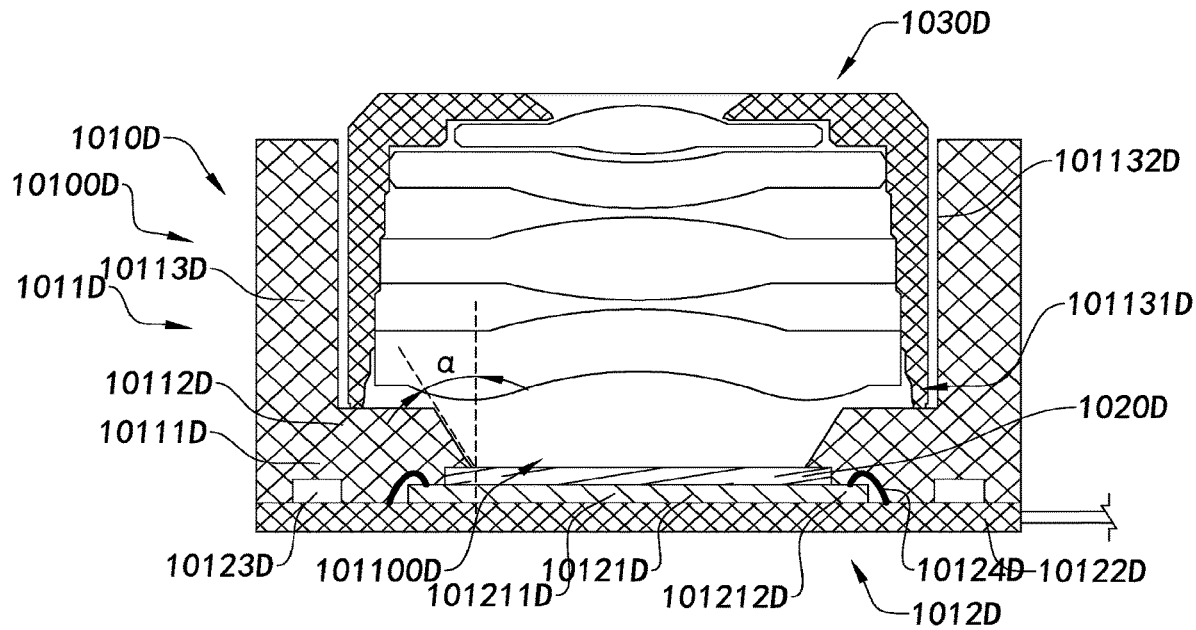
FIG. 20A is a sectional view of the camera module according to the above fifth preferred embodiment of the present invention.

Referring to FIGS. 19A and 20A, the photosensitive unit 1010D and camera module 10100D according to a fifth preferred embodiment of the present invention are illustrated. The photosensitive unit 1010D is adapted for assembling and producing camera module to achieve the molded camera module. The photosensitive unit 1010D includes an encapsulation portion 1011D and a photosensitive portion 1012D, wherein the encapsulation portion 1011D is molded to connect with the photosensitive portion 1012D.

Especially, the encapsulation portion is molded to couple to the photosensitive portion 1012D with the method of MOC.

The photosensitive portion 1012D includes a main circuit board 10122D and a photosensitive sensor 10121D, wherein the photosensitive sensor 10121D is disposed on the main circuit board 10122D. According to the present embodiment of the present invention, the photosensitive sensor 10121D is molded to connect to the main circuit board 10122D.

According to the present embodiment of the present invention, the photosensitive portion 1012D includes a connecting circuit and at least a circuit element 10123D. The connecting circuit is prearranged in the main circuit board 10122D and the circuit element 10123D is electrically connected to the connecting circuit and the photosensitive sensor 10121D to process the photosensing function for the photosensitive sensor 10121D. The circuit element 10123D is protrudingly deployed on the main circuit board 10122D. The circuit element 10123D can be, for example but not limited to, resistors, capacitors, diodes, triodes, potentiometers, electric relays, actuators, or etc. It is worth mentioning that the encapsulation portion 1011D encapsulates and wraps up the circuit element 10123D therein, so that the circuit element 10123D will not be directly exposed in any space, and more specifically, not be exposed in the environment that communicates with the photosensitive sensor 10121D. Therefore, during the assembling of the camera module, the circuit element 10123D will not contaminate pollutions, such as dusts, or adversely influence the photosensitive sensor 10121D. It is different from the conventional camera module that the circuit element 10123D, such as resistance-capacitance components, is exposed outside. The enclosure and encapsulation of the photosensitive sensor 10121D by molding, sundries and dusts are prevented from staying on the surface of the circuit element 10123D that avoids the photosensitive sensor 10121D from being contaminated and causes dark spots and other defectives of the camera module.

The encapsulation portion 1011D forms a window 101100D to provide a photosensitive path for the photosensitive sensor 10121D.

According to the present fifth preferred embodiment of the present invention, the photosensitive portion 1012D includes at least one connecting element 10124D for electrically connecting the photosensitive sensor 10121D with the main circuit board 10122D. Further, the connecting element 10124D can be embodied to be, for example but not limited to, gold wire, copper wire, aluminum wire, and/or silver wire. Especially, the connecting elements 10124D curvingly connect the photosensitive sensor 10121D and the main circuit board 10122D.

It is worth mentioning that the connecting element 10124D is molded inside the encapsulation portion 1011D, so that the connecting element(s) 10124D are enclosed, encapsulated and/or wrapped up by the molded encapsulation portion 1011D that keep them from direct exposure to the outside. Therefore, during the assembling of the camera module, the connecting element(s) 10124D will not suffer any collision or damage, and, at the same time, the influence by the environmental factors, such as temperature, on the connecting element 10124D is reduced that results in stabilization of the communication and connection between the photosensitive sensor 10121D and the main circuit board 10122D. This is completely different from the prior art.

It is worth mentioning that the encapsulation portion 1011D encapsulates and wraps up the circuit element 10123D and the connecting element 10124D, which advantages in protecting the circuit element 10123D and the connecting element 10124D as well as obtaining a higher performance camera module. However, those skilled in the art should understand that the encapsulation portion 1011D shall not be limited in wrapping up the circuit element 10123D and/or the connecting element 10124D. In other words, in other embodiments of the present invention, the encapsulation portion 1011D can be directly molded on main circuit board 10122D without protruded circuit element 10123D or be molded on various positions, such as the outer sides, the periphery, and etc., of the circuit element 10123D.

The photosensitive unit 1010D further includes an optical filter 1020D, wherein the optical filter 1020D is molded to overlappedly disposed on the photosensitive sensor 10121D. The edges of the optical filter 1020D are molded by the encapsulation portion 1011D so as to affix the optical filter 1020D in position. It is worth mentioning that the optical filter 1020D covers on the photosensitive sensor 10121D and insulates the photosensitive sensor 10121D from the external environment to protect the photosensitive sensor 10121D from damage and prevent dusts from entering therein.

In addition, each of the photosensitive sensors 10121D has a photosensitive area 101211D and a non-photosensitive area 101212D, wherein the non-photosensitive area 101212D is positioned surrounding the periphery of the photosensitive area 101211D. The photosensitive area 101211D is adapted for processing photosensitization. The connecting element 10124D is connected to the non-photosensitive area 101212D.

According to the present preferred embodiment of the present invention, the encapsulation portion 1011D is extended to mold on the non-photosensitive area 101212D of the photosensitive sensor 10121D, so as to overlappedly mount the photosensitive sensor 10121D on the main circuit board 10122D by means of molding. In this manner, such as the method of Molding on Chip (MOC), the molding area of the encapsulation portion 1011D can be extended inwardly, so that the outer structural portions of the encapsulation portion 1011D and the main circuit board 10122D can be reduced, which further reduces the size in length and width of the photosensitive portion 1012D as well as the size in length and width of the camera module assembled thereby.

In the present embodiment of the present invention, the encapsulation portion 1011D is protrudingly positioned surrounding the outer portion of the photosensitive area 101211D of the photosensitive sensor 10121D. Particularly, the encapsulation portion 1011D integrally seal its connection, so as to provide a great sealingness and tightness. Therefore, when the photosensitive unit 1010D is used to assemble the camera module, the photosensitive sensor 10121D will be sealed inside the camera module to forms a sealed inner space.

Particularly, in producing the photosensitive unit 1010D, a conventional circuit board can be used to make the main circuit board 10122D. The photosensitive sensor 10121D is deployed on the main circuit board 10122D and electrically connected by the connecting elements 10124D. Then, after the main circuit board 10122D and the photosensitive sensor 10121D are initially assembled, they are processed by Surface Mount Technology (SMT) and then molded by the insert molding technique, for example by means of an injection molding machine, to form the encapsulation portion 1011D, or molded by the pressing molding technique, which is commonly applied in semiconductor packaging, to form the encapsulation portion 1011D. The main circuit board 10122D can selectively be, for example but not limited to, rigid-flex board, ceramic substrate (without flexible board), or rigid PCB (without flexible board). The formation of the encapsulation portion 1011D can be selected by, for example but not limited to, injection molding technique and pressing molding technique. The material of the encapsulation portion 1011D can be, for example but not limited to, nylon, liquid crystal polymer (LCP), or polypropylene (PP) for injection molding technique, or thermoplastic resin or thermosetting resin for pressing molding technique. Person skilled in the art should understand that the above available manufacture methods and available materials are examples to describe available implementations of the present invention, rather than limitations of the present invention.

Furthermore, the encapsulation portion 1011D includes a covering section 10111D, an optical filter installing section 10112D and a camera lens installing section 10113D. The optical filter installing section 10112D and the camera lens installing section 10113D are molded with the covering section 10111D in order to form an integral body. The covering section 10111D is molded on the main circuit board 10122D to wrap up and enclose the circuit element 10123D and the connecting element 10124D. The camera lens installing section 10113D is for mounting a camera lens 1030D thereon. In other words, when the photosensitive unit 1010D is used in assembling the camera module, the camera lens 1030D is mounted within the camera lens installing section 10113D of the encapsulation portion 1011D, which provides a stable mounting site for the camera lens 1030D. The camera lens installing section 10113D defines a lens installing grooves 101131D. The lens installing groove 101131D is communicated with the window 101100D and provides adequate installation space for the camera lens 1030D. In other words, the encapsulation portion 1011D provides an optical filter installing groove 101121D and the lens installing groove 101131D. The optical filter 1020D is molded in the installing groove 101121D. The camera lens 1030D is installed in the lens installing groove 101131D. Referring to FIGS. 19A and 20, the optical filter 1020D is integrally encapsulated on the covering section of the encapsulation portion 1011. In this case, it does not require providing the installing groove 101121D.

The camera lens installing section 10113D is integrally extended upwards to form a step structure therein, so as to provide a supportive mounting site for the camera lens 1030D, so that it does not require extra component for the installation of the camera lens 1030D. In other words, the encapsulation portion 1011D is molded to integrally extend upward and forms an internal step shape structure to encapsulate and to support the camera lens 30D and to support the camera lens.

The tubular camera lens installing section 10113D has a camera lens inner wall 101132D. The camera lens inner wall 101132D is in close ring shape and adapted for providing an installation room for the camera lens 1030D. It is worth mentioning that the surface of the camera lens inner wall 101132D of the camera lens installing section 10113D is flat and smooth, which is adapted for installing the camera lens 1030D that is thread less to form a fixed focus module. Particularly, the camera lens 1030D can be secured in the camera lens installing section 10113D by adhering. Certainly, the camera lens inner wall 201132 can also be in an open ring shape. Therefore, it can be a ring structure with opening(s). Hence, person skilled in the art should understand that the structure of the camera lens inner wall 101132D shall not limit the scope of the present invention.

It is worth mentioning that the inner wall of the covering section 10111D of the encapsulation portion 1011D can be shaped according to the shape of the connecting element. For example, it can be inclined and slope shape, so that the encapsulation portion 11D not only encapsulates and wrap up the connecting elements 10124D, but also ensure the photosensitive sensor 10121D can receive more light through the window 1100D. Person skilled in the art should understand that a specific shape of the encapsulation portion 1011D will not limit the scope of the present invention.

Figure 19B:
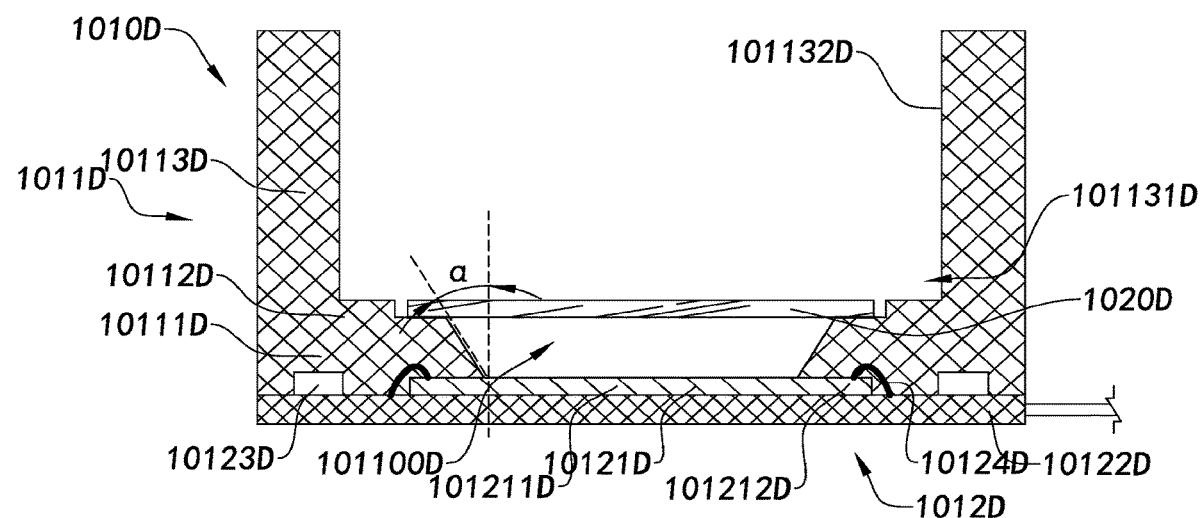
FIG. 19B is an alternative mode of the above fifth preferred embodiment of the present invention.

Referring to FIG. 19B, an alternative mode of the fifth preferred embodiment of the present invention is illustrated, wherein the encapsulation portion 1011D of the photosensitive unit 1010D comprises a covering section 10111D, an optical filter installing section 10112D, and a camera lens installing section 10113D. The optical filter installing section 10112D and the camera lens installing section 10113D are molded integrally and upwardly to extend from the covering section 10111D orderly. The covering section 10111D is molded to attach on the main circuit board 10122D for encapsulating, wrapping up, and covering the circuit elements 10123D and the connecting elements 10124D. The camera lens installing section 10113D is for mounting a camera lens 1030D thereon. In other words, when the photosensitive unit 1010D is used in assembling the camera module, the camera lens 1030D is mounted within the camera lens installing section 10113D of the encapsulation portion 1011D, which provides a stable mounting site for the camera lens 1030D. The camera lens installing section 10113D defines a lens installing grooves 101131D. The lens installing groove 101131D is communicated with the window 101100D and provides adequate installation space for the camera lens 1030D. In other words, the encapsulation portion 1011D provides an installing groove 10112lD and the lens installing groove 10113lD. The optical filter 1020D is molded in the installing groove 10112lD. The camera lens 1030D is installed in the lens installing groove 10113lD.

The camera lens installing section 10113D is integrally extended upwards to form a step structure therein, so as to provide a supportive mounting site for the camera lens 1030D, so that it does not require extra component for the installation of the camera lens 1030D. In other words, the encapsulation portion 1011D is molded to integrally extend upward and forms an internal step shape structure to encapsulate the circuit elements 10123D and the connecting element 1020D and to provide installation sites for the optical filter 1020D and the camera lens 1030D. The camera lens installing section 10113D limits the space of the camera lens and the motor unit 1040, such that the camera lens 1030D or the motor unit 1040D can be fast and accurately mounted on the corresponding position.

The height and structure of the camera lens installing section 10113D can be arranged based on the needs, which can be a closed cylinder structure or a spacing wall or spacing column with gap.

Referring to FIG. 20A, the camera module 10100D according to the fifth preferred embodiment of the present invention is illustrated. The camera module can be an automatic focus module. The camera module includes one the photosensitive unit 1010D and one the camera lens 1030D.

More specifically, the camera lens 1030D is installed in the lens installing groove 10113lD of the camera lens installing section 10113D of the encapsulation portion 1011D of the photosensitive unit 1010D. The optical filter 1020D is molded on the photosensitive unit 1011D. Therefore, no additional independent optical filter is required and it is unnecessary to further separately install the optical filter when assembling the camera module. Hence, the assembling processes can be reduced and the back focal length of the camera module can be decreased due to the molded optical filter arrangement of the present invention.

It is also worth mentioning that the camera lens 1030D is supported in the camera lens installing section 10113D of the encapsulation portion 1011D of the photosensitive unit 1010D. Therefore, the encapsulation portion 1011D would be functioned as the mounting frame or lens barrel of the conventional camera module to provide a supportive and holding site for the camera lens 1030D, but the present invention is assembled by different technical process from conventional COB technology. The mounting frame of the conventional camera module based on conventional COB technique is affixed on the circuit board by adhesive, but the encapsulation portion 1011D of the present invention is affixed on the main circuit board 10122D by means of molding technique that does not require the adhering and affixing process. The molding method with respect to the conventional adhering and affixing method has better connection stability and technological process controllability. Besides, it does not have to reserve any adhesive space between the encapsulation portion 1011D and the main circuit board 10122D for AA adjustment, and thus saves the adhesive space of AA adjustment for conventional camera module, which allows the thickness of the camera module to be further reduced. Also, the encapsulation portion 1011D according to the molding arrangement of the present invention has better smoothness and evenness, so that when assembling the camera module, it is unnecessary to conduct AA adjustment. Furthermore, the encapsulation portion 1011D, which encapsulates and wraps the circuit elements 10123D and the connecting elements 10124D therein, allows the function of the conventional mounting frame, the circuit elements 10123D and the connecting element 10124D being spatially overlapped by molding to fill all the space between the components including the circuit elements 10123D and the connecting elements 10124D to form a solid body, that is distinctive from the conventional camera module that requires to reserve safety distance around all the circuit components. As a result, the height of the encapsulation portion 1011D that can be functioned as the mounting frame can be arranged in a smaller range, so as to further provide room for reducing the thickness of the camera module. Besides, the encapsulation portion 1011D eliminates the conventional mounting frame but provides installing site for the camera lens 1030D by itself, that avoids any tilt deviation generally occurred in attaching and assembling the conventional mounting frame and reduces the accumulated tolerance during the assembling of the camera module. In addition, the encapsulation and wrapping up of the connecting element(s) 10124D by the encapsulation portion 1011D and the inner extension of the encapsulation portion 1011D towards the non-photosensitive area 10121 2D of the photosensitive sensor 10121D enables the size of the encapsulation portion 1011D can be shrunk inwardly, so as to further decrease the lateral sizes in length and width of the camera module.

Figure 20B:
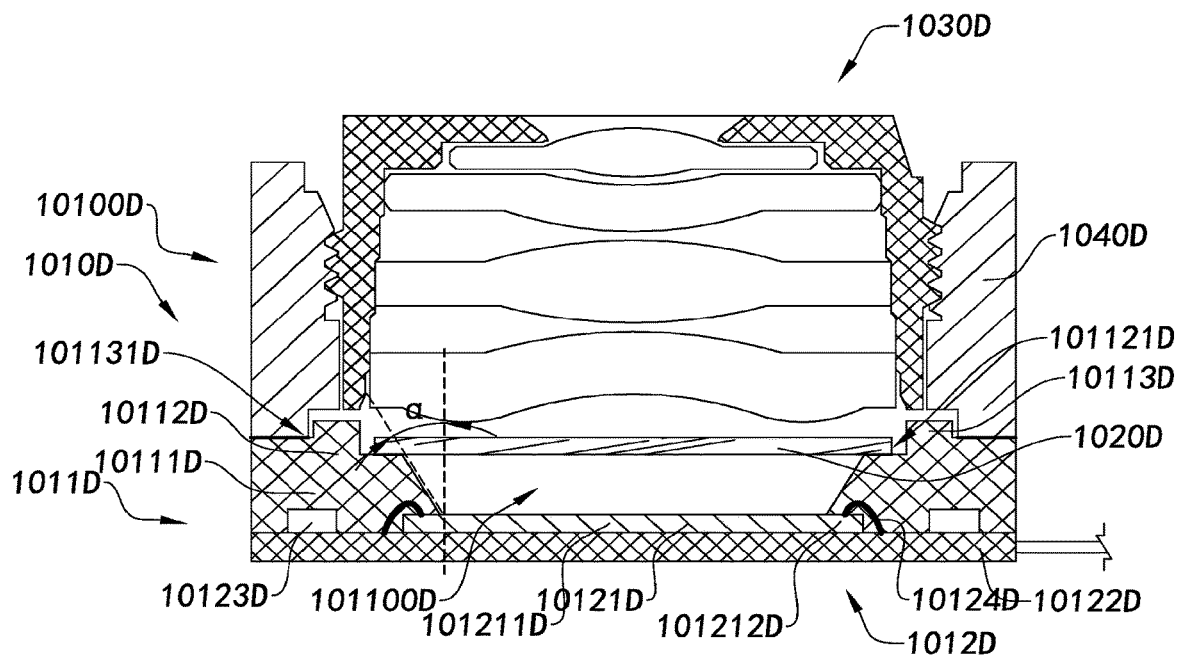
FIG. 20B is a sectional view of a photosensitive unit according to the above fifth preferred embodiment of the present invention.

FIG. 20B is a camera module 10100D according to an alternative mode of the above fifth preferred embodiment of the present invention. Furthermore the encapsulation portion 1011D includes a covering section 10111D, an optical filter installing section 10112D, and a protruding 10113D. The optical filter installing section 10112D and the protruding 10113D are orderly molded with the covering section 10111D in order to form an integral body. The covering section 10111D is molded on the main circuit board 10122D to wrap up and enclose the circuit element 10123D and the connecting element 10124D.

The protruding 10113D is partially upwardly extended from the optical filter installing section 1112D. Also, the optical filter installing section 10112D forms an outer installing groove 10113lD, so as for installing the camera lens 1030D or the motor unit 1040D. Namely, the protruding 10113D separates the installation site of the camera lens 1030D or the motor unit 1040D from the inner space of the photosensitive unit 1010D, so as to avoid the gluing medium, such as the adhesive and etc., of the camera lens 1030D or the motor unit 1040D from being spread to the inner space and polluting the lens of the camera lens 1030D or the interior of the camera module. In other words, the encapsulation portion 1011D provides an installing groove 10112lD and one the outer installing groove 10113lD. The installing groove 101121 is provided on the inner side thereof for installing the optical filter 1020D, while the outer installing groove 10113lD is provided on the outer side thereof for installing the camera lens 1030D or the motor unit 1040D.

Figure 21:
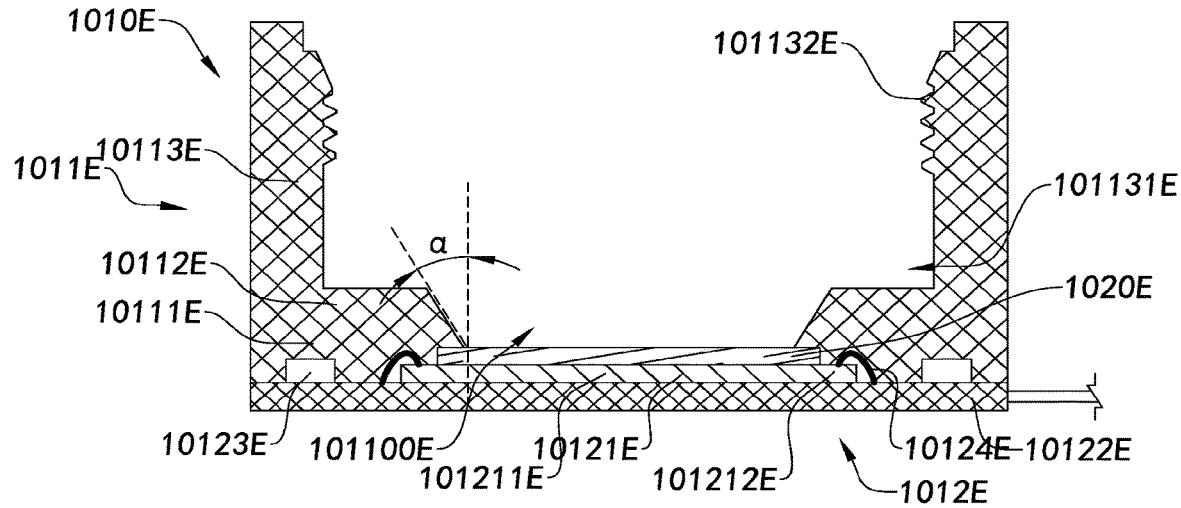
FIG. 21 is a sectional view of a photosensitive unit according to a sixth preferred embodiment of the present invention.
Figure 22:
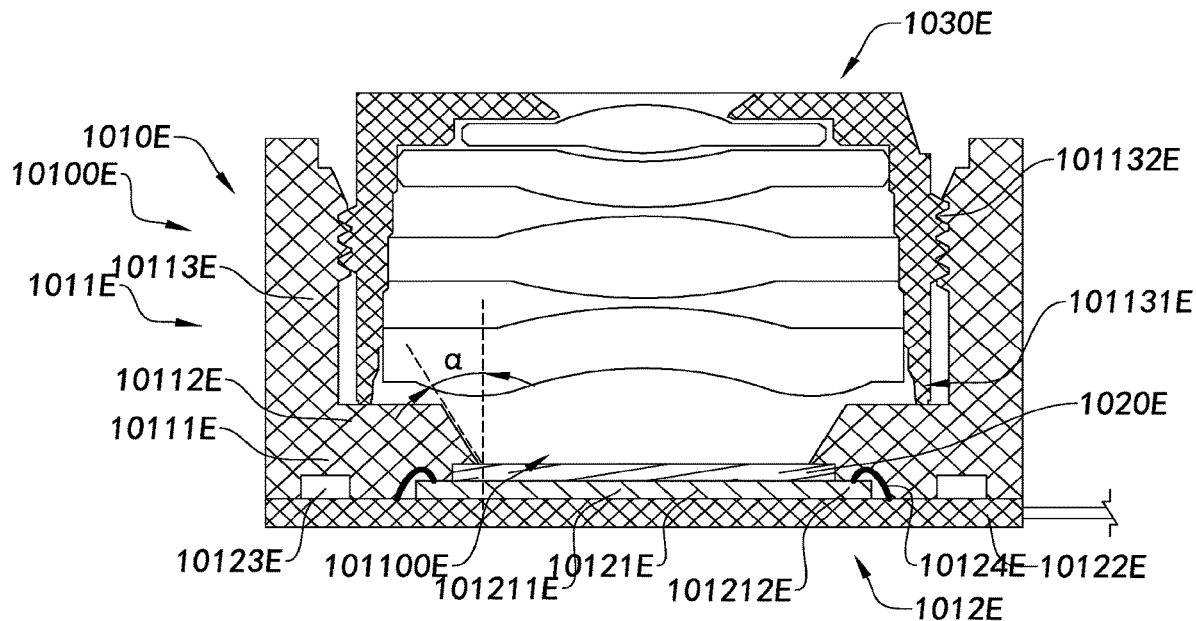
FIG. 22 is a sectional view of the camera module according to an alternative mode of the above sixth preferred embodiment of the present invention.

Referring to FIGS. 21 and 22, the photosensitive unit 1010E and camera module 10100E according to a sixth preferred embodiment of the present invention are illustrated. The photosensitive unit 1010E is adapted for assembling and producing camera module to achieve the molded camera module. The photosensitive unit 1010E includes an encapsulation portion 1011E and a photosensitive portion 1012E, wherein the encapsulation portion 1011E is molded to connect with the photosensitive portion 1012E.

The photosensitive portion 1012E includes a main circuit board 10122E and a photosensitive sensor 10121E, wherein the photosensitive sensor 10121E is disposed on the main circuit board 10122E. According to the present embodiment of the present invention, the photosensitive sensor 10121E is molded to connect to the main circuit board 10122.

According to the present embodiment of the present invention, the photosensitive portion 1012E includes a connecting circuit and at least a circuit element 10123E. The connecting circuit is prearranged in the main circuit board 10122E and the circuit element 10123E is electrically connected to the connecting circuit and the photosensitive sensor 10121E to process the photosensing function for the photosensitive sensor 10121E. The circuit element 10123E is protrudingly deployed on the main circuit board 10122E. The circuit element 10123E can be, for example but not limited to, resistors, capacitors, diodes, triodes, potentiometers, electric relays, actuators, and/or etc.

It is worth mentioning that the encapsulation portion 1011E encapsulates and wraps up the circuit element 10123E therein, so that the circuit element 10123E will not be directly exposed in any space, and more specifically, not be exposed in the environment that communicates with the photosensitive sensor 10121E. Therefore, during the assembling of the camera module, the circuit element 10123E will not contaminate pollutions, such as dusts, or adversely influence the photosensitive sensor 10121E. It is different from the conventional camera module that the circuit element 10123E, such as resistance-capacitance components, is exposed outside. The enclosure and encapsulation of the photosensitive sensor 10121E by molding, sundries and dusts are prevented from staying on the surface of the circuit element 10123E that avoids the photosensitive sensor 10121E from being contaminated and causes dark spots and other defectives of the camera module.

The encapsulation portion 1011E forms a window 101100E to provide a photosensitive path for the photosensitive sensor 10121E.

According to the present fifth preferred embodiment of the present invention, the photosensitive portion 1012E includes at least one connecting element 10124E for electrically connecting the photosensitive sensor 10121E with the main circuit board 10122E. Further, the connecting element 10124E can be embodied to be, for example but not limited to, gold wire, copper wire, aluminum wire, and/or silver wire. Especially, the connecting elements 10124E curvingly connects the photosensitive sensor 10121E and the main circuit board 10122E.

It is worth mentioning that the connecting element 10124E is molded within the encapsulation portion 1011E, so that the encapsulation portion 1011E, encloses, encapsulates and/or wraps up the connecting element(s) 10124E and keep them from direct exposure to the outside. Therefore, during the assembling of the camera module, the connecting element(s) 10124E will not suffer any collision or damage, and, at the same time, it reduces the impact due to the environmental factors, such as temperature, on the connecting element 10124E and stabilizes the communication and connection between the photosensitive sensor 10121E and the main circuit board 10122E. This is completely absent in the traditional art.

It is worth mentioning that the encapsulation portion 1011E encapsulates and wraps up the circuit element 10123E and the connecting element 10124E, which advantages in protecting the circuit element 10123E and the connecting element 10124E as well as obtaining a higher performance camera module. However, those skilled in the art should understand that the encapsulation portion 1011E shall not be limited in wrapping up the circuit element 10123E and/or the connecting element 10124E. In other words, in other embodiments of the present invention, the encapsulation portion 1011E can be directly molded on main circuit board 10122E without protruded circuit element 10123E or be molded on various positions, such as the outer sides, the periphery, and etc., of the circuit element 10123E.

The photosensitive unit 1010E further includes an optical filter 1020E, wherein the optical filter 1020E is molded to be overlappedly disposed on the photosensitive sensor 10121E. The edges of the optical filter 1020E are molded by the encapsulation portion 1011E so as to affix the optical filter 1020E in position. It is worth mentioning that the optical filter 1020E covers on the photosensitive sensor 10121E and insulates the photosensitive sensor 10121E from the external environment to protect the photosensitive sensor 10121E from damage and prevent dusts from entering therein.

In addition, each of the photosensitive sensors 10121E has a photosensitive area 101211E and a non-photosensitive area 101212E, wherein the non-photosensitive area 101212E is positioned surrounding the periphery of the photosensitive area 101211E. The photosensitive area 101211E is adapted for processing photosensitization. The connecting element 10124E is connected to the non-photosensitive area 101212E.

According to the present preferred embodiment of the present invention, the encapsulation portion 1011E is extended to mold on the non-photosensitive area 101212E of the photosensitive sensor 10121E, so as to overlappedly mount the photosensitive sensor 10121E on the main circuit board 10122E by means of molding. In this manner, such as by the method of Molding on Chip, the moldable area of the encapsulation portion 1011E can be extended inwardly, such that the outer structural portion of the encapsulation portion 1011E and the main circuit board 10122E can be reduced, which further reduces the size in length and width of the molded photosensitive portion 1012E and reduces the size in length and width of the camera module assembled thereby.

In the present embodiment of the present invention, the encapsulation portion 1011E is protrudingly positioned surrounding the outer portion of the photosensitive area 101211E of the photosensitive sensor 10121E. Particularly, the encapsulation portion 1011E integrally seal its connection, so as to provide a great sealingness and tightness. Therefore, when the photosensitive unit 1010E is used to assemble the camera module, the photosensitive sensor 10121E will be sealed inside the camera module to forms a sealed inner space.

Particularly, in producing the photosensitive unit 1010E, a conventional circuit board can be used to make the main circuit board 10122E. The photosensitive sensor 10121E is deployed on the main circuit board 10122E and electrically connected by the connecting elements 10124E. Then, after the main circuit board 10122E and the photosensitive sensor 10121E are initially assembled, they are processed by Surface Mount Technology (SMT) and then molded by the insert molding technique, for example by means of an injection molding machine, to form the encapsulation portion 1011E, or molded by the pressing molding technique, which is commonly applied in semiconductor packaging, to form the encapsulation portion 1011E. The main circuit board 10122E can selectively be, for example but not limited to, rigid-flex board, ceramic substrate (without flexible board), or rigid PCB (without flexible board). The formation of the encapsulation portion 1011E can be selected by, for example but not limited to, injection molding technique and pressing molding technique. The material of the encapsulation portion 1011E can be, for example but not limited to, nylon, liquid crystal polymer (LCP), or polypropylene (PP) for injection molding technique, or thermosetting resin or thermosetting resin for pressing molding technique. Person skilled in the art should understand that the above available manufacture methods and available materials are examples to describe available implementations of the present invention, rather than limitations of the present invention.

Furthermore, the encapsulation portion 1011E includes a covering section 10111E and a camera lens installing section 10113E. The camera lens installing section 10113E is integrally molded to be mounted on the covering section 10111E. The covering section 10111E is molded to attach on the main circuit board 10122E for encapsulating and wrapping up the circuit element 10123E and the connecting element 10124E. The camera lens installing section 10113E is for mounting a camera lens 1030E thereon. In other words, when the photosensitive unit 1010E is used in assembling the camera module, the camera lens 1030E is mounted within the camera lens installing section 10113E of the encapsulation portion 1011E, which provides a stable mounting site for the camera lens 1030E.

The camera lens installing section 10113E defines a lens installing grooves 101131E. The lens installing groove 101131E is communicated with the window 101100E and provides adequate installation space for the camera lens 1030E. In other words, the encapsulation portion has one the lens installing groove 101131E, while the camera lens 1030E is mounted on the lens installing groove 101131E.

The camera lens installing section 10113E is integrally extended upwards along the covering portion 10111E to form a step structure therein, so as to provide a supportive mounting site for the camera lens 1030E, so that it does not require extra component for the installation of the camera lens 1030E. In other words, the encapsulation portion 1011E is molded to integrally extend upward and forms an internal step shape structure to encapsulate and to support the camera lens 10124E, and to support the camera lens 1030E.

The tubular camera lens installing section 10113E has a camera lens inner wall 101132E. The camera lens inner wall 101132E is in close ring shape and adapted for providing an installation room for the camera lens 1030E. It is worth mentioning that the surface of the camera lens inner wall 101132E of the camera lens installing section 10113E has a thread structure, which is adapted for installing the camera lens 1030E with thread to form a fixed focus module. Particularly, the camera lens 1030E can be secured in the camera lens installing section 10113E by screwing.

It is worth mentioning that the inner wall of the covering section 10111E of the encapsulation portion 1011 can be shaped according to the shape of the connecting element. For example, it can be inclined and slope shape, so that the encapsulation portion not only encapsulates and wraps up the connecting elements 10124E, but also ensure that the photosensitive sensor 10121E can receive more light through the window. Person skilled in the art should understand that a specific shape of the encapsulation portion 1011E will not limit the scope of the present invention.

Referring to FIG. 22, the camera module 10100E according to a sixth preferred embodiment of the present invention is illustrated. The camera module can be an automatic focus module. The camera module includes one the photosensitive unit 1010E and one the camera lens 1030E.

More specifically, the camera lens 1030E is installed in the lens installing groove 101131E of the camera lens installing section 10113E of the encapsulation portion 1011E of the photosensitive unit 1010E. The optical filter 1020E is molded on the photosensitive unit 1011E. Therefore, no additional independent optical filter is required and it is unnecessary to further separately install the optical filter when assembling the camera module. Hence, the assembling processes of the camera module can be reduced and the back focal length of the camera module can be decreased due to the molded optical filter arrangement of the present invention.

It is also worth mentioning that the camera lens 1030E is supported in the camera lens installing section 10113E of the encapsulation portion 1011E of the photosensitive unit 1010E. Therefore, the encapsulation portion 1011E would be functioned as the mounting frame or lens barrel of the conventional camera module to provide a supportive and holding site for the camera lens 1030E, but the present invention is assembled by different technical process from conventional COB technology. The independent mounting frame of a camera module based on the conventional COB technique is affixed on the circuit board by means of adhering, but the encapsulation portion 1011E of the present invention is affixed on the main circuit board 10122E by means of molding that does not require the process of adhering and affixing. Contrasting to the process of adhering and affixing, the process of molding provides better connection stability and technological process controllability. In addition, it does not have to reserve the adhesive space between the encapsulation portion 1011E and the main circuit board 10122E for AA adjustment. Therefore, it saves the adhesive space of AA adjustment of conventional camera module, and allows the thickness of the camera module to be further reduced. Meanwhile, the encapsulation portion 1011E encapsulates and wraps the circuit elements 10123E and the connecting elements 10124E, that enables the function of the conventional mounting frame, the circuit elements 10123E, and the connecting element 10124E can spatially overlap without the need to reserve a safety distance around the circuit components as in the conventional camera module. As a result, the height of the encapsulation portion 1011E, which functions as the independent mounting frame, can be arranged in a smaller range, so as to further provide room for reducing the thickness of the camera module. Besides, the encapsulation portion 1011E eliminates the conventional mounting frame but provides installing site for the camera lens 1030E by itself, that avoids any tilt deviation generally occurred in attaching and assembling the conventional mounting frame and reduces the accumulated tolerance during the assembling of the camera module. In addition, the encapsulation and wrapping up of the connecting element(s) 10124E by the encapsulation portion 1011E and the inner extension of the encapsulation portion 1011E towards the non-photosensitive area 101212E of the photosensitive sensor 10121E enables the size of the encapsulation portion 1011E can be shrunk inwardly, so as to further decrease the lateral sizes in length and width of the camera module.

Figure 23:
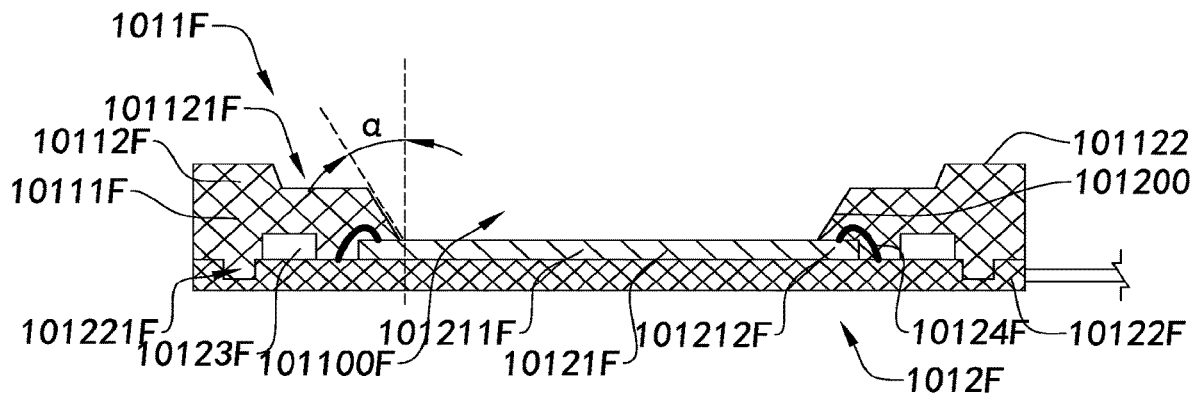
FIG. 23 is a sectional view of a photosensitive unit according to a seventh preferred embodiment of the present invention.
Figure 24:
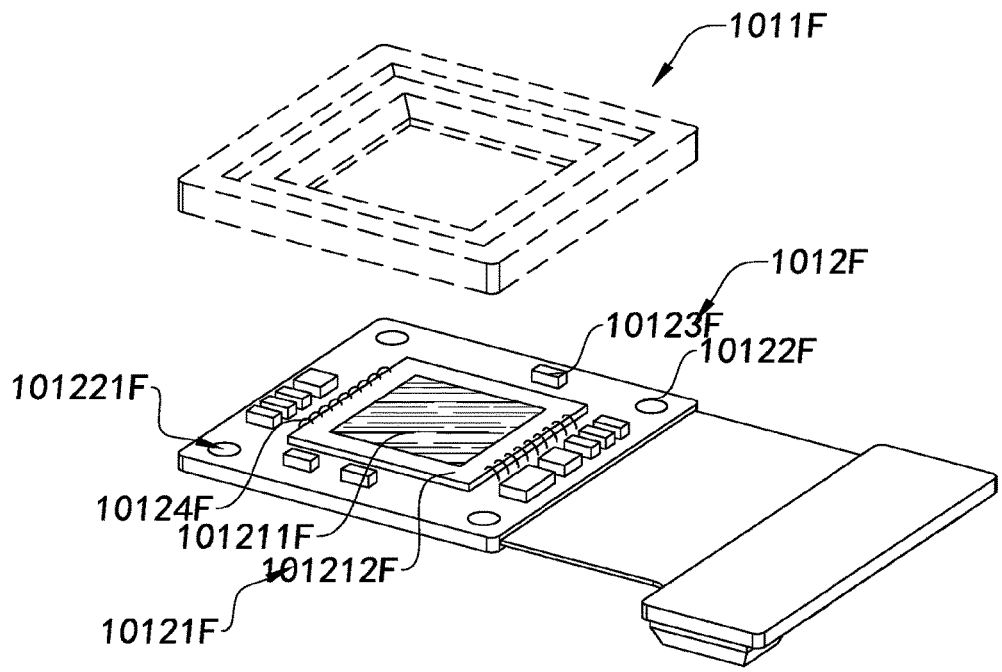
FIG. 24 is an exploded perspective view of a photosensitive unit according to the above seventh preferred embodiment of the present invention.

Referring to FIGS. 23 and 24, a camera module 10100F and a photosensitive unit 1010F according to a seventh preferred embodiment of the present invention is illustrated. The photosensitive unit 1010F is adapted for assembling and producing camera module to achieve the molded camera module. The photosensitive unit 1010F includes an encapsulation portion 1011F and a photosensitive portion 1012F, wherein the encapsulation portion 1011F is molded to connect with the photosensitive portion 1012F.

The photosensitive portion 1012F includes a main circuit board 10122F and a photosensitive sensor 10121F, wherein the photosensitive sensor 10121F is disposed on the main circuit board 10122F. According to the present embodiment of the present invention, the photosensitive sensor 10121F is molded to connect to the main circuit board 10122F.

According to the present embodiment of the present invention, the photosensitive portion 1012F includes a connecting circuit and at least a circuit element 10123F. The connecting circuit is prearranged in the main circuit board 10122F and the circuit element 10123F is electrically connected to the connecting circuit and the photosensitive sensor 10121F to process the photosensing function for the photosensitive sensor 10121F. The circuit element 10123F is protrudingly deployed on the main circuit board 10122F. The circuit element 10123F can be, for example but not limited to, resistors, capacitors, diodes, triodes, potentiometers, electric relays, actuators, or etc.

It is worth mentioning that the encapsulation portion 1011F encapsulates and wraps up the circuit element 10123F therein, so that the circuit element 10123F will not be directly exposed in any space, and more specifically, not be exposed in the environment that communicates with the photosensitive sensor 10121F. Therefore, during the assembling of the camera module, the circuit element 10123F will not contaminate pollutions, such as dusts, or adversely influence the photosensitive sensor 10121F. It is different from the conventional camera module that the circuit element 10123F, such as resistance-capacitance components, is exposed outside. The enclosure and encapsulation of the photosensitive sensor 10121F by molding, sundries and dusts are prevented from staying on the surface of the circuit element 10123F that avoids the photosensitive sensor 10121F from being contaminated and causes dark spots and other defectives of the camera module.

The encapsulation portion 1011F forms a window 101100F to provide a photosensitive path for the photosensitive sensor 10121F.

According to the present fifth preferred embodiment of the present invention, the photosensitive portion 1012F includes at least one connecting element 10124F for electrically connecting the photosensitive sensor 10121F with the main circuit board 10122F. Further, the connecting element 10124F can be embodied to be, for example but not limited to, gold wire, copper wire, aluminum wire, and/or silver wire. Especially, the connecting elements 10124F curvingly connects the photosensitive sensor 10121F and the main circuit board 10122F.

It is worth mentioning that the connecting element 10124F is molded inside the encapsulation portion 1011F, so as to enclose, encapsulate and/or wrap up the connecting element 10124F by the encapsulation portion 1011F to keep them from direct exposure to outside. Therefore, during the assembling of the camera module, the connecting element(s) 10124F will not receive any collision and damage, and, at the same time, it reduces the adverse effect of the connecting element(s) 10124F due to the environmental factors, such as temperature and humidity, so as to ensure a stable communication and connection between the photosensitive sensor 10121F and the main circuit board 10122F. This is completely different from the conventional art.

It is worth mentioning that the encapsulation portion 1011F encapsulates and wraps up the circuit element 10123F and the connecting element 10124F, which advantages in protecting the circuit element 10123F and the connecting element 10124F as well as obtaining a higher performance camera module. However, those skilled in the art should understand that the encapsulation portion 1011F shall not be limited in wrapping up the circuit element 10123F and/or the connecting element 10124F. In other words, in other embodiments of the present invention, the encapsulation portion 1011F can be directly molded on main circuit board 10122F without protruded circuit element 10123F or be molded on various positions, such as the outer sides, the periphery, and etc., of the circuit element 10123F.

In addition, each of the photosensitive sensors 10121F has a photosensitive area 101211F and a non-photosensitive area 101212F, wherein the non-photosensitive area 101212F is positioned surrounding the periphery of the photosensitive area 101211F. The photosensitive area 101211F is adapted for processing photosensitization. The connecting element 10124F is connected to the non-photosensitive area 101212F.

According to the present preferred embodiment of the present invention, the encapsulation portion 1011F is extended to mold on the non-photosensitive area 101212F of the photosensitive sensor 10121F, so as to overlappedly mount the photosensitive sensor 10121F on the main circuit board 10122F by means of molding. In this manner, such as by the method of Molding on Chip, the moldable area is extended towards the inside of the encapsulation portion 1011F, such that the structural portion outside of the encapsulation portion 1011F and the main circuit board 10122F can be reduced, that further reduces the size in length and width of the molded photosensitive portion 1012F and reduces the size in length and width of the camera module assembled thereby.

In the present embodiment of the present invention, the encapsulation portion 1011F is protrudingly positioned surrounding the outer portion of the photosensitive area 101211F of the photosensitive sensor 10121F. Particularly, the encapsulation portion 1011F integrally seal its connection, so as to provide a great sealingness and tightness. Therefore, when the photosensitive unit 1010F is used to assemble the camera module, the photosensitive sensor 10121F will be sealed inside the camera module to forms a sealed inner space.

Particularly, in producing the photosensitive unit 1010F, a conventional circuit board can be used to make the main circuit board 10122F. The photosensitive sensor 10121F is deployed on the main circuit board 10122F and electrically connected by the connecting elements 10124F. Then, after the main circuit board 10122F and the photosensitive sensor 10121F are initially assembled, they are processed by Surface Mount Technology (SMT) and then molded by the insert molding technique, for example by means of an injection molding machine, to form the encapsulation portion 1011F, or molded by the pressing molding technique, which is commonly applied in semiconductor packaging, to form the encapsulation portion 1011F. The main circuit board 10122F can selectively be, for example but not limited to, rigid-flex board, ceramic substrate (without flexible board), or rigid PCB (without flexible board). The formation of the encapsulation portion 1011F can be selected by, for example but not limited to, injection molding technique and pressing molding technique. The material of the encapsulation portion 1011F can be, for example but not limited to, nylon, liquid crystal polymer (LCP), or polypropylene (PP) for injection molding technique, or thermoplastic resin or thermosetting resin for pressing molding technique. Person skilled in the art should understand that the above available manufacture methods and available materials are examples to describe available implementations of the present invention, rather than limitations of the present invention.

Furthermore, the encapsulation portion 1011F includes a covering section 10111F and an optical filter installing section 10112F. The optical filter installing section 10112F is molded integrally to connect with the covering section

10111F. The covering section 10111F is molded to attach on the main circuit board 10122F for encapsulating and wrapping up the circuit element 10123F and the connecting element 10124F. The optical filter installing section 10112F is arranged for installing an optical filter 1020F. In other words, when the photosensitive unit 1010F is used to assemble the camera module, the optical filter 1020F of the camera module will be mounted at the optical filter installing section 10112F, which makes the optical filter 1020F be positioned along the photosensitive path of the photosensitive sensor 10121F without the need of any additional mounting frame of the optical filter. In other words, the encapsulation portion 1011F of the present embodiment has a function as a conventional optical filter frame while the top portion of the optical filter installing section 10112F has a good evenness and smoothness by means of the molding technique, that enables the optical filter 1020F to be installed evenly, that is superior to conventional camera modules.

In addition, the optical filter installing section 10112F has an installing groove 101121F. The installing groove 101121F is communicated with the window 101100F to provide an adequate installation space for the optical filter 1020F such that the optical filter 1020F will not protrude from the top surface 101122F of the optical filter installing section 10112F. In other words, the top of the encapsulation portion 1011F with the installing groove 101121F provided therein is adapted for the optical filter 1020F to be installed on the encapsulation portion 1011F without protruding out from the top of the encapsulation portion 1011F.

It is worth mentioning that the inner wall of the encapsulation portion 1011F can be shaped according to the need of the object, such as connecting element 10124F, to be installed. For example, the inner wall can be in an inclined and slope shape, so that by the time the connecting element(s) 10124F is wrapped up by the encapsulation portion 1011F, the photosensitive sensor 10121F can receive as much light as possible. Person skilled in the art should understand that a specific shape of the encapsulation portion 1011F will not limit the scope of the present invention.

The differences between this seventh preferred embodiment with the other preferred embodiments of the present invention, one or more reinforced holes 101221F are formed on top of the main circuit board 10122F and the bottom of the encapsulation portion 1011F is molded to extend into the reinforced holes 101221F, so as to enhance the structural strength of the main circuit board 10122F and connection of the main circuit board 10122F and the encapsulation portion 1011F. In other words, the combination of two different materials forms a combined composite structure that reinforces the structural strength of the main circuit board 10122F, as a base.

The positions of the reinforced holes 101221F can be determined based on practical needs. Also, based on the need of the structural strength of the circuit board, the reinforced holes 10224D can be, for example, arranged in a symmetrical construction. By reinforcing the structural strength of the main circuit board 10122F with such reinforced holes 101221F which are filled with the encapsulation portion, the thickness of the main circuit board 10122F and the thickness of the camera module assembled thereof can thus be reduced. Besides, the heat dissipative ability of the photosensitive unit 1010F is enhanced as well.

It is worth mentioning that, according to the present seventh preferred embodiment of the present invention, the reinforced holes 101221F are indented slots that avoid the molding material of the encapsulation portion 1011F from leaking through the reinforced holes 101221F when molding to make the photosensitive unit 1010F.

Similar to the above preferred embodiments, the photosensitive unit 1010F can be assembled for a fixed focus module or zoom lens module. Those skilled in the art should understand that the assembling and application ways of the photosensitive unit 1010F shall not considered be limitations of the present invention.

Figure 25:
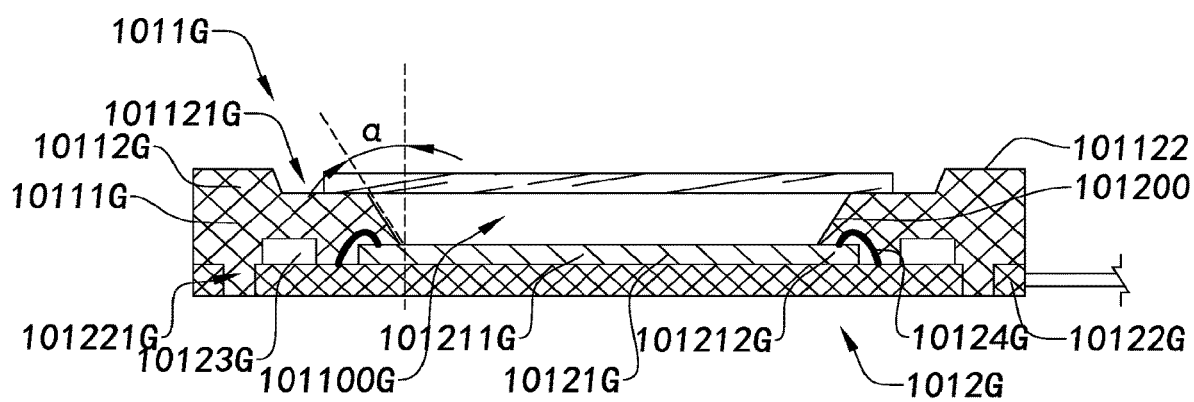
FIG. 25 is a sectional view of a photosensitive unit of the camera module according to an eighth preferred embodiment of the present invention.

Referring to FIG. 25, a photosensitive unit 1010G according to an eighth preferred embodiment of the present invention is illustrated. The photosensitive unit 1010G is adapted for assembling and producing camera module to achieve the molded camera module. The photosensitive unit 1010G includes an encapsulation portion 1011G and a photosensitive portion 1012G, wherein the encapsulation portion 1011G is molded to connect with the photosensitive portion 1012G.

The photosensitive portion 1012G includes a main circuit board 10122G and a photosensitive sensor 10121G, wherein the photosensitive sensor 10121G is disposed on the main circuit board 10122G. According to the present embodiment of the present to invention, the photosensitive sensor 10121G is molded to connect to the main circuit board 10122.

According to the present embodiment of the present invention, the photosensitive portion 1012G includes a connecting circuit and at least a circuit element 10123G. The connecting circuit is prearranged in the main circuit board 10122G and the circuit element 10123G is electrically connected to the connecting circuit and the photosensitive sensor 10121G to process the photosensing function for the photosensitive sensor 10121G. The circuit element 10123G is protrudingly deployed on the main circuit board 10122G. The circuit element 10123G can be, for example but not limited to, resistors, capacitors, diodes, triodes, potentiometers, electric relays, actuators, and/or etc.

It is worth mentioning that the encapsulation portion 1011G encapsulates and wraps up the circuit element 10123G therein, so that the circuit element 10123G will not be directly exposed in any space, and more specifically, not be exposed in the environment that communicates with the photosensitive sensor 10121G. Therefore, during the assembling of the camera module, the circuit element 10123G will not contaminate pollutions, such as dusts, or adversely influence the photosensitive sensor 10121G. It is different from the conventional camera module that the circuit element 10123G, such as resistance-capacitance components, is exposed outside. The enclosure and encapsulation of the photosensitive sensor 10121G by molding, sundries and dusts are prevented from staying on the surface of the circuit element 10123G that avoids the photosensitive sensor 10121G from being contaminated and causes dark spots and other defectives of the camera module.

The encapsulation portion 1011G forms a window 101100G to provide a photosensitive path for the photosensitive sensor 10121G.

According to the present fifth preferred embodiment of the present invention, the photosensitive portion 1012G includes at least one connecting element 10124G for electrically connecting the photosensitive sensor 10121G with the main circuit board 10122G. Further, the connecting element 10124G can be embodied to be, for example but not limited to, gold wire, copper wire, aluminum wire, and/or silver wire. Especially, the connecting elements 10124G curvingly connects the photosensitive sensor 10121G and the main circuit board 10122G.

It is worth mentioning that the connecting element 10124G is molded within the encapsulation portion 1011G, so that the encapsulation portion 1011G, encloses, encapsulates and/or wraps up the connecting element(s) 10124G and keep them from direct exposure to the outside. Therefore, during the assembling of the camera module, the connecting element(s) 10124G will not suffer any collision or damage, and, at the same time, it reduces the impact due to the environmental factors, such as temperature, on the connecting element 10124G and stabilizes the communication and connection between the photosensitive sensor 10121G and the main circuit board 10122G. This is completely absent in the traditional art.

It is worth mentioning that the encapsulation portion 1011G encapsulates and wraps up the circuit element 10123G and the connecting element 10124G, which advantages in protecting the circuit element 10123G and the connecting element 10124G as well as obtaining a higher performance camera module. However, those skilled in the art should understand that the encapsulation portion 1011G shall not be limited in wrapping up the circuit element 10123G and/or the connecting element 10124G. In other words, in other embodiments of the present invention, the encapsulation portion 1011G can be directly molded on main circuit board 10122G without protruded circuit element 10123G or be molded on various positions, such as the outer sides, the periphery, and etc., of the circuit element 10123G.

In addition, each of the photosensitive sensors 10121G has a photosensitive area 101211G and a non-photosensitive area 101212G, wherein the non-photosensitive area 101212G is positioned surrounding the periphery of the photosensitive area 101211G. The photosensitive area 101211G is adapted for processing photosensitization. The connecting element 10124G is connected to the non-photosensitive area 101212G.

According to the present preferred embodiment of the present invention, the encapsulation portion 1011G is extended to mold on the non-photosensitive area 101212G of the photosensitive sensor 10121G, so as to overlappedly mount the photosensitive sensor 10121G on the main circuit board 10122G by means of molding. In this manner, such as by the method of Molding on Chip, the moldable area of the encapsulation portion 1011G can be extended inwardly, such that the outer structural portion of the encapsulation portion 1011G and the main circuit board 10122G can be reduced, which further reduces the size in length and width of the molded photosensitive portion 1012G and reduces the size in length and width of the camera module assembled thereby.

In the present embodiment of the present invention, the encapsulation portion 1011G is protrudingly positioned surrounding the outer portion of the photosensitive area 101211G of the photosensitive sensor 10121G. Particularly, the encapsulation portion 1011G integrally seal its connection, so as to provide a great sealingness and tightness. Therefore, when the photosensitive unit 1010G is used to assemble the camera module, the photosensitive sensor 10121G will be sealed inside the camera module to forms a sealed inner space.

Particularly, in producing the photosensitive unit 1010G, a conventional circuit board can be used to make the main circuit board 10122G. The photosensitive sensor 10121G is deployed on the main circuit board 10122G and electrically connected by the connecting elements 10124G. Then, after the main circuit board 10122G and the photosensitive sensor 10121G are initially assembled, they are processed by Surface Mount Technology (SMT) and then molded by the insert molding technique, for example by means of an injection molding machine, to form the encapsulation portion 1011G, or molded by the pressing molding technique, which is commonly applied in semiconductor packaging, to form the encapsulation portion 1011G. The main circuit board 10122G can selectively be, for example but not limited to, rigid-flex board, ceramic substrate (without flexible board), or rigid PCB (without flexible board). The formation of the encapsulation portion 1011G can be selected by, for example but not limited to, injection molding technique and pressing molding technique. The material of the encapsulation portion 1011G can be, for example but not limited to, nylon, liquid crystal polymer (LCP), or polypropylene (PP) for injection molding technique, or thermoplastic resin or thermosetting resin for pressing molding technique. Person skilled in the art should understand that the above available manufacture methods and available materials are examples to describe available implementations of the present invention, rather than limitations of the present invention.

Furthermore, the encapsulation portion 1011G includes a covering section 10111G and an optical filter installing section 10112G. The optical filter installing section 10112G is molded integrally to connect with the covering section 10111G. The covering section 10111G is molded to attach on the main circuit board 10122G for encapsulating and wrapping up the circuit element 10123G and the connecting element 10124G. The optical filter installing section 10112G is arranged for installing an optical filter 1020G. In other words, when the photosensitive unit 1010G is used to assemble the camera module, the optical filter 1020G of the camera module will be mounted at the optical filter installing section 10112G, which makes the optical filter 1020G be positioned along the photosensitive path of the photosensitive sensor 10121G without the need of any additional mounting frame of the optical filter 1020G. In other words, the encapsulation portion 1011G of the present embodiment has a function as a conventional optical filter frame while the top portion of the optical filter installing section 10112G has a good evenness and smoothness by means of the molding technique, that enables the optical filter 1020G to be installed evenly, that is superior to conventional camera modules.

In addition, the optical filter installing section 10112G has an installing groove 101121G. The installing groove is communicated with the window 101100G to provide an adequate installation space for the optical filter 1020G such that the optical filter 1020G will not protrude from the top surface 101122G of the optical filter installing section 10112G. In other words, the top of the encapsulation portion 1011F with the installing groove 101121F provided therein is adapted for the optical filter 1020F to be installed on the encapsulation portion 1011F without protruding out from the top of the encapsulation portion 1011F.

It is worth mentioning that the inner wall of the encapsulation portion 1011G can be shaped according to the shape of the connecting element. For example, it can be an inclined and slope shape, so that the photosensitive sensor 10121G can receive more light while the connecting element 10124G is encapsulated and wrapped by the encapsulation portion 1011G. Person skilled in the art should understand that a specific shape of the encapsulation portion 1011G will not limit the scope of the present invention The differences between this seventh preferred embodiment with the other preferred embodiments of the present invention include one or more reinforced holes 101221G which are formed on top of the main circuit board 10122G and the bottom of the encapsulation portion 1011G which is molded to extend into the reinforced holes 101221G, so as to enhance the structural strength of the main circuit board 10122G and connection of the main circuit board 122F and the encapsulation portion 11F. In other words, the combination of two different materials forms a combined composite structure that reinforces the structural strength of the main circuit board 10122G, as a base.

The positions of the reinforced holes 101221G can be determined based on practical needs. Also, based on the need of the structural strength of the circuit board, the reinforced holes 10224D can be, for example, arranged in a symmetrical construction. By reinforcing the structural strength of the main circuit board 10122G with such reinforced holes 101221G which are filled with the encapsulation portion, the thickness of the main circuit board 10122G and the thickness of the camera module assembled thereof can thus be reduced. Besides, the heat dissipative ability of the photosensitive unit 1010G is enhanced as well.

It is worth mentioning that, according to the present preferred embodiment of the present invention, the reinforced holes 101221G are through holes penetrating through the main circuit board 10122G to communicate both sides of the main circuit board 10122G. Therefore, during the production of the photosensitive unit 1010G, the molding material of the encapsulation portion 1011G can be fully bonded with the main circuit board 10122G to form a more solid structure of combined composite material. Besides, the through hole type reinforced hole of this eighth preferred embodiment would be more easy to make than the indention type reinforced hole in the above seventh preferred embodiment.

Similar to the above preferred embodiments, the photosensitive unit 1010G can be assembled for a fixed focus module or zoom lens module. Those skilled in the art should understand that the assembling and application ways of the photosensitive unit 1010G shall not considered be limitations of the present invention.

Figure 26:
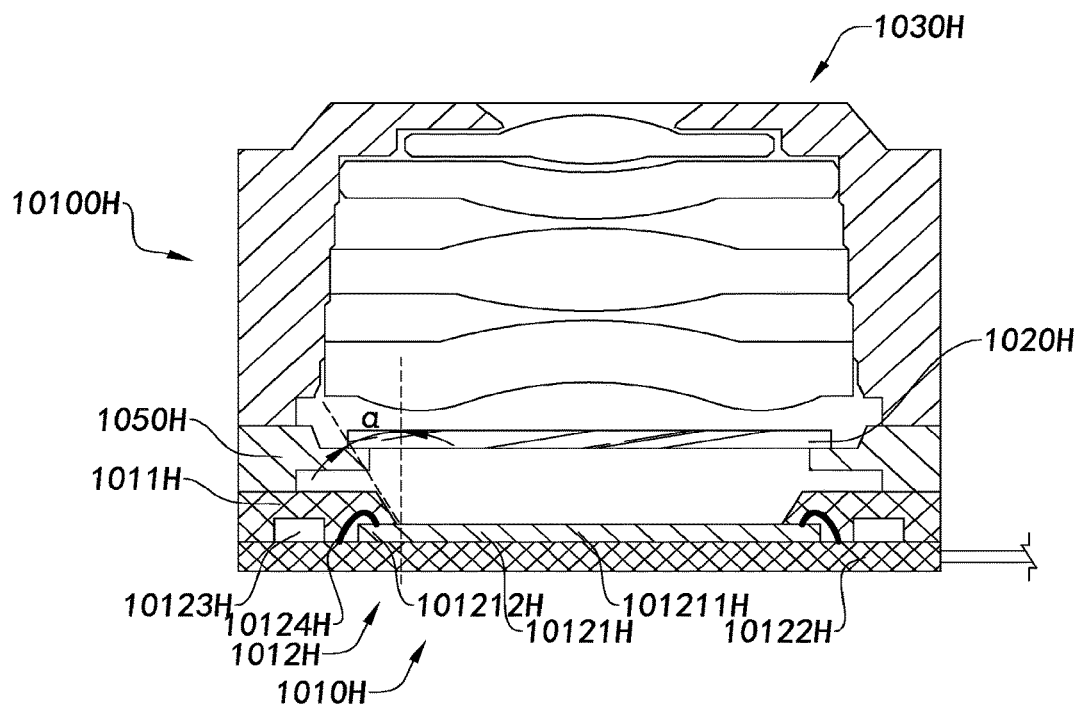
FIG. 26 is a sectional view of the camera module according to a ninth preferred embodiment of the present invention.

Referring to FIG. 26, the camera module 10100H according to a ninth preferred embodiment of the present invention is illustrated. The camera module can be a fixed focus module (FFM). The camera module 10100H includes a photosensitive unit 1010H, a frame 1050H, an optical filter 1020H, and a camera lens 1030H.

The frame 1050H is mounted on the photosensitive unit 1010H, wherein the optical filter 1020H is mounted on the frame 1050H and the camera lens 1030H is mounted on the frame 1050H.

The photosensitive unit 1010H includes an encapsulation portion 1011H and a photosensitive portion 1012H, wherein the encapsulation portion 1011H is molded to connect with the photosensitive portion 1012H.

The photosensitive portion 1012H includes a main circuit board 10122H and a photosensitive sensor 10121H, wherein the photosensitive sensor 10121H is disposed on the main circuit board 10122H. According to the present embodiment of the present invention, the photosensitive sensor 10121H is molded to connect to the main circuit board 10122.

According to the present embodiment of the present invention, the photosensitive portion 1012H includes a connecting circuit and at least a circuit element 10123H. The connecting circuit is prearranged in the main circuit board 10122H and the circuit element 10123H is electrically connected to the connecting circuit and the photosensitive sensor 10121H to process the photosensing function for the photosensitive sensor 10121H. The circuit element 10123H is protrudingly deployed on the main circuit board 10122H. The circuit element 10123H can be, for example but not limited to, resistors, capacitors, diodes, triodes, potentiometers, electric relays, actuators, and/or etc.

It is worth mentioning that the encapsulation portion 1011H encapsulates and wraps up the circuit element 10123H therein, so that the circuit element 10123H will not be directly exposed in any space, and more specifically, not be exposed in the environment that communicates with the photosensitive sensor 10121H. Therefore, during the assembling of the camera module, the circuit element 10123H will not contaminate pollutions, such as dusts, or adversely influence the photosensitive sensor 10121H. It is different from the conventional camera module that the circuit element 10123H, such as resistance-capacitance components, is exposed outside. The enclosure and encapsulation of the photosensitive sensor 10121H by molding, sundries and dusts are prevented from staying on the surface of the circuit element 10123H that avoids the photosensitive sensor 10121H from being contaminated and causes dark spots and other defectives of the camera module.

The encapsulation portion 1011H forms a window 101100H to provide a photosensitive path for the photosensitive sensor 10121H.

According to the present fifth preferred embodiment of the present invention, the photosensitive portion 1012H includes at least one connecting element 10124H for electrically connecting the photosensitive sensor 10121H with the main circuit board 10122H. Further, the connecting element 10124H can be embodied to be, for example but not limited to, gold wire, copper wire, aluminum wire, and/or silver wire. Especially, the connecting elements 10124H curvingly connects the photosensitive sensor 10121H and the main circuit board 10122H.

It is worth mentioning that the connecting element 10124H is molded within the encapsulation portion 1011H, so that the encapsulation portion 1011H, encloses, encapsulates and/or wraps up the connecting element(s) 10124H and keep them from direct exposure to the outside. Therefore, during the assembling of the camera module, the connecting element(s) 10124H will not suffer any collision or damage, and, at the same time, it reduces the impact due to the environmental factors, such as temperature, on the connecting element 10124H and stabilizes the communication and connection between the photosensitive sensor 10121H and the main circuit board 10122H. This is completely absent in the traditional art.

It is worth mentioning that the encapsulation portion 1011H encapsulates and wraps up the circuit element 10123H and the connecting element 10124H, which advantages in protecting the circuit element 10123H and the connecting element 10124H as well as obtaining a higher performance camera module. However, those skilled in the art should understand that the encapsulation portion 1011H shall not be limited in wrapping up the circuit element 10123H and/or the connecting element 10124H. In other words, in other embodiments of the present invention, the encapsulation portion 1011H can be directly molded on main circuit board 10122H without protruded circuit element 10123H or be molded on various positions, such as the outer sides, the periphery, and etc., of the circuit element 10123H.

In addition, each of the photosensitive sensors 10121H has a photosensitive area 101211H and a non-photosensitive area 101212H, wherein the non-photosensitive area 101212H is positioned surrounding the periphery of the photosensitive area 101211H. The photosensitive area 101211H is adapted for processing photosensitization. The connecting element 10124H is connected to the non-photosensitive area 101212H.

According to the present preferred embodiment of the present invention, the encapsulation portion 1011H is extended to mold on the non-photosensitive area 101212H of the photosensitive sensor 10121H, so as to overlappedly mount the photosensitive sensor 10121H on the main circuit board 10122H by means of molding. In this manner, such as by the method of Molding on Chip (MOC), the moldable area of the encapsulation portion 1011H can be extended inwardly, such that the outer structural portion of the encapsulation portion 1011H and the main circuit board 10122H can be reduced that further reduces the size in length and width of the molded photosensitive portion 1012H and reduces the size in length and width of the camera module assembled thereby.

In the present embodiment of the present invention, the encapsulation portion 1011H is protrudingly positioned surrounding the outer portion of the photosensitive area 101211H of the photosensitive sensor 10121H. Particularly, the encapsulation portion 1011H integrally seal its connection, so as to provide a great sealingness and tightness. Therefore, when the photosensitive unit 1010H is used to assemble the camera module, the photosensitive sensor 10121H will be sealed inside the camera module to forms a sealed inner space.

Particularly, in producing the photosensitive unit 1010H, a conventional circuit board can be used to make the main circuit board 10122H. The photosensitive sensor 10121H is deployed on the main circuit board 10122H and electrically connected by the connecting elements 10124H. Then, after the main circuit board 10122H and the photosensitive sensor 10121H are initially assembled, they are processed by Surface Mount Technology (SMT) and then molded by the insert molding technique, for example by means of an injection molding machine, to form the encapsulation portion 1011H, or molded by the pressing molding technique, which is commonly applied in semiconductor packaging, to form the encapsulation portion 1011H. The main circuit board 10122H can selectively be, for example but not limited to, rigid-flex board, ceramic substrate (without flexible board), or rigid PCB (without flexible board). The formation of the encapsulation portion 1011H can be selected by, for example but not limited to, injection molding technique and pressing molding technique. The material of the encapsulation portion 1011H can be, for example but not limited to, nylon, liquid crystal polymer (LCP), or polypropylene (PP) for injection molding technique, or thermoplastic resin or thermosetting resin for pressing molding technique. Person skilled in the art should understand that the above available manufacture methods and available materials are examples to describe available implementations of the present invention, rather than limitations of the present invention.

The encapsulation portion 1011H provides an installation site for the frame 1050H based on the advantage of the molding technology. The encapsulation portion 1011H can be molded to achieve good flatness and evenness, so as to allow the frame 1050H to be evenly and levelly installed.

It is worth mentioning that the inner wall of the encapsulation portion 1011H can be shaped according to the shape of the connecting element. For example, it can be an inclined and slope shape, so that the photosensitive sensor 10121H can receive more light while the connecting element 10124H is encapsulated and wrapped by the encapsulation portion 1011H. Person skilled in the art should understand that a specific shape of the encapsulation portion 1011H will not limit the scope of the present invention.

In other embodiments of the present invention, the photosensitive unit can also be assembled into an automatic focus camera module, so as to change the focal length of the camera module. Therefore, person skilled in the art should understand that the type of the camera module shall not limit the scope of the present invention.

Figure 27:
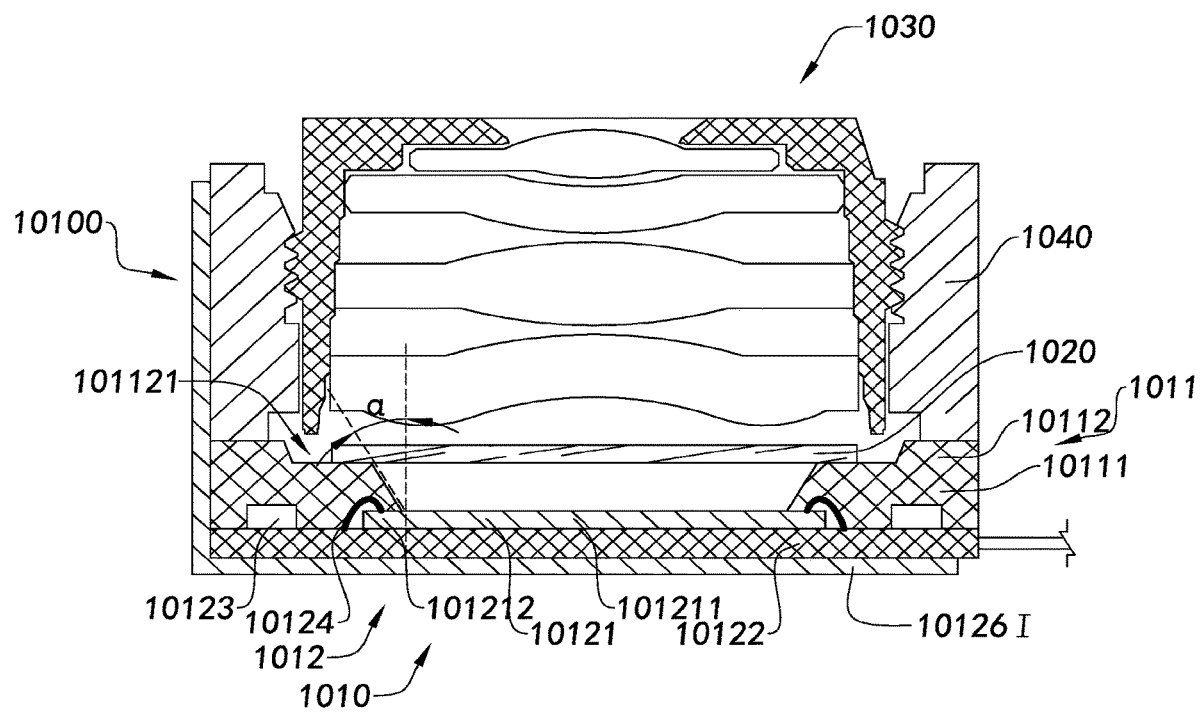
FIG. 27 is a sectional view of the camera module according to a tenth preferred embodiment of the present invention.

Referring to FIG. 27, the photosensitive unit 1010 and camera module 10100 according to a tenth preferred embodiment of the present invention are illustrated. The different of this tenth preferred embodiment with respect to the other preferred embodiments, the photosensitive unit 1010 includes a shielding layer 10126I that covers the main circuit board 10122 and the encapsulation portion 1011, so as to not only reinforce the structural strength of the main circuit board 10122, but also enhance an electromagnetic immunity ability of the photosensitive unit 1010.

Furthermore, the shielding layer 10126I is a metal layer that can be made in form of plate structure or net structure.

Figure 28:
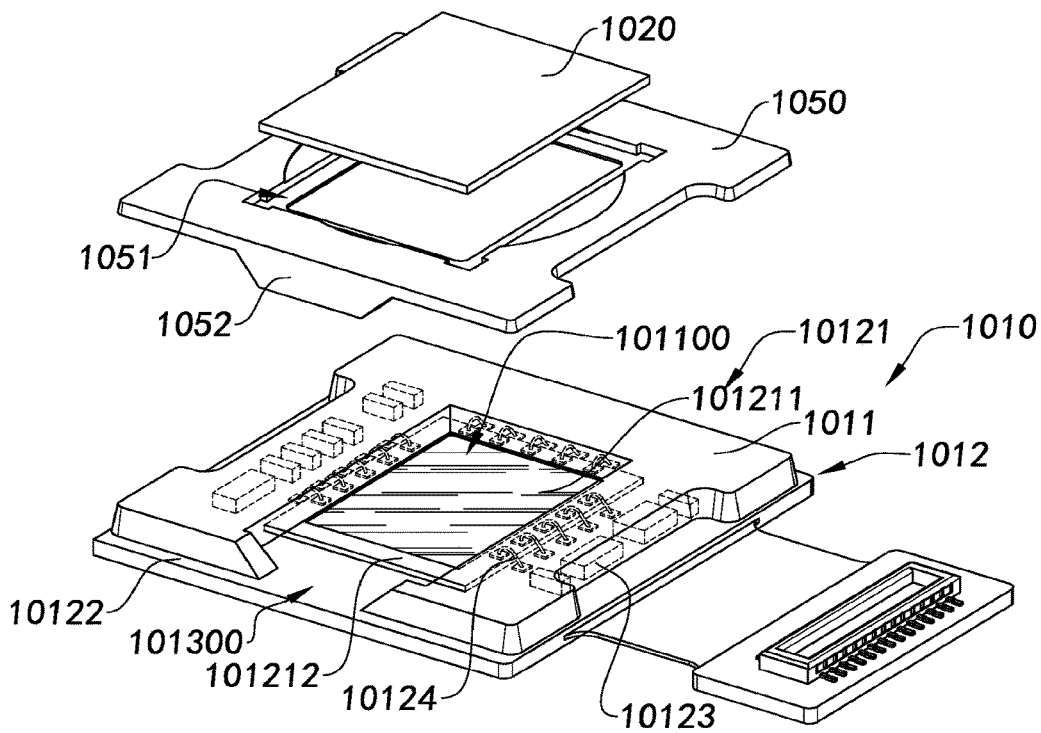
FIG. 28 is a sectional view of a photosensitive unit according to an eleventh preferred embodiment of the present invention.

Referring to FIG. 28, a photosensitive unit 1010 according to an eleventh preferred embodiment of the present invention is illustrated. The photosensitive unit 1010 comprises a frame 1050. The frame 1050 is coupled on the encapsulation portion 1011, so as to form a surroundingly closed window 101100 with the encapsulation portion 1011.

Further, the encapsulation portion 1011 has a notch 101300. The frame 1050 is fillingly arranged on the notch 101300, so as to close the notch 101300 and make the window 101100. In other words, the encapsulation portion 1011 is not a close ring shaped structure, but it becomes a surroundingly closed structure after the frame 1050 is coupled therewith.

The frame 1050 has an optical filter groove 1051, configured for installing the optical filter 1020. The frame 1050 is added on the encapsulation portion 1011, so as for providing an installation site for the optical filter 1020.

The frame 1050 comprises an extended leg 1052 that fills in the notch 101300 and extends to connect with the main circuit board 10122, so as to close the notch 101300 to create closure of the window 101100.

In the implementation illustrated in the figure, the encapsulation portion 1011 forms a platform structure that supports the frame 1050 and the frame 1050 provides an installation site for the optical filter 1020. According to another embodiment of the present invention, the encapsulation portion can also have the optical filter installing groove arranged thereon for installing the frame 1050, wherein the extended leg 1052 is extended to be connected with the main circuit board 10122. Further, the structures of the notch 101300 of the encapsulation portion 1011 and the extended leg 1052 of the frame can be wedge-shaped, so as for the frame 1050 to be smoothly and stably mounted on the encapsulation portion 1011. Certainly, in other embodiments of the present invention, the frame 1050 can also be formed into other shapes. Therefore, person skilled in the art should understand that the structure of the frame 1050 shall not limit the scope of the present invention.

Further, the frame 1050 is extended downward to be connected with the main circuit board 10122. The connection is through, for example but not limited to, adhesive.

In other words, in this implementation, at least part of the non-photosensitive area 101212 of the photosensitive sensor 10121 is integrally encapsulated by the encapsulation portion 1011, and at least part of the non-photosensitive area 101212 is not integrally encapsulated by the encapsulation portion 1011. The non-photosensitive area 101212 that was not integrally encapsulated by the encapsulation portion 1011 is corresponding to the extended position of the frame 1050.

Figure 29:
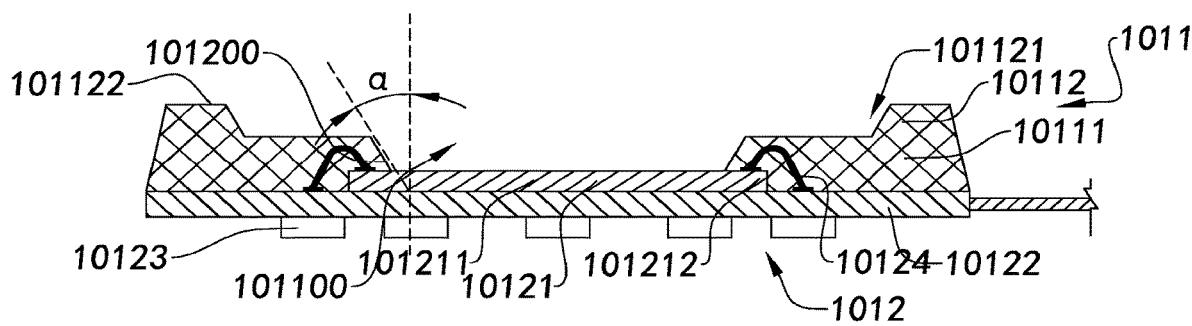
FIG. 29 is a sectional view of a photosensitive unit according to a twelfth preferred embodiment of the present invention.

Referring to FIG. 29, a photosensitive unit 1010 according to a twelfth preferred embodiment of the present invention is illustrated. In this implementation, the circuit element 10123 is deployed on the back side of the main circuit board 10122. For instance, a plurality of the circuit elements 10123 are spacingly attached on the back side of the main circuit board 10122. In other words, the circuit element may not be deployed on the front side of the main circuit board 10122, which is, not be deployed around the photosensitive sensor 10121, such that it does not have to reserve installation site for the circuit element 10123 around the photosensitive sensor on the front side of the circuit board. Therefore, it can reduce the size in length and width of the main circuit board 10122, so as to reduce the size in length and width of the camera module and allow the camera module to be utilized in the electronic devices that are expected to be more compact.

The circuit element 10123 is deployed on the back side of the main circuit board 10122. In other words, the circuit element 10123 can be deployed on the back side of the main circuit board 10122 at the position corresponding to the photosensitive sensor 10121, such that there can be a larger area available for deploying the circuit element 10123. When the circuit element 10123 is deployed on the front side of the main circuit board 10122, it can only be arranged around the periphery of the photosensitive sensor 10121. As a result, it will require the main circuit board 10122 to be larger. Moreover, when the encapsulation portion 1011 is being formed, because the encapsulation portion 1011 has to encapsulate, wrap up and/or enclose the circuit element 10123, it will also require the encapsulation portion 1011 to be larger. All these limit the potential of size deduction of the photosensitive unit 1010 and the camera module to a certain extent.

Figure 30:
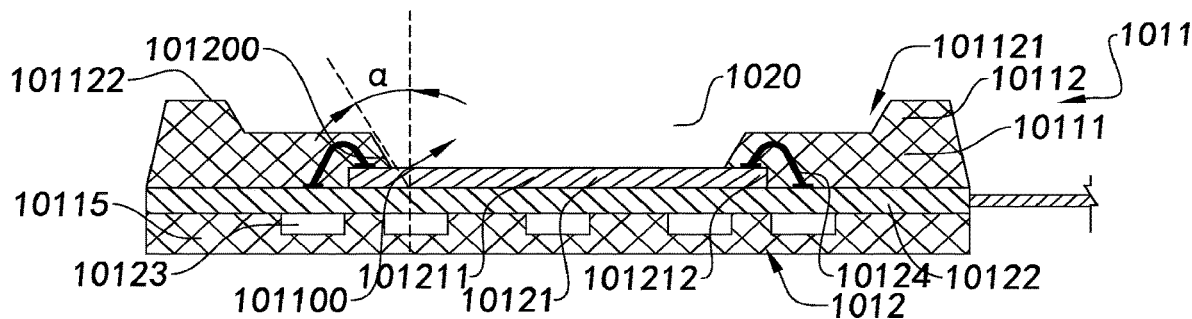
FIG. 30 is the photosensitive unit according to an alternative mode of the above twelfth preferred embodiment of the present invention.

Referring to FIG. 30, in the photosensitive unit 1010 according to the alternative mode of the twelfth preferred embodiment of the present invention, the circuit element 10123 is deployed on the back side of the main circuit board 10122 and the encapsulation portion 1011 covers and encloses, encapsulates and/or wraps up the circuit element 10123.

Further, the encapsulation portion 1011 comprises a lower covering portion 10115, provided on the back side of the main circuit board 10122. The covering portion 10115 is integrally formed on the back side of the main circuit board 10122, so as to encapsulate, wrap up and/or enclose the circuit element 10123 located on the back side of the main circuit board 10122, such that the circuit element can be stably arranged.

It is worth mentioning that, during the manufacturing process, the lower covering portion 10115 can be integrally formed with the covering section 10111 and the optical filter installing section 10112 located on the upper portion of the main circuit board 10122 or be formed solely. That is to say, it may also form the lower covering portion 101115 on the back side of the main circuit board 10122 after the main circuit board 10122 was formed. Person skilled in the art should understand that the forming process and size of the lower covering portion 10115 shall not limit the present invention.

Figure 31:
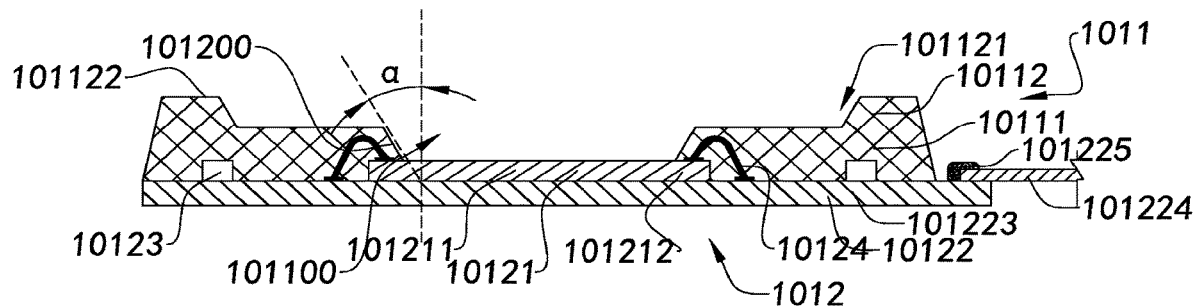
FIG. 31 is a sectional view of a photosensitive unit according to a thirteenth preferred embodiment of the present invention.

Referring to FIG. 31, a photosensitive unit 1010 according to a thirteenth preferred embodiment of the present invention is illustrated. The main circuit board 10122 comprises a first board body 101223 and a second board body 101224. The first board body 101223 is electrically connected with the second board body 101224. In addition, the first board body 101223 is electrically connected with the second board body 101224 through a conductive medium 101225. The conductive medium 101225 can be, for example but not limited to, anisotropic conductive adhesive. Particularly, the first board body 101223 can be a rigid board, while the second board body 101224 can be a flexible board.

The photosensitive sensor 10121 is arranged on the first board body 101223 and the encapsulation portion 1011 at least partially integrally encapsulates the first board body 101223 and at least part of the non-photosensitive area of the photosensitive sensor 10121.

In addition, the photosensitive sensors 10121 are connected to the first board body 101223 by electrically connecting with the connecting elements 10124.

According to the figure of the present embodiment, the second board body 101224 is lapped on the front side of the first board body 101223 and be electrically connected with the first board body 101223 through the conductive medium 101225.

In addition, the second board body 101224 can be spliced with the first board body 101223 and be electrically connected with the first board body 101223 through the conductive medium 101225.

In addition, the second board body 101224 can be connected to the back side of the first board body 101223 and be electrically connected with the first board body 101223 through the conductive medium 101225.

When manufacturing the photosensitive unit 1010, according to an implementation, it may first integrally form the encapsulation portion on the first board body 101223 and then electrically connect the first board body 101223 and the second board body 101224. According to another implementation, it may electrically connect the first board body 101223 and the second board body 101224 first and then integrally form the encapsulation portion 1011 on the first board body 101223. Certainly, the encapsulation portion 1011 can be integrally formed on the connection site of the first board body 101223 and the second board body 101224, so as to stably affix the first board body 101223 and the second board body 101224. Nonetheless, those skilled in the art should understand that the connection mode of the first board body 101223 and the second board body 101224 and the forming position of the encapsulation portion 1011 shall not limit the present invention.

Figure 32A:
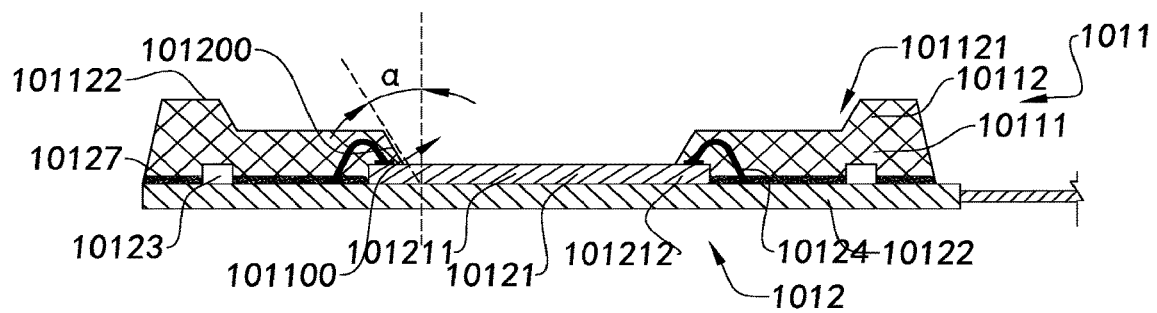
FIGS. 32A and 32B are sectional views of a photosensitive unit according to a fourteenth preferred embodiment of the present invention.

Referring to FIG. 32A, a photosensitive unit 1010 according to a fourteenth preferred embodiment of the present invention is illustrated. In the present embodiment of the present invention, the photosensitive unit 1010 comprises a protective layer 10127 arranged on the main circuit board 10122, so as to make the surface of the main circuit board 10122 flat and smooth and protect the main circuit board 10122 during the manufacturing process.

Further, the main circuit board 10122 comprises a basal plate 1227 and at least a circuit 1228, wherein the circuit 1228 is deployed on the basal plate 1227. The protective layer 10127 covers the circuit so as to protect the circuit. Besides, it also fill up the uneven area formed on the surface of the basal plate 1227 of the circuit 1228.

The protective layer 10127 can be expanded to the edge of the basal plate, so as to cushion and support the forming mold when manufacturing the photosensitive unit and to protect the main circuit board 10122 by avoiding the ram force from damaging the main circuit board when the forming mold is clamping.

In the manufacturing process, the protective layer may be deployed after the photosensitive sensor 10121 has been attached on the main circuit board 10122. Alternatively, it may deploy the protective layer 10127 on the main circuit board first, and then attach the main circuit board on the photosensitive sensor 10121.

For example, according to some embodiments, it may coat ink on the main circuit board 10122, so as to form the protective layer on the main circuit board 10122 by means of the medium like ink and etc. The thickness of the protective layer 10122 and the deploying area are both based on the needs.

According to some embodiments, the protective layer 10127 can be arranged around the periphery area of the photosensitive sensor 10121. For example, the photosensitive sensor 10121 is attached on the main circuit board 10122. Then the photosensitive sensor 10121 is electrically connected with the main circuit board 10122 through the connecting element 10124. After that, medium like ink and etc. is coated on the main circuit board around the area of the photosensitive sensor, so as to form the protective layer.

Figure 32B:
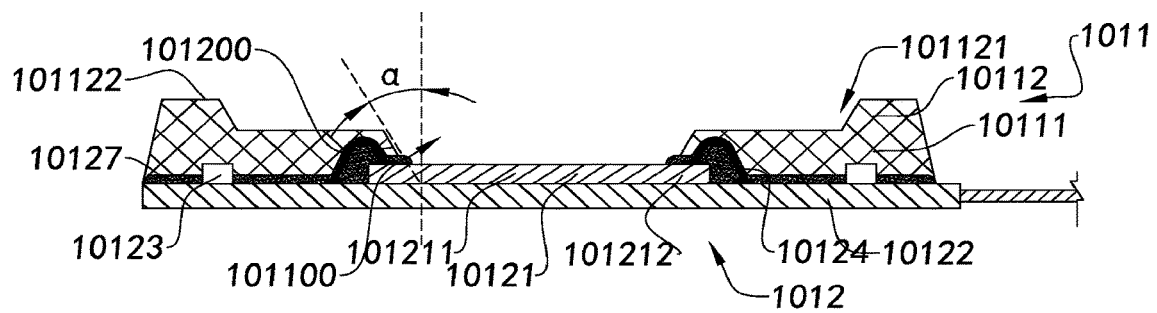

Referring to FIG. 32B, in this implementation, the protective layer 10127 can be deployed on at least part of the non-photosensitive area of the photosensitive sensor, so as to protect the photosensitive sensor 10121. In other words, when the encapsulation portion 1011 is formed through the forming mold, the forming mold may not directly contact the main circuit board 10122 and the photosensitive sensor 10121, but be supported by the protective layer 10127, such that the main circuit board 10122 and the photosensitive sensor 10121 can be protected.

To arrange the protective layer 10127 on the main circuit board 10122 and/or the photosensitive sensor 10121 is advantageous in several aspects, for example but not limited to the follows. First, it can fill the uneven area of the main circuit board 10121, so as to make the surface of the main circuit board 10121 even and flat, which facilitates the integral forming process of the encapsulation portion 1011. Second, it can cushion and support the forming mold when the forming mold is utilized in forming the encapsulation portion 1011, so as to reduce the impact of the ram effect of the forming mold on the main circuit board 10121 and/or the photosensitive sensor. Third, the protective layer is flexible, such that when it is engaged with the edge of the forming mold, it can prevent the forming material from overflowing during the molding process and rendering burr. Fourth, after the photosensitive unit 1010 is formed, because the resilience of the protective layer 10127 is better than it of the encapsulation portion 1011 and the main circuit board 10122, it can flexibly cushion the interactive force between the encapsulation portion 1011 and the main circuit board 10122, such that the main circuit board 10122 will not break away from the encapsulation portion 1011 easily due to environmental factors, like temperature and etc., and other components like optical filter 1020 will not be affected as well. Of course, there are other advantages of the arrangement of the protective layer 10127, which, nevertheless, are not completely specified here. It is worth mentioning that the resilience is a relative characteristic comparing to the encapsulation portion 1011 and the main circuit board 10122 and it will not affect the image quality of the camera module.

Figure 33:
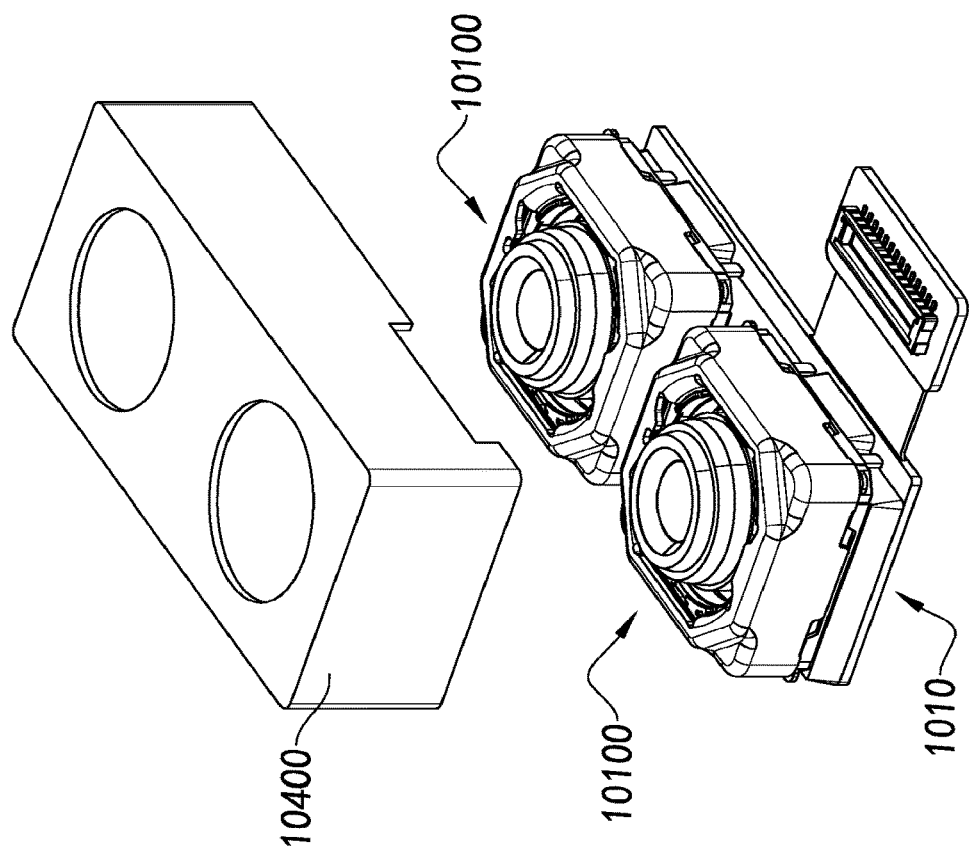
FIG. 33 is a perspective view of an alternative mode of an array camera module according to the above preferred embodiment of the present invention.

Referring to FIG. 33, each of the camera modules of the above preferred embodiments can respectively form an array camera module, wherein the array camera module comprises at least two of the camera modules 10100. The camera modules 10100 coordinate with each other to conduct the image capturing of the array camera module, though the camera modules 10100 are both independent.

In the present alternative mode of the above preferred embodiment of the present invention, the camera modules 10100 are independent, but integrally assembled through an external frame 10400. Namely, components of the camera modules 10100 may not be connected to one another, but be assembled freely. The camera modules 10100 can be affixed on the external frame 10400 through gluing.

The array camera module can be assembled with any of the camera modules having one or more features of the photosensitive units 1010 or camera modules 10100 according to the above embodiments, rather than only be implemented in the manners illustrated in the figure.

Figure 34:
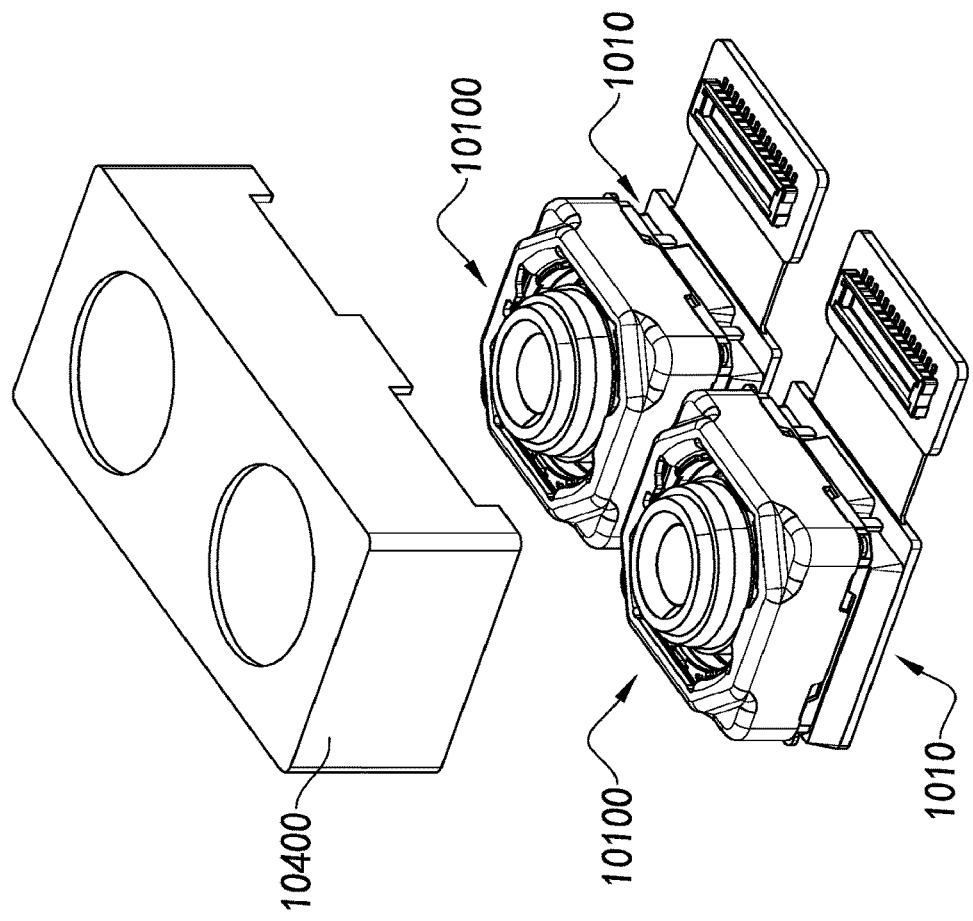
FIG. 34 is a perspective view of an alternative mode of an array camera module according to the above preferred embodiment of the present invention.

Referring to FIG. 34, according to an alternative mode of the above preferred embodiments, each of the camera modules 10100 can respectively form another array camera module. The array camera module comprises at least two of the camera modules 10100. The camera modules 10100 coordinate with each other to conduct the image capturing of the array camera module, and the camera modules 10100 are connected to each other.

In one embodiment, the main circuit boards 10122 of the camera modules 10100 are interconnected, so as to form an integral main circuit board, which can utilize a shared connector.

In one embodiment, the encapsulation portions 1011 of the camera modules 10100 are integrally connected, so as to form a conjoined encapsulation portion. In other words, a conjoined dual encapsulation portion 1011 can be formed at once on the main circuit boards 10122 and the photosensitive sensors 10121, so as to interconnect the photosensitive unit s 1010 of the two camera modules 10100.

In one embodiment, the frames 1050 of the camera modules are integrally connected, so as to form a conjoined frame, such that the photosensitive units 1010 can be connected through the conjoined frame.

The above embodiment of the present invention utilizes a dual-camera array camera module constructed by two camera modules 100 as an example for the description. Nevertheless, in other embodiments of the present invention, it may also be constructed by more of the camera modules 100, such as, three or more. Person skilled in the art should understand that quantity of the camera module 100 shall not be a limitation of the invention.

Figure 35:
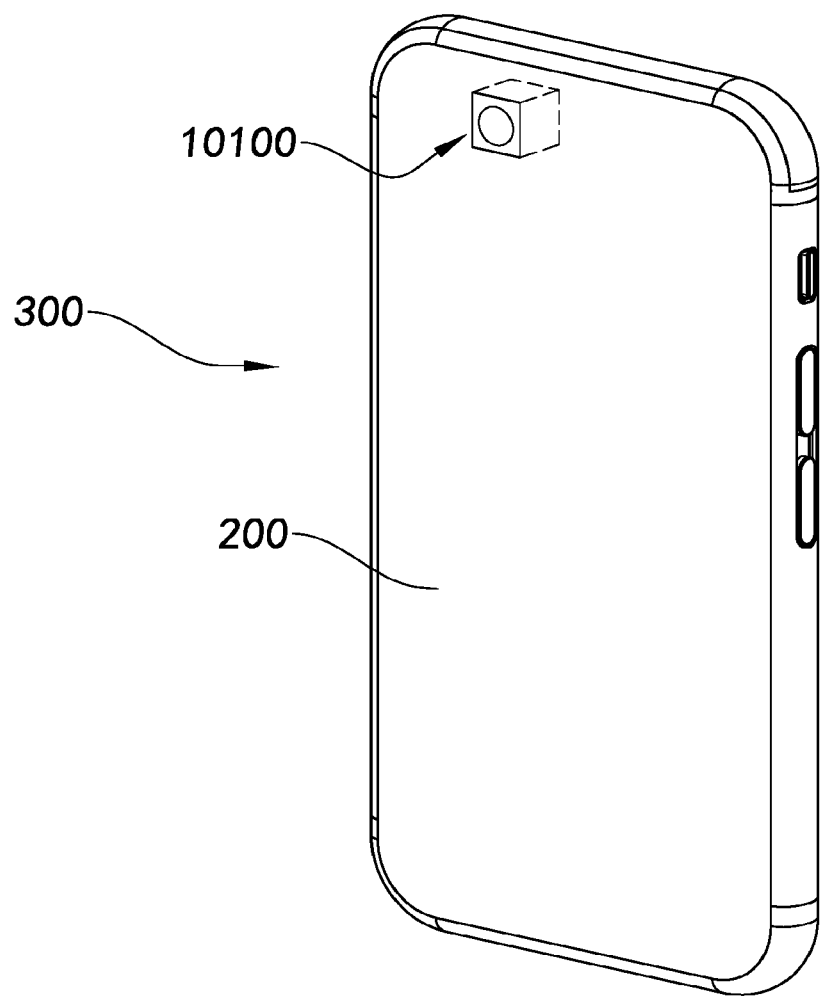
FIG. 35 is a perspective view of an application of the camera module according to the above preferred embodiment of the present invention.
Figure 37:
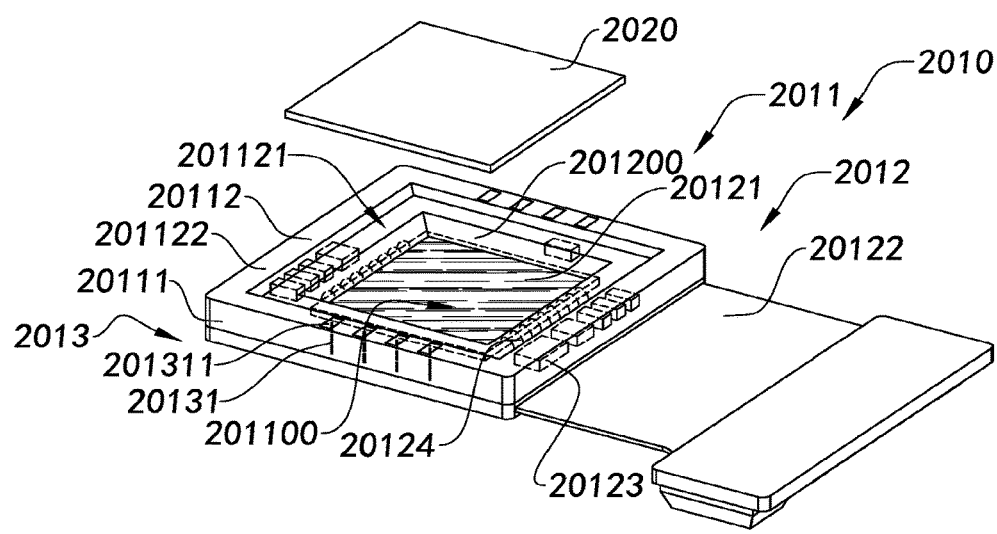
FIG. 37 is a perspective view of a photosensitive unit according to a fifteenth preferred embodiment of the present invention.
Figure 38:
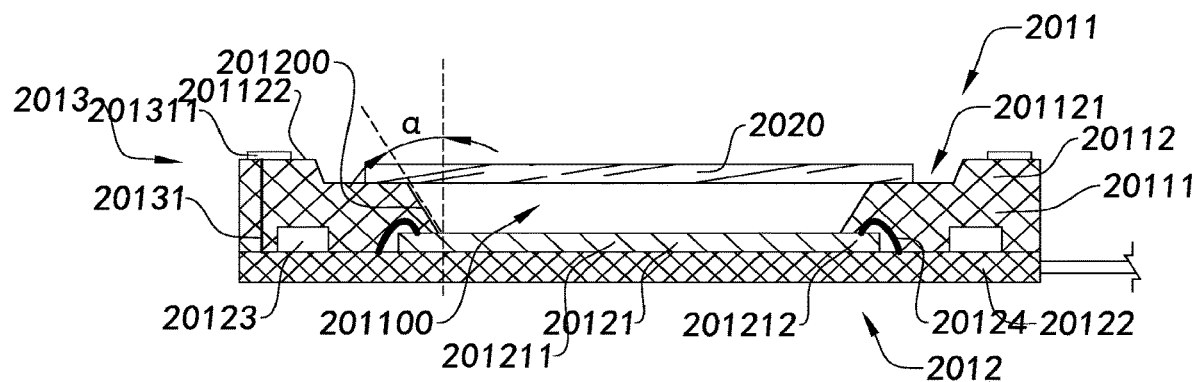
FIG. 38 is a sectional view of a photosensitive unit according to a fifteenth preferred embodiment of the present invention.
Figure 39:
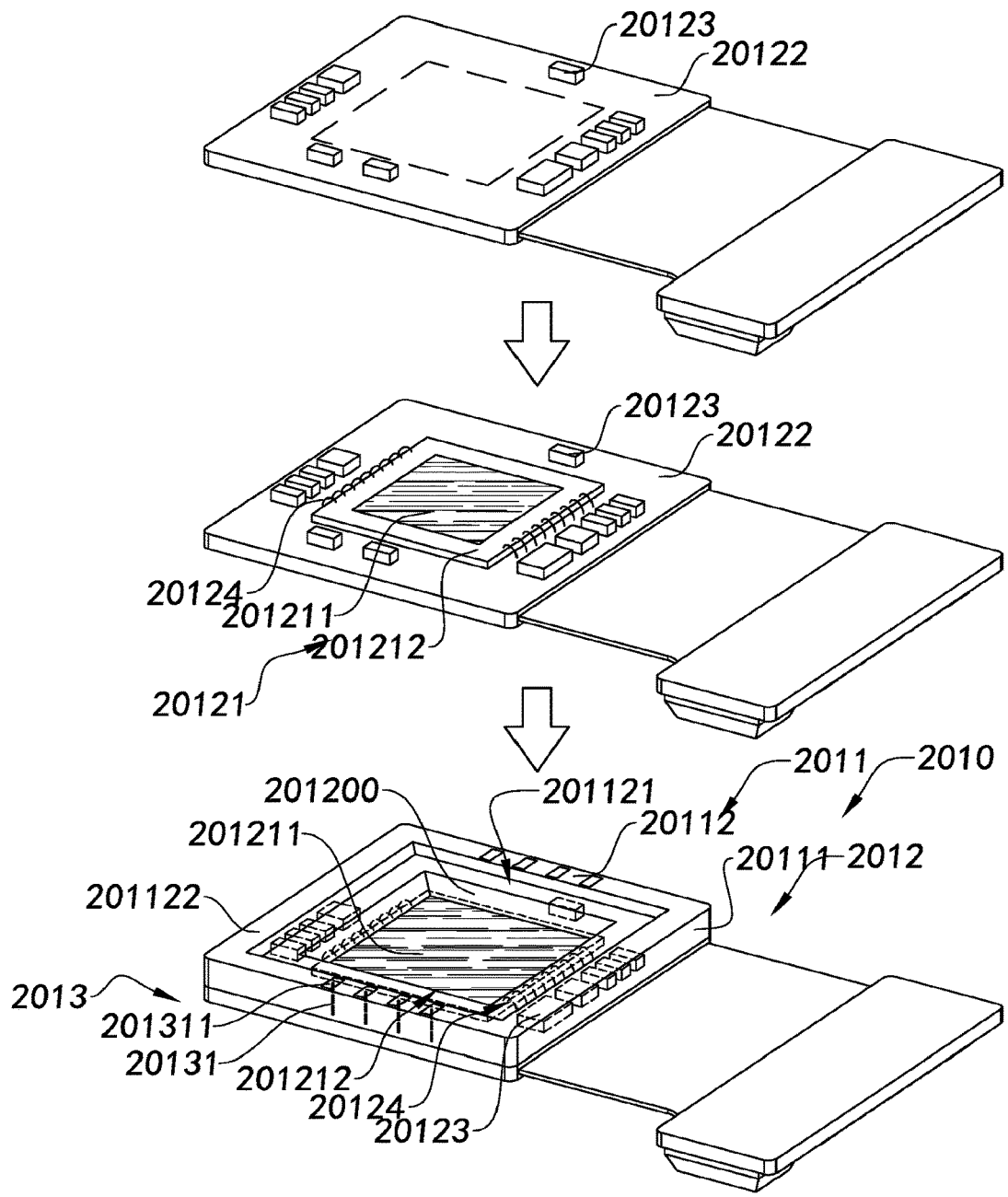
FIG. 39 is a manufacturing process diagram of a photosensitive unit according to the above fifteenth preferred embodiment of the present invention.
Figure 40:
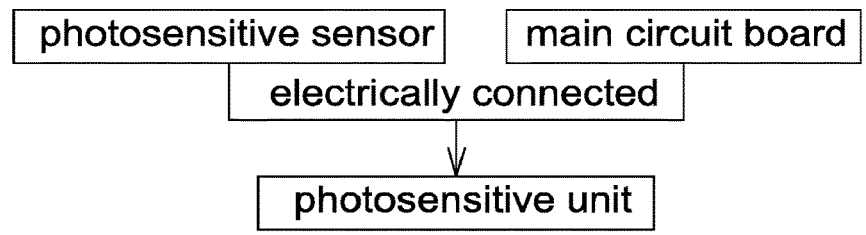
FIG. 40 is a block diagram illustrating a manufacturing method for a photosensitive unit according to the above fifteenth preferred embodiment of the present invention.

Referring to FIG. 35, the camera module 10100 can be utilized on an electronic device body 200, so as to coordinate with the electronic device body 200 to make an electronic device that has image capturing functions. The electronic device 300 can specifically embodied as, for example but not limited to, a smartphone.

Although the electronic device body 200 is embodied to be a smartphone in FIG. 1B, according to other embodiments of the present invention, the electronic device body 200 may also be embodied to be tablet, laptop, camera, PDA, eBook, MP3/4/5, and any other electronic devices that the camera module 10100 may apply. Of course, person skilled in the art should understand that it is also possible to deploy the camera module 10100 on traditional electrical appliances, such as refrigerator, washing machine, television, and etc. and constructions, such as burglar-proof door, wall, and etc. Hence, the applicable circumstances and usage modes of the camera module 10100 shall not limit the content and scope of the camera module 10100 of the present invention.

FIGS. 36A and 36B illustrate comparison views of the camera module according to the present invention and a conventional camera module. In FIG. 36A, the conventional camera module is illustrated in the left view, while the camera module of the present invention is illustrated in the right view. In FIG. 36B, the left view refers the manufacturing of the conventional circuit board, and the right view refers the manufacturing of the photosensitive unit of the present invention.

In view of above, it is apparent that the photosensitive unit and camera module of the present invention have the following advantages:

1. The size in length and width of the camera module can be reduced, wherein the encapsulation portion and the circuit elements, such as resistance-capacitances, can be spatially overlapped. However, the mounting frame of the conventional camera module must be installed at the outer side of the capacitors and reserve a predetermined safety distance therebetween. The present invention can utilize the space of the capacitors to fill molding material around the capacitors directly.

2. The module tilt can be prevented. The encapsulation portion would substitute conventional plastic frame and decrease accumulated tolerance/deviance.

3. The molding formation enhances structural strength of the circuit board that, under the same structural strength, the circuit board can be made thinner to reduce the height of the camera module because the encapsulation portion can also provide support and increase structural strength.

4. In view of the altitude space, a safety space for assembling must be reserved between capacitors and the base in the conventional camera module. However, the molding structure of the camera module of the present invention does not require to reserve any safety space for assembling that can reduce the height of the camera module. A safety gap must also be reserved between the top of the capacitors and the frame in the conventional camera module in order to prevent interferences, but the present invention can directly fill molding material around the capacitors.

5. The resistance-capacitance components can be encapsulated and wrapped by molding, so as to avoid dark spots and defectives of the camera module caused by soldering flux, dust, and etc. in the resistance-capacitance area, and to increase the product yield rate.

6. The present invention is suitable for highly efficient mass production. Photosensitive unit of the present invention is more suitable for mass imposition process. According to the molding formation of the photosensitive unit of the present invention, the photosensitive unit is more suitable for imposition process. In other words, only at most 8 conventional frames can be produced in one process, but more photosensitive units, as many as 80 to 90 pieces, can be molded to produce in each molding process.

Referring to FIGS. 37 to 43, a camera module 20100 and photosensitive unit 2010 are illustrated according to a fifteenth preferred embodiment of the present invention. The photosensitive unit 2010 is for assembling and producing the camera module. The photosensitive unit 2010 includes an encapsulation portion 2011 and a photosensitive portion 2012, wherein the encapsulation portion 2011 is integrally encapsulated and connected to the photosensitive portion 2012, such as forming an integral body through molding.

The photosensitive portion 2012 includes a main circuit board 20122 and a photosensitive sensor 20121, wherein the photosensitive sensor 20121 is disposed on the main circuit board 20122. According to the present embodiment of the present invention, the photosensitive sensor 20121 is molded to connect to the main circuit board 20122. Especially, the encapsulation portion 2011 is moldingly coupled to the photosensitive portion 2012 by means of, for example, the method of Molding on Chip (MOC).

According to the present embodiment of the present invention, the photosensitive portion 2012 includes a connecting circuit and at least a circuit element 20123. The connecting circuit is prearranged in the main circuit board 20122 and the circuit element 20123 is electrically connected to the connecting circuit and the photosensitive sensor 20121 to process the photosensing function for the photosensitive sensor 20121. The circuit element 20123 is protrudedly deployed on the main circuit board 20122. The circuit element 20123 can be, for example but not limited to, resistors, capacitors, diodes, triodes, potentiometers, electric relays, and/or actuators.

It is worth mentioning that the encapsulation portion 2011 encapsulates and wraps up the circuit element 20123 therein, so that the circuit element 20123 will not be directly exposed in any space, and more specifically, not be exposed in the environment that communicates with the photosensitive sensor 20121. Therefore, during the assembling of the camera module, the circuit element 20123 will not be contaminated with contaminants, such as dusts, and influence the photosensitive sensor 20121, that is different from the arrangement of conventional camera module that the circuit components, such as resistance-capacitance components, are exposed to outside. So that by means of such molding encapsulation, sundries and dusts are prevented from staying on the surface of the circuit element 20123 to avoid the photosensitive sensor 20121 from being contaminated thereby that would result in dark spots and other defectives of the camera module.

It is worth mentioning that, in the present embodiment of the present invention, the circuit element 20123 is recited as protruded on the main circuit board 20122 as an example for the description, whereas in other embodiments of the present invention, the circuit element 20123 can also be embedded in the main circuit board 20123 without protruding from the main circuit board. Person skilled in the art should understand that the shape, type, and mounting position of the circuit element 20123 should not limit the present invention.

The encapsulation portion 2011 has a through hole window 201100 formed therein to provide a photosensitive path for the photosensitive sensor 20121.

In other words, the encapsulation portion 2011 provides a window, so as to serve as an light path for the photosensitive sensor 20121, such that light passed through the camera lens 2030 (being introduced later) positioned on the top of the encapsulation portion 2011 can reach the photosensitive sensor 20121 without being obstructed by the encapsulation portion 2011.

According to the present preferred embodiment of the present invention, the photosensitive portion 2012 includes at least one connecting element 20124 for electrically connecting the photosensitive sensor 20121 with the main circuit board 20122. Further, 20 the connecting element 20124 can be embodied to be, for example but not limited to, gold wire, copper wire, aluminum wire, and/or silver wire. Especially, the connecting elements 20124 curvingly connects the photosensitive sensor 20121 and the main circuit board 20122.

It is worth mentioning that the connecting element 20124 is molded inside the encapsulation portion 2011, so as to enclose, encapsulate and/or wrap up the connecting element 20124 by the encapsulation portion 2011 to keep them from direct exposure to outside. Therefore, during the assembling of the camera module, the connecting element(s) 20124 will not receive any collision and damage, and, at the same time, it reduces the adverse effect of the connecting element(s) 20124 due to the environmental factors, such as temperature and humidity, so as to ensure a stable communication and connection between the photosensitive sensor 20121 and the main circuit board 20122. This is completely different from the conventional art.

From the bottom of each of the windows 201100 of the encapsulation portion 2011, the size of the window 20100 is gradually enlarged to the top thereof to form a slope shape. Nevertheless, it is understandable that this slope or inclined shape of the window 201100 shall not limit the present invention.

The encapsulation portion 2011 has an inner side 201200. The inner side 201200 surrounds to form the window 201100. The inner side 201200 is arranged in a inclined and slope manner, such that the window 201100 enlarges its size from a bottom thereof upwardly and gradually, having a smaller bottom size and a larger top size, to form an inclined shape slope side. Specifically, the inner side 201200 has a tilt angle α, which is the included angle between the tilt direction of the inner side 201200 and the vertical direction.

It is worth mentioning that the encapsulation portion 2011 substantially covers and encloses, encapsulates and/or wraps up the circuit element 20123 and the connecting element 20124 that advantages in protecting the circuit element 20123 and the connecting element 20124 as well as in achieving a higher performance camera module. However, those skilled in the art should understand that the encapsulation portion 2011 shall not be limited in wrapping up the circuit element 20123 and/or the connecting element 20124. In other words, in other embodiments of the present invention, the encapsulation portion 2011 can be directly molded on the main circuit board 20122 without circuit element 20123 protruded thereon or be molded on various positions, such as the outer side portion and the periphery, of the circuit element 20123.

In addition, the photosensitive sensor 20121 has a photosensitive area 201211 and a non-photosensitive area 201212, wherein the non-photosensitive area 201212 is positioned around the periphery of the photosensitive area 201211. The photosensitive area 201211 is for conducting photosensitive function and process. The connecting element 20124 is connected to the non-photosensitive area 201212.

According to this preferred embodiment of the present invention, the encapsulation portion 2011 is extended to the non-photosensitive area 201212 of the photosensitive sensor 20121, so as to overlappedly affix the photosensitive sensor 20121 on the main circuit board 20122 by means of molding. In this manner, such as the method of Molding on Chip (MOC), the molding area of the encapsulation portion 2011 can be extended inwardly, so that the outer structural portions of the encapsulation portion 2011 and the main circuit board 20122 can be reduced, which further reduces the size in length and width of the photosensitive unit 2010 as well as the size in length and width of the camera module assembled thereby.

In the present embodiment of the present invention, the encapsulation portion 2011 is protrudingly positioned surrounding the outer portion of the photosensitive area 201211 of the photosensitive sensor 20121. Particularly, the encapsulation portion 2011 integrally seal its connection, so as to provide a great sealingness and tightness. Therefore, when the photosensitive unit 2010 is used to assemble the camera module, the photosensitive sensor 20121 will be sealed inside the camera module to forms a sealed inner space.

Particularly, in producing the photosensitive unit 2010, a conventional circuit board can be used to make the main circuit board 20122. The photosensitive sensor 20121 is deployed on the main circuit board 20122 and electrically connected by the connecting elements 20124. Then, after the main circuit board 20122 and the photosensitive sensor 20121 are initially assembled, they are processed by Surface Mount Technology (SMT) and then molded by the insert molding technique, for example by means of an injection molding machine, to form the encapsulation portion 2011, or molded by the pressing molding technique, which is commonly applied in semiconductor packaging, to form the encapsulation portion 2011. The main circuit board 20122 can selectively be, for example but not limited to, rigid-flex board, ceramic substrate (without flexible board), or rigid PCB (without flexible board). The formation of the encapsulation portion 2011 can be selected by, for example but not limited to, injection molding technique and pressing molding technique. The material of the encapsulation portion 2011 can be, for example but not limited to, nylon, liquid crystal polymer (LCP), or polypropylene (PP) for injection molding technique, or epoxy resin for pressing molding technique. Person skilled in the art should understand that the above available manufacture methods and available materials are examples to describe available implementations of the present invention, rather than limitations of the present invention.

It is worth mentioning that according to the molding formation method of the photosensitive unit 2010 of the present invention, the molded photosensitive unit 2010 is suitable for making in form of combined board that can produce photosensitive units 2010 as many as 90 pieces, for example, at the same time, while the one-time injected encapsulation portion, that is, the lens holder, of conventional frame structure requires a prior gluing process and usually allow only one piece to be attached at a time, which can merely allow 4-8 piece in most cases or up to 32 pieces the most to be produced at one time.

Furthermore, the encapsulation portion 2011 includes a covering section 20111 and an optical filter installing section 20112. The optical filter installing section 20112 is integrally molded to connect with the covering section 20111. The covering section 20111 is molded to mount on the main circuit board 20122 to encapsulate, wrap up and/or enclose the circuit element(s) 20123 and the connecting element(s) 20124. The optical filter installing section 20112 is configured for installing the optical filter 2020. In other words, when the photosensitive unit 2010 is used for assembling the camera module, the optical filter 2020 of the camera module is mounted at the optical filter installing section 20112 to ensure the optical filter 2020 be deployed along a photosensitive path of the photosensitive sensor 20121 and does not require any additional mounting frame for installing the optical filter. In other words, the encapsulation portion 2011 itself also provides the function as a conventional mounting frame and, in addition, according to the advantage of molding technique, the top of the optical filter installing section 20112 would have good evenness and smoothness due to the molding technique, so as to allow the optical filter 2020 to be installed in an even and flat manner that is more superior to the conventional camera modules.

In addition, the optical filter installing section 20112 has an installing groove 201121. The installing groove 201211 is communicated with the window 201100 to provide an adequate installation space for the optical filter 2020 such that the optical filter 2020 will not protrude from the top surface 201122 of the optical filter installing section 20112.

In other words, the installing groove 201121 is provided on top of the encapsulation portion 2011 for the optical filter 2020 to be installed therein. Particularly, the optical filter 2020 can be an Infrared-Cut Filter (IRCF).

It is worth mentioning that, in the present embodiment of the present invention, the installing groove 201121 can be used for the installation of the optical filter, whereas in other embodiments of the present invention, the installing groove 201121 can be used for the installation of other component, such as the camera lens, motor of the camera module, or etc. Person skilled in the art should understand that the use of the installing groove 201121 shall not consider as a limitation of the present invention.

It is worth mentioning that the inner wall of the encapsulation portion 2011 is designed according to the shape of the connecting element 20124 to be mounted thereon. For example, it can be in sloped or inclined shape, so that while it encapsulates and wraps up the connecting element(s) 20124, the photosensitive sensor 20121 is capable of receiving as much light as possible. Person skilled in the art should understand that a specific shape of the encapsulation portion 2011 will not limit the scope of the present invention.

Furthermore, according to the present preferred embodiment of the present invention, the photosensitive unit 2010 includes a motor connecting structure 2013 for connecting to the motor unit 2040 of the camera module. Each of the motor units 2040 has at least one motor terminal 2041. Each of the motor connecting structure 2013 includes at least one lead element such as lead wire 20131, wherein each of the lead elements 20131 is connected to the motor unit 2040 and the main circuit board 20122. Each of the lead elements 20131 is electrically connected to the main circuit board 20122. Further, each of the lead elements 20131 is electrically connected to the connecting circuit of the main circuit board 20122. The lead element 20131 is deployed in the encapsulation portion 2011 and extended to the top of the encapsulation portion 2011. Each of the lead elements 20131 has a motor coupling terminal 201311 exposed on top of the encapsulation portion 2011 for being electrically connected to the motor terminal 2041 of the respective motor unit 2040. It is worth mentioning that the lead element 20131 can be deployed by embedding during the molding formation of the encapsulation portion 2011. In the conventional way of connection, component like driving motor is connected to the circuit board through independent lead wires, which involve relatively complicated manufacture technique. However, the molding method of the present invention that embeds the lead elements 20114 in the molding process can not only substitute the conventional technological process, such as motor soldering, but also make the circuit connection being more stable. Particularly, in one preferred embodiment of the present invention, the lead element 20131 is a conductor being embedded inside the encapsulation portion 2011. For example, the motor terminal 41 can be connected to the motor coupling terminal 201311 by attaching with conducting adhesive or by welding and soldering.

It is worth mentioning that the embedding position of the lead element 20131 and the revealing position of the motor coupling terminal 201311 of the lead element 20131 on the encapsulation portion 2011 can both be arranged based on the needs. For instance in one preferred embodiment of the present invention the motor coupling terminal 201311 of the lead element 20131 can be deployed on the periphery of the encapsulation portion 2011, that is the top surface of the encapsulation portion 2011 and the top surface 201122 of the optical filter installing section 20112. However, in an alternative mode of the embodiment of the present invention, the motor coupling terminal 201311 can be deployed on the inner side of the encapsulation portion 2011, which is the bottom side of the installing groove 201121 of the encapsulation portion 2011. Therefore, there may be various installation sites provided for the motor unit 40. In other words, when the motor unit 40 has to be installed on top of the encapsulation portion 2011, the motor coupling terminal 201311 will be provided on the top surface of the outer side of the encapsulation portion 2011. When the motor unit 40 has to be installed in the installing groove 201121, the motor coupling terminal 201311 can be provided on the inner side of the encapsulation portion 2011, which is the bottom of the installing groove 201121.

In other words, when producing the photosensitive unit 2010, firstly the photosensitive sensor 20121 is attached in position, and then the encapsulation portion 2011 is molded on the main circuit board 20122 with the photosensitive sensor 20121 attached thereon by means of such as the MOC technology. At the same time, the lead element(s) 20131 can be embedded inside the encapsulation portion 2011 during the molding while electrically connecting the lead element(s) 20131 with the main circuit board 20122 and revealing the motor coupling terminal(s) 201311 of the lead element(s) 20131 on top of the encapsulation portion 2011 for connecting with the motor terminal(s) 2041 of the motor unit 2040. For example, when the photosensitive unit 2010 is to be installed on the camera module, each motor terminal 2041 of the motor unit 2040 is connected to the motor coupling terminal 201311 of the respective lead element 20131 by welding and soldering so as to electrically connect the motor unit 2040 with the main circuit board 20122. An independent lead wire is required to be deployed to connect the motor unit 2040 and the main circuit board 20122 to allow the length of the motor terminal 2042 of the motor unit 2040 to be shortened.

It is worth mentioning that the embedding position of the lead element(s) 20131 can be configured based on the needs. For example, in one preferred embodiment of the present invention, the embedding position can be configured inside the encapsulation portion 2011 to hide the lead element 20131(*s*). In an alternative mode, the embedding position can be configured on the surface of the encapsulation portion 2011. Person skilled in the art should understand that position of the lead element 20131 shall not limit the scope of the present invention.

Figure 41A:
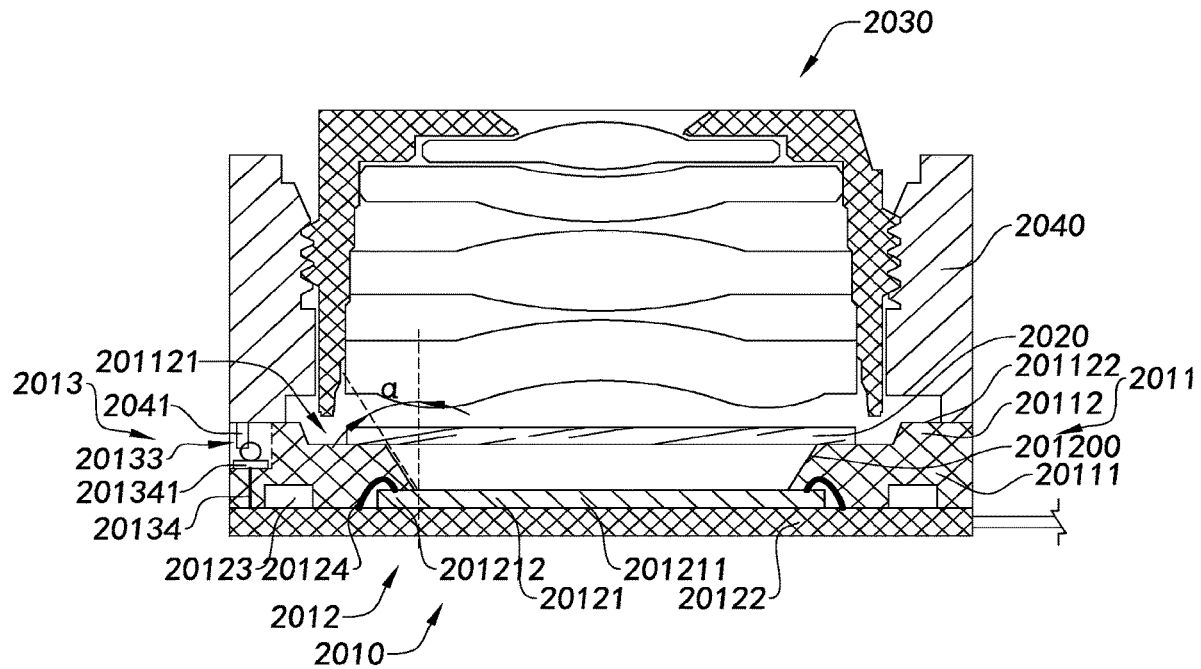
FIGS. 41A and 41B are sectional views of different alternative modes of the connecting structure of the photosensitive unit according to the above fifteenth preferred embodiment of the present invention.

FIG. 41A illustrates an equivalent alternative mode of the motor connecting structure according to the above fifteenth preferred embodiment of the present invention. The motor connecting structure 2013 includes at least one terminal slot 20133. The terminal slot 20133 is for accommodating the motor terminal 41 of the motor unit 40 of the camera module. The terminal slot 20133 is deployed on top of the encapsulation portion 2011. The motor connecting structure 2013 includes at least one lead element such as lead wire 20134, wherein the lead element 20134 is connected to the motor unit 2040 and the main circuit board 20122. The lead element 20134 is arranged in the encapsulation portion 2011 and upwardly extended to the bottom wall of the terminal slot 20133 of the encapsulation portion 2011. The lead element 20134 includes a motor coupling terminal 1341 exposed on the bottom wall of the terminal slot 20133 of the encapsulation portion 2011 for being electrically connected to the motor terminal 2041 of the motor unit 2040. Particularly, in an implementation, the motor coupling terminal 1341 can be embodied as a pad. The lead element 20134 can be embodied as a conductor embedded inside the encapsulation portion 2011.

In other words, when producing the photosensitive unit 2010, in one embodiment, the photosensitive sensor 20121 is firstly adhered to the main circuit board 20122, and then the encapsulation portion 2011 is molded on the main circuit board 20122 and the photosensitive sensor 20121 by means of the MOC technology, wherein the terminal slot 20133 with predetermined length is provided in the encapsulation portion 2011 to embed the lead element 20134 therein during the molding process, while the lead element 20134 is electrically connected with the main circuit board 20122 and the motor coupling terminal 1341 of the lead element 20134 is revealed on the bottom wall of the terminal slot 20133 of the encapsulation portion 2011 for connecting with the motor terminal 2041 of the motor unit 2040. For example, when the photosensitive unit 2010 is used to assemble the camera module, each motor terminal 2041 of the motor unit 2040 is inserted into the terminal slot 20133 and connected to the motor coupling terminal 1341 of the lead element 20134 by welding or soldering so as to electrically connect the motor unit 2040 with the main circuit board 20122. An independent lead element is required to connect the motor unit 2040 with the main circuit board 20122 to ensure stable connection for the motor terminal 2042 of the motor unit 2040 and to avoid unnecessary contact from the motor terminal 2042. Particularly, the lead element 20134 can be embodied as a conductor embedded inside the encapsulation portion 2011.

It is worth mentioning that the embedding position of the lead element(s) 20134 can be configured based on the needs. For example, in one preferred embodiment of the present invention, the embedding position can be configured inside the encapsulation portion 2011 to hide the lead element 20134(s). In an alternative mode, the embedding position can be configured on the surface of the encapsulation portion 2011. Person skilled in the art should understand that position of the lead element 20134 shall not limit the scope of the present invention.

Figure 41B:
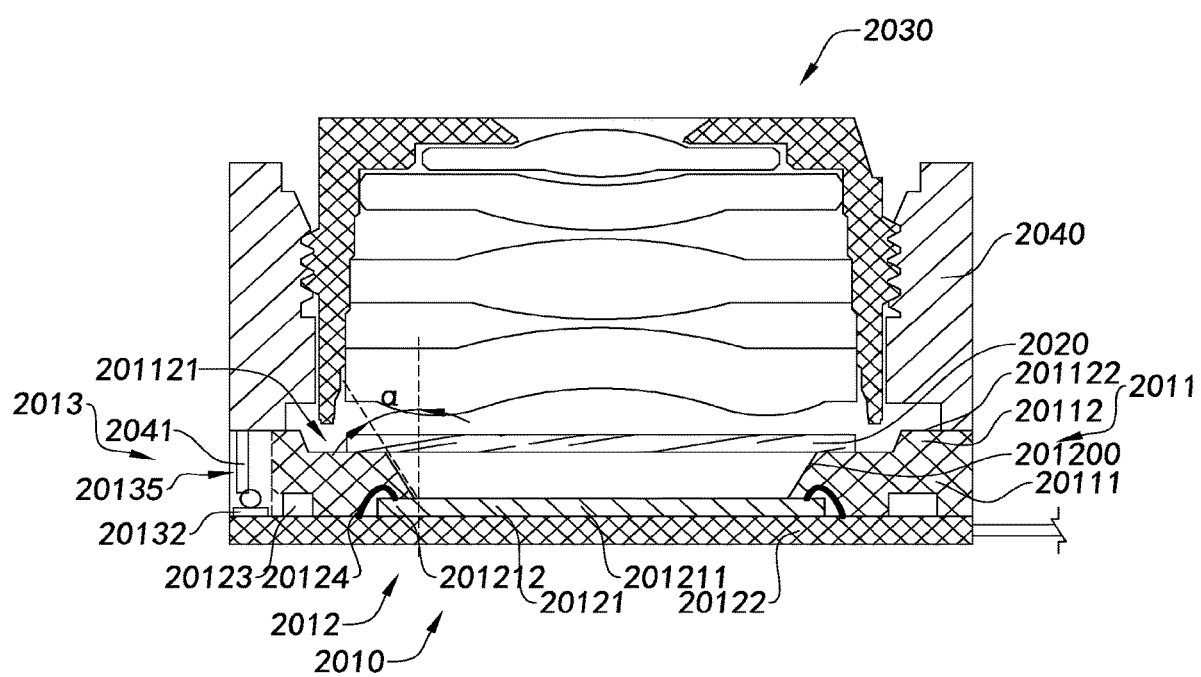

Referring to FIG. 41B, an alternative mode of the motor connecting structure of the above fifteenth preferred embodiment of the present invention is illustrated. The motor connecting structure 2013 includes a terminal slot 20135. The terminal slot 20135 is for accommodating the motor terminal 2041 of the motor unit 2040 of the camera module. The terminal slot 20135 is provided inside the encapsulation portion 2011. Each of the motor connecting structures 2013 includes at least one circuit junction 20132, wherein the circuit junction 20132 is preset on the main circuit board 20122 and electrically connected to the connecting circuit in the main circuit board 20122. Furthermore, each the terminal slot 20135 is extended from the top of the encapsulation portion 2011 to the main circuit board 20122 to present the circuit connection junction 20132. In one preferred embodiment, the motor terminal 2041 is adapted to insert into the terminal slot 20135 and connected to the circuit connection junction 20132 by soldering or welding.

In other words, when producing the photosensitive unit 2010, each the circuit connection junction 20132 is provided on the main circuit board 20122 and the photosensitive sensor 20121 is attached to the main circuit board 20122. Then, the encapsulation portion 2011 is molded on the main circuit board 20122 and the photosensitive sensor 20121 by means of the MOC technology, while the terminal slot 20135 with predetermined length is provided and the circuit connection junction 20132 is revealed through the terminal slot 20135 for connecting with the motor terminal 2041 of the motor unit 2040. For example, when the photosensitive unit 2010 is to be assembled to form the camera module, each motor terminal 2041 of the motor unit 2040 is inserted into the terminal slot 20135 and connected to the circuit connection junction 20132 of the main circuit board 20122 by welding and soldering so as to electrically connect the motor unit 2040 with the main circuit board 20122 to ensure stable connection for the motor terminal 2041 of the motor unit 2040 and to avoid unnecessary contact of the motor terminal 2041.

Figure 41C:
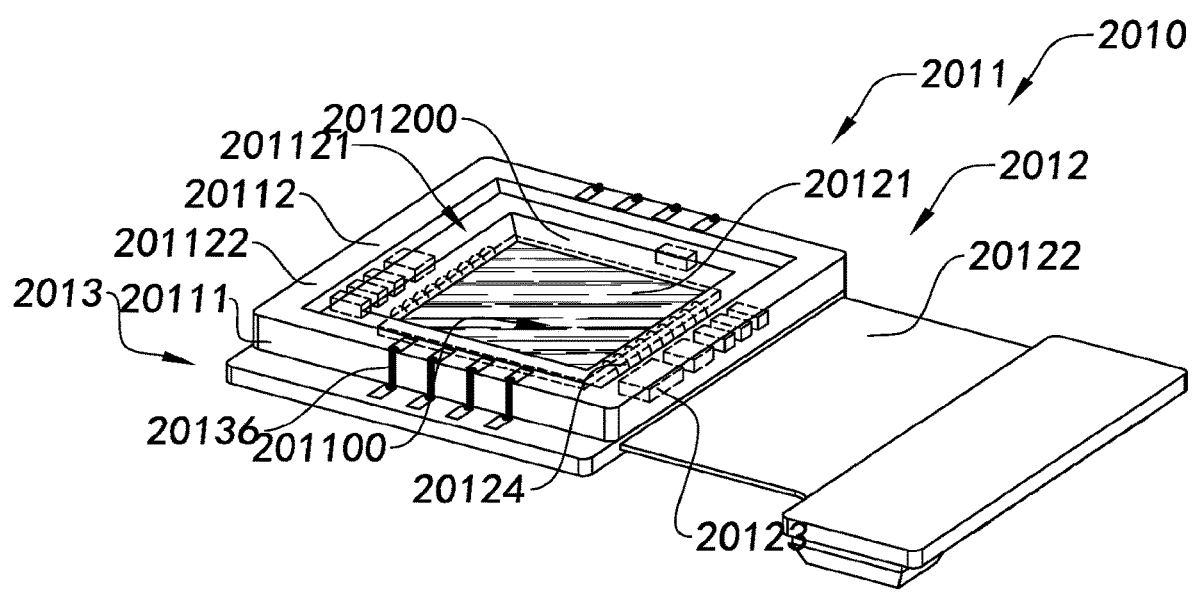
FIG. 41C is a perspective view illustrates the motor connecting structure of the photosensitive unit according to another alternative mode of the above fifteenth preferred embodiment of the present invention.
Figure 42:
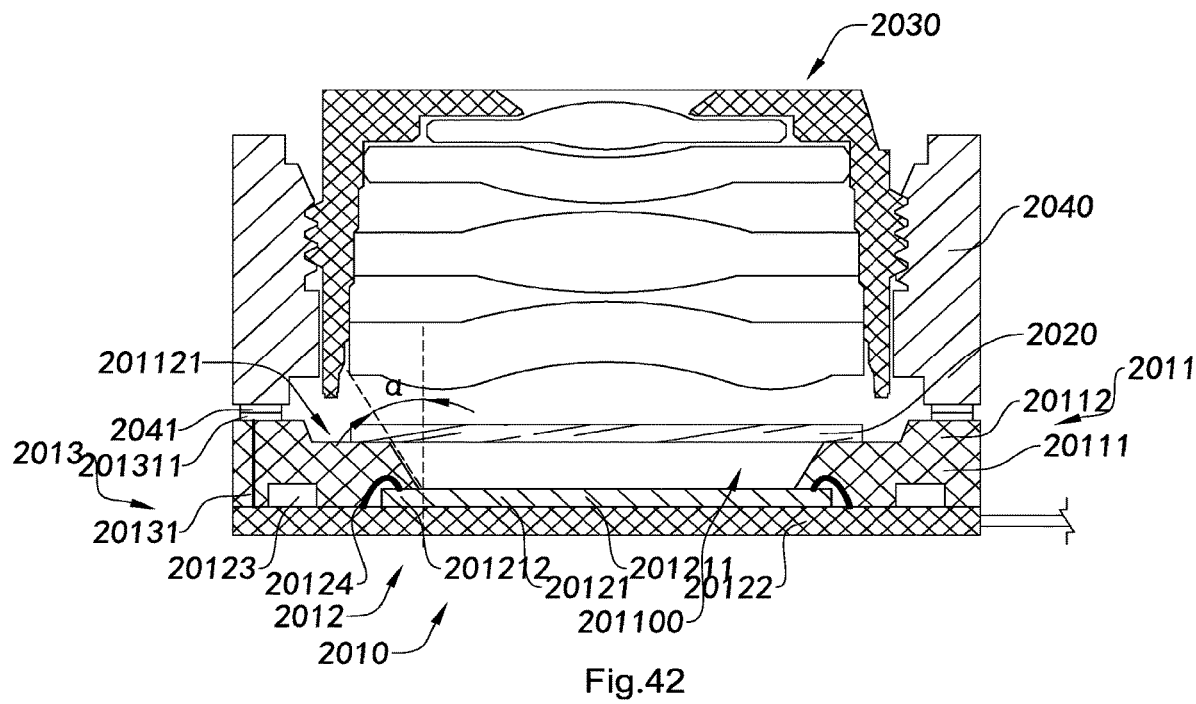
FIG. 42 is a sectional view of the camera module according to an alternative mode of the above fifteenth preferred embodiment of the present invention.
Figure 43:
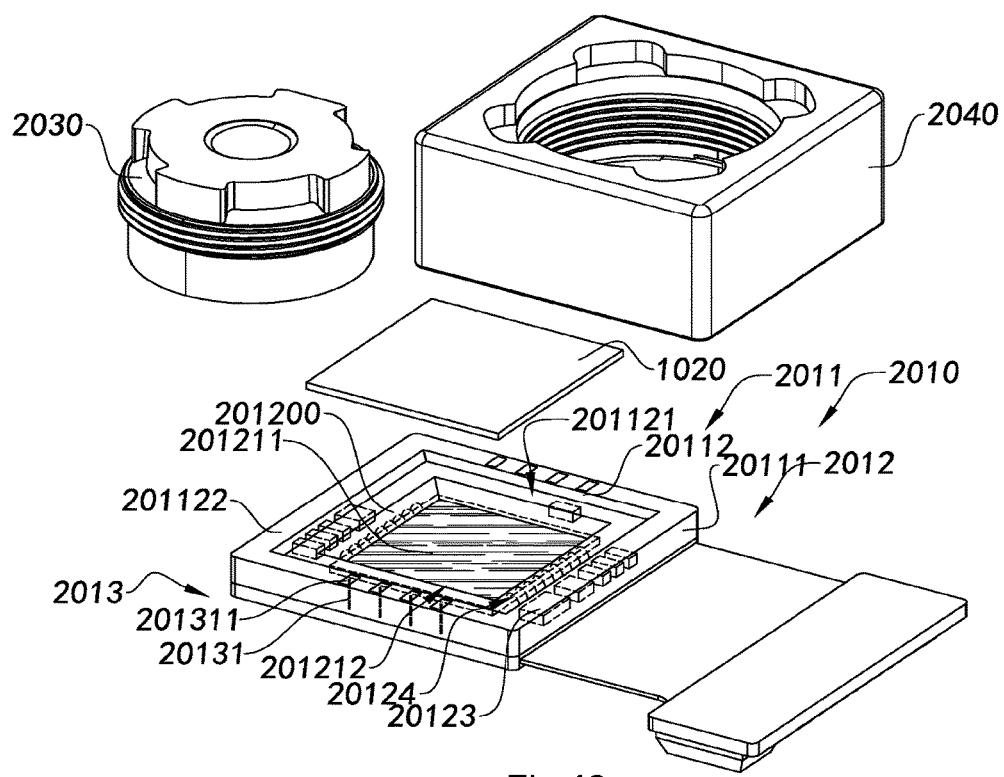
FIG. 43 is an exploded perspective view of the camera module according to the above fifteenth preferred embodiment of the present invention.
Figure 44:
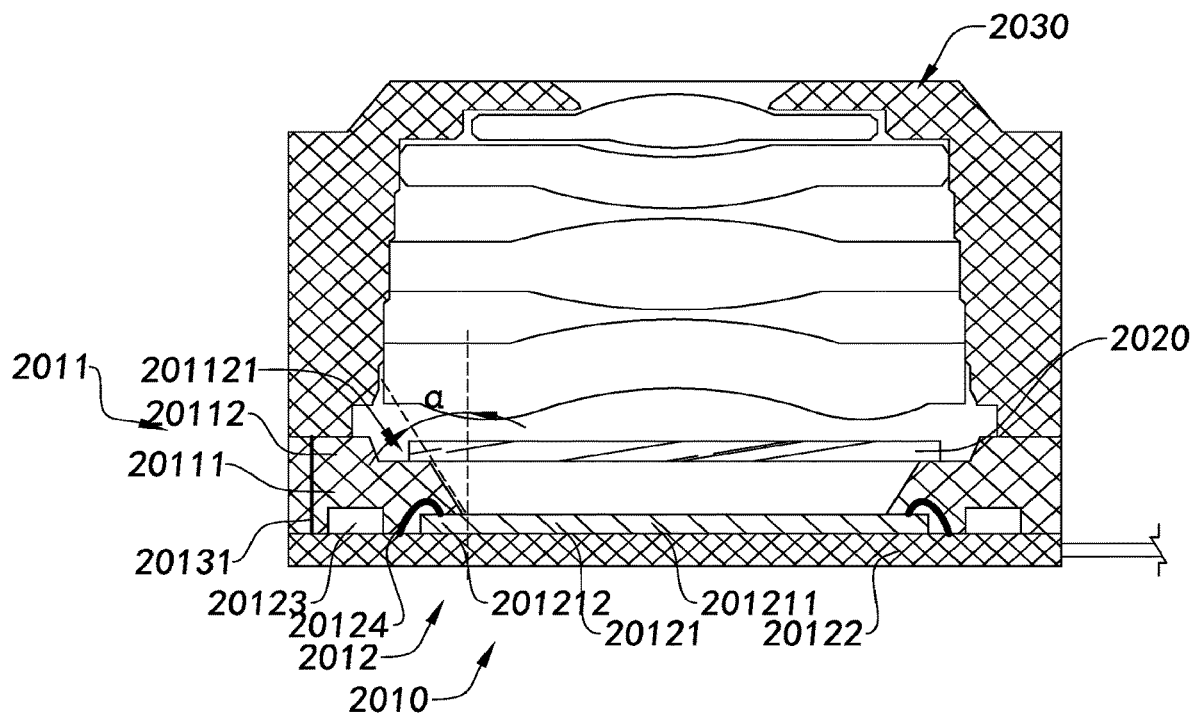
FIG. 44 is sectional view of the camera module according to an alternative mode of the above fifteenth preferred embodiment of the present invention.
Figure 45:
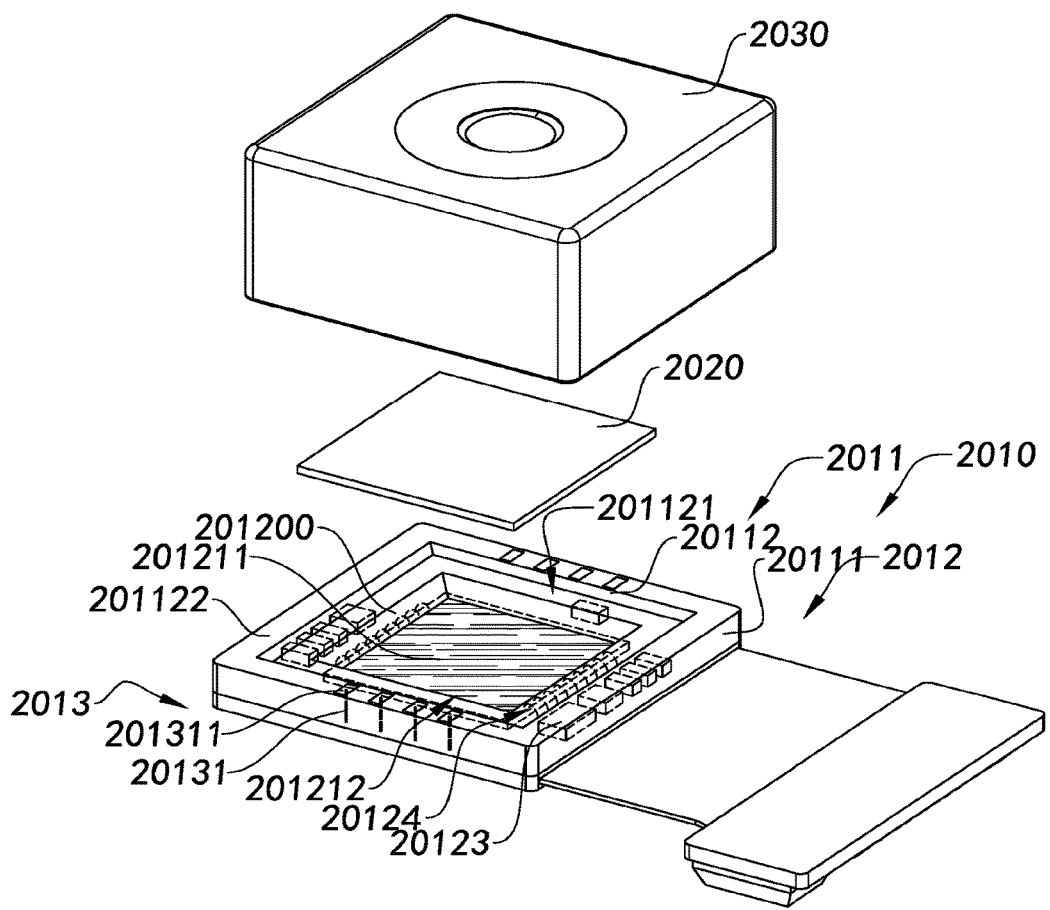
FIG. 45 is an exploded perspective view of the camera module according to the above alternative mode of the above fifteenth preferred embodiment of the present invention.

Referring to FIG. 41C, another alternative mode of the motor connecting structure of the above fifteenth preferred embodiment of the present invention. The motor connecting structure 2013 includes at least one carving line 20136. The carving line 20136 is adapted to electrically connect the connecting elements, the photosensitive sensor 20121, and the motor unit on the main circuit board 20122. For example, but not limited to that the carving line 20136 can be provided by Laser Direct Structuring (LDS) during the forming of the encapsulation portion 2011. For example, in an embodiment of the present invention, the carving line 20136 is formed by Laser Direct Structuring on the surface the encapsulation portion 2011. In the conventional way of connection, components like driving motor are connected to the circuit board through independent lead wires, which involve relatively complicated manufacture technique. However, the method of the present invention that arranges the carving line(s) 20136 in the molding process can not only substitute the conventional technological processes, like plugging or soldering of the motor terminal, but also make the circuit connection being more stable. More specifically, the formation process of the carving line 20136 can be formed by first providing a carving slot in the encapsulation portion 2011 and then electroplating or chemical plating in the carving slot to form the electrical circuit.

Referring to FIGS. 37, 40, 42, and 43, a camera module according to the above fifteenth preferred embodiment of the present invention is illustrated. The camera module can be an Automatic Focus Camera Module (AFM). The camera module 20100 includes one the photosensitive unit 2010, one the optical filter 2020, one motor unit 2030, and a camera lens 30.

The optical filter 2020 is mounted in the photosensitive unit 2010, while the camera lens 2030 is mounted in the motor unit 2040. The motor unit 2040 is mounted on the photosensitive unit 2010.

Furthermore, the optical filter 2020 is mounted in the installing groove 201121 of the optical filter installing section 20112 of the encapsulation portion 2011 of the photosensitive unit 2010. The motor unit 40 is mounted on top of the optical filter installing section 20112 of the encapsulation portion 2011 of the photosensitive unit 2010. In other words, the optical filter 2020 is mounted in the installing groove of the encapsulation portion 2011, while the camera lens 2030 is installed in the motor unit 2040. The motor unit 2040 is mounted on top of the encapsulation portion 2011.

Especially, the motor terminals 2041 of the motor units 2040 are electrically connected with the circuit connection junctions 20132 of the photosensitive unit, respectively, so as to be electrically connected to the main circuit board 20122 through the lead element 20131. The motor terminal 2041 can be connected to the motor coupling terminal 201311 of the lead element 20131 by attaching with conducting adhesive or by welding and soldering.

Especially, when the motor terminal is affixed on the circuit junction by attaching with conducting adhesive, it does not require to solder any lead wire for connecting the motor unit 2040 with the main circuit board 20122 of the photosensitive portion 2012, and thus it reduces the motor soldering process.

It is worth mentioning that the electrical connection of the motor unit 40 is described as electrical connecting the motor unit 40 by the lead element 20131 according to the present embodiment of the present invention, but in other embodiments of the present invention, it is possible to apply different motor connecting structures 2013 to connect the motor unit 40. For example, the various methods as shown in FIGS. 41A, 41B, and 41C. In other words, the various motor connecting structures as illustrated in FIGS. 41A, 41B, and 41C can be coupled with different photosensitive units respectively to provide different ways to electrically connect the motor unit. Therefore, person skilled in the art should understand that what are shown in the appended drawings shall not limit the scope of the present invention.

Those skilled in the art should understand that the structures and forms of the camera module mentioned above are just examples to describe ways of implementing the camera module, rather than limitations of the present invention.

Referring to FIGS. 37-40, 44, and 45, alternative mode of the camera module according to a fifteenth preferred embodiment of the present invention is illustrated. The camera module can be a fixed focus module (FFM). The camera module 20100 includes one the photosensitive unit 2010, one the optical filter 2020, and a camera lens 2030.

The optical filter 2020 and the camera lens 2030 are mounted at the photosensitive unit 2010.

More specifically, the optical filter 2020 is mounted in the installing groove 201121 of the optical filter installing section 20112 of the encapsulation portion 2011 of the photosensitive unit 2010. The camera lens 2030 is mounted at a top portion of the optical filter installing section 20112 of the encapsulation portion 2011 of the photosensitive unit 2010. In other words, the optical filter 20 is mounted in the installing groove, while the camera lens 2030 is mounted on top of the encapsulation portion 2011.

It is also worth mentioning that the camera lens 2030 is supported on top of the optical filter installing section 20112 of the encapsulation portion 2011 of the photosensitive unit 2010. Therefore, the encapsulation portion 2011 functions as the frame of a conventional camera module to provide a supportive and holding site for the camera lens 2030, but it is assembled by a different process from the process of the conventional COB technology. The independent mounting frame of a camera module based on the conventional COB technique is affixed on the circuit board by means of adhering, but the encapsulation portion 2011 of the present invention is affixed on the main circuit board 20122 by means of molding that does not require the process of adhering and affixing. Contrasting to the process of adhering and affixing, the process of molding provides better connection stability and technological process controllability. In addition, it does not have to reserve the adhesive space between the encapsulation portion 2011 and the main circuit board 20122 for AA adjustment. Therefore, it saves the adhesive space of AA adjustment of conventional camera module, and allows the thickness of the camera module to be further reduced. Meanwhile, the encapsulation portion 2011 encapsulates and wraps the circuit elements 20123 and the connecting elements 20124, which enables the function of the conventional mounting frame, the circuit elements 20123, and the connecting element 20124 can spatially overlap without the need to reserve a safety distance around the circuit components as in the conventional camera module. As a result, the height of the encapsulation portion 2011, which functions as the independent mounting frame, can be arranged in a smaller range, so as to further provide room for reducing the thickness of the camera module. Besides, the encapsulation portion 2011 substitutes the conventional frame that prevents any tilt deviation occurred in adhering and assembling such conventional frame that reduces the accumulated tolerance of the assembling of the camera module. In addition, the encapsulation and wrapping up of the connecting element(s) 20124 by the encapsulation portion 2011 and the inner extension of the encapsulation portion 2011 towards the non-photosensitive area 201212 of the photosensitive sensor 20121 enables the size of the encapsulation portion 2011 can be shrunk inwardly, so as to further decrease the lateral sizes in length and width of the camera module.

Figure 46:
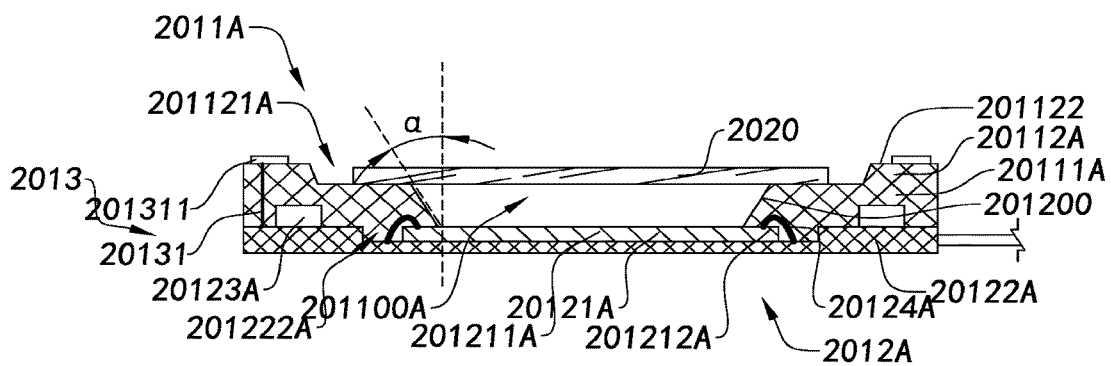
FIG. 46 is a sectional view of a photosensitive unit according to a sixteenth preferred embodiment of the present invention.
Figure 47:
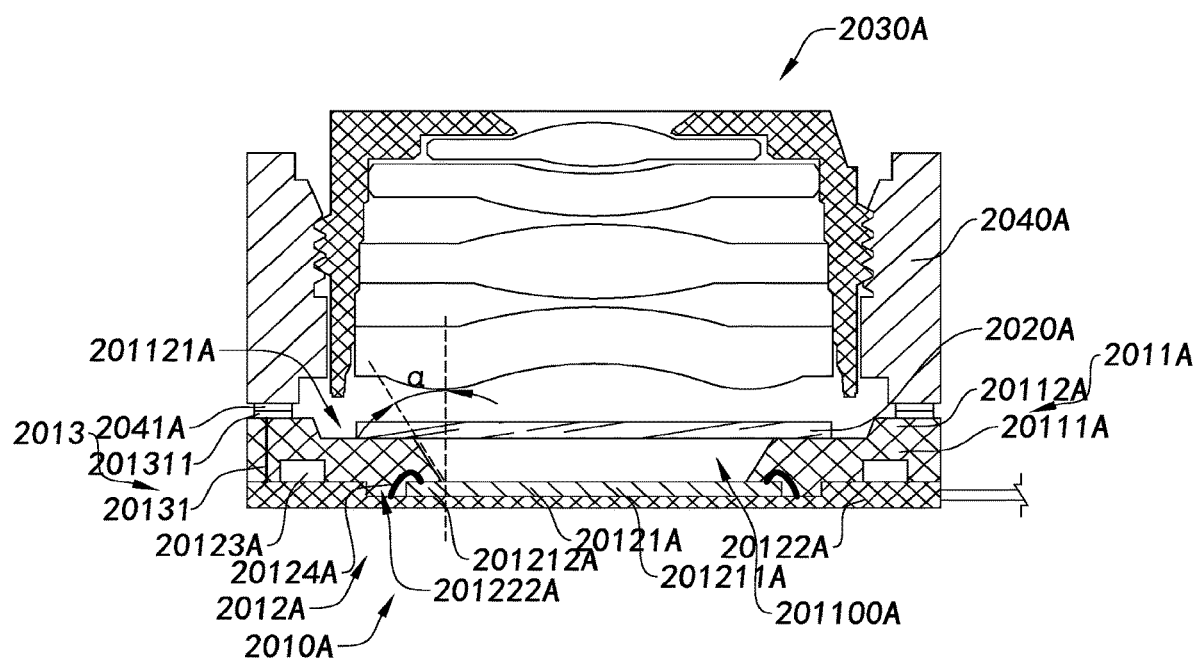
FIG. 47 is sectional view of the camera module according to an alternative mode of the above sixteenth preferred embodiment of the present invention.

Referring to FIGS. 46 and 47, a photosensitive unit and a camera module thereof according to a sixteenth preferred embodiment of the present invention are illustrated. The photosensitive unit 2010A is used for assembling and producing of camera module 20100A, so as to obtain a molded camera module. The photosensitive unit 2010A includes an encapsulation portion 2011A and a photosensitive portion 2012A, wherein the encapsulation portion 2011A is molded to connect with the photosensitive portion 2012A.

The photosensitive portion 2012A includes a main circuit board 20122A and a photosensitive sensor 20121A, wherein the photosensitive sensor 20121A is disposed on the main circuit board 20122A. According to the present embodiment of the present invention, the photosensitive sensor 20121A is molded to connect to the main circuit board 20122A.

According to the present embodiment of the present invention, the photosensitive portion 2012A includes a connecting circuit and at least a circuit element 20123A. The connecting circuit is prearranged in the main circuit board 20122A and the circuit element 20123A is electrically connected to the connecting circuit and the photosensitive sensor 20121A to process the photosensing function for the photosensitive sensor 20121A. The circuit element 20123A is protrudingly deployed on the main circuit board 20122A. The circuit element 20123A can be, for example but not limited to, resistors, capacitors, diodes, triodes, potentiometers, electric relays, actuators, or etc.

It is worth mentioning that the encapsulation portion 2011A encapsulates and wraps up the circuit element 20123A therein, so that the circuit element 20123A will not be directly exposed in any space, and more specifically, not be exposed in the environment that communicates with the photosensitive sensor 20121A. Therefore, during the assembling of the camera module, the circuit element 20123A will not contaminate pollutions, such as dusts, or adversely influence the photosensitive sensor 20121A. It is different from the conventional camera module that the circuit element 20123A, such as resistance-capacitance components, is exposed outside. The enclosure and encapsulation of the photosensitive sensor 20121A by molding, sundries and dusts are prevented from staying on the surface of the circuit element 20123A that avoids the photosensitive sensor 20121A from being contaminated and causes dark spots and other defectives of the camera module.

The encapsulation portion 2011A forms a window 201100A to provide a photosensitive path for the photosensitive sensor 20121A.

According to the present preferred embodiment of the present invention, the photosensitive portion 2012A includes at least one connecting element 20124A for electrically connecting the photosensitive sensor 20121A with the main circuit board 20122A. Further, the connecting element 20124A can be embodied to be, for example but not limited to, gold wire, copper wire, aluminum wire, and/or silver wire. Especially, the connecting elements 20124A curvingly connects the photosensitive sensor 20121A and the main circuit board 20122A. It is worth mentioning that the connecting element 20124A is molded inside the encapsulation portion 2011A, so that the connecting element(s) 20124A are enclosed, encapsulated and/or wrapped up by the molded encapsulation portion 2011A that keep them from direct exposure to the outside. Therefore, during the assembling of the camera module, the connecting element(s) 20124A will not suffer any collision or damage, and, at the same time, the influence by the environmental factors, such as temperature, on the connecting element 20124A is reduced that results in stabilization of the communication and connection between the photosensitive sensor 20121A and the main circuit board 20122A. This is completely different from the prior art.

It is worth mentioning that the encapsulation portion 2011A encapsulates and wraps up the circuit element 20123A and the connecting element 20124A, which advantages in protecting the circuit element 20123A and the connecting element 20124A as well as obtaining a higher performance camera module. However, those skilled in the art should understand that the encapsulation portion 2011A shall not be limited in wrapping up the circuit element 20123A and/or the connecting element 20124A. In other words, in other embodiments of the present invention, the encapsulation portion 2011A can be directly molded on main circuit board 20122A without protruded circuit element 20123A or be molded on various positions, such as the outer sides, the periphery, and etc., of the circuit element 20123A.

This is an alternative mode of the above preferred embodiment that, the main circuit board 20122A has an inner groove 201222A and the photosensitive sensor 20121A is installed in the inner groove 201222A, so as to reduce the relative height of the photosensitive sensor 20121A and the main circuit board 20122A. Therefore, when the encapsulation portion 2011A covers and wraps up the photosensitive sensor 20121A, the height of the encapsulation portion 2011A can be reduced that results in reducing the height of the camera module assembled with the photosensitive unit 2010A.

In addition, each of the photosensitive sensors 20121A has a photosensitive area 201211A and a non-photosensitive area 201212A, wherein the non-photosensitive area 201212A is positioned surrounding the periphery of the photosensitive area 201211A. The photosensitive area 201211A is adapted for processing photosensitization. The connecting element 20124A is connected to the non-photosensitive area 201212A.

According to the present preferred embodiment of the present invention, the encapsulation portion 2011A is extended to mold on the non-photosensitive area 201212A of the photosensitive sensor 20121A, so as to overlappedly mount the photosensitive sensor 20121A on the main circuit board 20122A by means of molding. Such that, for example, by using the process of Molding on Chip (MOC) or other molding technologies, the moldable area of the encapsulation portion can be increased inwardly, so that the structural portion 2011A the outer portions of the encapsulation portion 2011A and the main circuit board 20122A can be reduced, which further reduces the size in length and width of the photosensitive unit 2012A and reduces the size in length and width of the molded camera module assembled thereby.

In the present embodiment of the present invention, the encapsulation portion 2011A is protrudingly positioned surrounding the outer portion of the photosensitive area 201211A of the photosensitive sensor 20121A. Particularly, the encapsulation portion 2011A integrally seal its connection, so as to provide a great sealingness and tightness. Therefore, when the photosensitive unit 2010A is used to assemble the camera module, the photosensitive sensor 20121A will be sealed inside the camera module to forms a sealed inner space.

Furthermore, the encapsulation portion 2011A includes a covering section 20111A and an optical filter installing section 20112A. The optical filter installing section 20112A is molded integrally to connect with the covering section 20111A. The covering section 20111A is molded to attach on the main circuit board 20122A for encapsulating and wrapping up the circuit element 20123A and the connecting element 20124A. The optical filter installing section 20112A is arranged for installing an optical filter 2020A. In other words, when the photosensitive unit 2010A is used to assemble the camera module, the optical filter 2020A of the camera module will be mounted at the optical filter installing section 20112A, which makes the optical filter 2020A be positioned along the photosensitive path of the photosensitive sensor 20121A without the need of any additional mounting frame of the optical filter 2020A. In other words, the encapsulation portion 2011A of the present embodiment has a function as a conventional optical filter frame while the top portion of the optical filter installing section 20112A has a good evenness and smoothness by means of the molding technique, that enables the optical filter 2020A to be installed evenly, that is superior to conventional camera modules.

In addition, the optical filter installing section 20112A has an installing groove 201121A. The installing groove 201121A is communicated with the window 201100A to provide an adequate installation space for the optical filter 2020A such that the optical filter 2020A will not protrude from the top surface 201122A of the optical filter installing section 20112A. In other words, the top of the encapsulation portion 2011A has the installing groove 201121A provided therein for the optical filter 2020A to be stably installed at the encapsulation portion 2011A without protruding from the top of the encapsulation portion 2011A.

It is worth mentioning that the molded inner wall defines the window and can be provided according to the shape of the connecting element 20124A. For example, it can be in inclined or slope shape, so that while the connecting element 20124A is encapsulated and wrapped up by the encapsulation portion, the photosensitive sensor 20121A may receive as much light as possible. Person skilled in the art should understand that a specific shape of the encapsulation portion 2011A will not limit the scope of the present invention.

Referring to FIGS. 46-47, the camera module according to the sixteenth preferred embodiment of the present invention is illustrated. The camera module can be an automatic focus camera module (AFM). Such camera module includes one the photosensitive unit 2010A, one the optical filter 2020A, one motor unit 2030A, and a camera lens 2030A.

The optical filter 2020A is mounted in the photosensitive unit 2010A, while the camera lens 2030A is mounted in the motor unit 2040A. The motor unit 2040A is mounted on the photosensitive unit 2010A.

Furthermore, the optical filter 2020A is mounted in the installing groove 201121A of the optical filter installing section 20112A of the encapsulation portion 2011A of the photosensitive unit 2010A. The motor unit 40 is mounted on top of the optical filter installing section 20112A of the encapsulation portion 2011A of the photosensitive unit 2010A. In other words, the optical filter 2020A is mounted in the installing groove 201121A of the encapsulation portion 2011A, while the camera lens 30 is installed in the motor unit 2030A. The motor unit 40 is mounted on top of the encapsulation portion 2011A.

Especially, the motor unit 2040A is electrically connected with the photosensitive unit 2010A through the motor connecting structure 2013. The motor terminal 2041A of the motor unit 2040A is electrically connected with the circuit connection junction 20132 of the photosensitive unit 2010, so as to be electrically connected to the main circuit board 20122 through the lead element 20131. The motor terminal 2041 can be connected to the motor coupling terminal 201311 of the lead element 20131 by attaching with conducting adhesive or by welding and soldering.

Especially, when the motor terminal 2041A is affixed on the circuit junction by attaching with conducting adhesive, it does not require to solder any lead wire for connecting the motor unit 2040A with the main circuit board 20122 of the photosensitive portion 2012, and thus it reduces the motor soldering process.

It is worth mentioning that the electrical connection of the motor unit 2040A is described as electrical connecting the motor unit 2040A by the lead element 20131 according to the present embodiment of the present invention, but in other embodiments of the present invention, it is possible to apply different motor connecting structures 2013 to connect the motor unit 2040G. For example, the various methods as shown in FIGS. 41A, 41B, and 41C. In other words, the various motor connecting structures as illustrated in FIGS. 41A, 41B, and 41C can be coupled with the photosensitive unit 2010A of the present embodiment, so as to provide different ways to electrically connect the motor unit. Therefore, person skilled in the art should understand that what are shown in the appended drawings shall not limit the scope of the present invention.

In other embodiments of the present invention, the photosensitive unit 2010A can also be assembled into a fixed focus camera module. Therefore, person skilled in the art should understand that the type of the camera module shall not limit the scope of the present invention.

Figure 48:
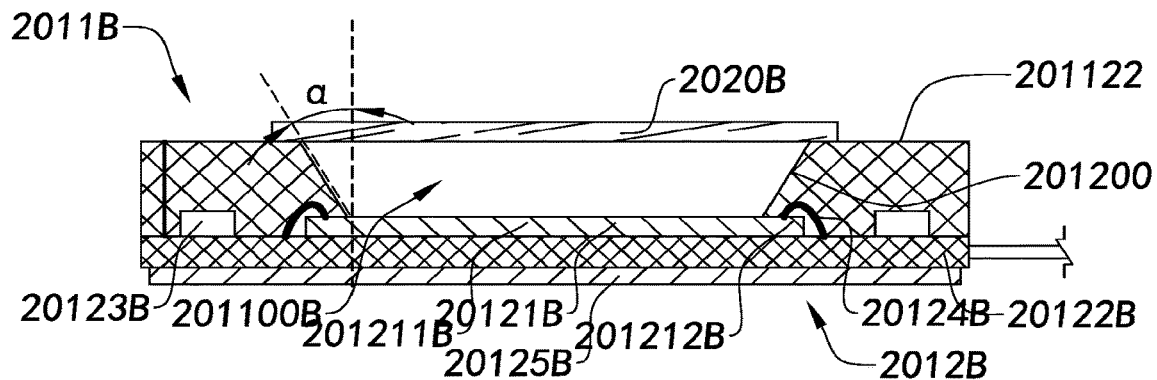
FIG. 48 is a sectional view of a photosensitive unit according to an seventeenth preferred embodiment of the present invention.
Figure 49:
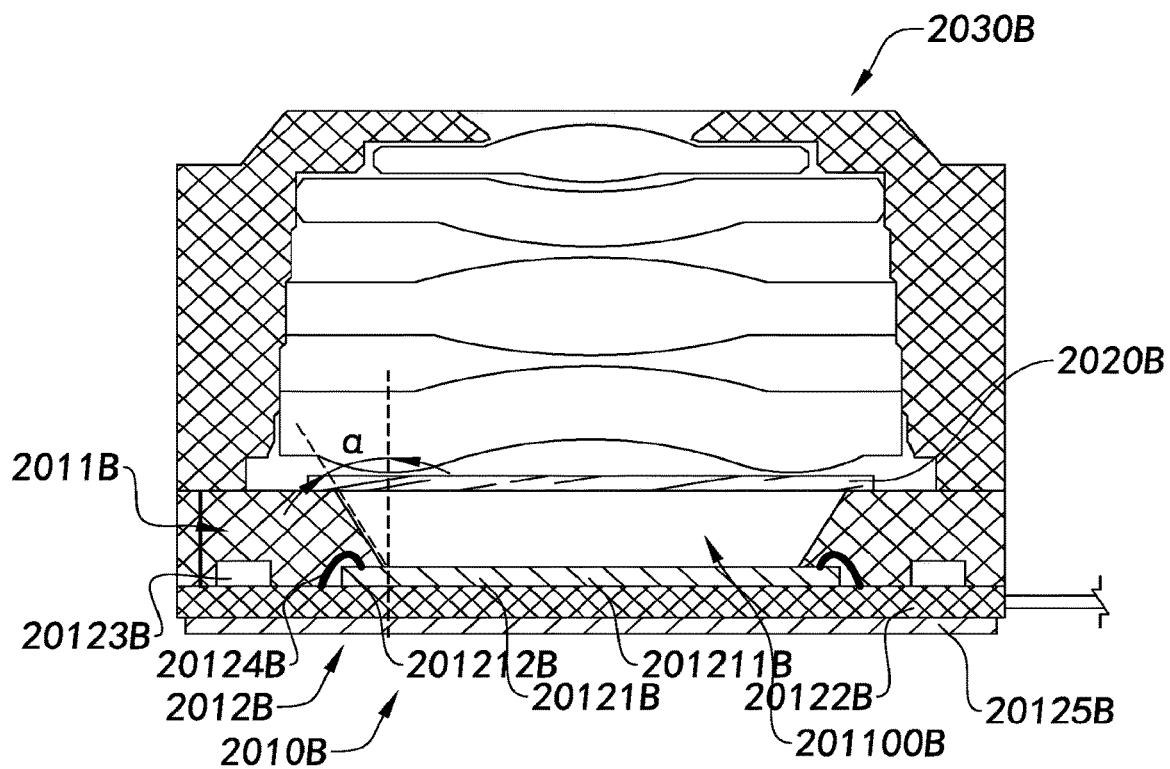
FIG. 49 is sectional view of the camera module according to an alternative mode of the above seventeenth preferred embodiment of the present invention.

Referring to FIGS. 48 and 49, a photosensitive unit and a camera module according to an seventeenth preferred embodiment of the present invention is illustrated. The photosensitive unit 2010B is used for assembling and producing of camera module, so as to obtain a molded camera module. The photosensitive unit 2010B includes an encapsulation portion 2011B and a photosensitive portion 2012B, wherein the encapsulation portion 2011B is molded to connect with the photosensitive portion 2012B.

The photosensitive portion 2012B includes a main circuit board 20122B and a photosensitive sensor 20121B, wherein the photosensitive sensor 20121B is disposed on the main circuit board 20122B. According to the present embodiment of the present invention, the photosensitive sensor 20121B is molded to connect to the main circuit board 20122B.

According to the present embodiment of the present invention, the photosensitive portion 2012B includes a connecting circuit and at least a circuit element 20123B. The connecting circuit is prearranged in the main circuit board 20122B and the circuit element 20123B is electrically connected to the connecting circuit and the photosensitive sensor 20121B to process the photosensing function for the photosensitive sensor 20121B. The circuit element 20123B is protrudingly deployed on the main circuit board 20122B. The circuit element 20123B can be, for example but not limited to, resistors, capacitors, diodes, triodes, potentiometers, electric relays, actuators, or etc.

It is worth mentioning that the encapsulation portion 2011B encapsulates and wraps up the circuit element 20123B therein, so that the circuit element 20123B will not be directly exposed in any space, and more specifically, not be exposed in the environment that communicates with the photosensitive sensor 20121B. Therefore, during the assembling of the camera module, the circuit element 20123B will not contaminate pollutions, such as dusts, or adversely influence the photosensitive sensor 20121B. It is different from the conventional camera module that the circuit element 20123B, such as resistance-capacitance components, is exposed outside. The enclosure and encapsulation of the photosensitive sensor 20121B by molding, sundries and dusts are prevented from staying on the surface of the circuit element 20123B that avoids the photosensitive sensor 20121B from being contaminated and causes dark spots and other defectives of the camera module.

The encapsulation portion 2011B forms a window 201100B to provide a photosensitive path for the photosensitive sensor 20121B.

According to the present preferred embodiment of the present invention, the photosensitive portion 2012B includes at least one connecting element 20124B for electrically connecting the photosensitive sensor 20121B with the main circuit board 20122B. Further, the connecting element 20124B can be embodied to be, for example but not limited to, gold wire, copper wire, aluminum wire, and/or silver wire. Especially, the connecting elements 20124B curvingly connects the photosensitive sensor 20121B and the main circuit board 20122B.

It is worth mentioning that the connecting element 20124B is molded within the encapsulation portion 2011B, so that the encapsulation portion 2011B, encloses, encapsulates and/or wraps up the connecting element(s) 20124B and keep them from direct exposure to the outside. Therefore, during the assembling of the camera module, the connecting element(s) 20124B will not suffer any collision or damage, and, at the same time, it reduces the impact due to the environmental factors, such as temperature and humidity, on the connecting element 20124B and stabilizes the communication and connection between the photosensitive sensor 20121B and the main circuit board 20122B. This is completely absent in the traditional art.

It is worth mentioning that the encapsulation portion 2011B encapsulates and wraps up the circuit element 20123B and the connecting element 20124B, which advantages in protecting the circuit element 20123B and the connecting element 20124B as well as obtaining a higher performance camera module. However, those skilled in the art should understand that the encapsulation portion 2011B shall not be limited in wrapping up the circuit element 20123B and/or the connecting element 20124B. In other words, in other embodiments of the present invention, the encapsulation portion 2011B can be directly molded on main circuit board 20122B without protruded circuit element 20123B or be molded on various positions, such as the outer sides, the periphery, and etc., of the circuit element 20123B.

In addition, each of the photosensitive sensors 20121B has a photosensitive area 201211B and a non-photosensitive area 201212B, wherein the non-photosensitive area 201212B is positioned surrounding the periphery of the photosensitive area 20121IB. The photosensitive area 20121IB is adapted for processing photosensitization. The connecting element 20124B is connected to the non-photosensitive area 201212B.

According to the present preferred embodiment of the present invention, the encapsulation portion 2011B is extended to mold on the non-photosensitive area 201212B of the photosensitive sensor 20121B, so as to overlappedly mount the photosensitive sensor 20121B on the main circuit board 20122B by means of molding. In this manner, such as the method of Molding on Chip (MOC), the moldable area of the encapsulation portion 2011B can be extended inwardly, such that the structural portion outside of the encapsulation portion 2011B and the main circuit board 20122B can be reduced, that further reduces the size in length and width the molded photosensitive portion 2012B and reduces the size in length and width of the camera module assembled thereby.

In the present embodiment of the present invention, the encapsulation portion 2011B is protrudingly positioned surrounding the outer portion of the photosensitive area 20121IB of the photosensitive sensor 20121B. Particularly, the encapsulation portion 2011B integrally seal its connection, so as to provide a great sealingness and tightness. Therefore, when the photosensitive unit 2010B is used to assemble the camera module, the photosensitive sensor 20121B will be sealed inside the camera module to forms a sealed inner space.

Particularly, in producing the photosensitive unit 2010B, a conventional circuit board can be used to make the main circuit board 20122B. The photosensitive sensor 20121B is deployed on the main circuit board 20122B and electrically connected by the connecting elements 20124B. Then, after the main circuit board 20122B and the photosensitive sensor 20121B are initially assembled, they are processed by Surface Mount Technology (SMT) and then molded by the insert molding technique, for example by means of an injection molding machine, to form the encapsulation portion 2011B, or molded by the pressing molding technique, which is commonly applied in semiconductor packaging, to form the encapsulation portion 2011B. The main circuit board 20122B can selectively be, for example but not limited to, rigid-flex board, ceramic substrate (without flexible board), or rigid PCB (without flexible board). The formation of the encapsulation portion 2011B can be selected by, for example but not limited to, injection molding technique and pressing molding technique. The material of the encapsulation portion 2011B can be, for example but not limited to, nylon, liquid crystal polymer (LCP), or polypropylene (PP) for injection molding technique, or epoxy resin for pressing molding technique. Person skilled in the art should understand that the above available manufacture methods and available materials are examples to describe available implementations of the present invention, rather than limitations of the present invention.

Furthermore, the top surface of the encapsulation portion 2011B is flat and smooth, and is adapted for mounting an optical filter 2020B thereon. In other words, when the photosensitive unit 2010B is used in assembling the camera module, the optical filter 2020B of the camera module is mounted on the top surface of the encapsulation portion 2011B, enabling the optical filter 2020B to be arranged along the photosensitive path of the photosensitive sensor 20121B without the need of any additional mounting frame for the optical filter. In other words, the encapsulation portion 2011B also functions as a conventional independent mounting frame. In addition, due to the advantage of molding technique, the molded top portion of the encapsulation portion 2011B can take advantage of the mold to achieve good evenness and smoothness, so that the optical filter 2020B can be evenly installed, that is superior to conventional camera module.

The differences between the above preferred embodiments and the present seventeenth embodiment of the present invention, the photosensitive portion 2012B of the photosensitive unit 2010B further includes a reinforced layer 20125B overlappedly attached to the bottom of the main circuit board 20122B, so as to reinforce the structural strength of the main circuit board 20122B. In other words, the reinforced layer 20125B is adhered on a position of the bottom layer of the main circuit board 20122B corresponding to the positions of the encapsulation portion 2011B and the photosensitive sensor 20121B, so that the main circuit board 20122B can also stably and reliably support the encapsulation portion 2011B and the photosensitive sensor 20121B.

Furthermore, the reinforced layer 20125B is a metal plate attaching on the bottom layer of the main circuit board 20122B to increase the structural strength of the main circuit board 20122B as well as to enhance the heat dissipation of the photosensitive unit 2010B by effectively dissipating heat generated by the photosensitive sensor 20121B.

It is worth mentioning that the main circuit board 20122B can be Flex Print Circuit (FPC). By enhancing the rigidity of the FPC with the reinforced layer 20125B, the FPC having excellent flexural property can still fulfill the loading and supporting requirement for the photosensitive unit 2010B. In other words, more options of different circuit boards can be used as the main circuit board 20122B, such as PCB (Printed Circuit Board), FPC (Flexible Printed Circuit), and RF (Rigid Flex). By using the reinforced layer 20125B to enhance the structural strength and heat dissipation of the main circuit board 20122B, the thickness of the main circuit board 20122B can thus be reduced, that enables the height of the photosensitive unit 2010B to be further reduced. Hence, the height of the camera module assembled thereby can be reduced too.

It is worth mentioning that, according to the present embodiment of the present invention, the reinforced layer 20125 is overlapped on the main circuit board 20122B in a plane manner. In other embodiments of the present invention, the reinforced layer 20125B can be extended to cover the side walls of the encapsulation portion 2011B, so as to not only reinforce the structural strength of the photosensitive unit 2010B, but also enhance an anti-electromagnetic ability thereof.

It is worth mentioning that the inner wall of the encapsulation portion is designed according to the shape of the connecting element 20124 to be mounted thereon. For example, it can be in sloped or inclined shape, so that while it encapsulates and wraps up the connecting element(s) 20124B, the photosensitive sensor 20121B is capable of receiving as much light as possible. Person skilled in the art should understand that a specific shape of the encapsulation portion 2011B will not limit the scope of the present invention.

Referring to FIGS. 48-49, the camera module according to the seventeenth eighteenth preferred embodiment of the present invention is illustrated. The camera module can be a fixed focus module (FFM). The camera module includes one the photosensitive unit 2010B, one the optical filter 2020B, and a camera lens 2030B.

The optical filter 2020B is installed at the photosensitive unit 2010B, while the camera lens 2030B is mounted on the photosensitive unit 2010B.

More specifically, the optical filter 2020B is mounted on top of encapsulation portion 2011B of the photosensitive unit 2010B. The camera lens 2030B is mounted on top of encapsulation portion 2011B of the photosensitive unit 2010B. Particularly, the specific installation positions of the optical filter 2020B and the camera lens 2030B in the encapsulation portion 2011B can be coordinated and arranged based on practical needs.

It is also worth mentioning that the camera lens 2030B is supported on top portion of the encapsulation portion 2011B of the photosensitive unit 2010B. Therefore, the encapsulation portion 2011B can also function as the independent mounting frame of a conventional camera module to provide a supportive and holding site for the camera lens 2030B, but it is assembled by technical process different from the conventional COB technology. The independent mounting frame of a camera module based on the conventional COB technique is affixed on the circuit board by means of adhering, but the encapsulation portion 2011B of the present invention is affixed on the main circuit board 20122B by means of molding that does not require the process of adhering and affixing. Contrasting to the process of adhering and affixing, the process of molding provides better connection stability and technological process controllability. In addition, it does not have to reserve the adhesive space between the encapsulation portion 2011B and the main circuit board 20122B for AA adjustment. Therefore, it saves the adhesive space of AA adjustment of conventional camera module, and allows the thickness of the camera module to be further reduced. Meanwhile, the encapsulation portion 2011B encapsulates and wraps the circuit elements 20123B and the connecting elements 20124B, that enables the function of the conventional mounting frame, the circuit elements 20123B, and the connecting element 20124B can spatially overlap without the need to reserve a safety distance around the circuit components as in the conventional camera module. As a result, the height of the encapsulation portion 2011B, which functions as the independent mounting frame, can be arranged in a smaller range, so as to further provide room for reducing the thickness of the camera module. Besides, the encapsulation portion 2011B that substitutes the conventional mounting frame avoids any tilt deviation occurred in attaching and assembling the mounting frame as in the conventional camera module and to reduce the accumulated tolerance of in assembling the camera module. In addition, the encapsulation and wrapping up of the connecting element(s) 20124B by the encapsulation portion 2011B and the inner extension of the encapsulation portion 2011B towards the non-photosensitive area 201212B of the photosensitive sensor 20121B enables the size of the encapsulation portion 2011B can be shrunk inwardly, so as to further decrease the lateral sizes in length and width of the camera module.

Figure 50:
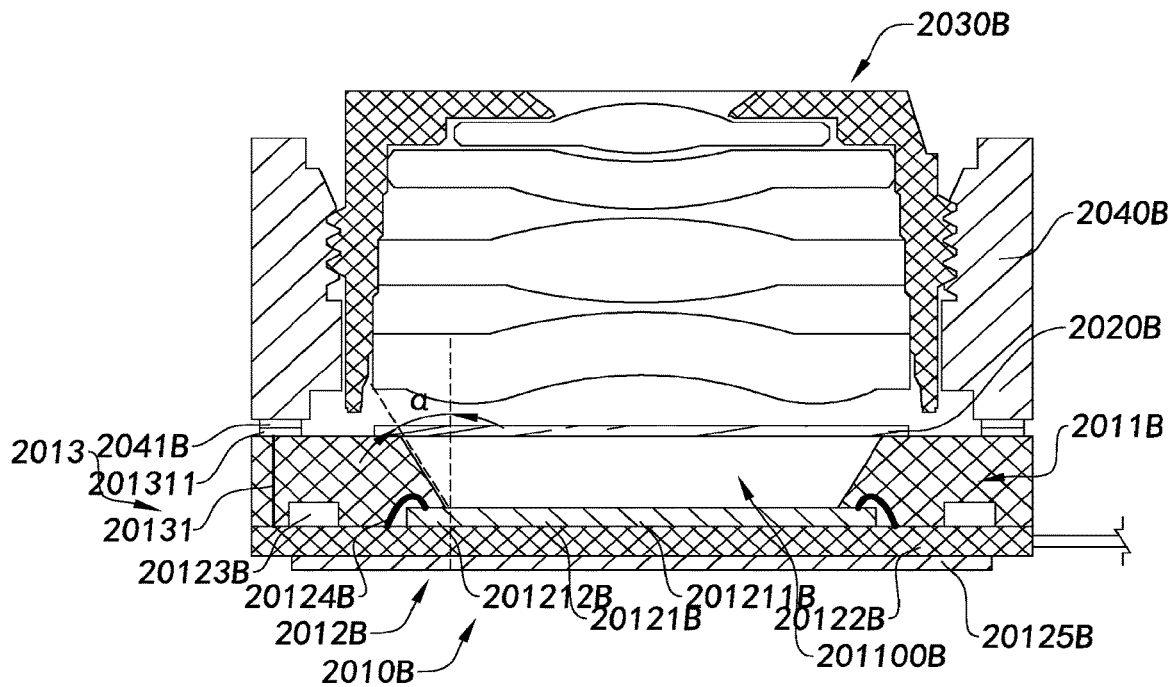
FIG. 50 is sectional view of the camera module according to an alternative mode of the above seventeenth preferred embodiment of the present invention.

Referring to FIGS. 48 to 50, alternative modes of the camera module according to the above seventeenth preferred embodiment of the present invention is illustrated. The camera module can be an automatic focus camera module. The camera module includes one the photosensitive unit 2010B, one the optical filter 2020B, a motor unit 2040B, and a camera lens 2030B.

The optical filter 2020B is mounted in the photosensitive unit 2010B, while the camera lens 2030B is mounted in the motor unit 2040B. The motor unit 2040B is mounted on the photosensitive unit.

Furthermore, the optical filter 2020B is mounted on the top portion of encapsulation portion 2011B of the photosensitive unit 2010B. The motor unit 2040B is mounted on the top portion of the encapsulation portion 2011B of the photosensitive unit 2010B. Particularly, the specific installation positions of the optical filter 2020B and the motor unit 2040B at the encapsulation portion 2011B can be coordinated and arranged based on practical needs.

Those skilled in the art should understand that the structures and forms of the camera module mentioned above are just examples to describe ways of implementing the camera module, rather than limitations of the present invention.

Especially, the motor unit 2040B is electrically connected with the photosensitive unit 2010B through the motor connecting structure 2013. The motor terminal 2041B of the motor unit 2040B is electrically connected with the circuit connection junction 20132 of the photosensitive unit 2010, so as to be electrically connected to the main circuit board 20122 through the lead element 20131. The motor terminal 2041B can be connected to the motor coupling terminal 201311 of the lead element 20131 by attaching with conducting adhesive or by welding and soldering.

Especially, when the motor terminal 2041B is affixed on the circuit junction by attaching with conducting adhesive, it does not require soldering any lead wire for connecting the motor unit 2040B with the main circuit board 20122 of the photosensitive portion 2012, and thus it reduces the motor soldering process.

It is worth mentioning that the electrical connection of the motor unit 2040B is described as electrical connecting the motor unit 2040B by the lead element 20131 according to the present embodiment of the present invention, but in other embodiments of the present invention, it is possible to apply different motor connecting structures 2013 to connect the motor unit 2040G. For example, the various methods as shown in FIGS. 41A, 41B, and 41C. In other words, the various motor connecting structures as illustrated in FIGS. 41A, 41B, and 41C can be coupled with the photosensitive unit 2010B of the present embodiment, so as to provide different ways to electrically connect the motor unit. Therefore, person skilled in the art should understand that what are shown in the appended drawings shall not limit the scope of the present invention.

Figure 51:
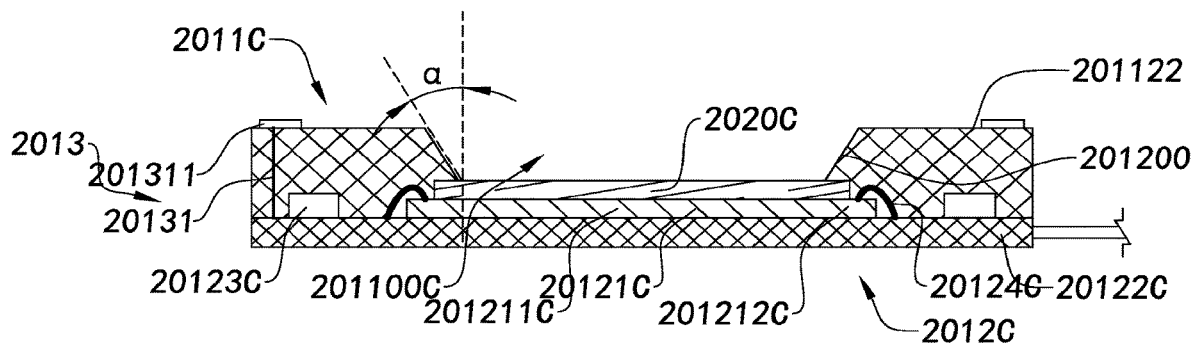
FIG. 51 is a sectional view of a photosensitive unit according to a eighteenth preferred embodiment of the present invention.
Figure 52:
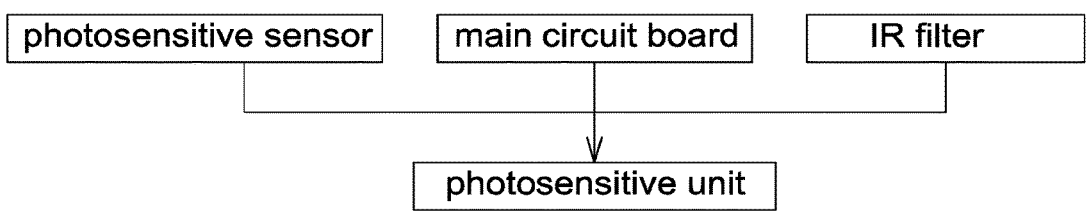
FIG. 52 is a block diagram of the photosensitive unit according to the above eighteenth preferred embodiment of the present invention.

Referring to FIGS. 51 and 52, the photosensitive unit and camera module according to an eighteenth preferred embodiment of the present invention are illustrated. The photosensitive unit 2010C is used for assembling and producing of camera module, so as to obtain a molded camera module. The photosensitive unit 2010C includes an encapsulation portion 2011C and a photosensitive portion 2012C, wherein the encapsulation portion 2011C is molded to connect with the photosensitive portion 2012C.

The photosensitive portion 2012C includes a main circuit board 20122C and a photosensitive sensor 20121C, wherein the photosensitive sensor 20121C is disposed on the main circuit board 20122C. According to the present embodiment of the present invention, the photosensitive sensor 20121C is molded to connect to the main circuit board.

According to the present embodiment of the present invention, the photosensitive portion 2012C includes a connecting circuit and at least a circuit element 20123C. The connecting circuit is prearranged in the main circuit board 20122C and the circuit element 20123C is electrically connected to the connecting circuit and the photosensitive sensor 20121C to process the photosensing function for the photosensitive sensor 20121C. The circuit element 20123C is protrudingly deployed on the main circuit board 20122C.

The circuit element 20123C can be, for example but not limited to, resistors, capacitors, diodes, triodes, potentiometers, electric relays, actuators, or etc.

It is worth mentioning that the encapsulation portion 2011C encapsulates and wraps up the circuit element 20123C therein, so that the circuit element 20123C will not be directly exposed in any space, and more specifically, not be exposed in the environment that communicates with the photosensitive sensor 20121C. Therefore, during the assembling of the camera module, the circuit element 20123C will not contaminate pollutions, such as dusts, or adversely influence the photosensitive sensor 20121C. It is different from the conventional camera module that the circuit element 20123C, such as resistance-capacitance components, is exposed outside. The enclosure and encapsulation of the photosensitive sensor 20121C by molding, sundries and dusts are prevented from staying on the surface of the circuit element 20123C that avoids the photosensitive sensor 20121C from being contaminated and causes dark spots and other defectives of the camera module.

The encapsulation portion 2011C forms a window 201100C to provide a photosensitive path for the photosensitive sensor 20121C.

According to the present preferred embodiment of the present invention, the photosensitive portion 2012C includes at least one connecting element 20124C for electrically connecting the photosensitive sensor 20121C with the main circuit board 20122C. Further, the connecting element 20124C can be embodied to be, for example but not limited to, gold wire, copper wire, aluminum wire, and/or silver wire. Especially, the connecting elements 20124C curvingly connects the photosensitive sensor 20121C and the main circuit board 20122C.

It is worth mentioning that the connecting element 20124C is molded within the encapsulation portion 2011C, so that the encapsulation portion 2011C, encloses, encapsulates and/or wraps up the connecting element(s) 20124C and keep them from direct exposure to the outside. Therefore, during the assembling of the camera module, the connecting element(s) 20124C will not suffer any collision or damage, and, at the same time, it reduces the impact due to the environmental factors, such as temperature and humidity, on the connecting element 20124C and stabilizes the communication and connection between the photosensitive sensor 20121C and the main circuit board 20122C. This is completely absent in the traditional art.

It is worth mentioning that the encapsulation portion 2011C encapsulates and wraps up the circuit element 20123C and the connecting element 20124C, which advantages in protecting the circuit element 20123C and the connecting element 20124C as well as obtaining a higher performance camera module. However, those skilled in the art should understand that the encapsulation portion 2011C shall not be limited in wrapping up the circuit element 20123C and/or the connecting element 20124C. In other words, in other embodiments of the present invention, the encapsulation portion 2011C can be directly molded on main circuit board 20122C without protruded circuit element 20123C or be molded on various positions, such as the outer sides, the periphery, and etc., of the circuit element 20123C.

In addition, each of the photosensitive sensors 20121C has a photosensitive area 201211C and a non-photosensitive area 201212C, wherein the non-photosensitive area 201212C is positioned surrounding the periphery of the photosensitive area 201211C. The photosensitive area 201211C is adapted for processing photosensitization. The connecting element 20124C is connected to the non-photosensitive area 201212C.

According to the present preferred embodiment of the present invention, the encapsulation portion 2011C is extended to mold on the non-photosensitive area 201212C of the photosensitive sensor 20121C, so as to overlappedly mount the photosensitive sensor 20121C on the main circuit board 20122C by means of molding. In this manner, such as using the method of Molding on the Chip, the moldable area of the encapsulation portion 2011C can be extended inwardly, such that the structural portion of the outer portion of the encapsulation portion 2011C and the main circuit board 20122C can be reduced, that further reduces the size in length and width of the photosensitive unit and reduces the size in length and width of the camera module assembled thereby.

In the present embodiment of the present invention, the encapsulation portion 2011C is protrudingly positioned surrounding the outer portion of the photosensitive area 201211C of the photosensitive sensor 20121C. Particularly, the encapsulation portion 2011C integrally seal its connection, so as to provide a great sealingness and tightness. Therefore, when the photosensitive unit 2010C is used to assemble the camera module, the photosensitive sensor 20121C will be sealed inside the camera module to forms a sealed inner space.

Particularly, in producing the photosensitive unit 2010C, a conventional circuit board can be used to make the main circuit board 20122C. The photosensitive sensor 20121C is deployed on the main circuit board 20122C and electrically connected by the connecting elements 20124C. Then, after the main circuit board 20122C and the photosensitive sensor 20121C are initially assembled, they are processed by Surface Mount Technology (SMT) and then molded by the insert molding technique, for example by means of an injection molding machine, to form the encapsulation portion 2011C, or molded by the pressing molding technique, which is commonly applied in semiconductor packaging, to form the encapsulation portion 2011C. The main circuit board 20122C can selectively be, for example but not limited to, rigid-flex board, ceramic substrate (without flexible board), rigid PCB (without flexible board), or flexible printed circuit (FPC). The formation of the encapsulation portion 2011C can be selected by, for example but not limited to, injection molding technique and pressing molding technique. The material of the encapsulation portion 2011C can be, for example but not limited to, nylon, liquid crystal polymer (LCP), or polypropylene (PP) for injection molding technique, or epoxy resin for pressing molding technique. Person skilled in the art should understand that the above available manufacture methods and available materials are examples to describe available implementations of the present invention, rather than limitations of the present invention.

The photosensitive unit 2010C further includes an optical filter 2020C, wherein the optical filter 2020C is molded to be overlappedly disposed on the photosensitive sensor 20121C. The edges of the optical filter 2020C are molded by the encapsulation portion 2011C so as to affix the optical filter 2020C in position. It is worth mentioning that the optical filter 2020C covers on the photosensitive sensor 20121C and insulates the photosensitive sensor 20121C from the external environment to protect the photosensitive sensor 20121C from damage and prevent dusts from entering therein.

To produce the photosensitive unit 2010C, the photosensitive sensor 20121C is firstly adhered on the main circuit board 20122C and the connecting element 124C is connected with the photosensitive sensor 20121C and the main circuit board 20122C. Then, the optical filter 2020C is adhered on the photosensitive sensor 20121C. Thereafter, the main circuit board, the photosensitive sensor 20121C, and the optical filter 2020C are molded to form the encapsulation portion 2011C. During the molding process, since the optical filter 2020C covers on top of the photosensitive sensor 20121C, any damage caused by the molding mold to the photosensitive sensor 20121C can be prevented. In addition, because the distance between the optical filter 2020C and the photosensitive sensor 20121C is shortened, the back focal length of the camera module assembled thereby can also be shortened, so that the height of the camera module is reduced too. On the other hand, since there is no need to provide an additional supporting component for the optical filter 2020C, the thickness of the camera module can be further reduced.

It is worth mentioning that the inner wall of the encapsulation portion 2010C is designed according to the shape of the connecting element 20124 to be mounted thereon. For example, it can be in sloped or inclined shape, so that while it encapsulates and wraps up the connecting element(s) 20124C, the photosensitive sensor 20121C is capable of receiving as much light as possible. Person skilled in the art should understand that a specific shape of the encapsulation portion 2011C will not limit the scope of the present invention.

Figure 53:
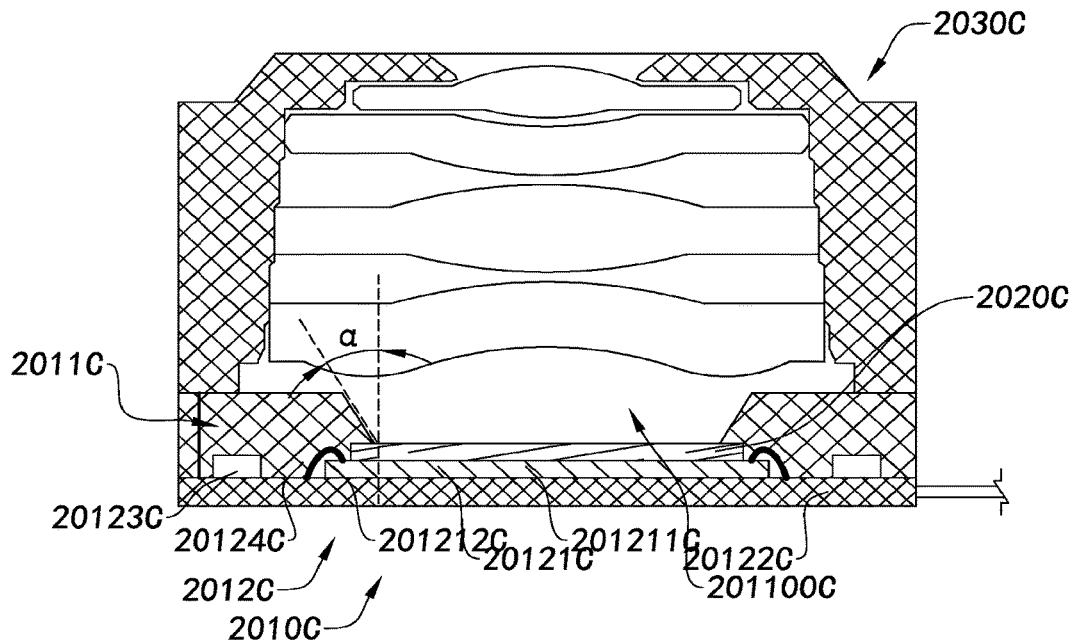
FIG. 53 is a sectional view of the camera module according to the above eighteenth preferred embodiment of the present invention.

Referring to FIGS. 51-53, the camera module according to the eighteenth nineteenth preferred embodiment of the present invention is illustrated. The camera module can be an automatic focus module. The camera module 20100C includes one the photosensitive unit 2010C and a camera lens 2030C. The camera lens 2030C is mounted on the photosensitive unit 2010C for assembling to form the camera module.

Especially, the camera lens 2030C can be affixed on top of the encapsulation portion 2011C of the photosensitive unit 2010C by means of adhering. In addition, taking advantage of the features of the molding production in the molding technique, the top portion of the encapsulation portion 2011C can have a better evenness and smoothness that provides an excellent installation condition for the camera lens 2030C, so as to achieve a high quality camera module.

It is worth mentioning that the camera lens 2030C is supported on top of the encapsulation portion 2011C of the photosensitive unit 2010C. Therefore, the encapsulation portion 2011C itself functions as the independent mounting frame of a conventional camera module to provide supportive and holding site for the camera lens 2030C, but it is assembled by different technical process from the conventional COB technology. The independent mounting frame of a camera module based on the conventional COB technique is affixed on the circuit board by means of adhering, but the encapsulation portion 2011C of the present invention is affixed on the main circuit board 20122C by means of molding that does not require the process of adhering and affixing. Contrasting to the process of adhering and affixing, the process of molding provides better connection stability and technological process controllability. In addition, it does not have to reserve the adhesive space between the encapsulation portion 2011C and the main circuit board 20122C for AA adjustment. Therefore, it saves the adhesive space of AA adjustment of conventional camera module, and allows the thickness of the camera module to be further reduced. Meanwhile, the encapsulation portion 2011C encapsulates and wraps the circuit elements 20123C and the connecting elements 20124C, that enables the function of the conventional mounting frame, the circuit elements 20123C, and the connecting element 20124C can spatially overlap without the need to reserve a safety distance around the circuit components as in the conventional camera module. As a result, the height of the encapsulation portion 2011C, which functions as the independent mounting frame, can be arranged in a smaller range, so as to further provide room for reducing the thickness of the camera module. Besides, the encapsulation portion 2011C that substitutes the conventional mounting frame avoids any tilt deviation occurred in attaching and assembling the mounting frame as in the conventional camera module and to reduce the accumulated tolerance of in assembling the camera module. In addition, the encapsulation and wrapping up of the connecting element(s) 20124C by the encapsulation portion 2011C and the inner extension of the encapsulation portion 2011C towards the non-photosensitive area 201212C of the photosensitive sensor 20121C enables the size of the encapsulation portion 2011C can be shrunk inwardly, so as to further decrease the lateral sizes in length and width of the camera module. Also, the photosensitive unit 2010C molds the optical filter 2020C therein, so when assembling the camera module, it is not necessary to conduct one more optical filter attachment process. As a result, the assembling technological process of the camera module can be minimized while the efficiency can be enhanced. These are both superior to the traditional art.

Figure 54:
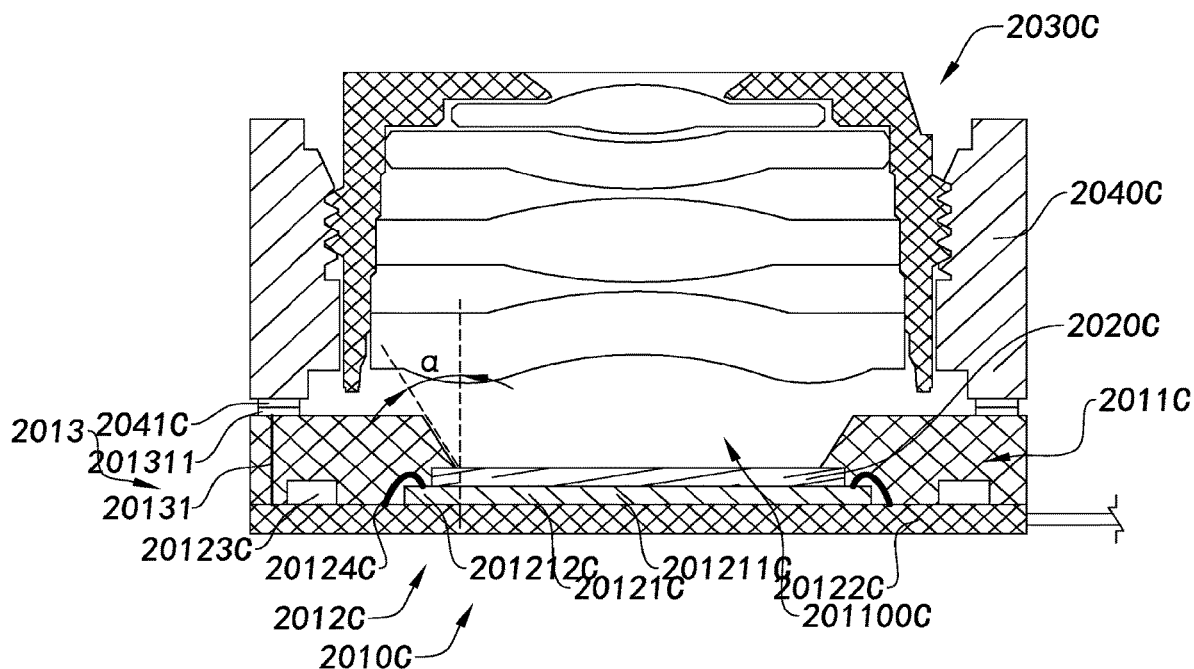
FIG. 54 is sectional view of the camera module according to an alternative mode of the above eighteenth preferred embodiment of the present invention.

Referring to FIGS. 51, 53, and 54, alternative modes of the camera module according to the above eighteenth preferred embodiment of the present invention are illustrated. The camera module 20100C can be an automatic focus camera module (AFM). The camera module includes one the photosensitive unit 2010C, one the motor unit 2040C, and a camera lens 2030C.

The camera lens 2030C is installed on the motor unit 2040C. The motor unit 2040C is installed on the photosensitive unit 2010C, so as to allow focal length adjustment of the camera module through the motor unit 2040C. The motor unit 2040C is mounted on the top portion of the encapsulation portion 2011C of the photosensitive unit 2010C.

Particularly, the motor unit 2040C is electrically connected to the photosensitive unit through the motor connecting structure 2013.

The motor terminals 2041C of the motor units 2040C are electrically connected with the circuit connection junctions 20132 of the photosensitive unit 2010C respectively, so as to be electrically connected to the main circuit board 20122 through the lead element 20131. The motor terminal 2041C can be connected to the motor coupling terminal 201311 of the lead element 20131 by attaching with conducting adhesive or by welding and soldering.

Especially, when the motor terminal 2041C is affixed on the circuit junction by attaching with conducting adhesive, it does not require soldering any lead wire for connecting the motor unit 2040C with the main circuit board 20122 of the photosensitive portion 2012, and thus it reduces the motor soldering process.

It is worth mentioning that the electrical connection of the motor unit 2040C is described as electrical connecting the motor unit 2040C by the lead element 20131 according to the present embodiment of the present invention, but in other embodiments of the present invention, it is possible to apply different motor connecting structures 2013 to connect the motor unit 2040C. For example, the various methods as shown in FIGS. 41A, 41B, and 41C. In other words, the various motor connecting structures as illustrated in FIGS. 41A, 41B, and 41C can be coupled with the photosensitive unit 2010C of the present embodiment, so as to provide different ways to electrically connect the motor unit. Therefore, person skilled in the art should understand that what are shown in the appended drawings shall not limit the scope of the present invention.

Those skilled in the art should understand that the structures and forms of the camera module mentioned above are just examples to describe ways of implementing the camera module, rather than limitations of the present invention.

Figure 55:
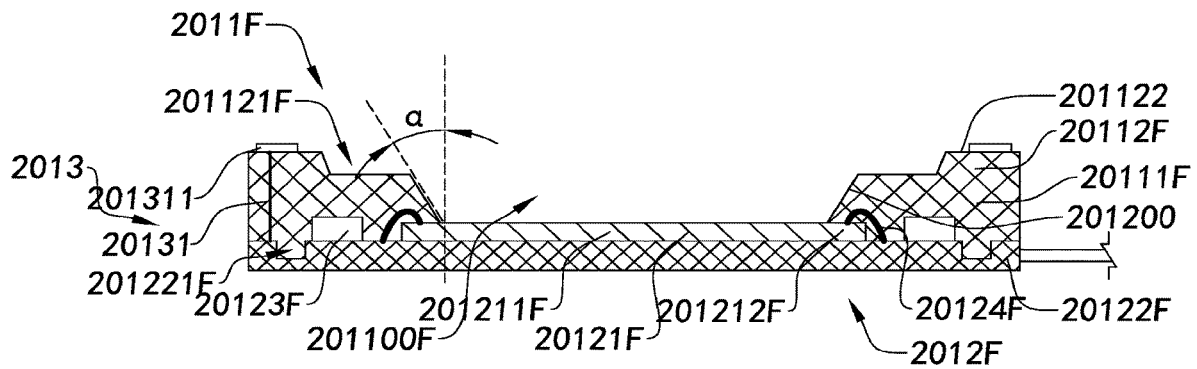
FIG. 55 is a sectional view of a photosensitive unit according to a nineteenth preferred embodiment of the present invention.
Figure 56:
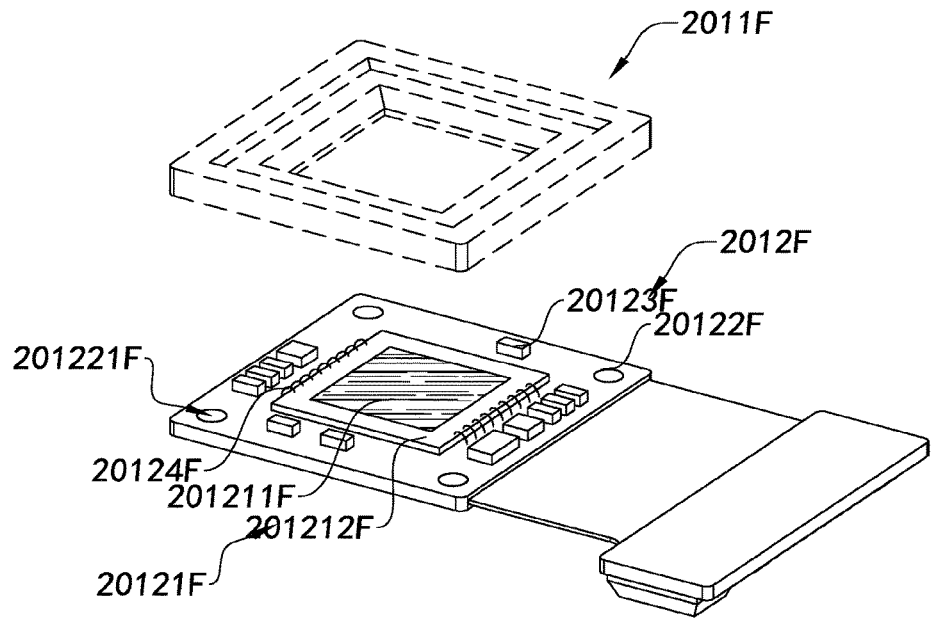
FIG. 56 is an exploded perspective view of a photosensitive unit according to the above nineteenth preferred embodiment of the present invention.

Referring to FIGS. 55 and 56, the photosensitive unit and camera module according to a nineteenth preferred embodiment of the present invention are illustrated. The photosensitive unit 2010F is adapted for assembling and producing camera module to achieve the molded camera module. The photosensitive unit 2010F includes an encapsulation portion 2011F and a photosensitive portion 2012F, wherein the encapsulation portion 2011F is molded to connect with the photosensitive portion 2012F.

The photosensitive portion 2012F includes a main circuit board 20122F and a photosensitive sensor 20121F, wherein the photosensitive sensor 20121F is disposed on the main circuit board 20122F. According to the present embodiment of the present invention, the photosensitive sensor 20121F is molded to connect to the main circuit board 20122F.

According to the present embodiment of the present invention, the photosensitive portion 2012F includes a connecting circuit and at least a circuit element 20123F. The connecting circuit is prearranged in the main circuit board 20122F and the circuit element 20123F is electrically connected to the connecting circuit and the photosensitive sensor 20121F to process the photosensing function for the photosensitive sensor 20121F. The circuit element 20123F is protrudingly deployed on the main circuit board 20122F. The circuit element 20123F can be, for example but not limited to, resistors, capacitors, diodes, triodes, potentiometers, electric relays, actuators, or etc.

It is worth mentioning that the encapsulation portion 2011F encapsulates and wraps up the circuit element 20123F therein, so that the circuit element 20123F will not be directly exposed in any space, and more specifically, not be exposed in the environment that communicates with the photosensitive sensor 20121F. Therefore, during the assembling of the camera module, the circuit element 20123F will not contaminate pollutions, such as dusts, or adversely influence the photosensitive sensor 20121F. It is different from the conventional camera module that the circuit element 20123F, such as resistance-capacitance components, is exposed outside. The enclosure and encapsulation of the photosensitive sensor 20121F by molding, sundries and dusts are prevented from staying on the surface of the circuit element 20123F that avoids the photosensitive sensor 20121F from being contaminated and causes dark spots and other defectives of the camera module.

The encapsulation portion 2011F forms a window 201100F to provide a photosensitive path for the photosensitive sensor 20121F.

According to the present preferred embodiment of the present invention, the photosensitive portion 2012F includes at least one connecting element 20124F for electrically connecting the photosensitive sensor 20121F with the main circuit board 20122F. Further, the connecting element 20124F can be embodied to be, for example but not limited to, gold wire, copper wire, aluminum wire, and/or silver wire. Especially, the connecting elements 20124F curvingly connects the photosensitive sensor 20121F and the main circuit board 20122F.

It is worth mentioning that the connecting element 20124F is molded within the encapsulation portion 2011F, so that the encapsulation portion 2011F, encloses, encapsulates and/or wraps up the connecting element(s) 20124F and keep them from direct exposure to the outside. Therefore, during the assembling of the camera module, the connecting element(s) 20124F will not suffer any collision or damage, and, at the same time, it reduces the impact due to the environmental factors, such as temperature, on the connecting element 20124F and stabilizes the communication and connection between the photosensitive sensor 20121F and the main circuit board 20122F. This is completely absent in the traditional art.

It is worth mentioning that the encapsulation portion 2011F encapsulates and wraps up the circuit element 20123F and the connecting element 20124F, which advantages in protecting the circuit element 20123F and the connecting element 20124F as well as obtaining a higher performance camera module. However, those skilled in the art should understand that the encapsulation portion 2011F shall not be limited in wrapping up the circuit element 20123F and/or the connecting element 20124F. In other words, in other embodiments of the present invention, the encapsulation portion 2011F can be directly molded on main circuit board 20122F without protruded circuit element 20123F or be molded on various positions, such as the outer sides, the periphery, and etc., of the circuit element 20123F.

In addition, each of the photosensitive sensors 20121F has a photosensitive area 201211F and a non-photosensitive area 201212F, wherein the non-photosensitive area 201212F is positioned surrounding the periphery of the photosensitive area 201211F. The photosensitive area 201211F is adapted for processing photosensitization. The connecting element 20124F is connected to the non-photosensitive area 201212F.

According to the present preferred embodiment of the present invention, the encapsulation portion 2011F is extended to mold on the non-photosensitive area 201212F of the photosensitive sensor 20121F, so as to overlappedly mount the photosensitive sensor 20121F on the main circuit board 20122F by means of molding. In this manner, such as by the method of Molding on Chip, the moldable area is extended towards the inside of the encapsulation portion 2011F, such that the structural portion outside of the encapsulation portion 2011F and the main circuit board 20122F can be reduced, that further reduces the size in length and width of the molded photosensitive portion 2012F and reduces the size in length and width of the camera module assembled thereby.

In the present embodiment of the present invention, the encapsulation portion 2011F is protrudingly positioned surrounding the outer portion of the photosensitive area 201211F of the photosensitive sensor 20121F. Particularly, the encapsulation portion 2011F integrally seal its connection, so as to provide a great sealingness and tightness. Therefore, when the photosensitive unit 2010F is used to assemble the camera module, the photosensitive sensor 20121F will be sealed inside the camera module to forms a sealed inner space.

Particularly, in producing the photosensitive unit 2010F, a conventional circuit board can be used to make the main circuit board 20122F. The photosensitive sensor 20121F is deployed on the main circuit board 20122F and electrically connected by the connecting elements 20124F. Then, after the main circuit board 20122F and the photosensitive sensor 20121F are initially assembled, they are processed by Surface Mount Technology (SMT) and then molded by the insert molding technique, for example by means of an injection molding machine, to form the encapsulation portion 2011F, or molded by the pressing molding technique, which is commonly applied in semiconductor packaging, to form the encapsulation portion 2011F. The main circuit board 20122F can selectively be, for example but not limited to, rigid-flex board, ceramic substrate (without flexible board), or rigid PCB (without flexible board). The formation of the encapsulation portion 2011F can be selected by, for example but not limited to, injection molding technique and pressing molding technique. The material of the encapsulation portion 2011F can be, for example but not limited to, nylon, liquid crystal polymer (LCP), or polypropylene (PP) for injection molding technique, or epoxy resin for pressing molding technique. Person skilled in the art should understand that the above available manufacture methods and available materials are examples to describe available implementations of the present invention, rather than limitations of the present invention.

Furthermore, the encapsulation portion 2011F includes a covering section 20111F and an optical filter installing section 20112F. The optical filter installing section 20112F is molded integrally to connect with the covering section 20111F. The covering section 20111F is molded to attach on the main circuit board 20122F for encapsulating and wrapping up the circuit element 20123F and the connecting element 20124F. The optical filter installing section 20112F is arranged for installing an optical filter 2020F. In other words, when the photosensitive unit 2010F is used to assemble the camera module, the optical filter 2020F of the camera module will be mounted at the optical filter installing section 20112F, which makes the optical filter 2020F be positioned along the photosensitive path of the photosensitive sensor 20121F without the need of any additional mounting frame of the optical filter 2020F. In other words, the encapsulation portion 2011F of the present embodiment has a function as a conventional optical filter frame while the top portion of the optical filter installing section 20112F has a good evenness and smoothness by means of the molding technique, that enables the optical filter 2020F to be installed evenly, that is superior to conventional camera modules.

In addition, the optical filter installing section 20112F has an installing groove 201121F. The installing groove is communicated with the window 201100F to provide an adequate installation space for the optical filter 2020F such that the optical filter 2020F will not protrude from the top surface of the optical filter installing section 20112F. In other words, the top of the encapsulation portion 2011F with the installing groove 201121F provided therein is adapted for the optical filter 2020F to be installed on the encapsulation portion 2011F without protruding out from the top of the encapsulation portion 2011F.

It is worth mentioning that the inner wall of the encapsulation portion 2011F can be shaped with respect to the object such as the optical filter to be connected. For example, it can be in an inclined or slope shape, so that while the connecting elements 20124F are encapsulated and wrapped, the photosensitive sensor 20121F can still receive more light through the window and the installing groove. Person skilled in the art should understand that a specific shape of the encapsulation portion 2011F will not limit the scope of the present invention.

The differences between this nineteenth preferred embodiment with the other preferred embodiments of the present invention, one or more reinforced holes 201221F are formed on top of the main circuit board 20122F and the bottom of the encapsulation portion 2011F is molded to extend into the reinforced holes 201221F, so as to enhance the structural strength of the main circuit board 20122F and connection of the main circuit board 122F and the encapsulation portion 11F. In other words, the combination of two different materials forms a combined composite structure that reinforces the structural strength of the main circuit board 20122F, as a base.

The positions of the reinforced holes 201221F can be determined based on practical needs. Also, based on the need of the structural strength of the circuit board, the reinforced holes 10224D can be, for example, arranged in a symmetrical construction. By reinforcing the structural strength of the main circuit board 20122F with such reinforced holes 201221F which are filled with the encapsulation portion, the thickness of the main circuit board 20122F and the thickness of the camera module assembled thereof can thus be reduced. Besides, the heat dissipative ability of the photosensitive unit 2010F is enhanced as well.

It is worth mentioning that, according to the present preferred embodiment of the present invention, the reinforced holes 201221F are indented slots that avoid the molding material of the encapsulation portion 2011F from leaking through the reinforced holes 201221F when molding to make the photosensitive unit 2010F.

Similar to the above preferred embodiments, the photosensitive unit 2010F can be assembled for a fixed focus module or zoom lens module. Those skilled in the art should understand that the assembling and application ways of the photosensitive unit 2010F shall not considered be limitations of the present invention.

Figure 57:
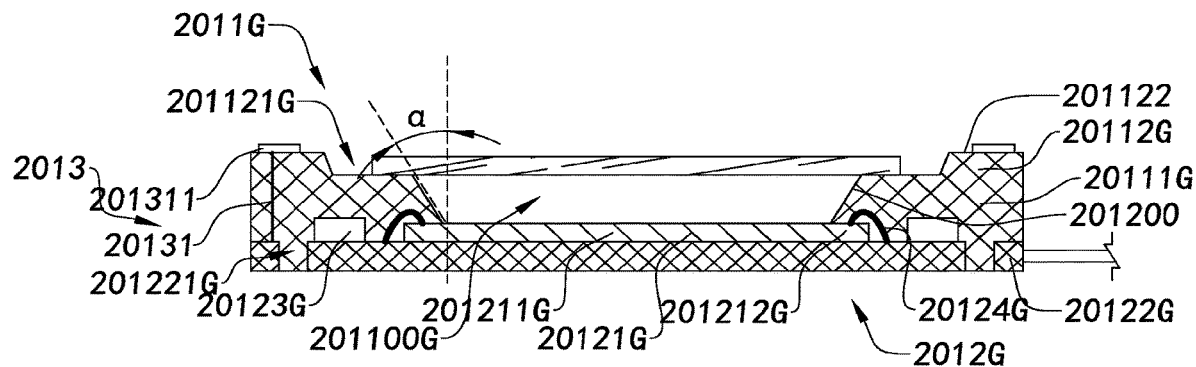
FIG. 57 is a sectional view of a photosensitive unit of the camera module according to a twentieth preferred embodiment of the present invention.
Figure 58:
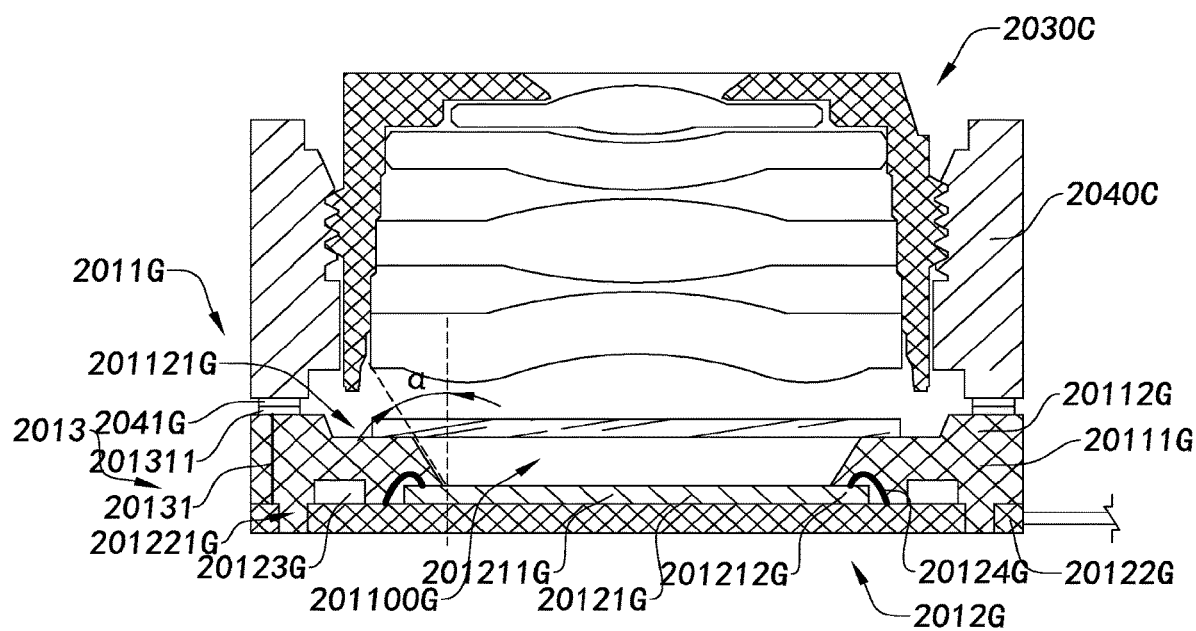
FIG. 58 is a sectional view of the camera module according to a twentieth preferred embodiment of the present invention.

Referring to FIGS. 57 and 58, the photosensitive unit and camera module according to a twentieth preferred embodiment of the present invention are illustrated. The photosensitive unit 2010G is adapted for assembling and producing camera module to achieve the molded camera module. The photosensitive unit 2010G includes an encapsulation portion 2011G and a photosensitive portion 2012G, wherein the encapsulation portion 2011G is molded to connect with the photosensitive portion 2012G.

The photosensitive portion 2012G includes a main circuit board 20122G and a photosensitive sensor 20121G, wherein the photosensitive sensor 20121G is disposed on the main circuit board 20122G. According to the present embodiment of the present invention, the photosensitive sensor 20121G is molded to connect to the main circuit board 20122G.

According to the present embodiment of the present invention, the photosensitive portion 2012G includes a connecting circuit and at least a circuit element 20123G. The connecting circuit is prearranged in the main circuit board 20122G and the circuit element 20123G is electrically connected to the connecting circuit and the photosensitive sensor 20121G to process the photosensing function for the photosensitive sensor 20121G. The circuit element 20123G is protrudingly deployed on the main circuit board 20122G. The circuit element 20123G can be, for example but not limited to, resistors, capacitors, diodes, triodes, potentiometers, electric relays, actuators, or etc.

It is worth mentioning that the encapsulation portion 2011G encapsulates and wraps up the circuit element 20123G therein, so that the circuit element 20123G will not be directly exposed in any space, and more specifically, not be exposed in the environment that communicates with the photosensitive sensor 20121G. Therefore, during the assembling of the camera module, the circuit element 20123G will not contaminate pollutions, such as dusts, or adversely influence the photosensitive sensor 20121G. It is different from the conventional camera module that the circuit element 20123G, such as resistance-capacitance components, is exposed outside. The enclosure and encapsulation of the photosensitive sensor 20121G by molding, sundries and dusts are prevented from staying on the surface of the circuit element 20123G that avoids the photosensitive sensor 20121G from being contaminated and causes dark spots and other defectives of the camera module.

The encapsulation portion 2011G forms a window 201100G to provide a photosensitive path for the photosensitive sensor 20121G.

According to the present preferred embodiment of the present invention, the photosensitive portion 2012G includes at least one connecting element 20124G for electrically connecting the photosensitive sensor 20121G with the main circuit board 20122G. Further, the connecting element 20124G can be embodied to be, for example but not limited to, gold wire, copper wire, aluminum wire, and/or silver wire. Especially, the connecting elements 20124G curvingly connects the photosensitive sensor 20121G and the main circuit board 20122G.

It is worth mentioning that the connecting element 20124G is molded within the encapsulation portion 2011G, so that the encapsulation portion 2011G, encloses, encapsulates and/or wraps up the connecting element(s) 20124G and keep them from direct exposure to the outside. Therefore, during the assembling of the camera module, the connecting element(s) 20124G will not suffer any collision or damage, and, at the same time, it reduces the impact due to the environmental factors, such as temperature and humidity, on the connecting element 20124G and stabilizes the communication and connection between the photosensitive sensor 20121G and the main circuit board 20122G. This is completely absent in the traditional art.

It is worth mentioning that the encapsulation portion 2011G encapsulates and wraps up the circuit element 20123G and the connecting element 20124G, which advantages in protecting the circuit element 20123G and the connecting element 20124G as well as obtaining a higher performance camera module. However, those skilled in the art should understand that the encapsulation portion 2011G shall not be limited in wrapping up the circuit element 20123G and/or the connecting element 20124G. In other words, in other embodiments of the present invention, the encapsulation portion 2011G can be directly molded on main circuit board 20122G without protruded circuit element 20123G or be molded on various positions, such as the outer sides, the periphery, and etc., of the circuit element 20123G.

In addition, each of the photosensitive sensors 20121G has a photosensitive area 201211G and a non-photosensitive area 201212G, wherein the non-photosensitive area 201212G is positioned surrounding the periphery of the photosensitive area 201211G. The photosensitive area 201211G is adapted for processing photosensitization. The connecting element 20124G is connected to the non-photosensitive area 201212G.

According to the present preferred embodiment of the present invention, the encapsulation portion 2011G is extended to mold on the non-photosensitive area 201212G of the photosensitive sensor 20121G, so as to overlappedly mount the photosensitive sensor 20121G on the main circuit board 20122G by means of molding. In this manner, such as by the method of Molding on Chip, the moldable area of the encapsulation portion 2011G can be extended inwardly, such that the outer structural portion of the encapsulation portion 2011G and the main circuit board 20122G can be reduced, which further reduces the size in length and width of the molded photosensitive portion 2012G and reduces the size in length and width of the camera module assembled thereby.

In the present embodiment of the present invention, the encapsulation portion 2011G is protrudingly positioned surrounding the outer portion of the photosensitive area 201211G of the photosensitive sensor 20121G. Particularly, the encapsulation portion 2011G integrally seal its connection, so as to provide a great sealingness and tightness. Therefore, when the photosensitive unit 2010G is used to assemble the camera module, the photosensitive sensor 20121G will be sealed inside the camera module to forms a sealed inner space.

Particularly, in producing the photosensitive unit 2010G, a conventional circuit board can be used to make the main circuit board 20122G. The photosensitive sensor 20121G is deployed on the main circuit board 20122G and electrically connected by the connecting elements 20124G. Then, after the main circuit board 20122G and the photosensitive sensor 20121G are initially assembled, they are processed by Surface Mount Technology (SMT) and then molded by the insert molding technique, for example by means of an injection molding machine, to form the encapsulation portion 2011G, or molded by the pressing molding technique, which is commonly applied in semiconductor packaging, to form the encapsulation portion 2011G. The main circuit board 20122G can selectively be, for example but not limited to, rigid-flex board, ceramic substrate (without flexible board), or rigid PCB (without flexible board). The formation of the encapsulation portion 2011G can be selected by, for example but not limited to, injection molding technique and pressing molding technique. The material of the encapsulation portion 2011G can be, for example but not limited to, nylon, liquid crystal polymer (LCP), or polypropylene (PP) for injection molding technique, or epoxy resin for pressing molding technique. Person skilled in the art should understand that the above available manufacture methods and available materials are examples to describe available implementations of the present invention, rather than limitations of the present invention.

Furthermore, the encapsulation portion 2011G includes a covering section 20111G and an optical filter installing section 20112G. The optical filter installing section 20112G is molded integrally to connect with the covering section 20111G. The covering section 20111G is molded to attach on the main circuit board 20122G for encapsulating and wrapping up the circuit element 20123G and the connecting element 20124G. The optical filter installing section 20112G is arranged for installing an optical filter 2020G. In other words, when the photosensitive unit 2010G is used to assemble the camera module, the optical filter 2020G of the camera module will be mounted at the optical filter installing section 20112G, which makes the optical filter 2020G be positioned along the photosensitive path of the photosensitive sensor 20121G without the need of any additional mounting frame of the optical filter 2020G. In other words, the encapsulation portion 2011G of the present embodiment has a function as a conventional optical filter frame while the top portion of the optical filter installing section 20112G has a good evenness and smoothness by means of the molding technique, that enables the optical filter 2020G to be installed evenly, that is superior to conventional camera modules.

In addition, the optical filter installing section 20112G has an installing groove 201121G. The installing groove 201121G is communicated with the window 20110G to provide an adequate installation space for the optical filter 2020G such that the optical filter 2020G will not protrude from the top surface of the optical filter installing section 20112G. In other words, the top of the encapsulation portion 2011F with the installing groove 201121F provided therein is adapted for the optical filter 2020F to be installed on the encapsulation portion 2011F without protruding out from the top of the encapsulation portion 2011F.

It is worth mentioning that the inner wall of the encapsulation portion 2011G is designed according to the shape of the connecting element 20124G to be mounted thereon. For example, it can be in sloped or inclined shape, so that while it encapsulates and wraps up the connecting element(s) 20124G, the photosensitive sensor 20121G is capable of receiving as much light as possible. Person skilled in the art should understand that a specific shape of the encapsulation portion 2011G will not limit the scope of the present invention.

The differences between this twentieth preferred embodiment with the other preferred embodiments of the present invention, one or more reinforced holes 201221G are formed on top of the main circuit board 20122G and the bottom of the encapsulation portion 2011G is molded to extend into the reinforced holes 201221G, so as to enhance the structural strength of the main circuit board 20122G and connection of the main circuit board 122F and the encapsulation portion 11F. In other words, the combination of two different materials forms a combined composite structure that reinforces the structural strength of the main circuit board 20122G, as a base.

The positions of the reinforced holes 201221G can be determined based on practical needs. Also, based on the need of the structural strength of the circuit board, the reinforced holes 10224D can be, for example, arranged in a symmetrical construction. By reinforcing the structural strength of the main circuit board 20122G with such reinforced holes 201221G which are filled with the encapsulation portion 11F, the thickness of the main circuit board 20122G and the thickness of the camera module assembled thereof can thus be reduced. Besides, the heat dissipative ability of the photosensitive unit 2010G is enhanced as well.

It is worth mentioning that, according to the present eighth preferred embodiment of the present invention, the reinforced holes 201221G are through holes penetrating through the main circuit board 20122G to communicate both sides of the main circuit board 20122G. Therefore, during the production of the photosensitive unit 2010G, the molding material of the encapsulation portion 2011G can be fully bonded with the main circuit board 20122G to form a more solid structure of combined composite material. Besides, the through hole type reinforced hole of this preferred embodiment would be more easy to make than the indention type reinforced hole in the above seventh preferred embodiment.

Referring to FIGS. 57-58, the camera module 20100G includes one photosensitive unit 2010G, one optical filter 2020G, a motor unit 2040G, and a camera lens 2030G.

The optical filter 2020G is mounted in the photosensitive unit 2010G, while the camera lens 2030G is mounted in the motor unit 2040G. The motor unit 2040G is mounted on the photosensitive unit 2010G.

Furthermore, the optical filter 2020G is mounted on the installing groove of the encapsulation portion 2011G of the photosensitive unit 2010G. The motor unit 2040G is mounted on the top portion of the encapsulation portion 2011G of the photosensitive unit 2010G. Particularly, the specific installation positions of the optical filter 2020G and the motor unit 2040G at the encapsulation portion 2011G can be coordinated and arranged based on practical needs.

Especially, the motor unit 2040G is electrically connected with the photosensitive unit 2010G through the motor connecting structure 2013. The motor terminal 2041G of the motor unit 2040G is electrically connected with the circuit connection junction 20132 of the photosensitive unit 2010, so as to be electrically connected to the main circuit board 20122 through the lead element 20131. The motor terminal 2041G can be connected to the motor coupling terminal 201311 of the lead element 20131 by attaching with conducting adhesive or by welding and soldering.

Especially, when the motor terminal 2041G is affixed on the circuit junction by attaching with conducting adhesive, it does not require to solder any lead wire for connecting the motor unit 2040G with the main circuit board 20122 of the photosensitive portion 2012, and thus it reduces the motor soldering process.

It is worth mentioning that the electrical connection of the motor unit 2040G is described as electrical connecting the motor unit 2040G by the lead element 20131 according to the present embodiment of the present invention, but in other embodiments of the present invention, it is possible to apply different motor connecting structures 2013 to connect the motor unit 2040G. For example, the various methods as shown in FIGS. 41A, 41B, and 41C. In other words, the various motor connecting structures as illustrated in FIGS. 41A, 41B, and 41C can be coupled with the photosensitive unit 2010G of the present embodiment, so as to provide different ways to electrically connect the motor unit. Therefore, person skilled in the art should understand that what are shown in the appended drawings shall not limit the scope of the present invention.

Similar to the above preferred embodiments, the photosensitive unit 2010G can be assembled for a fixed focus module or zoom lens module. Those skilled in the art should understand that the assembling and application ways of the photosensitive unit 2010G shall not considered be limitations of the present invention.

Figure 59:
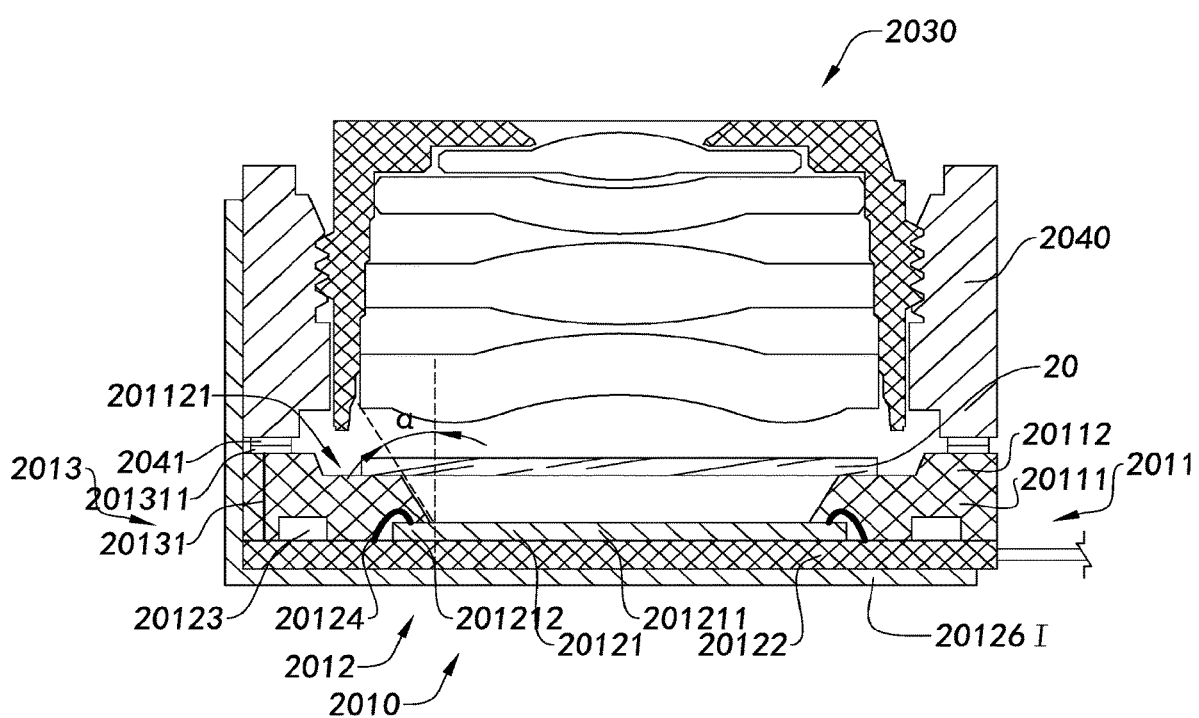
FIG. 59 is a sectional view of the camera module according to a twenty-one preferred embodiment of the present invention.

Referring to FIG. 59, the camera module with its photosensitive unit according to a twenty-one preferred embodiment of the present invention is illustrated. The different of this tenth preferred embodiment with respect to the other preferred embodiments, the photosensitive unit 2010 includes a shielding layer 20126I that covers the main circuit board 20122 and the encapsulation portion 2011, so as to not only reinforce the structural strength of the main circuit board 20122, but also enhance an electromagnetic immunity ability of the photosensitive unit 2010.

Furthermore, the shielding layer 20126I is a metal layer that can be made in form of plate structure or net structure.

Because the module of the present invention is integrally encapsulated to form based on integrally encapsulation technology, the embodiments of the present invention utilize molding technique of the encapsulation technology as example for illustration. Hence, in order to better and clearer disclose the content of the present invention, molding technique will firstly be briefly introduced as follows. Molding technique is usually implemented in two types. One is Molding On Board (MOB), which is to only form an encapsulation portion on the circuit board of the module. The other is Molding On Board (MOC), which is to form an encapsulation portion on both the circuit board and the photosensitive sensor of the module. The present invention will respectively disclose embodiments of different molding types in the following.

Besides, molding technique usually includes injection molding technique and pressing molding technique based on the devices. The injection molding technique includes compression molding and pressure casting. An injection molding machine is a major forming device that utilizes plastic forming mold to turn thermoplastic material or thermosetting material into plastic products of various shapes. Injection molding is implemented through injection molding machine and mold. The pressing molding technique includes pressing and molding, which can also be called compression molding. Mold pressing materials, such as plastic or rubber materials, can be heated and compressed in a closed mold cavity to be formed into the product. It utilizes the pressing molding technique of the molding technique as example to illustrate the present invention. However, person skilled in the art should be able to understand that the present invention shall not be restricted in pressing molding technique. Instead, other encapsulation or molding techniques may also apply. Hence, the present invention shall not be limited thereby.

Figure 60:
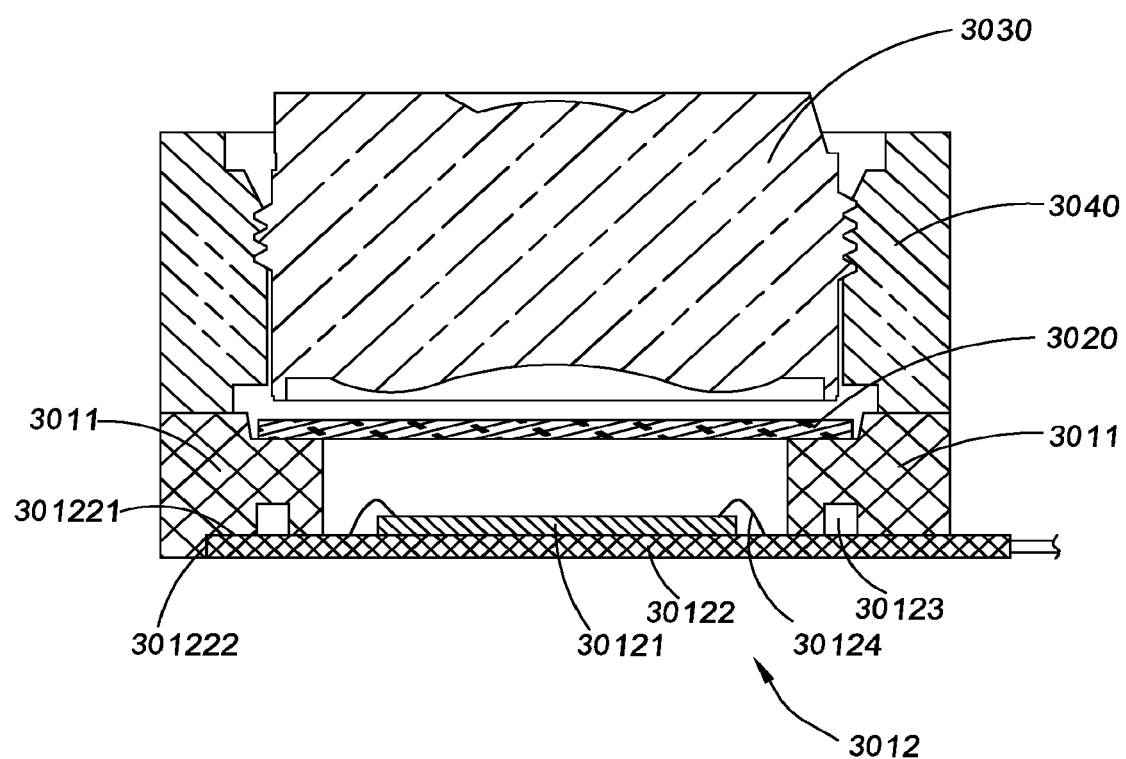
FIG. 60 is a sectional view of a camera module based on integrally encapsulation technology according to one preferred embodiment of the present invention.

FIG. 60 illustrates a camera module based on integrally encapsulation technology according to a preferred embodiment of the present invention, which utilizes MOB technology. The camera module based on integrally encapsulation technology includes an encapsulated photosensitive unit 3010, an optical filter 3020, a camera lens 3030, and motor unit 3040. Person skilled in the art should be able to understand that the motor unit 3040 can be absent in other embodiments of fixed focus modules. Therefore, the present invention shall not be limited thereby. In other words, this preferred embodiment of the present invention utilizes the automatic focus camera module as the example. The encapsulated photosensitive unit 3010 includes an encapsulation portion 3011 and a photosensitive unit 3012. The photosensitive unit 3012 further comprises a photosensitive sensor 30121 and a circuit board 30122, which comprises a set of circuit component(s) 30123 (e.g. resistor, capacitor, actuator, and etc.; IC hereinafter) and a set of lead element(s) 30124 deployed thereon. The lead element 30124 connects and communicates the photosensitive sensor 30121 and the circuit board 30122. Nevertheless, the photosensitive sensor 30121 and the circuit board 30122 may also be connected and communicated through other means. In the present preferred embodiment of the present invention, the lead element 30124 may be embodied to be a gold wire. The encapsulation portion 3011 serves as a frame to support the optical filter 3020. The encapsulation portion 3011 has electrical functions, such as having a carving line to electrically connect and communicate the motor unit 3040 and the photosensitive unit 3012, which can substitute conventional motor bonding wire and reduce conventional technology process. Certainly, the motor unit 3040 and the circuit board 30122 may also be connected and communicated through welding and soldering conventional motor weld leg(s). The encapsulation portion 3011 encapsulates the circuit board 30122 during the encapsulation process. In the present embodiment of the present invention, the encapsulation portion 3011 encapsulates all portions of the circuit board 30122 besides the area behind where it contacts the photosensitive sensor 30121 and the lead element 30124. The encapsulation portion 3011 not only encapsulates and wraps up the top surface 301221 of the circuit board 30122, but also encapsulates and wraps up at least a side 301222 of the circuit board 30122. It is understandable that the encapsulation portion 3011 may also integrally encapsulate the circuit component 30123 in the encapsulation process.

Figure 62A:
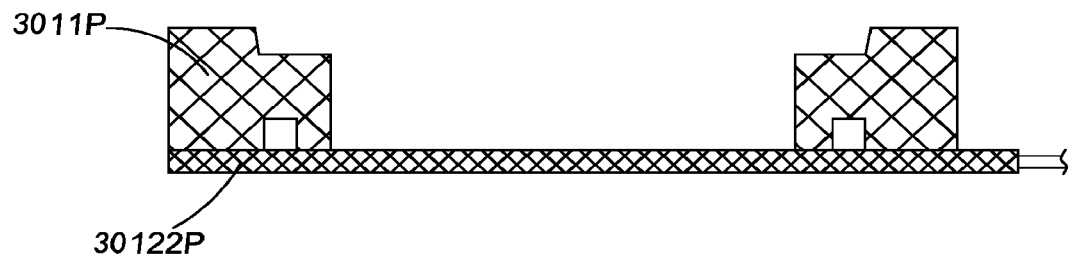
FIG. 62A is a sectional view illustrating the molding of the camera module according to the above preferred embodiments of the present invention.
Figure 62B:
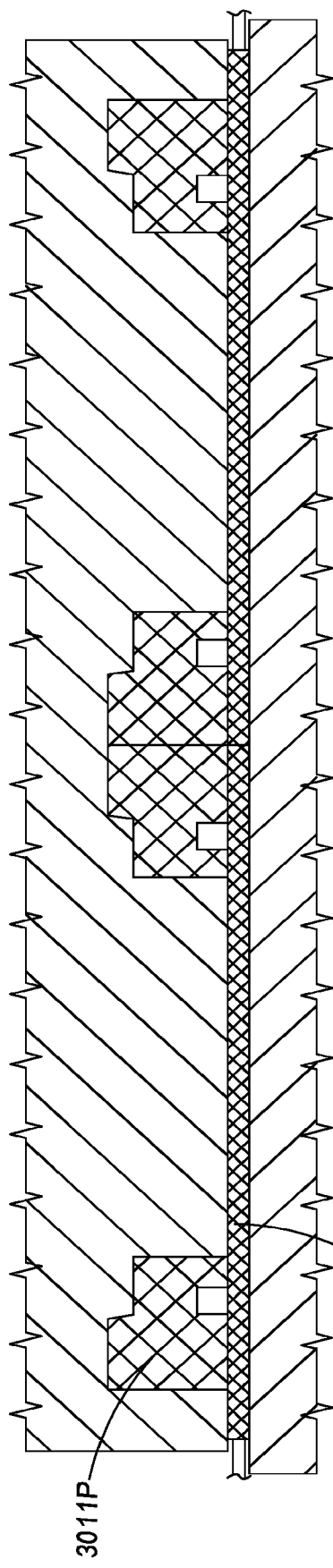
FIG. 62B is a sectional view illustrating the molding of the camera module molded according to the above preferred embodiments of the present invention.
Figure 62C:
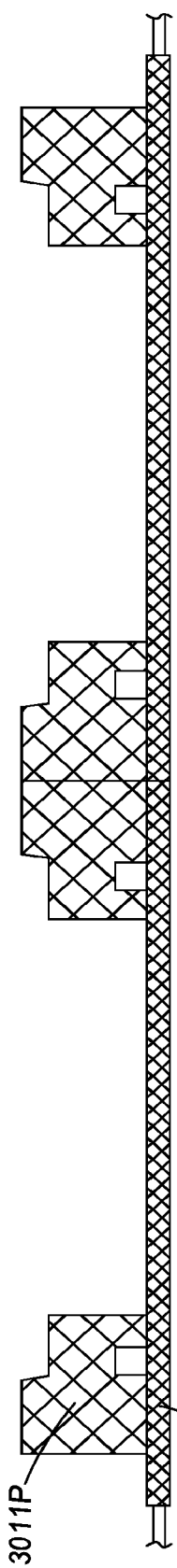
FIG. 62C is a sectional view illustrating the molding of the camera module according to the above preferred embodiments of the present invention.
Figure 62D:
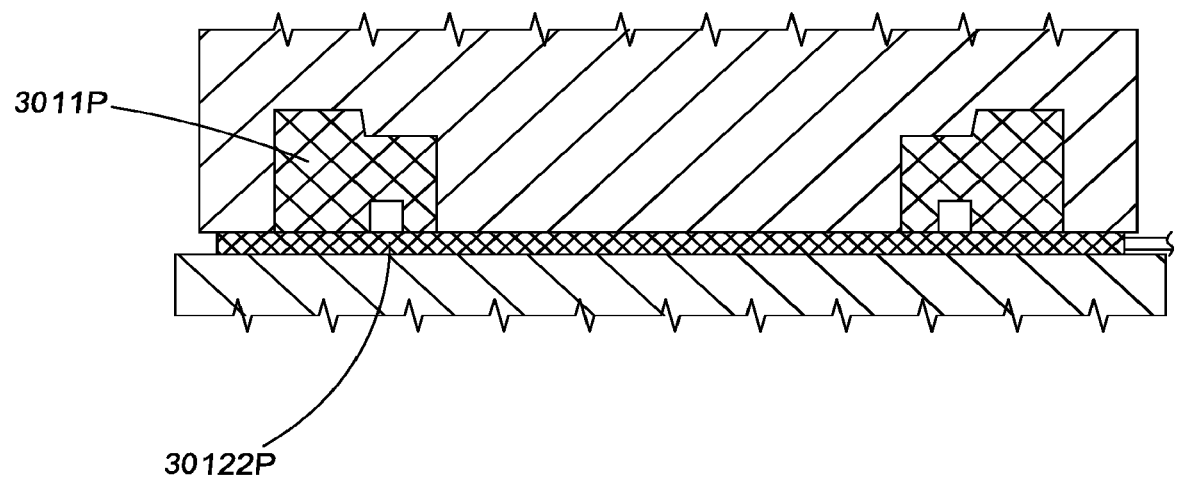
FIG. 62D is a sectional view illustrating the molding of the camera module according to the above preferred embodiments of the present invention.
Figure 62E:
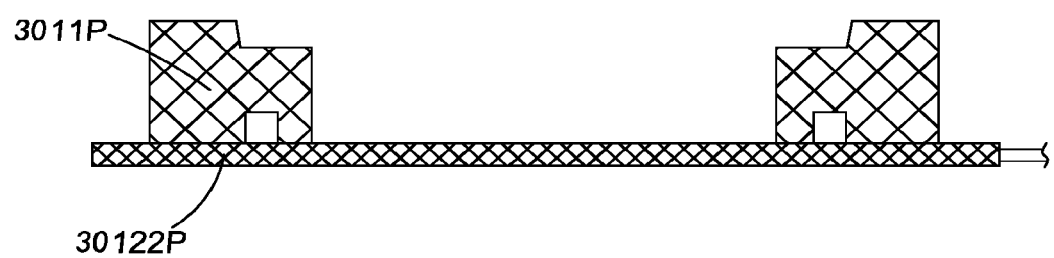
FIG. 62E is a sectional view illustrating the molding of the camera module according to the above preferred embodiments of the present invention.

The molding module is illustrated in FIGS. 62A-62E. Referring to FIG. 62A, the left portion of the encapsulation portion 3011P is aligned and leveled with the circuit board 30122P. Such design that levels the side of the circuit board 30122P and the side of the encapsulation portion 3011P can usually be found in traditional technology as well. Hence, in order to achieve the above demands, as FIG. 62B illustrates, it has to make the structure as demonstrated in the figure before assembling the module. It has to process the circuit board 30122P as illustrated in FIG. 62B when molding, which includes coupling two or more circuit boards 30122P for molding and, referring to FIG. 62B, cutting along the middle with machine. This will require a cutting device. Without utilizing the method illustrated in FIG. 62B, it is impossible to align the fringe of the circuit board 30122P to the encapsulation portion 3011P because there must be a certain alignment deviation between the circuit board 30122P and the mold. Therefore, it may only be designed into what was illustrated in FIG. 62C. Referring to the figure, the circuit board 30122P has to protrude a little for mold clamping, the protruding length of the circuit board 30122P is usually 0.1 mm~10 mm. Referring to FIG. 62E, without dicing, the protruding portion of the circuit board 30122P will affect the final size of the module, which will increase the module size by 0.1 mm~10 mm and affect the quality of the product.

Hence, contrasting with traditional technology, the camera module based on integrally encapsulation technology of the present invention provides a reduction design on the circuit board 30122, which has the sides of the encapsulation portion 3011 cover the sides 301222 of the circuit board 30122, so as to reserve a certain dislocation space to the circuit board 30122 and the sides of the encapsulation portion 3011. Therefore, it avoids the circuit board 30122 from protruding from the sides after the molding process, which reduces the cutting procedure and improves the quality of the product.

It is worth mentioning that the encapsulation portion 3011 can encapsulate and cover two sides of the circuit board 30122. In the present preferred embodiment of the present invention, it only encapsulates the left side, which is the side 301222, of the circuit board 30122 because there are other elements, such as the flexible printed circuit, connected in the right side. Nonetheless, person skilled in the art should be able to understand that the encapsulation portion 3011 may not only encapsulate the side 301222 of the circuit board 30122, but also, according to other embodiments, encapsulate, wrap up and/or enclose the entire or part of the two sides of the circuit board 30122 at the same time. Hence, the present invention shall not be limited thereby.

Figure 61:
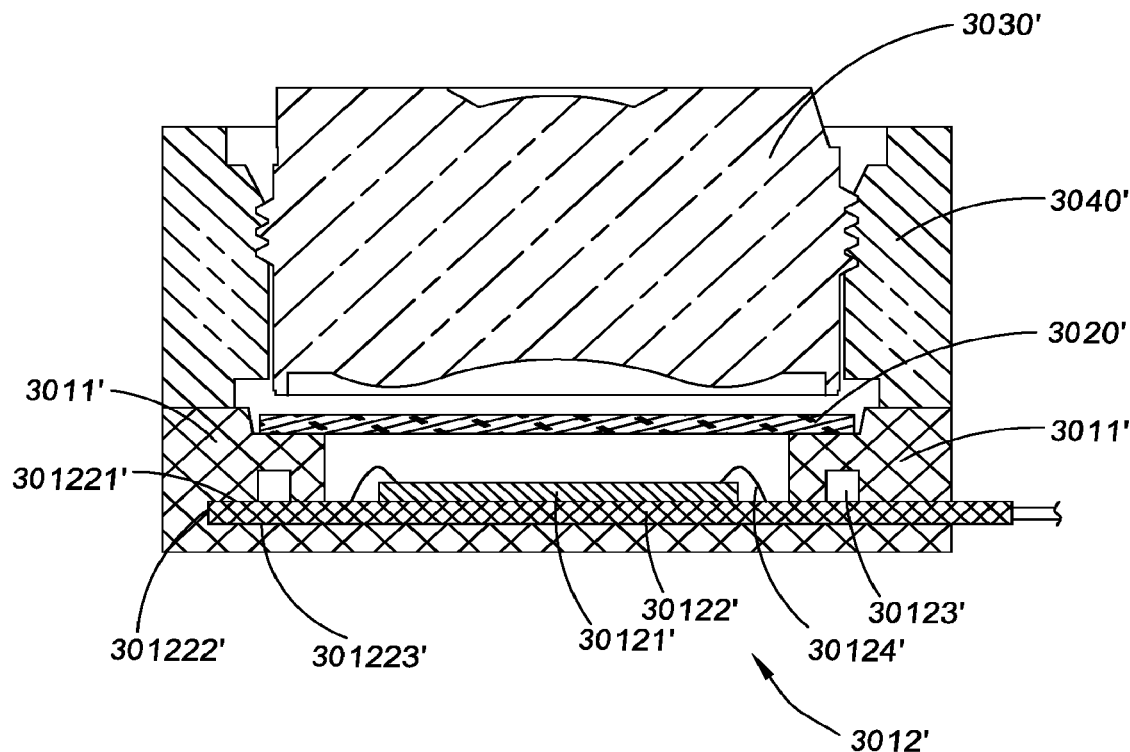
FIG. 61 is a sectional view of a camera module based on integrally encapsulation technology according to another embodiment of the present invention.

FIG. 61 illustrates the camera module based on integrally encapsulation technology of the present invention, which also utilizes MOB technique, helps the molded module to be installed and positioned, and enhances the flatness and smoothness thereof. The camera module based on integrally encapsulation technology comprises an encapsulated photosensitive unit 3010', an optical filter 3020', a camera lens 3030', and a motor unit 3040'. Similarly, it utilizes automatic focus module as example and discloses the motor unit 3040'. However, for other fixed focus modules, the motor unit 3040' is not required. Thus, the present invention shall not be limited thereby.

Specifically, the encapsulated photosensitive unit 3010' includes an encapsulation portion 3011' and a photosensitive unit 3012'. The photosensitive unit 3012' further comprises a photosensitive sensor 30121', and a circuit board 30122', which comprises a set of circuit component 30123' and a set of lead element 30124' deployed thereon. The encapsulation portion 3011' serves as a frame to support the optical filter 3020. The carving line of the encapsulation portion 3011' electrically connects and communicates the motor unit 3040' and the photosensitive unit 3012'. Comparing with the above preferred embodiment of the present invention, the encapsulation portion 3011' moldingly encapsulates and covers not only the top surface 301221' and at least a side 301222' of the circuit board 30122', but also a bottom 301223' of the circuit board 30122' when encapsulating the circuit board 30122' the circuit component 30123' during the molding process. Therefore, it ensures the overall evenness and smoothness of the sides and bottom of the camera module based on integrally encapsulation technology after the molding process, so as to facilitate its installation and positioning on other tooling.

It is worth mentioning that the encapsulation portion 3011' may encapsulate, wrap up and/or enclose the entire of the bottom 301223' of the circuit board 30122', but, according to other embodiments and based on different needs, it may encapsulate, wrap up and/or enclose only part of the bottom 301223' of the circuit board 30122'. Hence, the present invention shall not be limited thereby.

It is worth mentioning that according to this preferred embodiment of the present invention, because the right side of the camera module, as the figure illustrated, is still available for other processing or being connecting with other elements, hence the right side of the circuit board 30122' is not encapsulated. Nonetheless, according to other embodiments, the encapsulation portion 3011' can also encapsulate, wrap up and/or enclose the two sides or more sides of the circuit board 30122' as well as part or all of the bottom 301223' of the circuit board 30122'. The present invention shall not be limited thereby.

The embodiments illustrated in FIGS. 60 and 61 are disclosed in MOB type, but the following alternative modes switch to MOC type and combine various module structures to disclose the encapsulation of the module on the side or bottom of the circuit board.

Figure 63A:
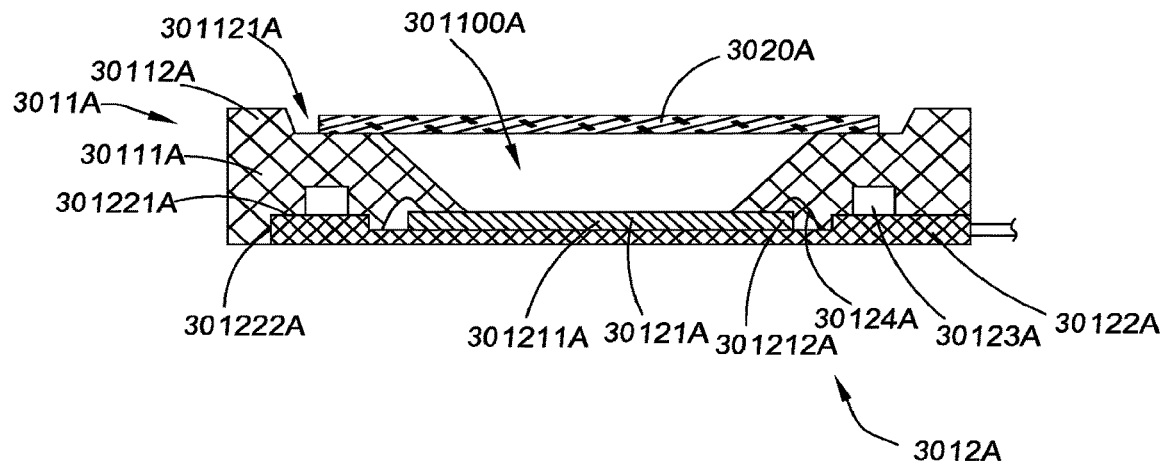
FIG. 63A is a sectional view of a camera module based on integrally encapsulation technology according to another embodiment of the present invention.

FIG. 63A illustrates the camera module based on integrally encapsulation technology according to another embodiment of the present invention. The camera module based on integrally encapsulation technology includes an encapsulation portion 3011A, a photosensitive unit 3012A, an optical filter 3020A, and a camera lens 3030. The photosensitive unit 3012A further comprises a photosensitive sensor 30121A and a circuit board 30122A, which comprises a set of circuit component 30123A and a set of lead element 30124A deployed thereon. The encapsulation portion 3011A serves as a frame to support the optical filter 3020A and is directly formed in the area besides the photosensitive area of the chip on the circuit board 30122A. In other words, this embodiment of the present invention utilizes the MOC style. It is worth mentioning that the photosensitive sensor 30121A comprises a photosensitive area 301211A and a non-photosensitive area 301212A besides the photosensitive area 301211A. The encapsulation portion 3011A does not encapsulate the photosensitive area 301211A during the encapsulation. Instead, it encapsulates the non-photosensitive area 301212A of the photosensitive sensor 30121A. The non-photosensitive area 301212A further comprises a terminal disposed thereon for connecting with the lead element 30124A, so as for the connection and communication of the photosensitive sensor 30121A.

Similarly, in the camera module based on integrally encapsulation technology illustrated in FIG. 63A, a reduction design is utilized on the circuit board 30122A, which has the sides of the encapsulation portion 3011A cover the sides 301222A of the circuit board 30122A, so as to reserve a certain dislocation space to the circuit board 30122A and the sides of the encapsulation portion 3011A. Therefore, it avoids the circuit board 30122A from protruding from the sides after the molding process. Besides, the encapsulation portion 3011A can encapsulate and cover a plurality of sides of the circuit board 30122A according to other alternative modes of the present embodiment.

Figure 63B:
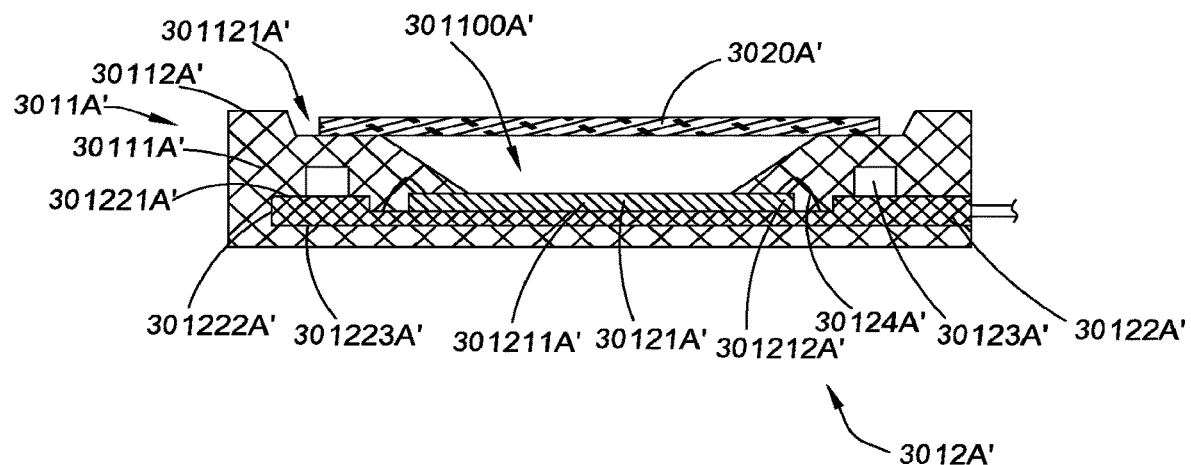
FIG. 63B is a sectional view of a camera module based on integrally encapsulation technology according to another embodiment of the present invention.

FIG. 63B illustrates the camera module based on integrally encapsulation technology according to another embodiment of the present invention. This differs from the embodiment illustrated in FIG. 63A in that the encapsulation portion 3011A' moldingly encapsulates and covers not only the top surface 301221A' and at least a side 301222A' of the circuit board 30122A', but also a bottom 301223A' of the circuit board 30122A' when encapsulating the circuit board 30122A' the circuit component 30123A'. Therefore, it ensures the overall evenness and smoothness of the sides and bottom of the camera module based on integrally encapsulation technology after the molding process, so as to facilitate its installation and positioning on other tooling.

Figure 64:
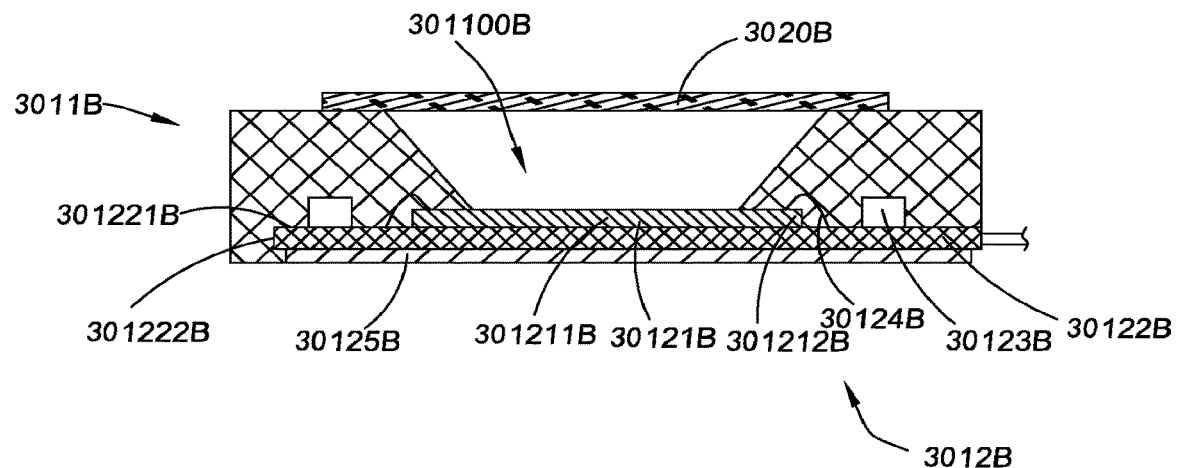
FIG. 64 is a sectional view of a camera module based on integrally encapsulation technology according to another embodiment of the present invention.

FIG. 64 illustrates the camera module based on integrally encapsulation technology according to another embodiment of the present invention. This differs from the embodiment illustrated in FIG. 63A is in the design and structure of the top portion of the encapsulation portion 3011B. In the embodiment illustrated in FIG. 63A, the top portion of the encapsulation portion 3011A protrudes upward and provides a clearance slot 301121A between it and the side edge of the optical filter 3020A, so as for installing various camera lens or motor unit. The clearance slot is absent in the embodiment as shown in FIG. 64. In addition, a reinforcing plate 30125B is attached on the bottom side of the circuit board 30122B. The reinforcing plate 30125B can be embodied to be a metal plate. The rest structures are the same with the structures illustrated in FIG. 63A. The encapsulation portion 3011B covers and encloses, encapsulates and/or wraps up and integrates the top surface 301221B and at least a side 301222B of the circuit board 30122B, the side of the reinforcing plate 30125B, the non-photosensitive area 301212B of the photosensitive sensor 30121B, the circuit component 30123B, and the lead element 30124B.

Figure 65:
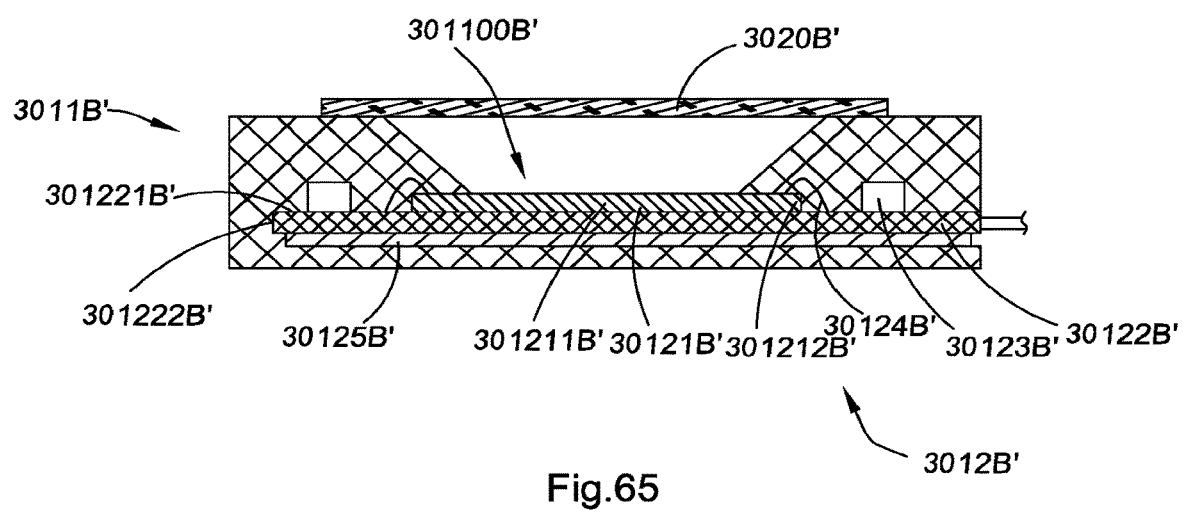
FIG. 65 is a sectional view of a camera module based on integrally encapsulation technology according to another embodiment of the present invention.

FIG. 65 illustrates the camera module based on integrally encapsulation technology according to another embodiment of the present invention. This differs from the embodiment illustrated in FIG. 64 is in that the encapsulation portion 3011B' moldingly encapsulates and covers not only the top surface 301221B' and at least a side 301222B' of the circuit board 30122B', but also a bottom of the reinforcing plate 30125B'. Therefore, it ensures the overall evenness and smoothness of the sides and bottom of the camera module based on integrally encapsulation technology after the molding process, so as to facilitate subsequent installation and positioning.

Figure 66A:
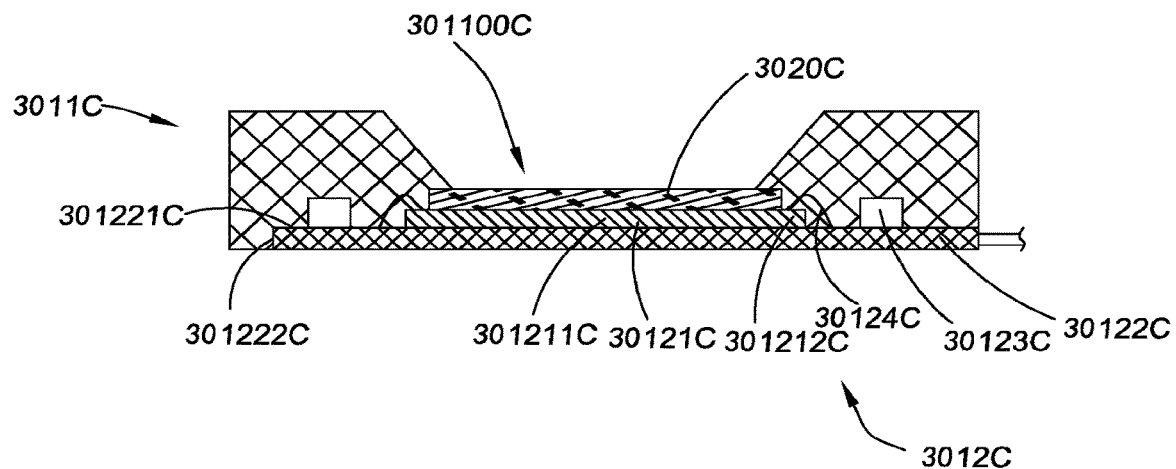
FIG. 66A is a sectional view of a camera module based on integrally encapsulation technology according to an alternative mode of the above embodiment of the present invention.

The module structure illustrated in FIG. 66A is an alternative mode of the module structure of the embodiment illustrated in FIG. 64. The only difference between them is that the optical filter 3020C is placed on the photosensitive sensor 30121C, so as to be encapsulated and wrapped up together by means of the encapsulation portion 3011C. In this manner, it can reduce the damage on the photosensitive sensor 30121C during the encapsulation and utilization and decrease the back focal length of the camera lens, so as to reduce the size thereof.

Figure 66B:
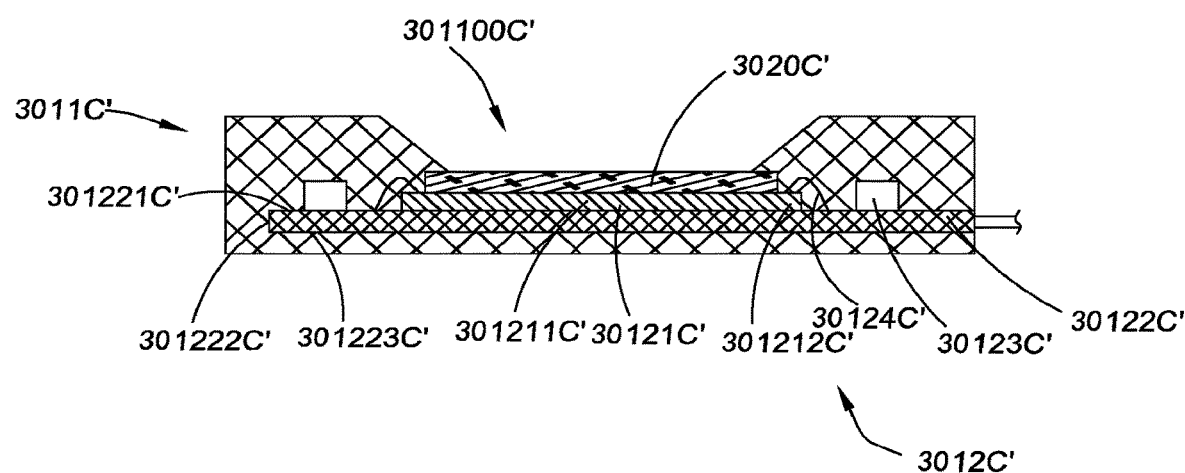
FIG. 66B is a sectional view of a camera module based on integrally encapsulation technology according to another alternative mode of the above embodiment of the present invention.

Similarly, the module structure illustrated in FIG. 66B is an alternative mode of the module structure of the embodiment illustrated in FIG. 65. The only difference between them is that the optical filter 3020C' is placed on the photosensitive sensor 30121C', so as to be encapsulated and wrapped up together by means of the encapsulation portion 3011C'. In this manner, it can reduce the damage on the photosensitive sensor 30121C' during the encapsulation and utilization and decrease the back focal length of the camera lens, so as to reduce the size thereof. Besides, it can also reduce the height thereof and dissipate heat generated by the photosensitive sensor 30121C, which provides great heat dissipation.

Figure 67A:
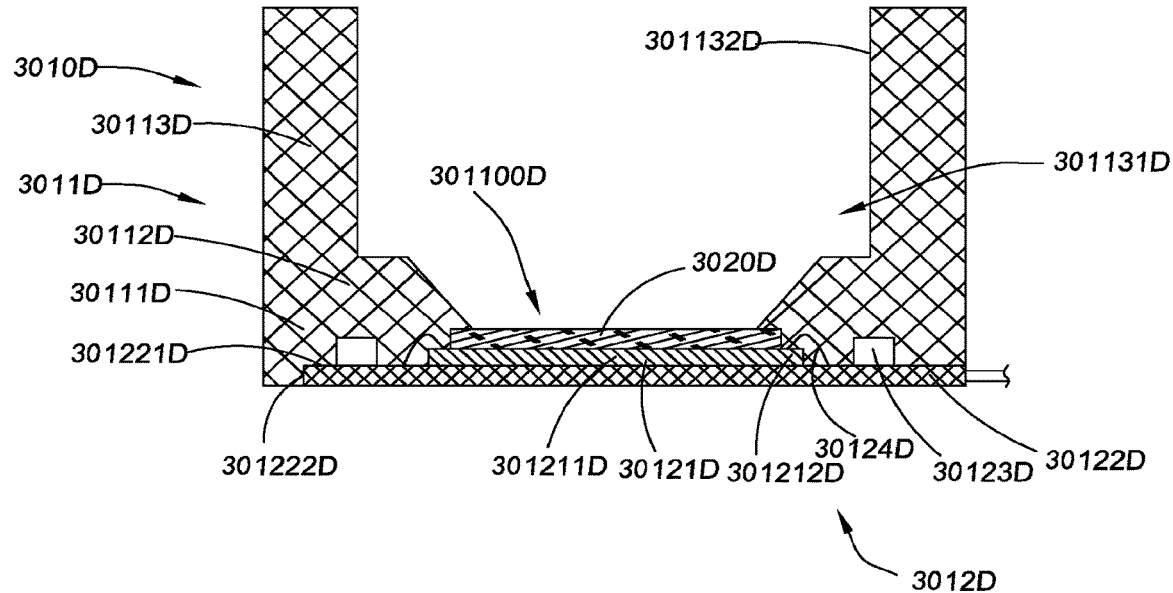
FIG. 67A is a sectional view of a camera module based on integrally encapsulation technology according to an alternative mode of the above embodiment of the present invention.

FIG. 67A is an alternative mode of the structure of the module according to the embodiment of FIG. 66A. It is mainly an alternative mode of the encapsulation portion 3011D. The top portions of the encapsulation portion 3011D are respectively upwardly extended to form the supporting walls 30113D. The supporting walls 30111D form an accommodating groove 301131D for accommodating the camera lens. In other words, the encapsulation portion 3011D can support the camera lens directly, so as to make a high accuracy fixed focus module.

Figure 67B:
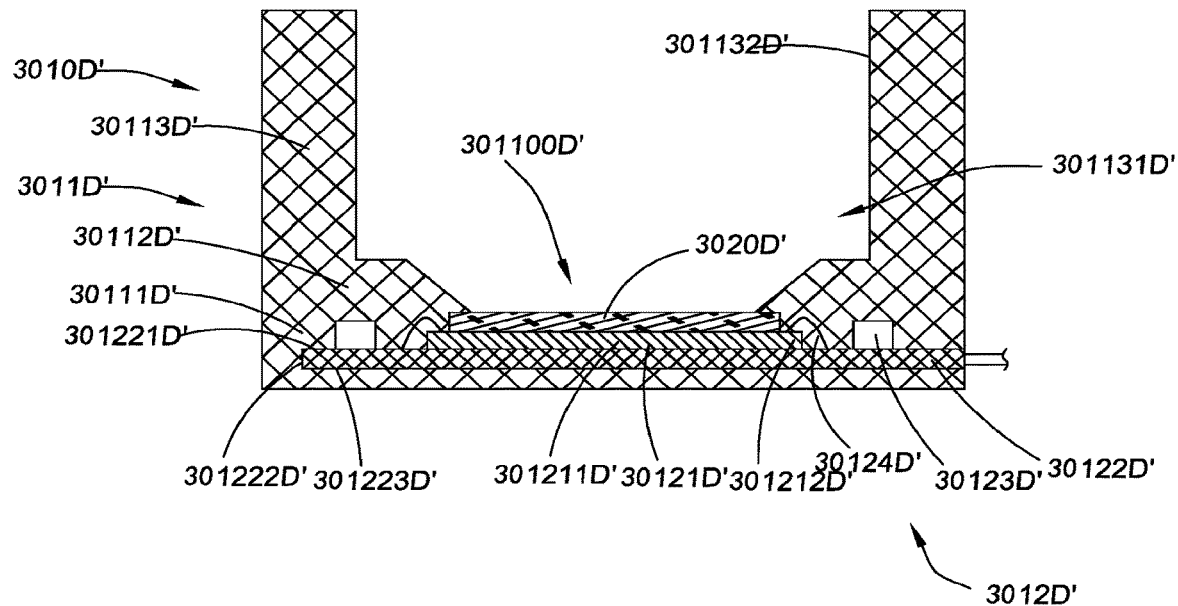
FIG. 67B is a sectional view of a camera module based on integrally encapsulation technology according to an alternative mode of the above embodiment of the present invention.

FIG. 67B is an alternative mode of the structure of the module according to the embodiment of FIG. 66B. It is mainly an alternative mode of the encapsulation portion 3011D'. The encapsulation portion 3011D' covers the bottom side of the circuit board 30121D'. The top portions of the encapsulation portion 3011D' are respectively upwardly extended to form the supporting walls 30111D'. The supporting walls 30111D' form an accommodating groove 1111D' for accommodating the camera lens. In other words, the encapsulation portion 3011D can support the camera lens directly, so as to make a high accuracy fixed focus module.

Figure 68A:
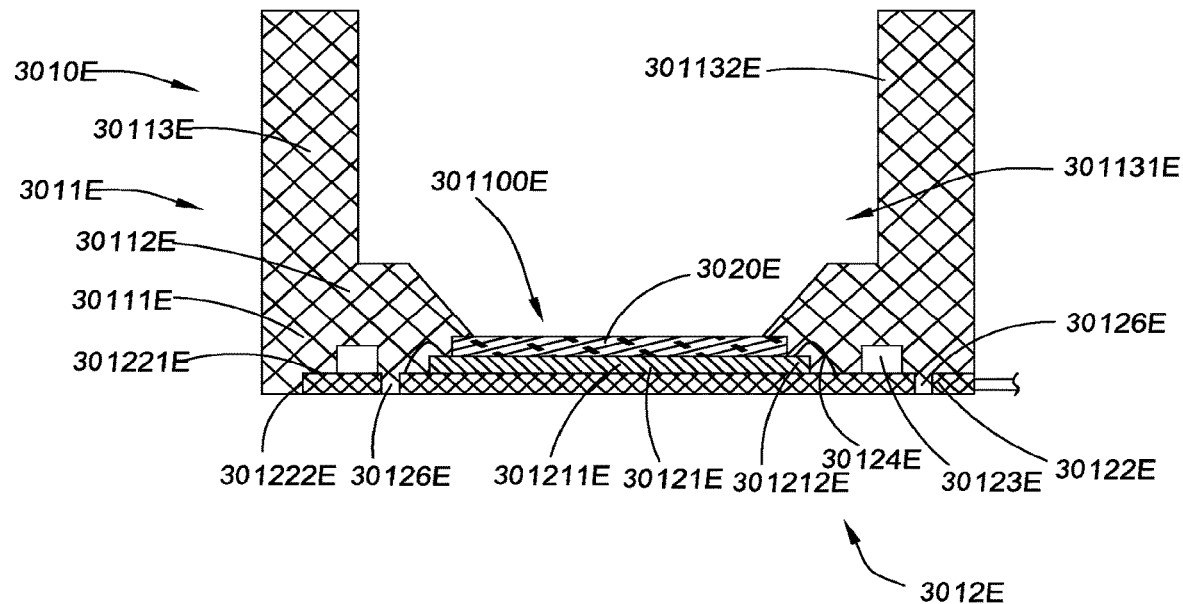
FIG. 68A is a sectional view of a camera module based on integrally encapsulation technology according to an alternative mode of the above embodiment of the present invention.
Figure 68B:
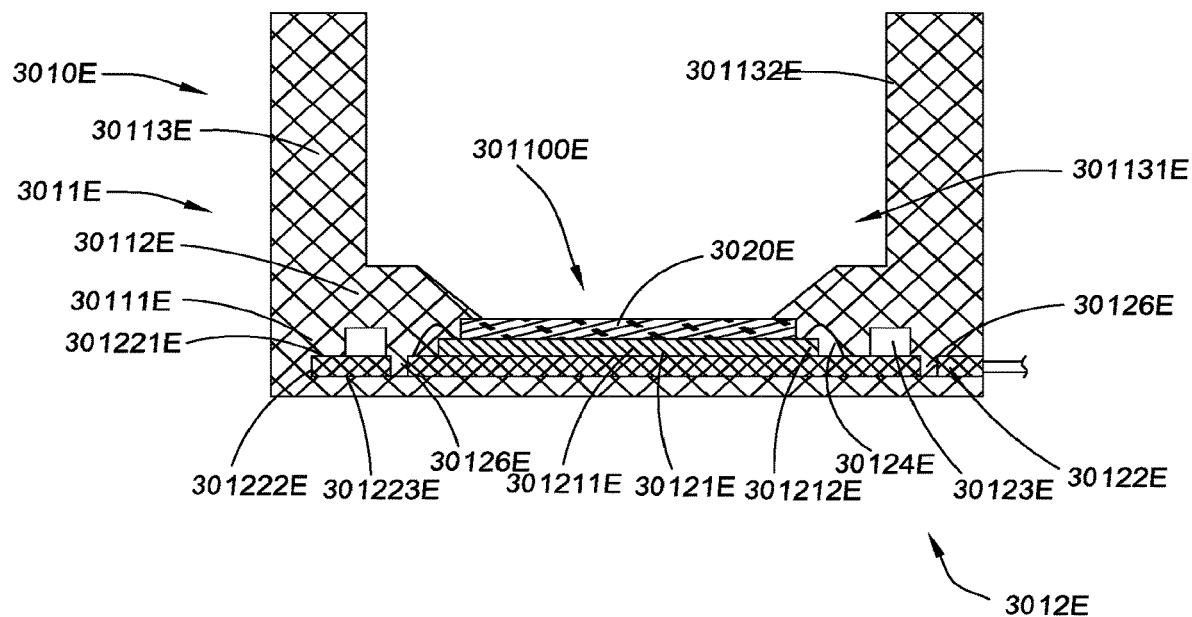
FIG. 68B is a sectional view of a camera module based on integrally encapsulation technology according to another alternative mode of the above embodiment of the present invention.

FIGS. 68A and 68B illustrate alternative modes of the structure of the module according to the embodiment as illustrated in FIG. 67A. It is mainly an alternative mode of the encapsulation portion 3011E. Therefore, the circuit board 30121E has one or more through holes 30126E arranged thereon, so that the molding material that forms the encapsulation portion 3011E can enter the through hole 30126E and be embedded into the through hole 30126E, so as to further enhance the reinforcement for the circuit board 30121E. Similarly, the encapsulation portion 3011E may not only covers and encloses, encapsulates and/or wraps up the top surface of the circuit board 30121E, but also covers and encloses, encapsulates and/or wraps up the sides and bottom side of the circuit board 30121E. It is understandable that this manner of deploying through hole 30126E on the circuit board 30121E can also be utilized in other embodiments of the present invention.

Figure 69:
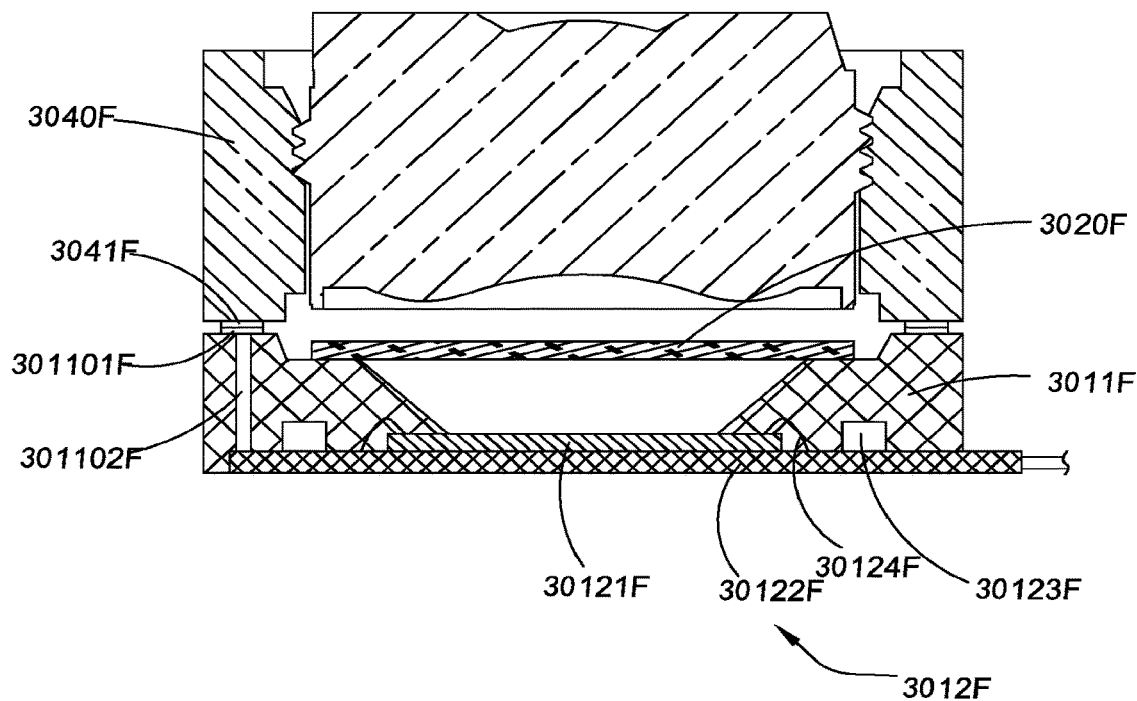
FIG. 69 is a sectional view of a connecting and communicating arrangement of the motor unit and the circuit board according to the above embodiment of the camera module based on integrally encapsulation technology of the present invention.
Figure 70:
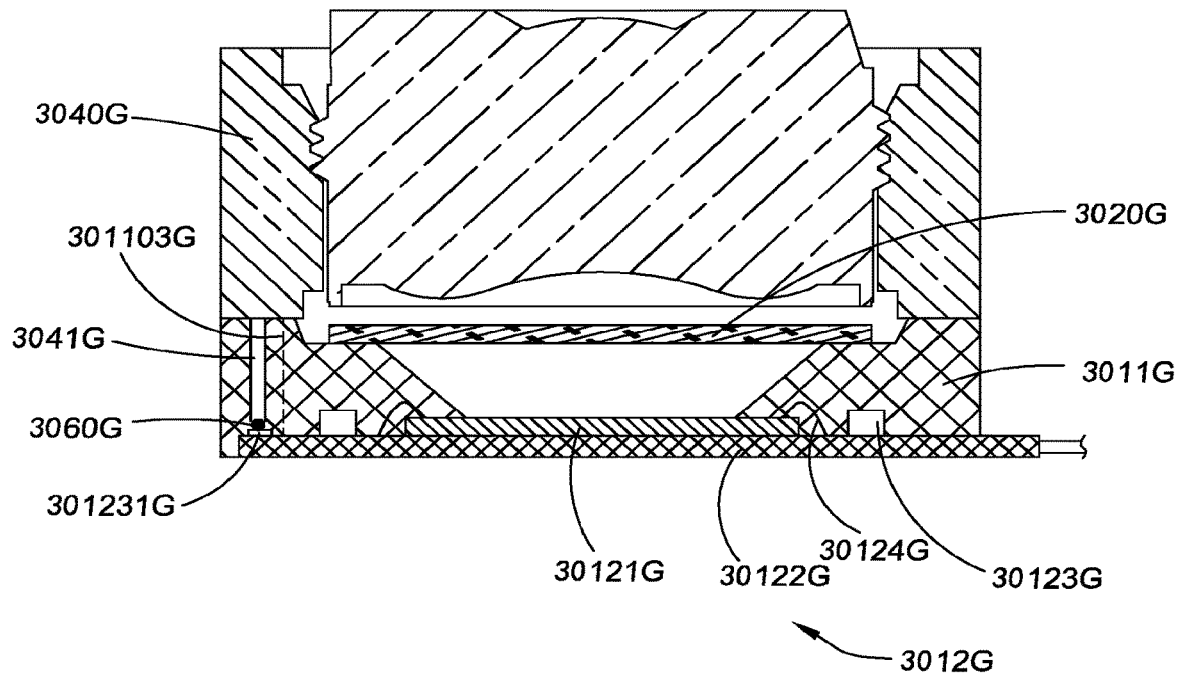
FIG. 70 is a sectional view of another connecting and communicating arrangement of the motor unit and the circuit board according to the above embodiment of the camera module based on integrally encapsulation technology of the present invention.
Figure 71:
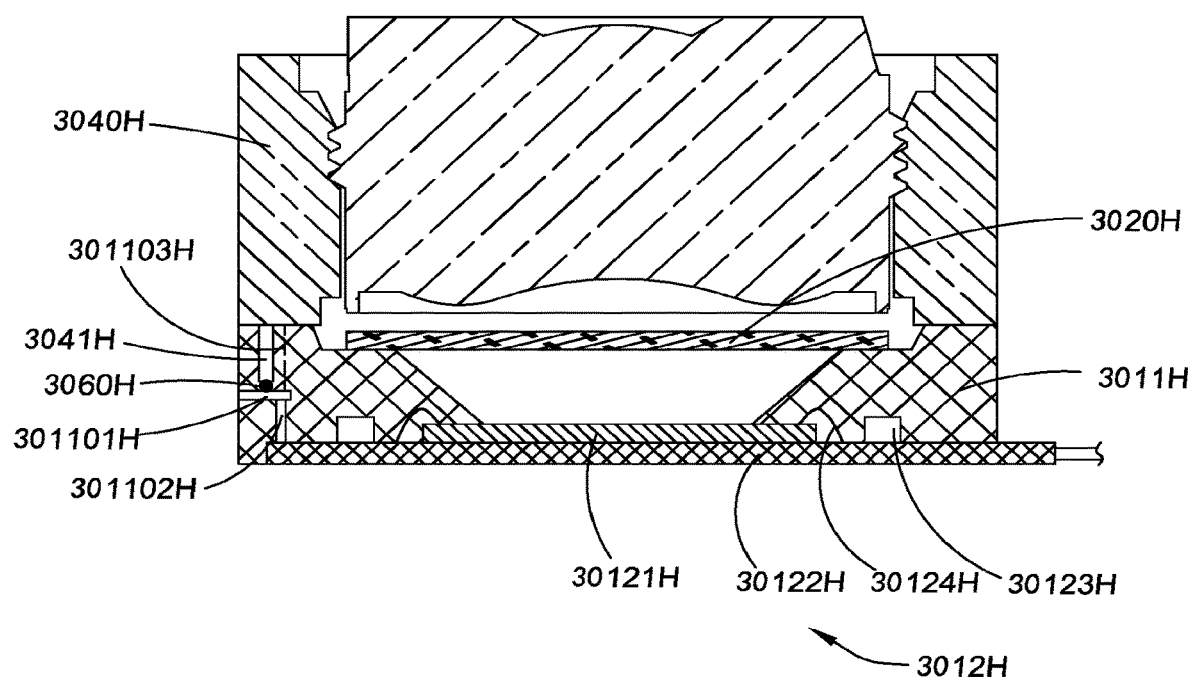
FIG. 71 is a sectional view of another connecting and communicating arrangement of the motor unit and the circuit board according to the above preferred embodiment of the camera module based on integrally encapsulation technology of the present invention.

It is worth mentioning that when a motor unit is needed to be connected for the embodiments illustrated in FIGS. 63A-66B based on the MOC technique thereof, it may utilize the connection modes that communicates the motor terminal and the circuit board illustrated in FIGS. 69-71.

FIG. 69 illustrates a structure according to an alternative mode, which utilizes the MOC technique. The camera module based on integrally encapsulation technology includes an encapsulated photosensitive unit, an optical filter 3020F, a camera lens 3030F, and a motor unit 3040F. In other words, this preferred embodiment of the present invention utilizes the automatic focus camera module as the example. The encapsulated photosensitive unit includes an encapsulation portion 3011F and a photosensitive unit 3012F. The photosensitive unit 3012F further comprises a photosensitive sensor 30121F, a circuit board 30122F, a set of circuit component 30123F, and a set of lead element 30124F. The lead element 30124F connects and communicates the photosensitive sensor 30121F and the circuit board 30122F. In the present embodiment of the present invention, the lead element 30124F may be embodied to be a gold wire. The encapsulation portion 3011F serves as a frame to support the optical filter 3020F. The encapsulation portion 3011F encapsulates the circuit board 30122F during the encapsulation process. In the present embodiment of the present invention, the encapsulation portion 3011F encapsulates all portions of the circuit board 30122F besides the photosensitive area of the photosensitive sensor 30121F. The encapsulation portion 3011F not only encapsulates and wraps up the top surface 301221F of the circuit board 30122F, but also encapsulates and wraps up at least a side 301222F of the circuit board 30122F. It is understandable that the encapsulation portion 3011F may also integrally encapsulate the circuit component 30123F in the encapsulation process.

It is worth mentioning that an encapsulation portion terminal 301101F of the encapsulation portion 3011F is electrically connected with the motor unit 3040F. It utilizes an internal lead wire 301102F of the encapsulation portion 3011F to connect and communicate at least a motor terminal 3041F of the motor unit 3040F to the circuit board 30122F. In this manner, it does not require welding and soldering process.

According to the embodiment illustrated in FIG. 70, it may also utilize welding and soldering process. The encapsulation portion 3011G has a groove channel 1103G arranged thereon communicating the top to the bottom thereof, so as for placing the motor terminal 3041G, such that it can allow the motor terminal 3041G to pass through the groove channel 1103G for being welded and soldered on a soldering point 3060G of a circuit board 1231G of the circuit board 30122G.

Correspondingly, the structure illustrated in FIG. 71 is relatively more similar with the structure illustrated in FIGS. 69 and 70. However, the motor terminal for the structure illustrated in FIGS. 69 and 70 may not be long enough because the encapsulation portion 303011H thereof is taller, so it can only utilize the structure illustrated in FIG. 71. In other words, the groove channel 301103H on the outer wall of the encapsulation portion 303011H is not straight-through. Instead, the motor terminal 3041H is welded and soldered with the encapsulation portion terminal 301101H of the encapsulation portion 3011H in the groove channel 301103H at a soldering point 3060H. Then, it is connected to the circuit board 30122H through the internal lead wire 301102H of the encapsulation portion 3011H, so as to make the connection and communication between the motor unit and the circuit board.

In addition, according to another implementation, it may also form an electroplated conductive circuit on the surface of the encapsulation portion by means of the Laser Direct Structuring technique, so as for connecting and communicating the motor unit and the circuit board. Certainly, the encapsulation portion may also have no electrical functions illustrated in the above embodiments, but utilize conventional technology to connect the motor unit and the circuit board through welding and soldering.

Person skilled in the art should be able to understand that the three embodiments illustrated in FIGS. 69-71 are just for demonstrating examples various ways of communicating the motor unit and the circuit board when there is a motor unit. The encapsulation portion according to these three embodiments may not only encapsulate the top surface and sides of the circuit board, but also, as the above alternative modes mentioned, encapsulate the bottom side of the circuit board. Besides, other structures of the camera module may also have corresponding changes. Therefore, the present invention shall not be limited thereby.

Referring to FIGS. 72-74F, a camera module and a manufacturing method for the camera module according to a preferred embodiment of the present invention are illustrated. The camera module comprises at least a camera lens 4030, at least a photosensitive sensor 4010, at least a protection frame 4060, at least a circuit board 4070, and at least an integrally encapsulated frame 4050.

It is more worth mentioning that the camera module of the present invention can be a fixed focus camera module or an automatic focus camera module. In other words, whether the camera module of the present invention allows focusing shall not limit the content and scope of the present invention.

It is more worth mentioning that the camera module of the present invention can be a single lens camera module or a multi-lens camera module. For instance, according to an embodiment, the camera module can also be embodied to be an array camera module. In other words, the quantity of the camera lens 4030 of the camera module of the present invention shall not limit the content and scope of the present invention.

Specifically speaking, according to this embodiment of the camera module of the present invention, the protection frame 4060 is protrudingly arranged on the periphery of the photosensitive area of the photosensitive sensor 4010, wherein the photosensitive sensor 4010 and the circuit board 4070 are connected and communicated and the integrally encapsulated frame 4050 is arranged to cover the circuit board 4070 and the non-photosensitive area of the photosensitive sensor 4010, so as to integrate the integrally encapsulated frame 4050, the photosensitive sensor 4010, and the circuit board 4070 into one unit. Besides, the camera lens 4030 is deployed along the photosensitive path of the photosensitive sensor 4010. Light reflected from an object can pass through the camera lens 4030 and be concentrated into the inside of the camera module, so as to further be received by the photosensitive sensor 4010 for photoelectric conversion, such that images corresponding to the object can be generated.

Figure 72:
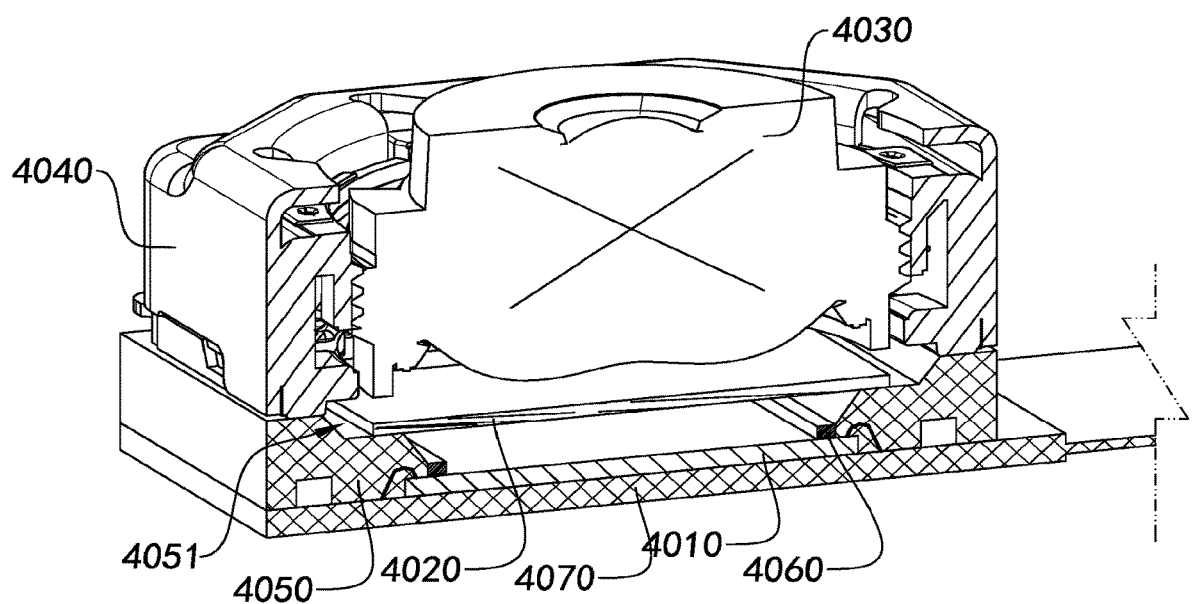
FIG. 72 is a sectional perspective view illustrating the camera module according to another preferred embodiment of the present invention.

According to the embodiment of the camera module of the present invention, the photosensitive sensor 4010 is attached on the circuit board 4070 and photosensitive sensor 4010 is connected and communicated with the circuit board 4070 through wire bonding technique. For example, it can conduct wire bonding between the non-photosensitive area of the photosensitive sensor 4010 and the circuit board 4070, so as to connect and communicate the photosensitive sensor 4010 and the circuit board 4070 through the gold wires, as FIG. 72 illustrated.

According to another embodiment of the camera module of the present invention, the photosensitive sensor 4010 is attached on the circuit board 4070 and connected and communicated with the circuit board 4070 at the same time. For instance, the non-photosensitive area of the photosensitive sensor 4010 may comprise a chip pad arranged thereon and the circuit board 4070 may comprise a circuit board pad arranged thereon, such that when the photosensitive sensor 4010 is attached on the circuit board 4070, the chip pad of the photosensitive sensor 4010 will be connected and communicated with the circuit board pad of the circuit board 4070.

The protection frame 4060 is a hollow structure, such that the protection frame 4060 can be surroundingly deployed on the periphery of the photosensitive area of the photosensitive sensor 4010. Preferably, the size of the inner side edge of the protection frame 4060 is greater than or equal to the size of the photosensitive area of the photosensitive sensor 4010, such that when the protection frame 4060 is protrudingly arranged on the photosensitive sensor 4010, the protection frame 4060 can be maintained in the periphery of the photosensitive area of the photosensitive sensor 4010. Therefore, the protection frame 4060 will not obstruct or shade the photosensitive area of the photosensitive sensor 4010.

Preferably, the size of the outer side edge of the protection frame 4060 is smaller than the size of the photosensitive sensor 4010, such that when the protection frame 4060 is protrudingly arranged on the photosensitive sensor 4010, the photosensitive sensor 4010 and the circuit board 4070 can be connected and communicated with each other through wire bonding in the outer side of the non-photosensitive area of the photosensitive sensor 4010. Nevertheless, person skilled in the art should be able to understand that when the photosensitive sensor 4010 and the circuit board 4070 are connected and communicated through chip pad and circuit board pad, the dimensions of the outer side edge of the protection frame 4060 can be consistent to the dimensions of the photosensitive sensor 4010.

When the integrally encapsulated frame 4050 is formed, it covers the circuit board 4070 and the non-photosensitive area of the photosensitive sensor 4010, so as to integrate the integrally encapsulated frame 4050, the circuit board 4070, and the photosensitive sensor 4010 into one unit, such that it can enhance the structural stability of the camera module and reduce the size and volume of the camera module, which allows the camera module to be utilized in the electronic devices that are expected to be more compact.

Further, the integrally encapsulated frame 4050 is arranged to cover the periphery of the protection frame 4060, so as to integrate the integrally encapsulated frame 4050, the circuit board 4070, the protection frame 4060, and the photosensitive sensor 4010.

Further, referring to FIG. 72, the camera module comprises at least a camera lens support 4040, arranged on the top of the integrally encapsulated frame 4050. The camera lens 4030 is arranged on the camera lens support 4040, such that the camera lens 4030 can be maintained along the photosensitive path of the photosensitive sensor 4010 by means of the camera lens support 4040.

According to the embodiment of the camera module of the present invention, after the camera lens support 4040 is formed, it will be arranged on the top of the integrally encapsulated frame 4050. According to another embodiment of the camera module of the present invention, the camera lens support 4040 can be integrally formed with the integrally encapsulated frame 4050. In this manner, it can decrease the encapsulation deviation of the camera module, which is helpful in enhancing the image quality of the camera module.

Preferably, the camera lens support 4040 can be embodied to be a motor unit. In other words, the camera lens 4030 is operably arranged on the camera lens support 4040, such that the camera lens 4030 can be driven to move back and forth along the photosensitive path of the photosensitive sensor 4010 through the camera lens support 4040, so as to adjust the focal length of the camera module through alter the distance between the camera lens 4030 and the photosensitive sensor 4010. It is worth mentioning that the camera lens support 4040 can be various drivers to drive the camera lens 4030 to move back and forth along the photosensitive path of the photosensitive sensor 4010. For example, according to this preferred embodiment of the present invention, the camera lens support 4040 can be embodied to be a voice coil motor.

Person skilled in the art should be able to understand that when the camera lens support 4040 is embodied to be a motor unit, the camera lens support 4040 and the circuit board 4070 are connected and communicated.

Further, referring to FIG. 72, the camera module comprises a filter 4020, arranged between the camera lens 4030 and the photosensitive sensor 4010, such that when the light reflected from an object is concentrated from the camera lens 4030 and projected to the inside of the camera module, the light will be filtered by the filter 4020 and then be received by the photosensitive sensor 4010 for photoelectric conversion, which provides a better image quality of the camera module. In other words, the filter 4020 can serve to denoise, so as to improve the image quality of the camera module.

It is worth mentioning that types of the filter 4020 shall not be limited. For example, according to an embodiment of the camera module of the present invention, filter 4020 is embodied as an infrared-cut filter, so as to utilize the filter 4020 to filter the infrared of the light. However, according to another embodiment of the camera module of the present invention, the filter 4020 is embodied as a visible light filter.

The integrally encapsulated frame 4050 forms at least a mounting platform 4051, for the filter 4020 to be mounted. For instance, the mounting platform 4051 can be an installing groove formed on the top of the integrally encapsulated frame 4050 or a plane formed on the top of the integrally encapsulated frame 4050. In other words, the filter 4020 can be directly attached on the top portion of the integrally encapsulated frame 4050.

FIGS. 74A-74F are perspective views of a manufacturing method for the camera module according to the present invention. The structural relations among the elements including the camera lens 4030, the photosensitive sensor 4010, the protection frame 4060, the circuit board 4070, and the integrally encapsulated frame 4050 of the camera module are all illustrated by means of sectional views in order to facilitate a clear illustration and description.

Figure 74A:
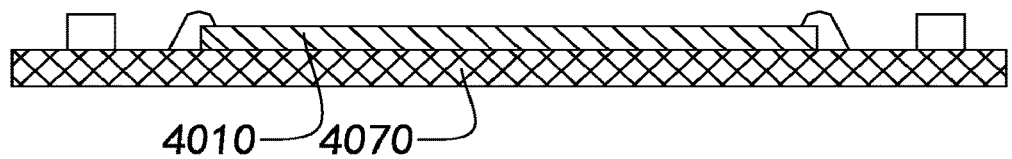
FIG. 74A is a sectional view illustrating step one of the manufacturing method for the camera module according to the above preferred embodiment of the present invention.

In the step illustrated in FIG. 74A, the photosensitive sensor 4010 is connected and communicated with the circuit board 4070. Person skilled in the art should be able to understand that, in the step illustrated in FIG. 74A, when the photosensitive sensor 4010 is attached on the circuit board 4070, it may connect and communicate the photosensitive sensor 4010 and the circuit board 4030 through wire bonding. Nonetheless, this is just an exemplar description. Such means of connecting and communicating the photosensitive sensor 4010 and the circuit board 4070 shall not limit the content and scope of the present invention. According to another embodiment of the camera module of the present invention, the photosensitive sensor 4010 and the circuit board 4070 can also be directly connected and communicated through a chip bonding pad and a circuit board bonding pad.

Figure 74B:
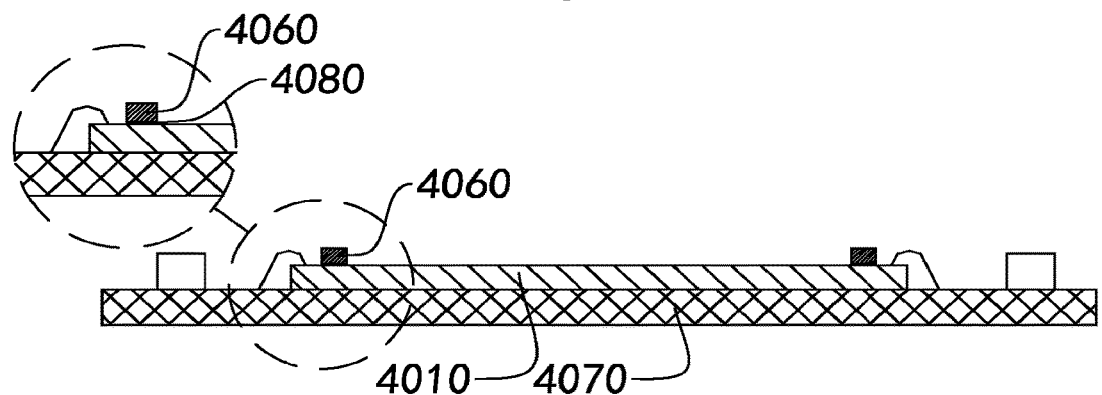
FIG. 74B is a sectional view illustrating step two of the manufacturing method for the camera module according to above preferred embodiment of the present invention.

In the step illustrated in FIG. 74B, the protection frame 4060 is protrudingly arranged on the periphery of the photosensitive area of the photosensitive sensor 4010. Specifically speaking, in the manufacturing method for the camera module of the present invention, after the protection frame 4060 is provided, the protection frame 4060 is protrudingly arranged on the periphery of the photosensitive area of the photosensitive sensor 4010. Preferably, a gluing layer 4080 is formed between the protection frame 4060 and the periphery of the photosensitive area of the photosensitive sensor 4010, so as to connect the protection frame 4060 and the periphery of the photosensitive area of the photosensitive sensor 4010 through the gluing layer 4080.

According to the embodiment of the camera module of the present invention, the adhesive is deployed on the periphery of the photosensitive area of the photosensitive sensor 4010 and/or the protection frame 4060, so as to form the gluing layer 4080 on the periphery of the photosensitive area of the photosensitive sensor 4010 and/or the protection frame 4060. In other words, the gluing layer 4080 is formed on at least a surface of the periphery of the photosensitive area of the photosensitive sensor 4010 and the protection frame 4060. Subsequently, the gluing layer 4080 will be utilized for connecting the protection frame 4060 to the periphery of the photosensitive area of the photosensitive sensor 4010.

Preferably, after the adhesive is deployed on the protection frame 4060 and the periphery of the photosensitive area of the photosensitive sensor 4010, the adhesive can be solidified through heat curing or UV curing and be turned into the gluing layer 4080 that connects the protection frame 4060 and the periphery of the photosensitive area of the photosensitive sensor 4010. According to another embodiment of the camera module of the present invention, the protection frame 4060 may carry the gluing layer 4080 already, such that the protection frame 4060 can be arranged on the periphery of the photosensitive area of the photosensitive sensor 4010 directly in the encapsulating method for the camera module.

In addition, the protection frame 4060 can be formed through injection molding technique or stamping technique. For example, the protection frame 4060 can be a plastic part formed through injection molding technique.

Figure 73:
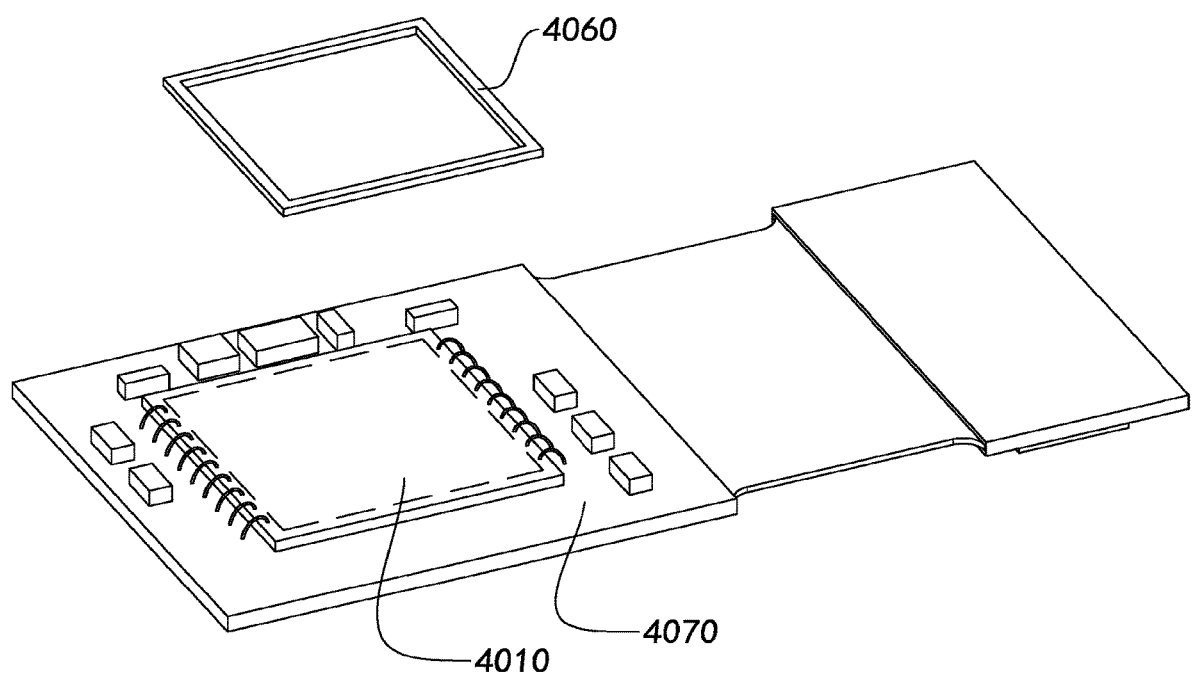
FIG. 73 is an exploded perspective view illustrating structural relations of the circuit board, photosensitive sensor, and protection frame of the camera module according to the above preferred embodiment of the present invention.

Referring to FIG. 73, the protection frame 4060 is a hollow structure, such that the protection frame 4060 can be protrudingly arranged on the periphery of the photosensitive area of the photosensitive sensor 4010, so as to isolate the photosensitive area of the photosensitive sensor 4020 from the external environment. Therefore, in the subsequent method for encapsulating the camera module, the protection frame 4060 can avoid contaminants from entering the photosensitive area of the photosensitive sensor 4010 and rendering defects like dark spots.

Figure 74C:
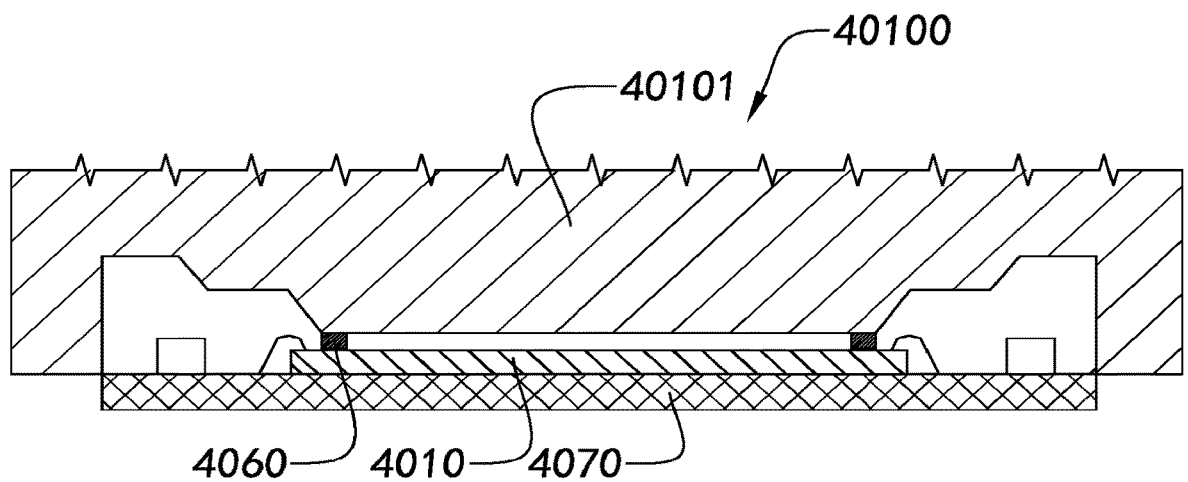
FIG. 74C is a sectional view illustrating step three of the manufacturing method for the camera module according to above preferred embodiment of the present invention.

In the step illustrated in FIG. 74C, it utilizes a forming mold 40100 to form the integrally encapsulated frame when the camera module is encapsulated. The forming mold 40100 comprises an upper mold 40101. The inner surface of the upper mold 40101 exerts pressure on the protection frame 4060, so as to isolate and divide the photosensitive area of the photosensitive sensor 4010 from the external environment.

Person skilled in the art should be able to understand that the protection frame 4060 is protrudingly arranged on the periphery of the photosensitive area of the photosensitive sensor 4010, such that when the inner surface of the upper mold 40101 exerts pressure on the protection frame 4060, the protection frame 4060 can prevent the inner surface of the upper mold 40101 from contacting the photosensitive area of the photosensitive sensor 4010. Therefore, the protection frame 4060 can avoid the inner surface of the upper mold 40101 from damaging or scratching the photosensitive area of the photosensitive sensor 4010.

Figure 76:
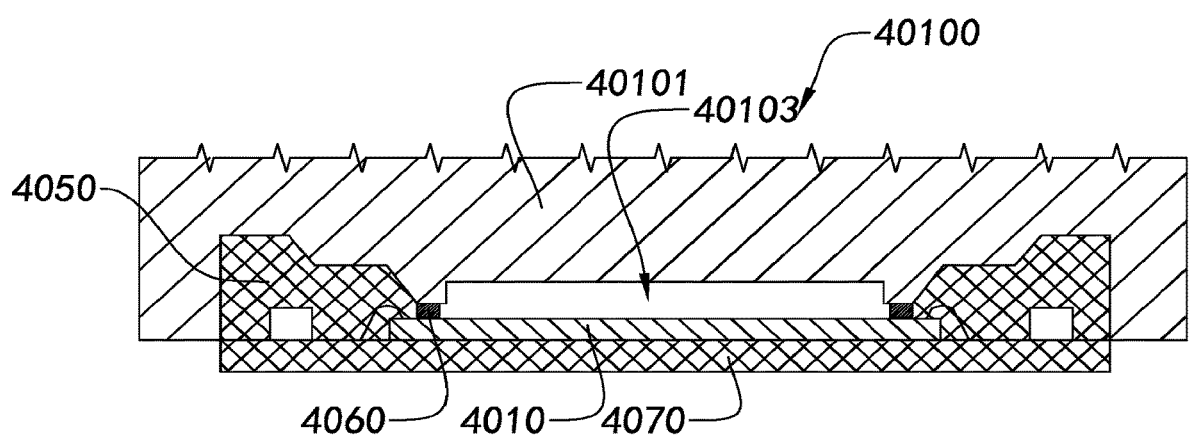
FIG. 76 is a sectional view illustrating step four of the manufacturing method for the camera module according to an alternative mode of the above preferred embodiment of the present invention.

Further, referring to an alternative mode of the manufacturing method for the camera module illustrated in FIG. 76, the inner surface of the upper mold 40101 is dented to form a groove 40102 at the area corresponding to the photosensitive area of the photosensitive sensor 4010, such that as the forming mold 40100 is utilized to form the integrally encapsulated frame 4050, the groove 40102 can create a safety clearance between the photosensitive area of the photosensitive sensor 4010 and the inner surface of the upper mold 40101, so as to further lower the impact of the upper mold 40101 to the photosensitive sensor 4010 and to prevent the photosensitive sensor 4010 from being damaged or scratched by the inner surface of the upper mold 40101.

Preferably, the protection frame 4060 has resilience, such that when the inner surface of the upper mold 40101 exert pressure on the protection frame 4060, the protection frame 4060 can serve as a cushion to prevent the photosensitive sensor 4010 from being damaged by the pressure brought by the upper mold 40101. In addition, due to the limitations of the manufacturing technology of the photosensitive sensor 4010, the manufacturing technology of the circuit board 4070, and the attaching technology of the photosensitive sensor 4010 and the circuit board 4070, when the photosensitive sensor 4010 is attached on the circuit board 4070, there could be tilt. As a result, when the inner surface of the upper mold 40101 presses on the protection frame 4060, the protection frame 4060 can be distorted, so as to isolate the photosensitive area of the photosensitive sensor 4010 from the external environment in order to prevent the molding material for forming the integrally encapsulated frame 4050 from entering into the photosensitive area of the photosensitive sensor 4010.

Figure 74D:
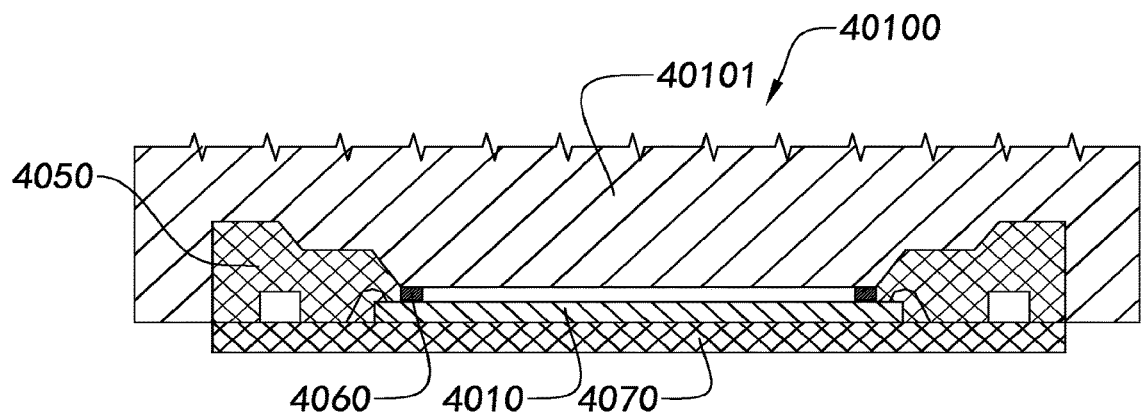
FIG. 74D is a sectional view illustrating step four of the manufacturing method for the camera module according to above preferred embodiment of the present invention.
Figure 74E:
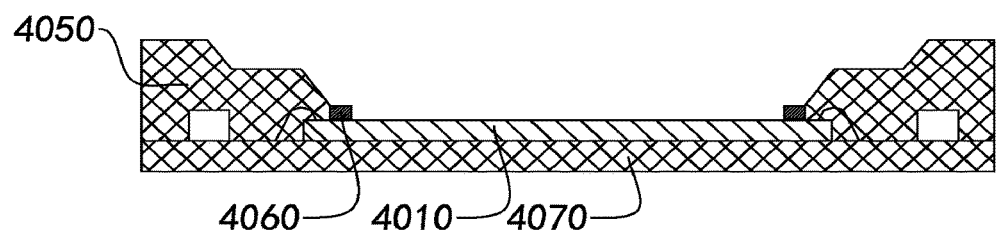
FIG. 74E is a sectional view illustrating step five of the manufacturing method for the camera module according to above preferred embodiment of the present invention.

In the step illustrated in FIG. 74D, the molding material is added into the upper mold 40101 and forms the integrally encapsulated frame 4050 after the molding material is solidified. The integrally encapsulated frame 4050 covers the circuit board 4070 and the non-photosensitive area of the photosensitive sensor 4010, so as to integrate the integrally encapsulated frame 4050, the circuit board 4070, and the photosensitive sensor 4010. Preferably, the integrally encapsulated frame 4050 further covers the periphery of the protection frame 4060, so as to integrate the integrally encapsulated frame 4050, the circuit board 4070, the protection frame 4060, and the photosensitive sensor 4010. It is worth mentioning that the molding material is a fluid material or a granulated material. After the forming mold 40100 is removed, an integrally encapsulated and formed unit containing the integrally encapsulated frame 4050, the circuit board 4070, the protection frame 4060, and the photosensitive sensor 4010 as FIG. 74E illustrated can be obtained.

Person skilled in the art should be able to understand that the photosensitive area of the photosensitive sensor 4010 is isolated from the external environment, such that after the molding material is added into the upper mold 40101, the molding material will not flow to the photosensitive area of the photosensitive sensor 4010. Therefore, the protection frame 4060 can avoid the molding material from damaging the photosensitive area of the photosensitive sensor 4010. Besides, the protection frame 4060 is flexible, so that there will not be gap between the protection frame 4060 and the upper mold 40101 that is pressing the protection frame 4060. Therefore, "burr" will not occur during the solidification of the molding material added into the upper mold 40101, which guarantees the image quality of the camera module.

Figure 75A:
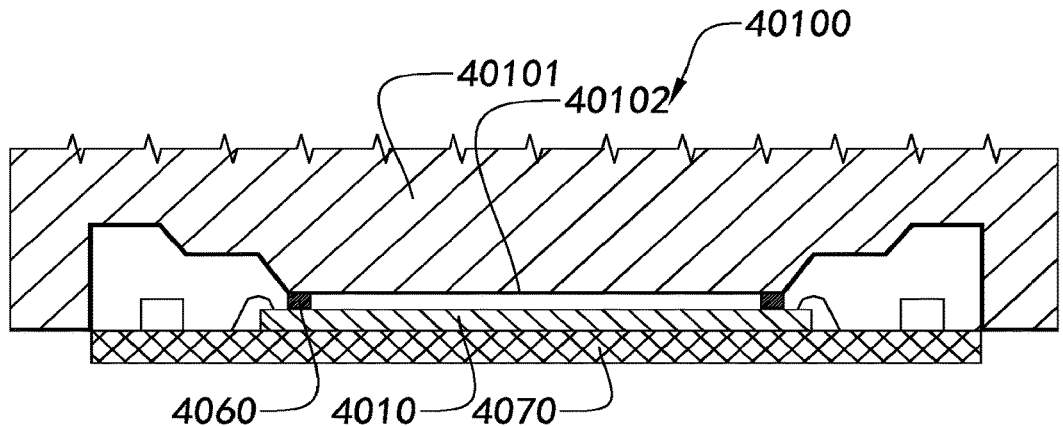
FIG. 75A is a sectional view illustrating step three of the manufacturing method for the camera module according to another alternative mode of the above preferred embodiment of the present invention.
Figure 75B:
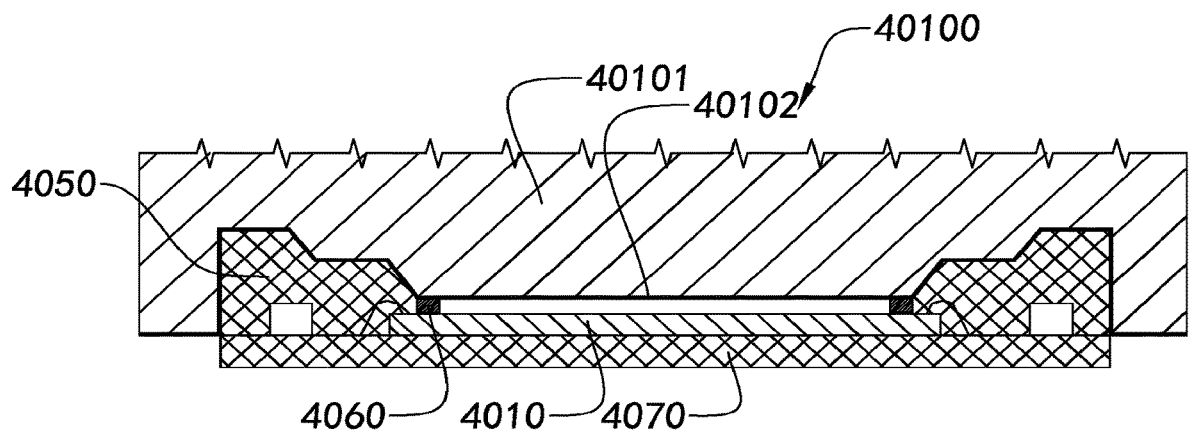
FIG. 75B is a sectional view illustrating step four of the manufacturing method for the camera module according to another alternative mode of the above preferred embodiment of the present invention.

Further, referring to an alternative mode of the manufacturing method for the camera module illustrated in FIGS. 75A and 75B, the inner surface of the upper mold 40101 comprises a cover film 40102 covered thereon, such that when the inner surface of the upper mold 40101 presses on the protection frame 4060, the cover film 40102 deployed on the upper mold 40101 will directly contact the protection frame 4060, so as to further protect the photosensitive sensor 4010 with the cover film 40103. Besides, it is understandable that the cover film 40102 can lower the difficulty of demolding and increase the sealingness and tightness, so as to prevent burr from occurring on the inner side of the integrally encapsulated frame 4050 when the molding material is being solidified.

Figure 74F:
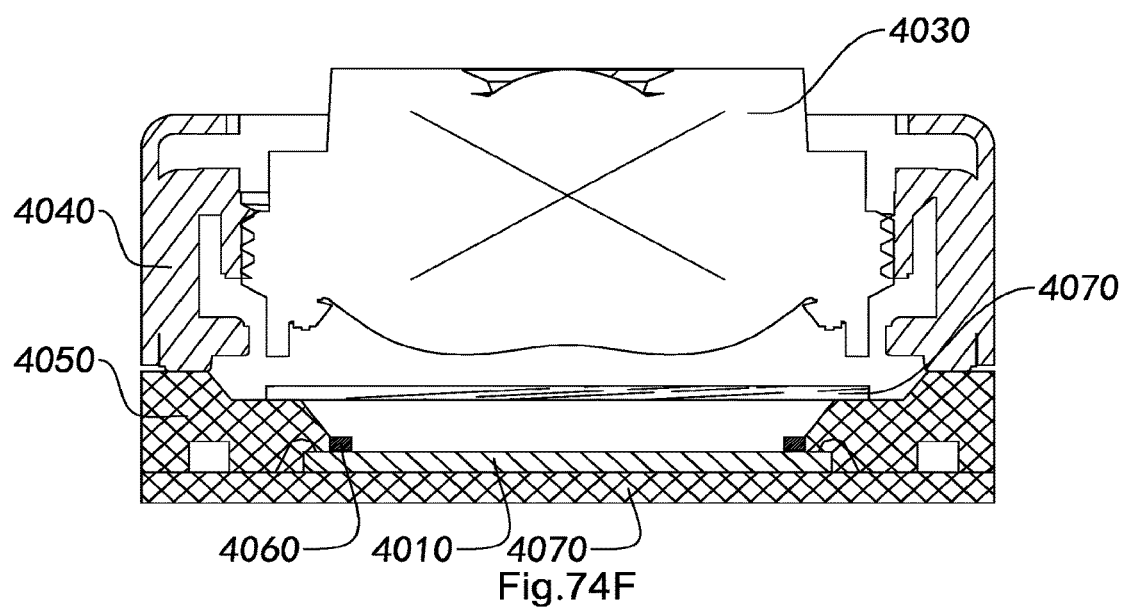
FIG. 74F is a sectional view illustrating step six of the manufacturing method for the camera module according to above preferred embodiment of the present invention.

In the step illustrated in FIG. 74F, the filter 4020 and the camera lens 4030 are respectively arranged in the photosensitive path of the photosensitive sensor 4010, so as to make the camera module. Preferably, the filter 4020 is arranged on the integrally encapsulated frame 4050 and the camera lens 4030 can be maintained along the photosensitive path of the photosensitive sensor 4010 by being arranged on the camera lens support 4040 of the integrally encapsulated frame 4050.

FIGS. 77A-77G illustrate sectional views of another manufacturing method for the camera module according to the present invention. In the step illustrated in FIG. 77A, the photosensitive sensor 4010 is connected and communicated with the circuit board 4070.

Figure 77A:
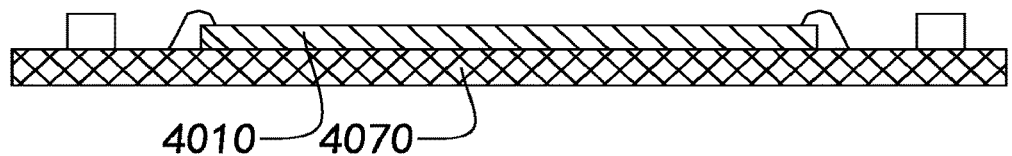
FIG. 77A is a sectional view illustrating step one of the manufacturing method for the camera module according to another preferred embodiment of the present invention.
Figure 77B:
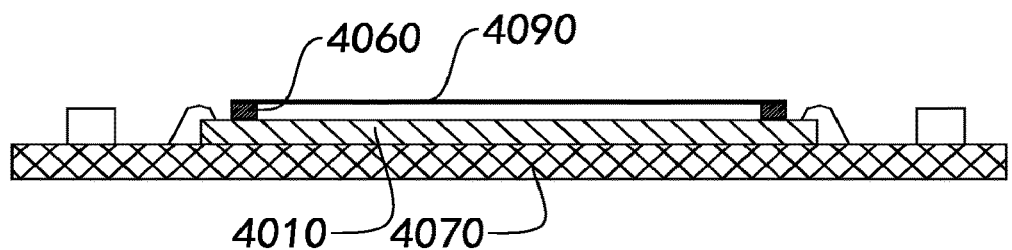
FIG. 77B is a sectional view illustrating step two of the manufacturing method for the camera module according to above preferred embodiment of the present invention.

In the step illustrated in FIG. 77B, the protection frame 4060 is protrudingly arranged on the periphery of the photosensitive area of the photosensitive sensor 4010. Preferably, a protective film 4090 is deployed on the top portion of the protection frame 4060, such that it will be easier to utilize vacuum suction to hold the protection frame 4060 and attach the protection frame 4060 on the periphery of the photosensitive area of the photosensitive sensor 4010. Person skilled in the art should be able to understand that when the protection frame 4060 is arranged on the periphery of the photosensitive area of the photosensitive sensor 4010, the protective film 4090 will be coordinately covered on the top of the photosensitive area of the photosensitive sensor 4010, so as to isolate the photosensitive area of the photosensitive sensor 4010 from the external environment through the protective film 4090 and the protection frame 4060. Therefore, it can avoid the molding material from flowing into the photosensitive area of the photosensitive sensor 4010 subsequently.

Figure 77C:
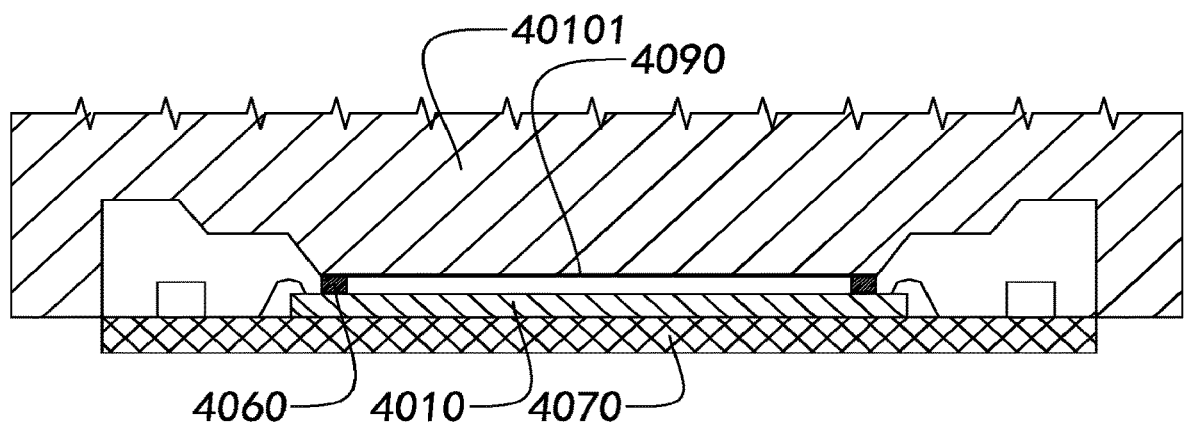
FIG. 77C is a sectional view illustrating step three of the manufacturing method for of the camera module according to above preferred embodiment of the present invention.

In the step illustrated in FIG. 77C, it exerts pressure on the protection frame 4060 through the inner surface of the upper mold 40101 of a forming mold 40100, so as to further isolate and divide the photosensitive area of the photosensitive sensor 4010 from the external environment.

Figure 77D:
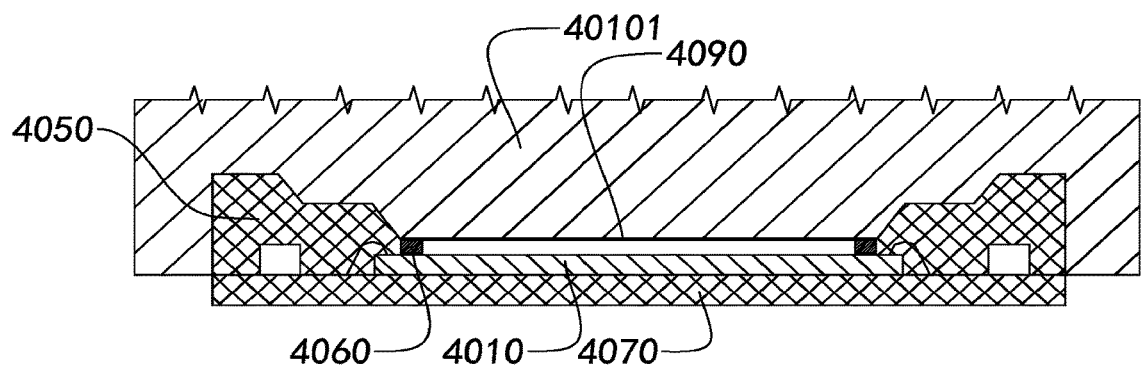
FIG. 77D is a sectional view illustrating step four of the manufacturing method for the camera module according to above preferred embodiment of the present invention.
Figure 77E:
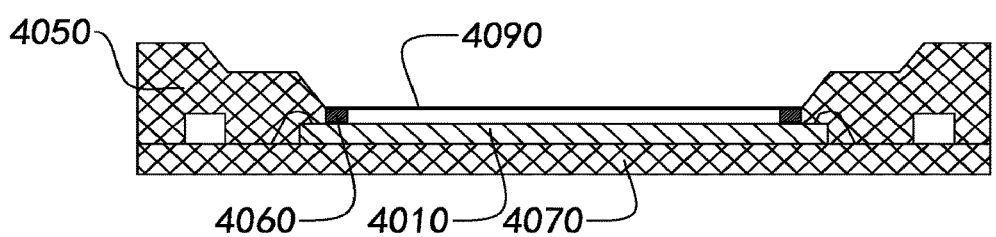
FIG. 77E is a sectional view illustrating step five of the manufacturing method for the camera module according to above preferred embodiment of the present invention.

In the step illustrated in FIG. 77D, the molding material is added into the upper mold 40101 and forms the integrally encapsulated frame 4060 after the molding material is solidified. The integrally encapsulated frame 4050 covers the circuit board 4070 and the non-photosensitive area of the photosensitive sensor 4010, so as to integrate the integrally encapsulated frame 4050, the circuit board 4070, and the photosensitive sensor 4010. Preferably, the integrally encapsulated frame 4050 further covers the periphery of the protection frame 4060, so as to integrate the integrally encapsulated frame 4050, the circuit board 4070, the protection frame 4060, and the photosensitive sensor 4010. After the forming mold 40101 is removed, an integrally encapsulated and formed unit containing the integrally encapsulated frame 4050, the circuit board 4070, the protection frame 4060, and the photosensitive sensor 4010 as FIG. 77E illustrated can be obtained, wherein the protective film 4090 is still disposed on the protection frame 4060.

Figure 77F:
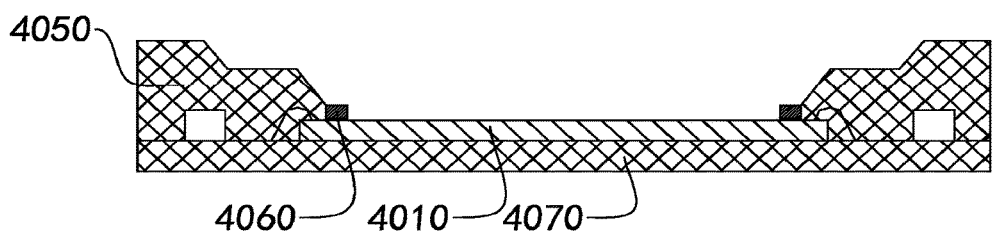
FIG. 77F is a sectional view illustrating step six of the manufacturing method for the camera module according to above preferred embodiment of the present invention.

In the step illustrated in FIG. 77F, the protective film 4090 is removed from the protection frame 4060, so as to obtain an integrally encapsulated and formed unit containing the integrally encapsulated frame 4050, the circuit board 4070, the protection frame 4060, and the photosensitive sensor 4010.

Figure 77G:
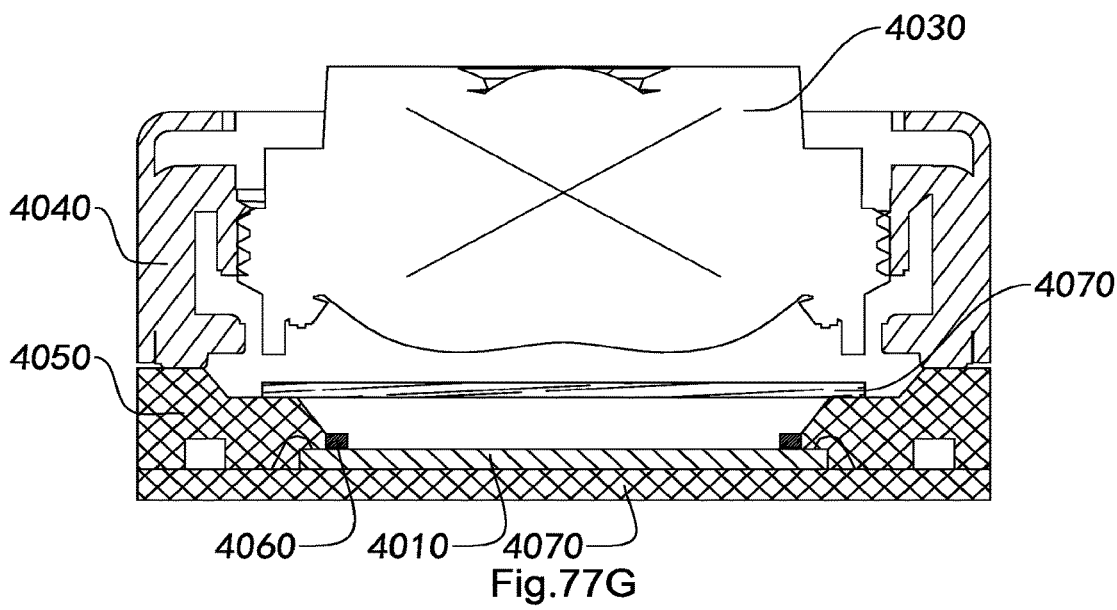
FIG. 77G is a sectional view illustrating step seven of the manufacturing method for the camera module according to above preferred embodiment of the present invention.
Figure 78:
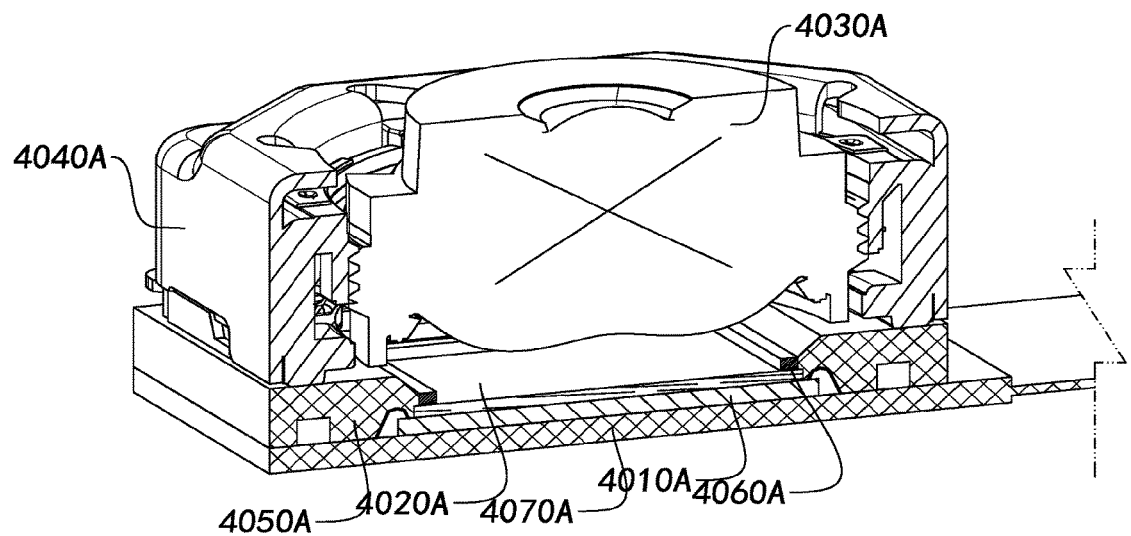
FIG. 78 is a sectional perspective view illustrating the camera module according to another preferred embodiment of the present invention.
Figure 79:
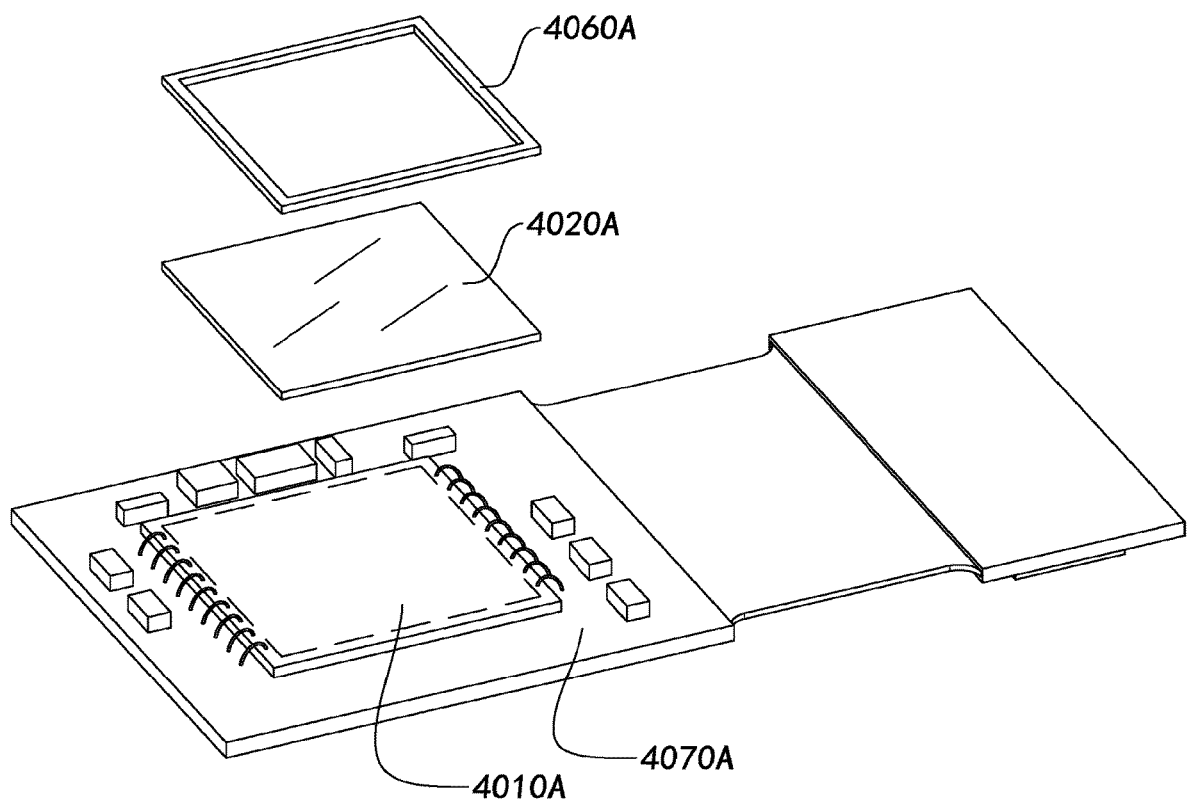
FIG. 79 is an exploded perspective view illustrating structural relations of the circuit board, photosensitive sensor, filter, and protection frame of the camera module according to the above preferred embodiment of the present invention.

In the step illustrated in FIG. 77G, the filter 4020 and the camera lens 4030 are respectively arranged in the photosensitive path of the photosensitive sensor 4010, so as to make the camera module.

Referring to FIGS. 78-80G, the camera module according to another preferred embodiment of the present invention is illustrated. The camera module comprises at least a camera lens 4030A, at least a photosensitive sensor 4010A, at least a protection frame 4060A, at least a circuit board 4070A, at least an integrally encapsulated frame 4050A, and at least a filter 4020A. The photosensitive sensor 4010A and the circuit board 4070A is connected and communicated. The filter 4020A is overlappedly arranged on the photosensitive sensor 4010A. The protection frame 4060A is arranged on the periphery of the filter 4020A, such that the protection frame 4060A will not obstruct or shade the photosensitive area of the photosensitive sensor 4010A. The integrally encapsulated frame 4050A is arranged to cover the periphery of the photosensitive sensor 4010A and the circuit board 4070A, so as to integrally bond the integrally encapsulated frame 4050A, the filter 4020A, the photosensitive sensor 4010A, and the circuit board 4070A. The camera lens 4030A is arranged along the photosensitive path of the photosensitive sensor 4010A. Light reflected from an object will pass through the camera lens 4030A and be concentrated into the inside of the camera module, so as to further be received by the photosensitive sensor 4010A for photoelectric conversion, such that images corresponding to the object can be generated.

Preferably, when the integrally encapsulated frame 4050A is formed, it covers the periphery of the filter 4020A and the circuit board 4070A, so as to integrate the integrally encapsulated frame 4050A, the filter 4020A, the photosensitive sensor 4010A, and the circuit board 4070A.

More preferably, the integrally encapsulated frame 4050A further covers the outer side edge of the protection frame 4060A, so as to integrate the integrally encapsulated frame 4050A, the filter 4020A, the photosensitive sensor 4010A, the circuit board 4070A, and the protection frame 4060A.

The protection frame 4060A is protrudingly arranged on the periphery of the filter 4020A, such that when the inner surface of the upper mold 40101A of a forming mold 40100A exerts pressure on the protection frame 4060A, the inner surface of the upper mold 40101A is unlikely to contact the surface of the filter 4020A, so as to avoid the inner surface of the upper mold 40101A from damaging or scratching the filter 4020A. In other words, the protection frame 4060A protrudingly arranged on the periphery of the filter 4020A create a safe distance between the surface of the filter 4020A and the inner surface of the upper mold 40101A, so as to avoid the inner surface of the upper mold 40101A from damaging or scratching the filter 4020A.

Further, the camera module comprises at least a camera lens support 4040A, arranged on the top of the integrally encapsulated frame 4050A. The camera lens 4030A is arranged on the camera lens support 4040A, such that the camera lens 4030A can be maintained along the photosensitive path of the photosensitive sensor 4010A by means of the camera lens support 4040A.

According to an embodiment of the camera module of the present invention, after the camera lens support 4040A is formed, it will be arranged on the top of the integrally encapsulated frame 4050A. According to another embodiment of the camera module of the present invention, the camera lens support 4040A can be integrally formed with the integrally encapsulated frame 4050A. In this manner, it can decrease the encapsulation deviation of the camera module, which is helpful in enhancing the image quality of the camera module.

Preferably, the camera lens support 4040A can be embodied to be a motor unit. In other words, the camera lens 4030A is operably arranged on the camera lens support 4040A, such that the camera lens 4030A can be driven to move back and forth along the photosensitive path of the photosensitive sensor 4010A through the camera lens support 4040A, so as to adjust the focal length of the camera module through alter the distance between the camera lens 4030A and the photosensitive sensor 4010A. It is worth mentioning that the camera lens support 4040A can be various drivers to drive the camera lens 4030A to move back and forth along the photosensitive path of the photosensitive sensor 4010A. For example, according to this preferred embodiment of the present invention, the camera lens support 4040A can be embodied to be a voice coil motor.

Person skilled in the art should be able to understand that when the camera lens support 4040A is embodied to be a motor unit, the camera lens support 4040A and the circuit board 4070A are connected and communicated.

FIGS. 80A-80G illustrate perspective views of a manufacturing method for the camera module according to the present invention. In the step illustrated in FIG. 80A, the photosensitive sensor 4010A is connected and communicated with the circuit board 4070A, which is similar with the above preferred embodiments of the present invention. Nonetheless, the way to connect and communicate the photosensitive sensor 4010A and the circuit board 4070A shall not be limited.

Figure 80A:
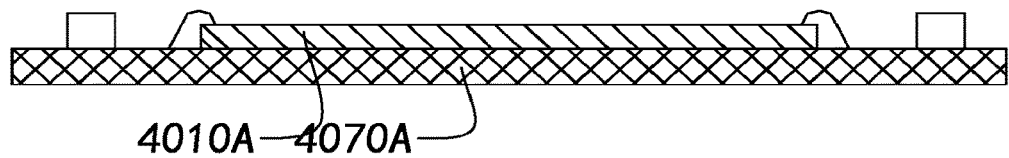
FIG. 80A is a sectional view illustrating step one of the manufacturing method for the camera module according to the above preferred embodiment of the present invention.
Figure 80B:
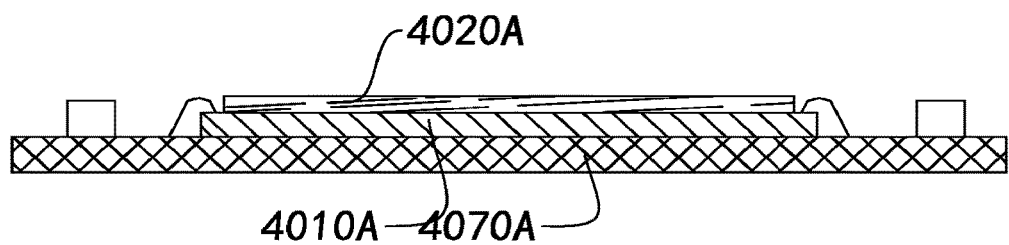
FIG. 80B is a sectional view illustrating step two of the manufacturing method for the camera module according to above preferred embodiment of the present invention.

In the step illustrated in FIG. 80B, the filter 4020A is overlappedly arranged on the photosensitive sensor 4010A. Person skilled in the art should be able to understand that the way that the filter 4020A and the photosensitive sensor 4010A are overlappedly arranged allows the back focal length of the camera module to be further reduced, so as to help for miniaturize the camera module and allow the camera module to be utilized in the electronic devices that are expected to be more compact.

Figure 80C:
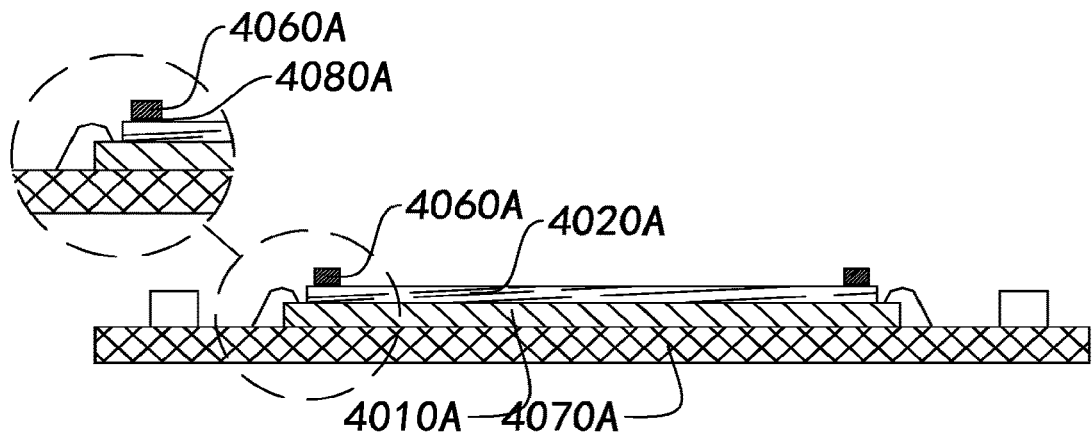
FIG. 80C is a sectional view illustrating step three of the manufacturing method for the camera module according to above preferred embodiment of the present invention.

In the step illustrated in FIG. 80C, the protection frame 4060A is placed on the periphery of the filter 4020A, wherein the protection frame 4060A will not obstruct or shade the photosensitive area of the photosensitive sensor 4010A. Person skilled in the art should be able to understand that after the protection frame 4060A is provided, it may have the protection frame 4060A be arranged on the periphery of the filter 4020A through a gluing layer 4080A. In other words, the gluing layer 4080A being deployed between the protection frame 4060A and the filter 4020A is for connecting and coupling the protection frame 4060A and the filter 4020A.

Figure 80D:
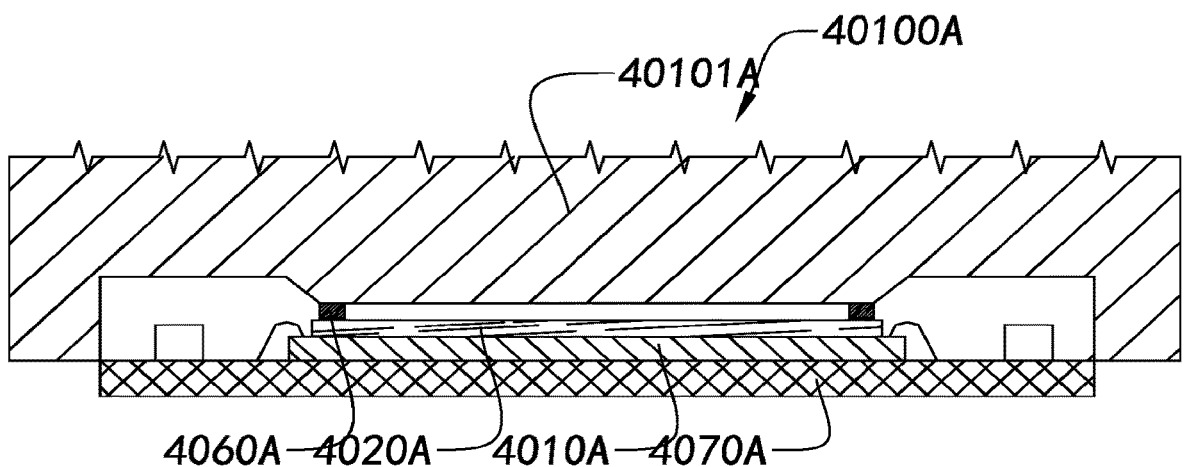
FIG. 80D is a sectional view illustrating step four of the manufacturing method for the camera module according to above preferred embodiment of the present invention.

In the step illustrated in FIG. 80D, it utilizes the inner surface of the upper mold 40101A to press on the protection frame 4060A so as to isolate the interior area of the filter 4020A from the periphery. The dimensions of the interior area of the filter 4020A is larger than or equal to the photosensitive area of the photosensitive sensor 4010A, so as to avoid the protection frame 4060A from obstructing or shading the photosensitive area of the photosensitive sensor 4010A. Person skilled in the art should be able to understand that the protection frame 4060A is protrudingly arranged on the periphery of the filter 4020A, such that when the inner surface of the upper mold 40101A exerts pressure on the protection frame 4060A, the protection frame 4060A can prevent the inner surface of the upper mold 40101A from contacting the photosensitive area of the filter 4020A. Therefore, the protection frame 4060A can avoid the inner surface of the upper mold 40101A from damaging or scratching the interior area of the filter 4020A.

Preferably, the protection frame 4060A has resilience, such that when the inner surface of the upper mold 40101A exert pressure on the protection frame 4060A, the protection frame 4060A can serve as a cushion to prevent the filter 4020A from being damaged by the pressure brought by the upper mold 40101A.

Figure 80E:
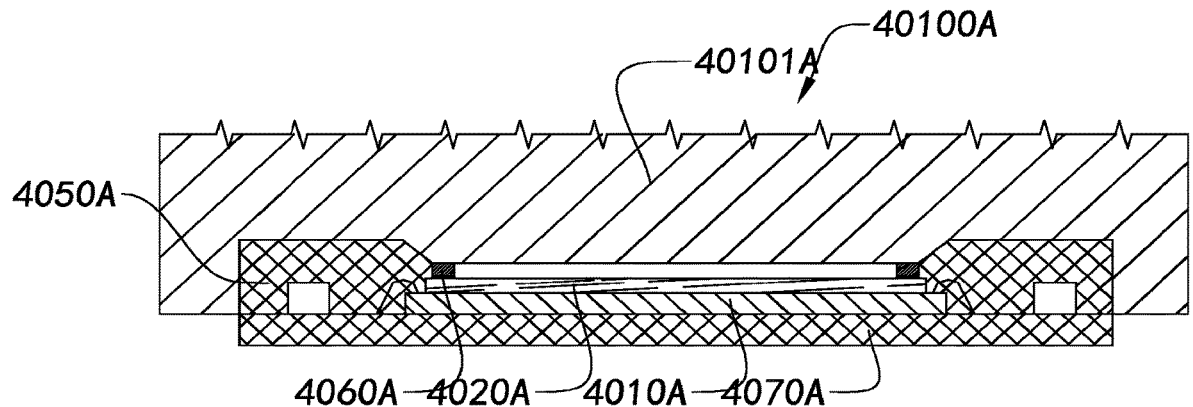
FIG. 80E is a sectional view illustrating step five of the manufacturing method for the camera module according to above preferred embodiment of the present invention.
Figure 80F:
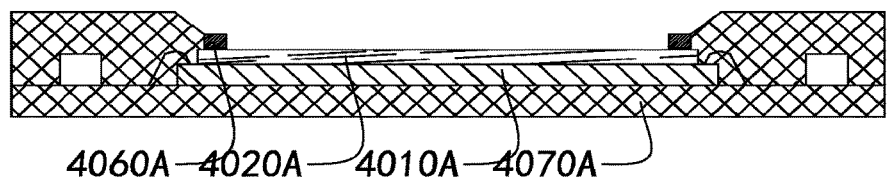
FIG. 80F is a sectional view illustrating step six of the manufacturing method for the camera module according to above preferred embodiment of the present invention.

In the step illustrated in FIG. 80E, the molding material is added into the upper mold 40101A and forms the integrally encapsulated frame 4050A after the molding material is solidified. The integrally encapsulated frame 4050A covers the circuit board 4070A, the periphery of the filter 4020A, so as to integrate the integrally encapsulated frame 4050A, the circuit board 4070A, the photosensitive sensor 4010A, and the filter 4020A. Preferably, the integrally encapsulated frame 4050A further covers the periphery of the protection frame 4060A, so as to integrate the integrally encapsulated frame 4050A, the circuit board 4070A, the protection frame 4060A, and the photosensitive sensor 4010A, and the filter 4020A. It is worth mentioning that the molding material is a fluid material or a granulated material. After the forming mold 40100A is removed, an integrally encapsulated and formed unit containing the integrally encapsulated frame 4050A, the circuit board 4070A, the protection frame 4060A, the photosensitive sensor 4010A, and the filter 4020A as FIG. 80F illustrated can be obtained.

Person skilled in the art should be able to understand that the interior area of the filter 4020A is isolated from the periphery thereof, such that after the molding material is added into the upper mold 40101A, the molding material will not flow to the interior area of the filter 4020A. Therefore, the protection frame 4060A can avoid the molding material from damaging the interior area of the filter 4020A. Besides, the protection frame 4060A is flexible, so that there will not be gap between the protection frame 4060A and the upper mold 40101A that is pressing the protection frame 4060A. Therefore, "burr" will not occur during the solidification of the molding material added into the upper mold 40101A, which guarantees the image quality of the camera module.

Figure 80G:
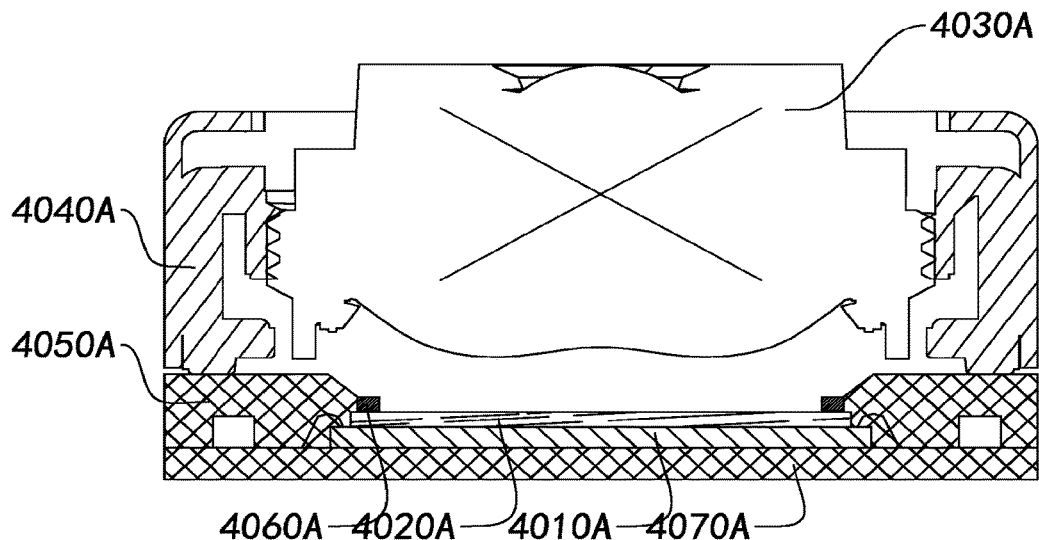
FIG. 80G is a sectional view illustrating step seven of the manufacturing process of the camera module according to above preferred embodiment of the present invention.
Figure 81A:
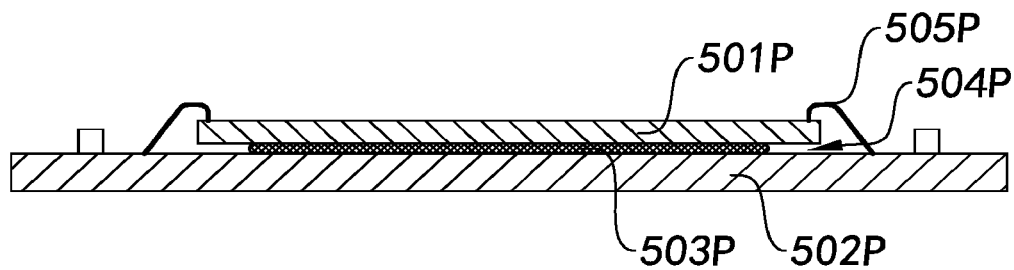
FIGS. 81A-81C illustrate chip and circuit board assembled by a D/A technology.
Figure 81B:
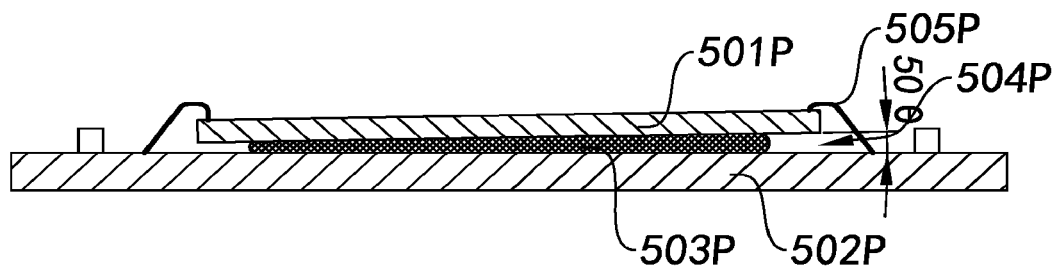
Figure 81C:
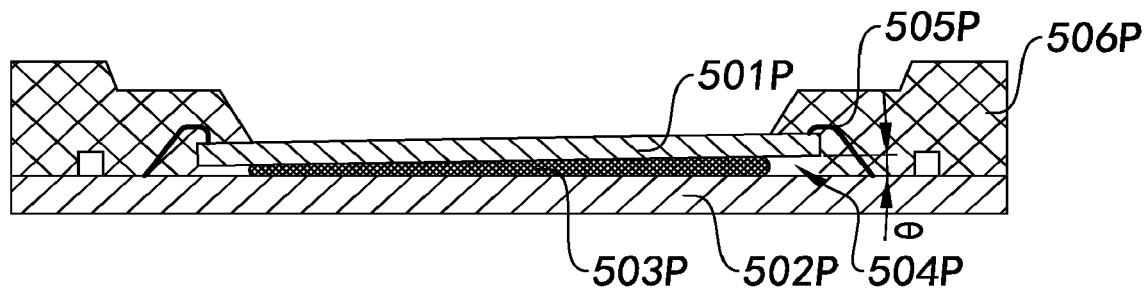
Figure 82:
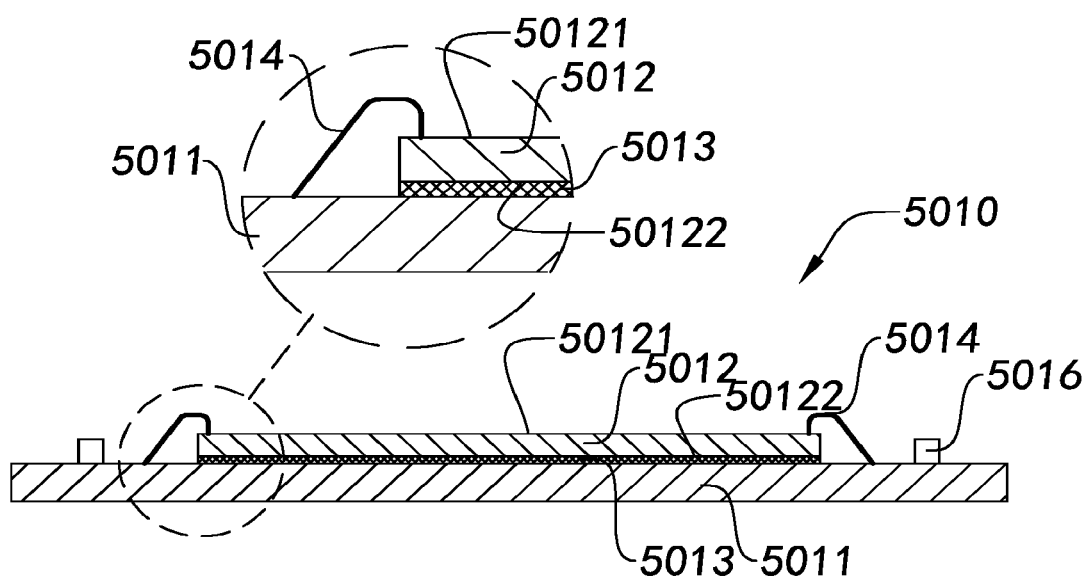
FIG. 82 is a sectional view of a photosensitive unit according to a preferred embodiment of the present invention.

In the step illustrated in FIG. 80G, the filter 4020A and the camera lens 4030A are respectively arranged in the photosensitive path of the photosensitive sensor 4010A, so as to make the camera module.

Further, the present invention also provides a manufacturing method of camera module, comprising the following steps:

(a) connecting and communicating at least a photosensitive sensor 4010 and at least a circuit board 4070;

(b) providing at least a protection frame 4060, wherein the protection frame 4060 is arranged on the periphery little the photosensitive area of the photosensitive sensor 4010.

(c) pressing the protection frame 4060 with the inner surface of the upper mold 40101 of a forming mold 40100, so as to divide the photosensitive area and the non-photosensitive area of the photosensitive sensor 4010.

(d) utilizing the molding material added into the forming mold 40100 to cover the circuit board 4070 and the non-photosensitive area of the photosensitive sensor 4010, so as to form an integrally encapsulated frame 4050 that integrally bonds the circuit board 4070 and the photosensitive sensor 4010 after the molding material was solidified; and (e) providing at least a camera lens 4030, wherein the camera lens 4030 is arranged in the photosensitive path of the photosensitive sensor 4010, so as to make the camera module.

Further, the present invention also provides a manufacturing method of camera module, comprising the following steps:

(A) connecting and communicating at least a photosensitive sensor 4010 and at least a circuit board 4070;

(B) overlapping a filter 4020 on the photosensitive sensor;

(C) providing at least a protection frame 4060, wherein the protection frame 4060 is arranged on the periphery of the filter 4020.

(D) pressing the protection frame 4060 with the inner surface of the upper mold 40101 of a forming mold 40100, so as to divide the periphery and the interior area of the filter 4020.

(E) utilizing the molding material added into the forming mold 40100 to cover the circuit board 4070 and the periphery of the filter 4020, so as to form an integrally encapsulated frame 4050 that integrally bonds the circuit board 4070, the photosensitive sensor 4010, and the filter 4020 after the molding material was solidified; and (F) providing at least a camera lens 4030, wherein the camera lens 4030 is arranged in the photosensitive path of the photosensitive sensor 4010, so as to make the camera module.

FIGS. 81 to 89 illustrate a photosensitive unit and camera module according to a preferred embodiment of the present invention. The photosensitive unit 5010 includes a main circuit board 5011, a photosensitive sensor 5012, and a connecting medium 5013.

The photosensitive sensor 5012 is attached on the main circuit board 5011 through the connecting medium 5013.

The photosensitive sensor 5012 has a front side 50121 and a back side 50122. The front side 50121 faces toward the outer side, which is the direction opposite to the main circuit board 5011. The front side 50121 is for conducting the photosensitive functions. The back side 50122 faces toward the main circuit board 5011. The connecting medium 5013 is deployed between the back side 50122 of the photosensitive sensor 5012 and the main circuit board 5011, so as to affix the photosensitive sensor 5012 on the main circuit board 5011.

It is worth mentioning that the shape of the connecting medium 5013 matches the shape of the photosensitive sensor 5012, so as to allow the photosensitive sensor 5012 to be stably, evenly, and flat attached on the main circuit board 5011. It is different from the circuit board with the chip thereon through conventional D/A attaching. According to previous description and referring to FIGS. 81A and 81B, the circuit board 502P with the chip 501P thereon through conventional D/A attaching usually has the overhanging space 4P between the circuit board 2P and the chip 501P, rendering unstable bonding, poor evenness and flatness, and high risk of tilt to the chip 501P. According to a preferred embodiment of the present invention, the connecting medium 5013 is evenly distributed between the photosensitive sensor 5012 and the main circuit board 5011, so as to completely fill the space between the back side 50122 of the photosensitive sensor 5012 and the main circuit board 5011 with the connecting medium 5013, to increase the covering area of the connecting medium 5013, and to avoid overhanging spaces. Therefore, the photosensitive sensor 5012 can be flat, levelly, and stably connected to the main circuit board 5011.

According to the present embodiment of the present invention, specifically, the connecting medium 5013 can be selected from the group consisting of UV tape, heat release tape, and UV-heat release tape.

According to the present embodiment of the present invention, the photosensitive unit 5010 includes at least a connecting element 5014 for electrically connecting the photosensitive sensor 5012 and the main circuit board 5011. The connecting elements 5014 can be for, for example but not limited to, gold wires, silver wire, copper wires, and/or aluminum wires. In other words, the photosensitive sensor 5012 and the main circuit board 5011 are electrically connected and communicated through the connecting elements 5014. Thus, when the photosensitive sensor 5012 sense the light, it will convert light signal into electrical signal and transmit the electrical signal to the main circuit board 5011 through the connecting elements 5014.

Figure 83:
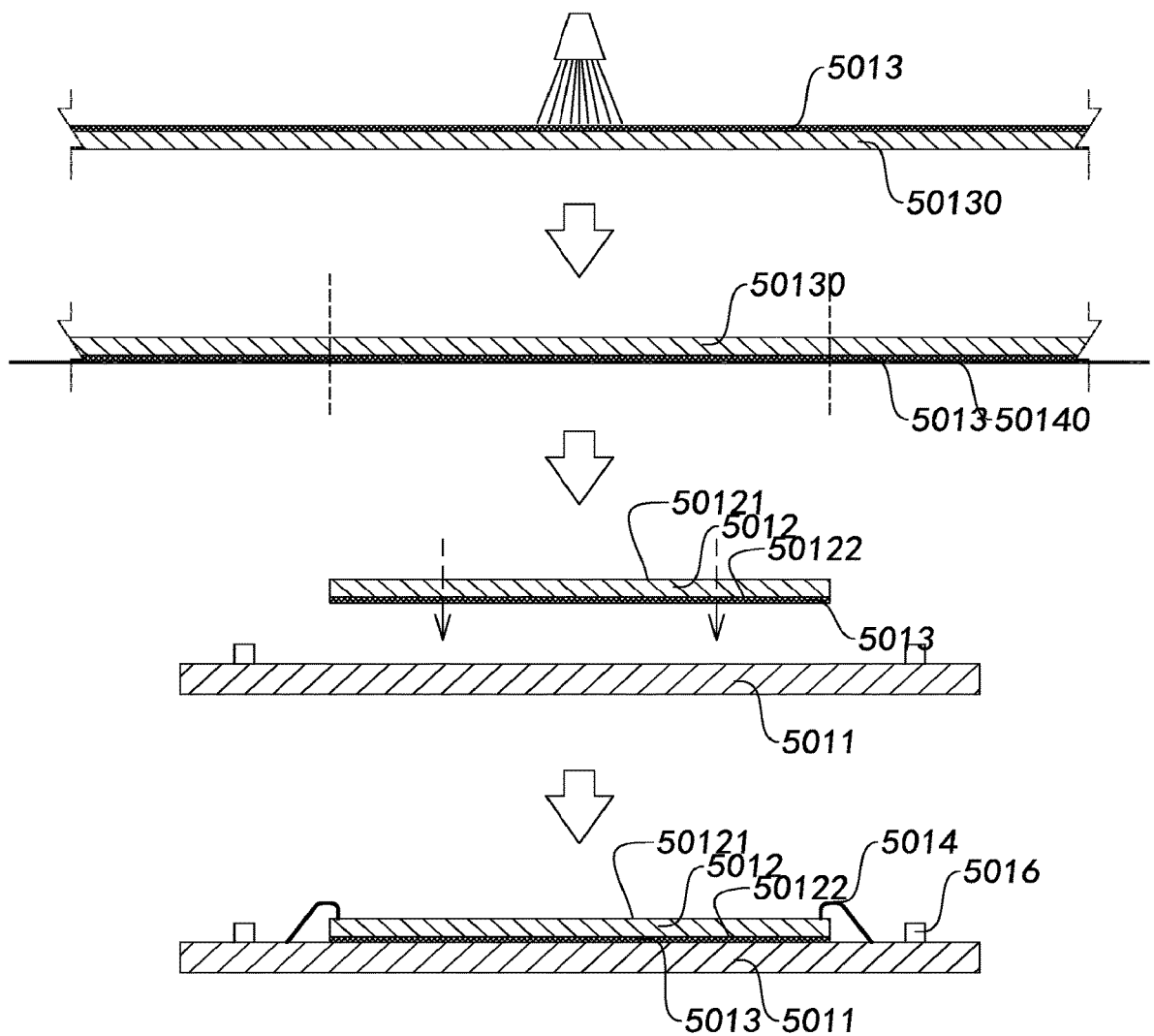
FIG. 83 is a procedural diagram of a first type of manufacturing method for a photosensitive unit according to a preferred embodiment of the present invention.
Figure 84:
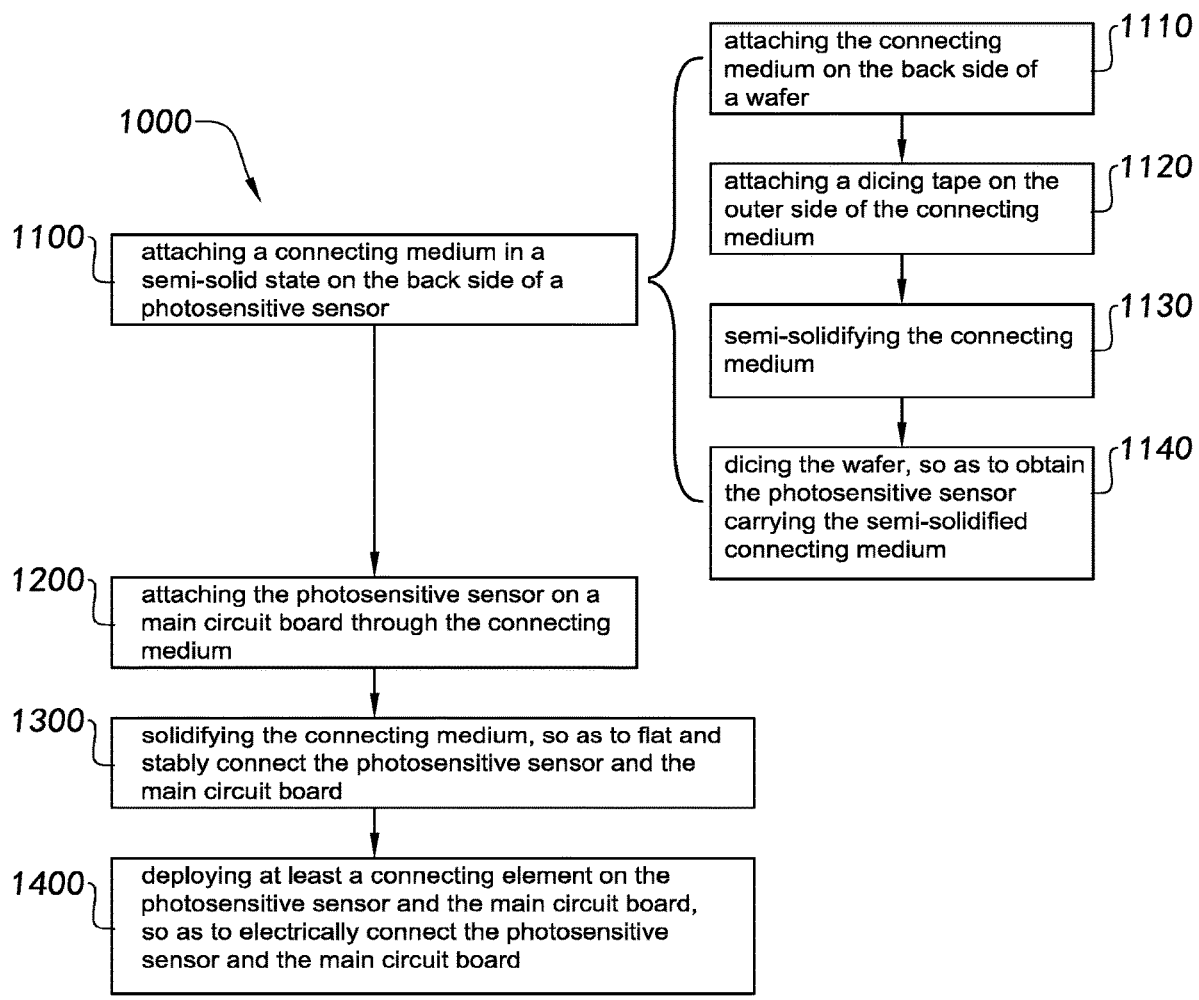
FIG. 84 is a block diagram of a first type of manufacturing method of a photosensitive unit according to a preferred embodiment of the present invention.

Referring to FIGS. 83-84, a first type of manufacturing method for the photosensitive unit 5010 is illustrated. According to this manufacturing method, when manufacturing the photosensitive unit 5010, a layer of the connecting medium 5013 is covered on the back side 50122 of the photosensitive sensor 5012, so as to attach the connecting medium 5013 on the back side 50122 of the photosensitive sensor 5012. The attaching method can be implemented through spray coating, spin-coating, rolling brushing, printing, and etc. The connecting medium 5013 may be selected from the group consisting of UV tape, heat release tape, and UV-heat release tape.

The connecting medium 5013 is semi-solidified through UV curing or heat curing, so as to turn the connecting medium 5013 into a semi-solidified state, in order to ensure that the connecting medium 5013 will not change easily. The UV method is the method of UV exposure. The heat curing method is the method to achieve curing through increasing the temperature.

It is worth mentioning that the photosensitive sensor 5012 is usually obtained through dicing a wafer 50130. Hence, in order to conduct the dicing process, it has to attach a dicing tape 50140 on the connecting medium 5013. Then, one may dice the wafer 50130 that has the connecting medium 5013 and the dicing tape 50140 attached thereon, so as to split the wafer 50130 into a plurality of the photosensitive sensors 5012. That is to say, it dices the wafer 50130 to split it, so as to make the shape of the connecting medium 5013 and the shape of the photosensitive sensor 5012 consistent.

Further, after the dicing tape 50140 is removed, the photosensitive sensor 5012 that carries the connecting medium 5013 will be attached on the main circuit board 5011. That is, the photosensitive sensor 5012 and the main circuit board 5011 are connected and affixed with each other through the connecting medium 5013. Besides, the connecting medium 5013 is solidified through pressing, heating or roasting, such that the photosensitive sensor 5012 and the main circuit board 5011 can be stably connected. Particularly, in an embodiment of the present invention, it further comprises a step of cleaning the photosensitive sensor 5012 before the photosensitive sensor 5012 is attached on the main circuit board 5011. That is to say, it is to clean the photosensitive sensor 5012 to remove the dusts contaminated on the photosensitive sensor 5012.

It is worth mentioning that according to another implementation of the present invention, it may also attach the dicing tape 50140 on the front side of the wafer 50130 during the forming process of the photosensitive sensor 5012, so as to facilitate dicing of the wafer 50130 into the photosensitive sensor(s) 5012. The dicing tape 50140 is removed after the dicing process, so as to make the photosensitive sensor 5012. In other words, the dicing tape 50140 may be deployed on the front side or back side of the wafer 50130. Therefore, those skilled in the art should understand that the deployment position of the dicing tape 50140 shall not limit the present invention.

Further, the connecting elements 5014 are deployed on the photosensitive sensor 5012 and the main circuit board 5011, such that the photosensitive sensor 5012 and the main circuit board 5011 can be electrically connected. For example, it may utilize wire bonding (WB) technology conduct wire bonding on the photosensitive sensor 5012 and the main circuit board 5011.

It is worth mentioning that, according to conventional D/A technology, it usually has to dispense glue on the surface of the circuit board 502P and place the chip 501P on the dispensing area. Then, the chip 501P will be pressed to expand the glue. Therefore, the actual shape of the glue colloid 503P is very uncertain, which, in other words, can be distributed very uneven and difficult to control. According to a preferred embodiment of the present invention, the connecting medium 5013 is attached on the back side 50122 of the photosensitive sensor 5012. Moreover, the connecting medium 5013 is evenly distributed on the back side 50122 of the photosensitive sensor 5012 in a manner of continuum plane rather than a discrete spots or lines, so as to ensure the flatness, smoothness and evenness of the connection between the photosensitive sensor 5012 and the main circuit board 5011. Further, it is in a semi-solid state with a relatively determined shape before the photosensitive sensor 5012 is attached on the main circuit board 5011. Therefore, the shape of the connecting medium 5013 changes relatively little when the photosensitive sensor 5012 is attached on the main circuit board 5011 through the connecting medium 5013, which will not affect the evenness and flatness of the connection between the photosensitive sensor 5012 and the circuit board much. For instance, the evenness and flatness of the photosensitive sensor 5012 can reach the level of 2 μm. Besides, according to this preferred embodiment of the present invention, the covering area of the connecting medium 5013 on the back side 50122 of the photosensitive sensor 5012 is increased, so as to avoid the overhanging space 4P from occurring therearound and reduce the risk of chip damage in the WB process. That is to say, it becomes easier to deploy the connecting element 5014 on the photosensitive sensor 5012 and the main circuit board 5011.

Accordingly, the present invention provides a manufacturing method 1000 of a photosensitive unit, comprising the following steps:

1100: attaching a connecting medium 5013 in a semi-solid state on the back side 50122 of a photosensitive sensor 5012;

1200: attaching the photosensitive sensor 5012 on a main circuit board 5011 through the connecting medium 5013;

1300: solidifying the connecting medium 5013, so as to flat and stably connect the photosensitive sensor 5012 and the main circuit board 5011; and

1400: deploying at least a connecting element 5014 on the photosensitive sensor 5012 and the main circuit board 5011, so as to electrically connect the photosensitive sensor 5012 and the main circuit board 5011.

The step 1100 can further be broken down into:

1110: attaching the connecting medium 5013 on the back side 50122 of a wafer 50130

1120: attaching a dicing tape 50140 on the outer side of the connecting medium 5013

1130: semi-solidifying the connecting medium 5013; and

1140: dicing the wafer 50130, so as to obtain the photosensitive sensor 5012 carrying the semi-solidified connecting medium 5013.

The steps 1110, 1120, 1130, and 1140 are suitable for mass producing the photosensitive unit 5010. When an independent photosensitive sensor 5012 is provided for manufacturing the photosensitive unit 5010, it may attach the connecting medium 5013 on the back side 50122 of the photosensitive sensor 5012 and semi-solidify the connecting medium 5013. Then the photosensitive sensor 5012 can be attached on the main circuit board 5011 through the connecting medium 5013. In other words, the dicing tape 50140 and the dicing process may not be necessary. Certainly, it may also attach a dicing tape 50140 on the front side of the wafer 50130 and then dice the wafer 50130 in the step 1100. It can also comprise the step of removing the dicing tape 50140 through, such as UV exposure.

The attaching method in the step 1110 can be selected from the group consisting of spray coating, spin-coating, rolling brushing, and printing. The connecting medium 5013 is selected from the group consisting of UV tape, heat release tape, and UV-heat release tape.

The semi-solidifying process of the step 1130 can be implemented through ultraviolet irradiation, heating, and etc.

The step 1200 further comprises a step 1210: cleaning the photosensitive sensor 5012.

The solidification method in the step 1300 can be pressing, heating, roasting, and etc.

The deploying method in the step 1400 is wire bonding.

It is worth mentioning that the manufacturing method for the photosensitive unit 5010 of the present invention is suitable for mass production. For instance, it can wholly attach the connecting medium 5013 on the back side 50122 of the wafer 50130 and then dice the wafer 50130, so as to obtain a plurality of the photosensitive sensors 5012. The photosensitive sensors 5012 can then respectively be attached on the main circuit boards 5011, so as to form a plurality of the photosensitive units 5010 at once, which increases the production efficiency. It is unlike conventional method that require separate dispensing and separate bonding processes, which is inefficient.

Figure 85:
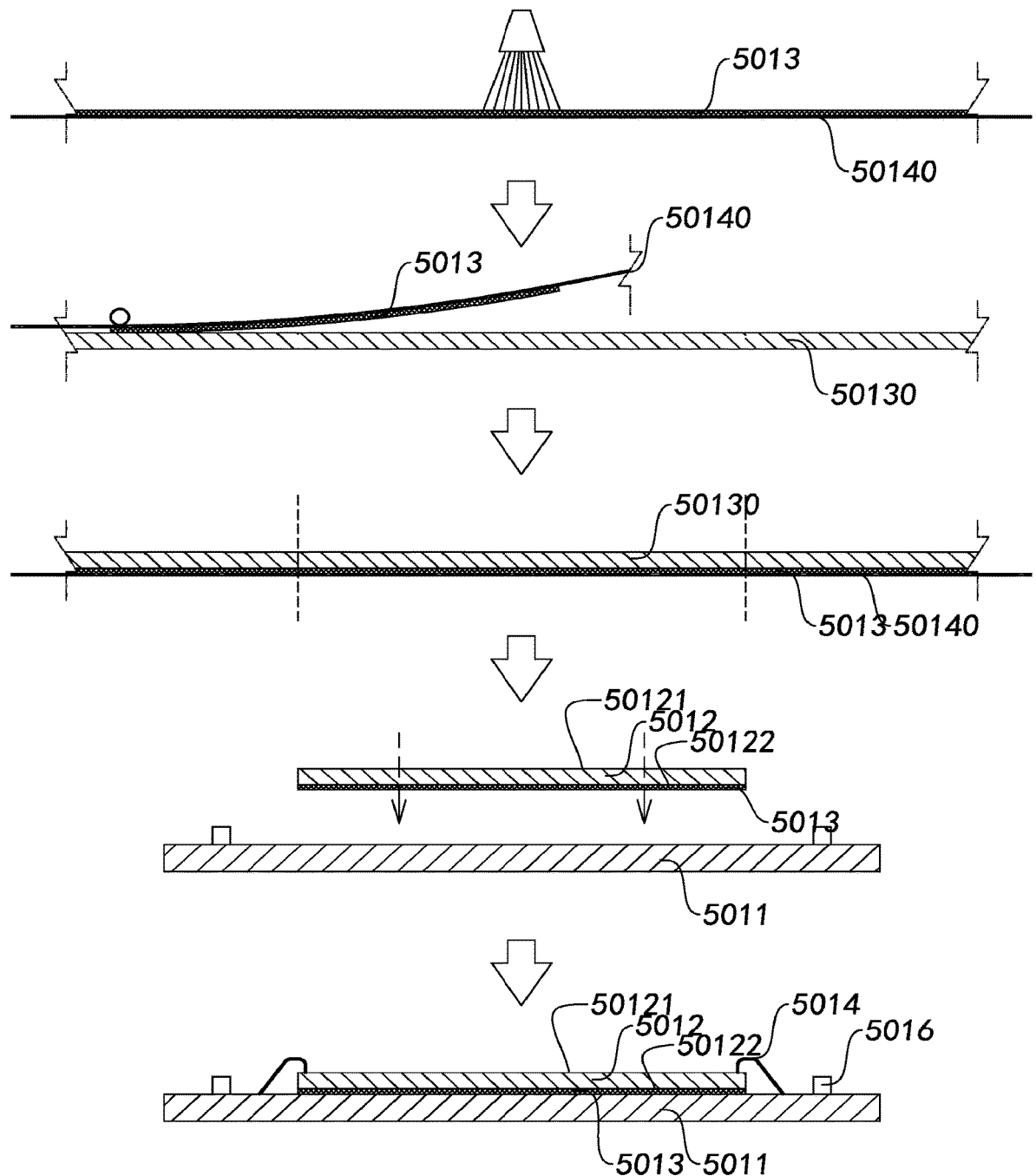
FIG. 85 is a procedural diagram of a second type of manufacturing method for a photosensitive unit according to a preferred embodiment of the present invention.
Figure 86:
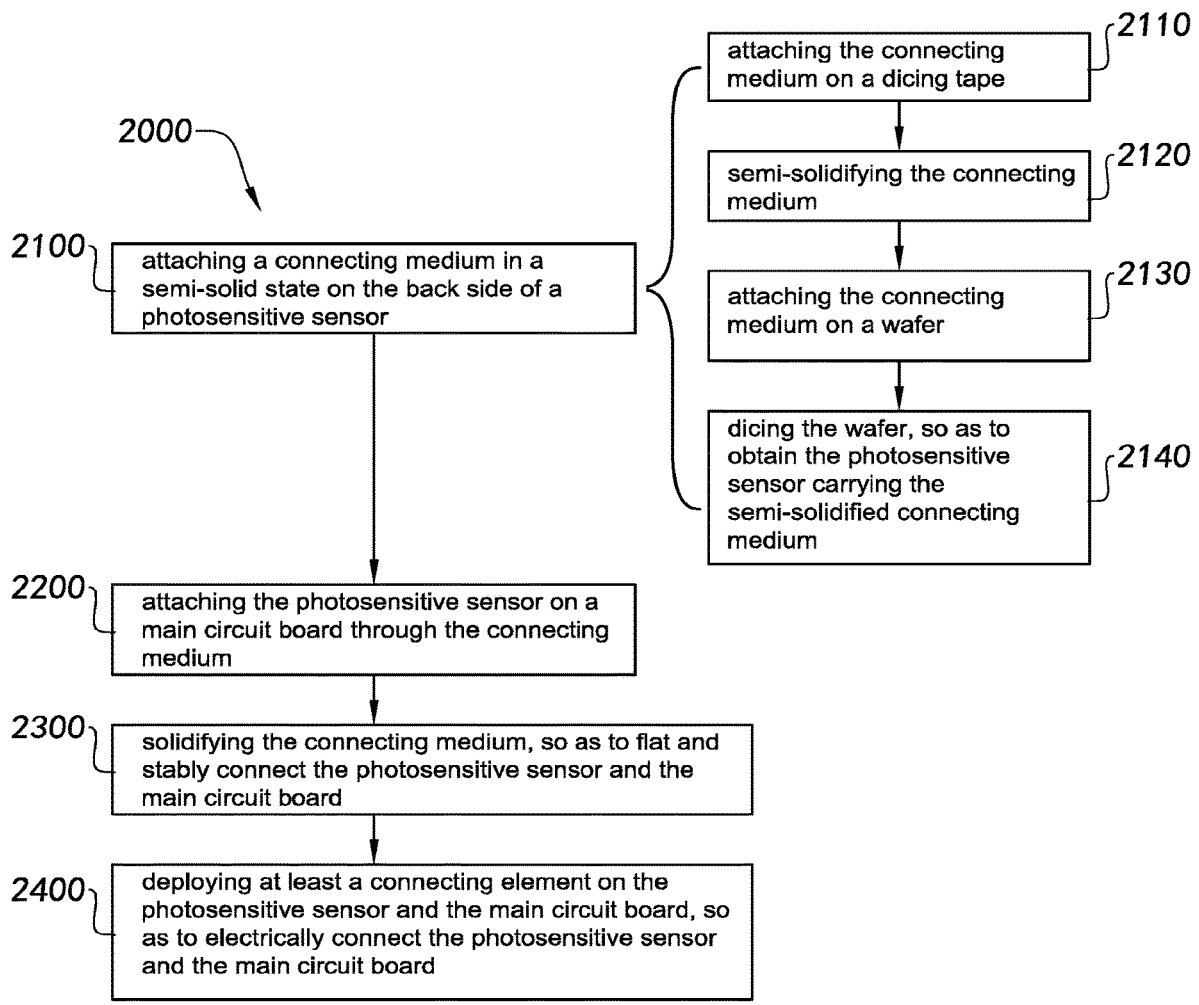
FIG. 86 is a block diagram of a second type of manufacturing method of a photosensitive unit according to a preferred embodiment of the present invention.

Referring to FIGS. 85-86, a second type of manufacturing method for the photosensitive unit 5010 is illustrated. According to this manufacturing method, when manufacturing the photosensitive unit 5010, the connecting medium 5013 is covered on the dicing tape 50140 first, and then the connecting medium 5013 will be semi-solidified. The attaching method can be selected from the group consisting of spray coating, spin-coating, rolling brushing, printing, and etc. The connecting medium 5013 is selected from the group consisting of UV tape, heat release tape, and UV-heat release tape. Particularly, the shape of the connecting medium 5013 is a predetermined shape, such as the shape that matches the photosensitive sensor 5012.

The photosensitive sensor 5012 is usually obtained by dicing the wafer 50130 in a regular production process. Therefore, it can attach the dicing tape 50140 that has the connecting medium 5013 attached thereon on the wafer 50130 and then dice the wafer 50130, such that independent photosensitive sensors 5012 can be obtained. Moreover, there will also be semi-solidified connecting medium 5013 on the photosensitive sensor 5012.

In other words, it may attach the connecting medium 5013 on the back side 50122 of the wafer 50130 with the aid of the dicing tape 50140, so as to bond the connecting medium 5013 on the back side 50122 of the photosensitive sensor 5012. Particularly, it can attach the chip on the back side 50122 of the wafer 50130 through roll extrusion.

It is worth mentioning that after the connecting medium 5013 is attached on the dicing tape 50140, it has to semi-solidify the connecting medium 5013 through, for example, UV curing or heat curing, so as to turn the connecting medium 5013 into a semi-solidified state in order to ensure that the connecting medium 5013 will not change easily. The UV method is the method of UV exposure. The heat curing method is the method to achieve curing through increasing the temperature.

Further, the photosensitive sensor 5012 that carries the connecting medium 5013 is attached on the main circuit board 5011. That is, the photosensitive sensor 5012 and the main circuit board 5011 are connected and affixed with each other through the connecting medium 5013. Besides, the connecting medium 5013 is solidified through pressing, heating or roasting, such that the photosensitive sensor 5012 and the main circuit board 5011 can be stably connected. Particularly, in an embodiment of the present invention, it further comprises a step of cleaning the photosensitive sensor 5012 before the photosensitive sensor 5012 is attached on the main circuit board 5011. That is to say, it is to remove the dusts contaminated on the photosensitive sensor 5012.

Further, the connecting elements 5014 are deployed on the photosensitive sensor 5012 and the main circuit board 5011, such that the photosensitive sensor 5012 and the main circuit board 5011 can be electrically connected.

Accordingly, the present invention provides a manufacturing method 2000 of a photosensitive unit, comprising the following steps:

2100: attaching a connecting medium 5013 in a semi-solid state on the back side 50122 of a photosensitive sensor 5012;

2200: attaching the photosensitive sensor 5012 on a main circuit board 5011 through the connecting medium 5013;

2300: solidifying the connecting medium 5013, so as to flat and stably connect the photosensitive sensor 5012 and the main circuit board 5011; and

2400: deploying at least a connecting element 5014 on the photosensitive sensor 5012 and the main circuit board 5011, so as to electrically connect the photosensitive sensor 5012 and the main circuit board 5011.

The step 2100 can further be broken down into:

2110: attaching the connecting medium 5013 on a dicing tape 50140;

2120: semi-solidifying the connecting medium 5013; and

2130: attaching the connecting medium 5013 on a wafer 50130; and

2140: dicing the wafer, so as to obtain the photosensitive sensor 5012 carrying the semi-solidified connecting medium 5013.

The steps 2110, 2120, 2130, and 2140 are suitable for mass production of the photosensitive unit 5010.

The attaching method in the step 2110 can be selected from the group consisting of spray coating, spin-coating, rolling brushing, and printing. The attaching method in the step 2120 can be roll extrusion.

The connecting medium 5013 is selected from the group consisting of UV tape, heat release tape, and UV-heat release tape.

The semi-solidifying process of the step 2120 can be implemented through ultraviolet irradiation, heating, and etc.

The step 2200 further comprises a step of: cleaning the photosensitive sensor 5012.

The solidification method in the step 2300 can be pressing, heating, roasting, and etc.

The deploying method in the step 2400 is wire bonding.

Figure 87A:
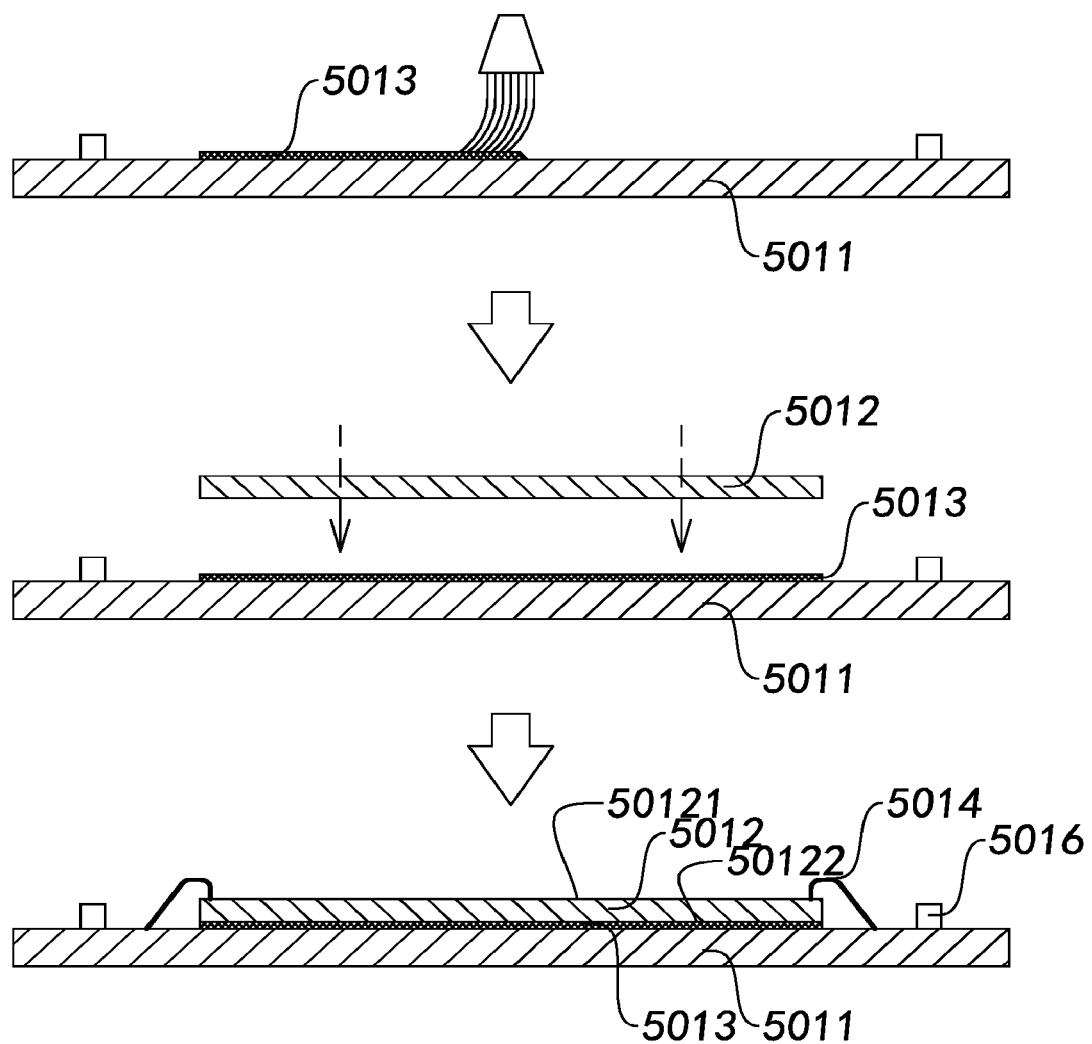
FIG. 87A is a procedural diagram of a third type of manufacturing method for a photosensitive unit according to a preferred embodiment of the present invention.
Figure 87B:
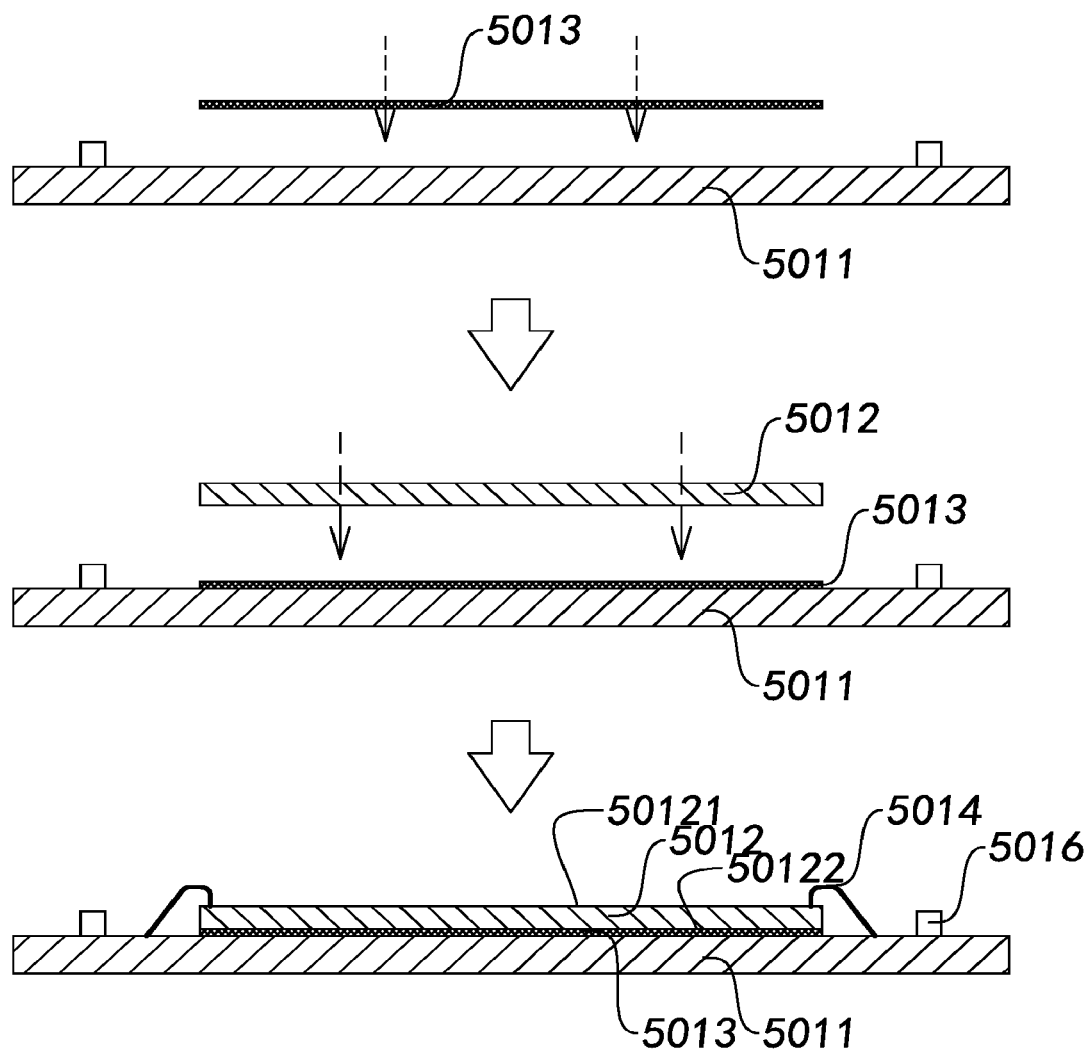
FIG. 87B is a procedural diagram of a fourth type of manufacturing method for a photosensitive unit according to a preferred embodiment of the present invention.
Figure 88:
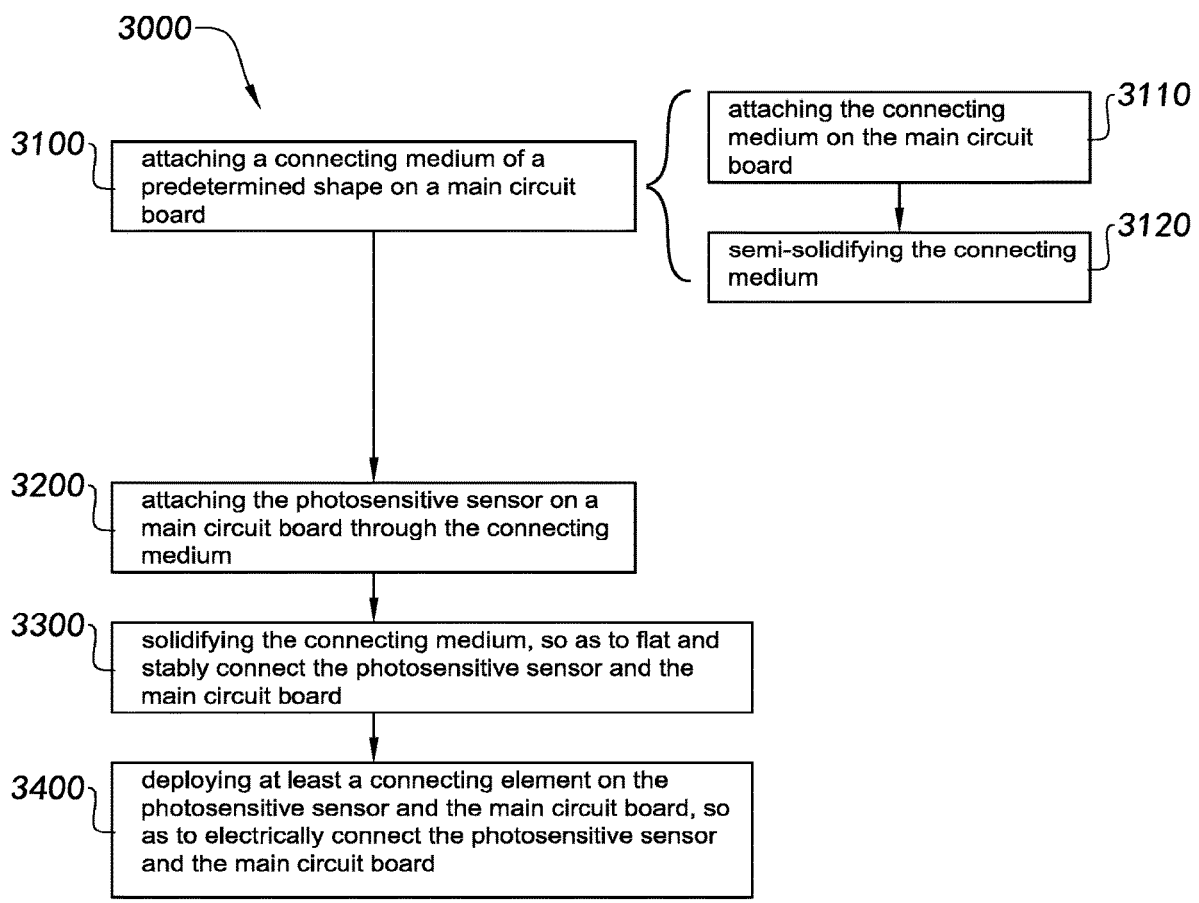
FIG. 88 is a block diagram of a third type of manufacturing method of a photosensitive unit according to a preferred embodiment of the present invention.

Referring to FIGS. 87A-88, a third type of manufacturing method for the photosensitive unit 5010 is illustrated. According to this manufacturing method, when manufacturing the photosensitive unit 5010, the connecting medium 5013 is covered on the main circuit board 5011 first, so as to create available connection site on the main circuit board 5011.

According to the present embodiment of the present invention, the connecting medium 5013 is semi-solidified through, for example, UV curing or heat curing, so as to turn the connecting medium 5013 into a semi-solidified state, in order to ensure that the connecting medium 5013 will not change easily. The UV method is the method of UV exposure. The heat curing method is the method to achieve curing through increasing the temperature.

In other embodiment of the present invention, the semi-solidifying process can be skipped. That is to say, the semi-solidifying process is not a required step for those methods.

Next, the photosensitive sensor 5012 is attached on the main circuit board 5011. Then the connecting medium 5013 is solidified, so as to make the stable and flat photosensitive unit 5010. The connecting medium 5013 may be selected from the group consisting of UV tape, heat release tape, and UV-heat release tape.

It is worth mentioning that the attaching method of the connecting medium 5013 in this manufacturing process may be selected from spray coating, frictioning, scratch brushing, printing, and etc., so as to form a layer of evenly distributed membrane with a certain thickness on the main circuit board 5011 at the position corresponding to the photosensitive sensor 5012, so as to serve as a bonding agent of D/A paster. Then the connecting medium 5013 will be semi-solidified. Next, the photosensitive sensor 5012 will be attached on the main circuit board 5011 and pressed, heated and presses or roasted, so as to stably and reliably connect the photosensitive sensor 5012 and the main circuit board 5011. Unlike traditional dispensing and bonding processes, the present method increases the covering area of the connecting medium 5013, so as to avoid overhanging spaces between the photosensitive sensor 5012 and the main circuit board 5011 and enhance the flatness, evenness, and smoothness. In addition, before the photosensitive sensor 5012 is attached on the main circuit board 5011, the connecting medium 5013 is semi-solidified, such that the shape of the connecting medium 5013 becomes relatively stable and will not change easily. Therefore, the shape of the connecting medium 5013 will not change much when the photosensitive sensor 5012 is attached on the main circuit board 5011 and when it subsequently goes through the process like pressing, heating and pressing, roasting, and etc., such that the evenness and flatness of the connection between the photosensitive sensor 5012 and the main circuit board 5011 can be ensured.

Further, the connecting elements 5014 are deployed on the photosensitive sensor 5012 and the main circuit board 5011, such that the photosensitive sensor 5012 and the main circuit board 5011 can be electrically connected. For example, it may utilize wire bonding (WB) technology conduct wire bonding on the photosensitive sensor 5012 and the main circuit board 5011.

Referring to FIG. 87B, the fourth type of manufacturing method for a photosensitive unit according to a preferred embodiment of the present invention is illustrated. According to this manufacturing method, when manufacturing the photosensitive unit 5010, the connecting medium 5013 is covered on the main circuit board 5011 first, so as to create available connection site on the main circuit board 5011. The differences between the above three manufacturing processes include that in this manufacturing process, the connecting medium 5013 is attached on the main circuit board 5011 through adhering. For example, a double side adhesive film with a predetermined shape can be attached on the surface of the main circuit board 5011. The shape of the film matches the shape of the photosensitive sensor 5012, so and to allow the photosensitive sensor 5012 to be evenly, flat, and gaplessly attached on the main circuit board 5011.

Further, according to another embodiment, after the connecting medium 5013 is attached, the connecting medium 5013 can be pre-solidified through UV irradiation. Next, the photosensitive sensor 5012 is attached on the connecting medium 5013. Then the connecting medium 5013 is solidified through heating, so as to stably connect and fasten the photosensitive sensor 5012 and the main circuit board 5011. In other words, in this implementation, the connecting medium 5013 may utilize material(s) without UV solidification characteristic for adhering.

According to another embodiment, after the connecting medium 5013 is attached, the connecting medium 5013 will not be pre-solidified by UV irradiation. Instead, the photosensitive sensor 5012 is directly attached on the connecting medium 5013 and then the connecting medium 5013 is solidified through heating, so as to stably connect and after fasten the photosensitive sensor 5012 and the main circuit board 5011. In other words, in this implementation, the connecting medium 5013 may utilize material(s) without UV solidification characteristic for adhering.

Correspondingly, according to the above two manufacturing processes of the present invention, the present invention provides a manufacturing method 3000 of a photosensitive unit 5010, comprising the following steps:

3100: attaching a connecting medium 5013 of a predetermined shape on a main circuit board 5011;

3200: attaching the photosensitive sensor 5012 on a main circuit board 5011 through the connecting medium 5013;

3300: solidifying the connecting medium 5013, so as to flat and stably connect the photosensitive sensor 5012 and the main circuit board 5011; and

3400: deploying at least a connecting element 5014 on the photosensitive sensor 5012 and the main circuit board 5011, so as to electrically connect the photosensitive sensor 5012 and the main circuit board 5011.

The step 3100 can further be broken down into:

3110: attaching the connecting medium 5013 on the main circuit board 5011; and

3120: semi-solidifying the connecting medium 5013; and

The attaching method in the step 3110 can be selected from the group consisting of spray coating, frictioning, scratch brushing, printing, and attaching. The connecting medium 5013 is selected from the group consisting of UV tape, heat release tape, and UV-heat release tape. Also, its predetermined shape matches the shape of the photosensitive sensor 5012, such that the photosensitive sensor 5012 can be attached on the main circuit board 5011 in an even and flat manner without creating an overhanging space 504P. In addition, the semi-solidifying process helps to make the shape of the connecting medium 5013 relatively fixed and not likely to change. It is worth mentioning that the semi-solidifying process is an optional step. Namely, according to other embodiments, it may directly coat the connecting medium 5013 corresponding to the photosensitive sensor 5012 and conduct the attaching.

The solidification method in the step 3300 can be pressing, heating, roasting, and etc.

The deploying method in the step 3400 is wire bonding.

Figure 89:
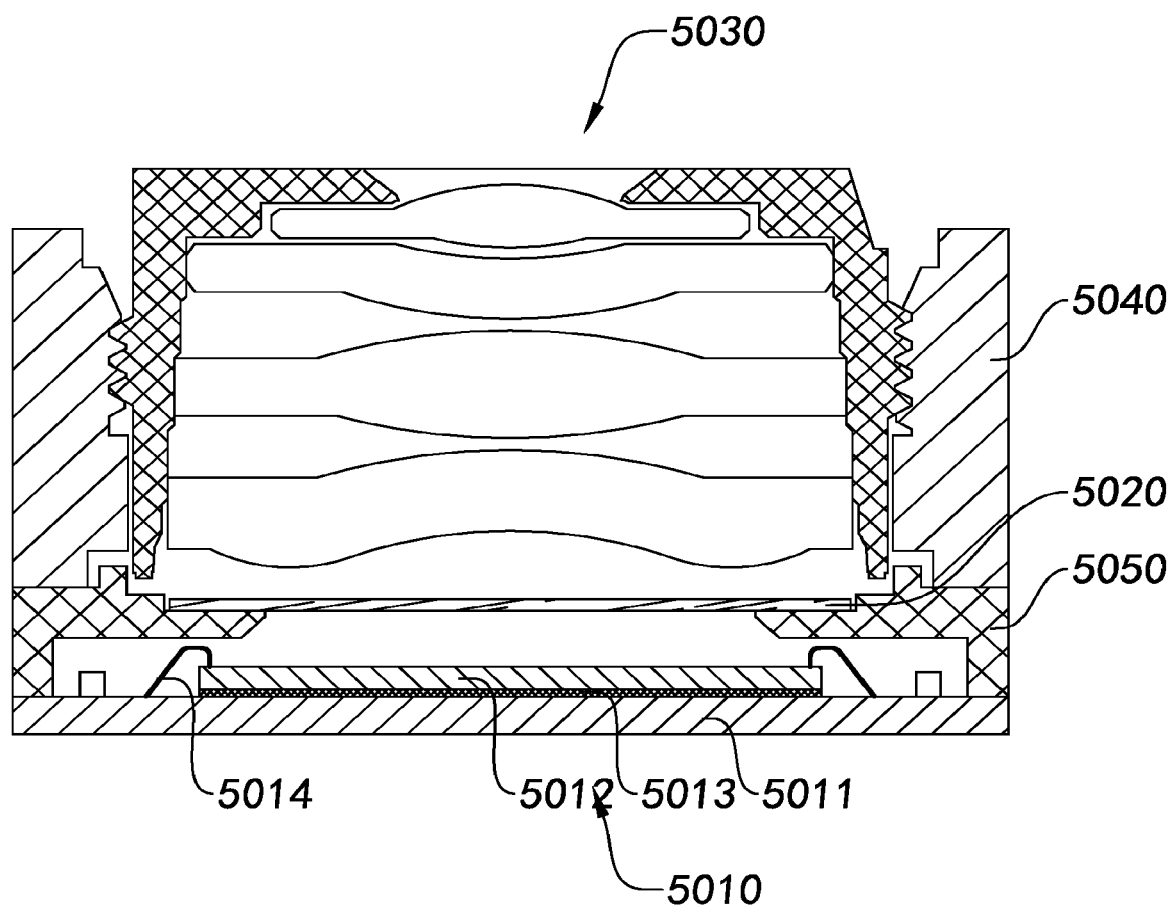
FIG. 89 is a sectional view of a camera module utilizing the photosensitive unit according to a preferred embodiment of the present invention.

Referring to FIG. 89, the camera module according to a preferred embodiment of the present invention is illustrated. The camera module includes one the photosensitive unit 5010, a frame 5050, an optical filter 5020, a camera lens 5030, and a motor unit 5040. The frame 5050 is mounted on the photosensitive unit 5010. The optical filter 5020 is installed on the frame 5050 and in the photosensitive path of the photosensitive sensor 5012. The camera lens 5030 is installed on the motor unit 5040, such that the focal length of the camera module can be adjusted through the motor unit 5040. The motor unit 5040 is installed on the frame 5050, so as to have the camera lens 5030 be positioned along the photosensitive path of the sensor 5050.

It is worth mentioning that the utilization of the photosensitive unit 5010 on the camera module provides the photosensitive sensor 5012 more flattening and smoothness, so that the consistency of the photosensitive axes of the photosensitive sensor 5012, optical filter 5020, and the camera lens 5030 can be adjusted more easily, which improves the imaging quality of the camera module and solves the issues of poor resolution, abnormal image curve, error code of the motor unit 5040, and etc. occurring in the test procedure of the camera module.

It is worth mentioning that, in the present embodiment of the present invention, it utilizes an automatic focus camera module as an example for the description, whereas in other embodiments of the present invention, the camera module can also be a fixed focus module, that is, without the motor unit 5040. Person skilled in the art should understand that the specific shape, type, and mounting of the camera module should not limit the present invention.

Figure 90:
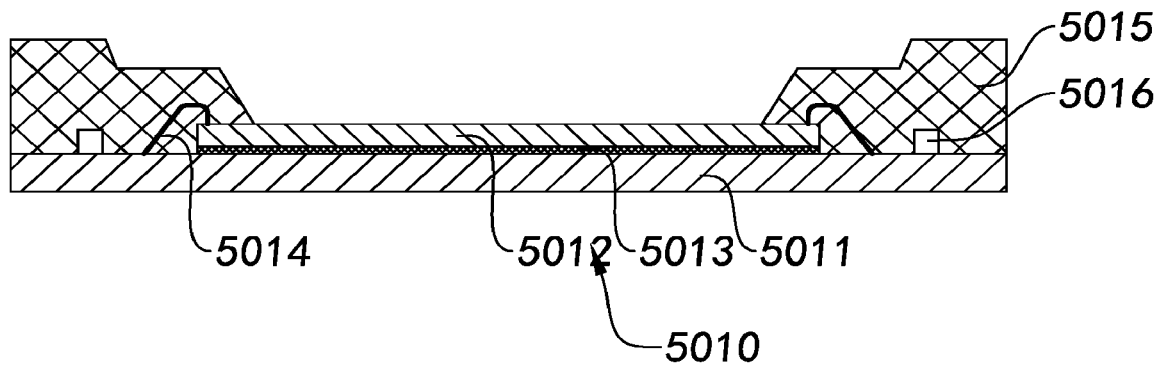
Figure 91:
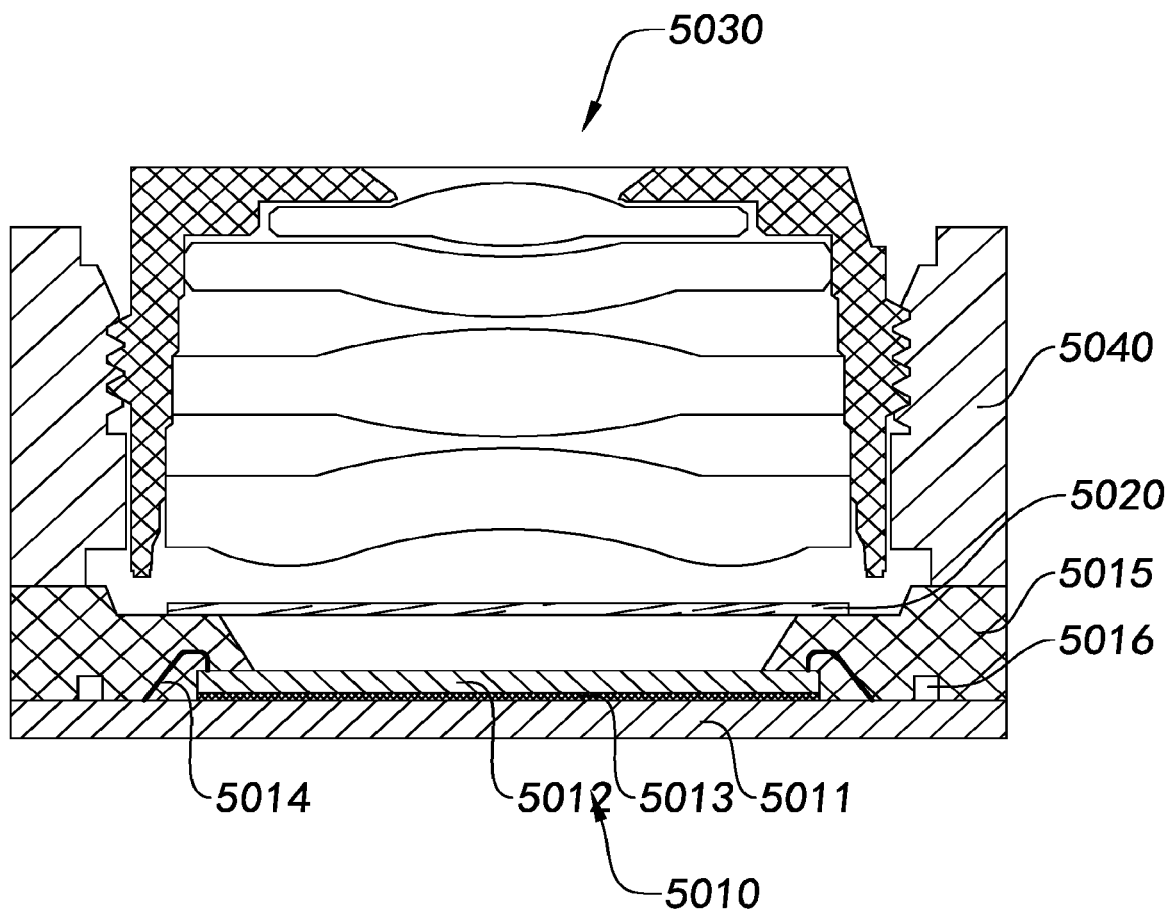

FIGS. 90 and 91 illustrate a photosensitive unit 5010 and camera module according to another preferred embodiment of the present invention. The differences between this preferred embodiment and the above preferred embodiments include that the photosensitive unit 5010 comprises a molding body 5015. The molding body 5015 is integrally formed on the main circuit board 5011 and the photosensitive sensor 5012.

It is worth mentioning that according to conventional D/A technology the overhanging space usually occur in the fringe area that the chip and the circuit board are connected. Therefore, it has to utilize the mold to press the fringe of the chip when it is molding to form the molding body 5015 after the D/A process. Nonetheless, because of the existence of the overhanging space, it can cause the photosensitive sensor 5012 tilted or damaged easily, which is disadvantageous for forming the molding body 5015 and for assembling the camera module. According to the present embodiment of the present invention, the photosensitive sensor 5012 is flat and evenly connected with the main circuit board 5011 through the connecting medium 5013 without leaving the overhanging space, such that it is easier to form the molding body 5015 and it can keeps the molding body 5015 flat and even.

Referring to FIG. 91, a camera module utilizing the photosensitive unit according to the present embodiment of the present invention is illustrated. The camera module comprises a photosensitive unit 5010, an optical filter 5020, a camera lens 5030, and a motor unit 5040.

The optical filter 5020 is mounted on the molding body 5015 of the photosensitive unit 5010 in the photosensitive path of the photosensitive sensor 5012. The camera lens 5030 is installed on the motor unit 5040, such that the focal length of the camera module can be adjusted through the motor unit 5040. The motor unit 5040 is installed on the molding body 5015, so as to have the camera lens 5030 be positioned along the photosensitive path of the photosensitive sensor 5050.

It is worth mentioning that the utilization of the photosensitive unit 5010 on the camera module provides both the photosensitive sensor 5012 and the molding body 5015 more flattening and smoothness, so that the consistency of the photosensitive axes of the photosensitive sensor 5012, optical filter 5020, and the camera lens 5030 can be adjusted more easily, which solves the problem of chip tilt rendered in forming of the molding body 5015, so as to improve the imaging quality of the camera module and solves the issues of poor resolution, abnormal image curve, error code of the motor unit, and etc. occurring in the test procedure of the camera module. Hence, the photosensitive unit 5010 of the present invention is especially suitable is for the camera modules being made by molding technology.

The photosensitive unit 5010 comprises at least a circuit element 5016 protruded from the main circuit board 5011 and encapsulated and wrapped up by the molding body 5015.

The molding body 5015 is integrally encapsulated on the non-photosensitive area of the front side 50121 of the photosensitive sensor 5012, so as to reinforce and strengthen the connection between the photosensitive sensor 5012 and the main circuit board 5011.

It is worth mentioning that, in the present embodiment of the present invention, it utilizes an automatic focus camera module (AFM) as an example for the description, whereas in other embodiments of the present invention, the camera module can also be a fixed focus module (FFM), that is, without the motor unit 5040. Person skilled in the art should understand that the specific shape, type, and mounting of the camera module should not limit the present invention.

Those skilled in the art shall understand that the above mentioned embodiments of the present invention in the descriptions and figures are to give examples, but to confine the present invention. Objectives of the present invention are completely and effectively implemented. Notions of the functions and structures of the present invention have been shown and described in the embodiments, whereas implementations of the present invention may have modifications or changes in any ways without going against the above notions.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An array camera module, comprising:
at least two camera modules, wherein each of the camera modules is independent from others, and the at least two camera modules coordinate with each other to conduct the image capturing of the array camera module, wherein each of the camera modules comprises:
a photosensitive unit, comprising:
an encapsulation portion;
a photosensitive portion, including a main circuit board and a photosensitive sensor, wherein the encapsulation portion is encapsulated to form on the main circuit board and the photosensitive sensor and has a window defined by an inclined inner wall of the encapsulation portion and positioned above the photosensitive sensor to provide a light path of the photosensitive sensor; and
a protective layer arranged on the main circuit board around an area of the photosensitive sensor; and
a camera lens, located in the photosensitive path of the photosensitive sensor of the photosensitive unit;
wherein the encapsulation portions of the at least two camera modules are integrally connected, so as to form a conjoined encapsulation portion.

2. The array camera module, as recited in claim 1, wherein the at least two camera modules are integrally assembled through an external frame.

3. The array camera module, as recited in claim 2, wherein the at least two camera modules are connected to each other.

4. The array camera module, as recited in claim 2, wherein the at least two camera modules are not connected to each other.

5. The array camera module, as recited in claim 1, wherein the main circuit boards of the at least two camera modules are interconnected, so as to form an integral main circuit board.

6. The array camera module, as recited in claim 1, wherein the frames of the at least two camera modules are integrally connected, so as to form a conjoined frame.

* * * * *